US012707803B2

(12) United States Patent
Watabe et al.

(10) Patent No.: US 12,707,803 B2
(45) Date of Patent: Aug. 11, 2026

(54) LIGHT-EMITTING DEVICE

(71) Applicant: Semiconductor Energy Laboratory Co., Ltd., Kanagawa-ken (JP)

(72) Inventors: Takeyoshi Watabe, Atsugi (JP); Nobuharu Ohsawa, Zama (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

(21) Appl. No.: 18/520,725

(22) Filed: Nov. 28, 2023

(65) Prior Publication Data

US 2024/0206217 A1 Jun. 20, 2024

(30) Foreign Application Priority Data

Nov. 30, 2022 (JP) ................................ 2022-191971
Dec. 27, 2022 (JP) ................................ 2022-209514

(51) Int. Cl.
*H10K 50/17* (2023.01)
*H10K 50/13* (2023.01)
(Continued)

(52) U.S. Cl.
CPC ......... *H10K 50/171* (2023.02); *H10K 50/131* (2023.02); *H10K 50/16* (2023.02);
(Continued)

(58) Field of Classification Search
CPC ........... H10K 50/13–131; H10K 50/16; H10K 50/171; H10K 50/19; H10K 2101/30; H10K 2101/40
See application file for complete search history.

(56) References Cited

U.S. PATENT DOCUMENTS 8,358,057 B2 1/2013 Oota
9,929,368 B2 3/2018 Kataishi et al.
(Continued)

FOREIGN PATENT DOCUMENTS

EP 3750901 A 12/2020
JP 2012-160473 A 8/2012
WO WO-2021/045020 3/2021

OTHER PUBLICATIONS

Fukagawa.H et al., "Universal Strategy for Efficient Electron Injection into Organic Semiconductors Utilizing Hydrogen Bonds", Adv. Mater. (Advanced Materials), Oct. 25, 2019, vol. 31, No. 43, pp. 1904201-1-1904201-8.

(Continued)

*Primary Examiner* — Christine S. Kim
*Assistant Examiner* — Tyler J Wiegand
(74) *Attorney, Agent, or Firm* — Husch Blackwell LLP

(57) ABSTRACT

To provide a light-emitting device having high efficiency and high reliability. The light-emitting device includes a first electrode, a second electrode, and an organic compound layer; the organic compound layer is between the first electrode and the second electrode; the organic compound layer includes a first light-emitting unit, a second light-emitting unit, and an intermediate layer; the intermediate layer is between the first light-emitting unit and the second light-emitting unit; the intermediate layer includes a mixed layer containing a first organic compound and a second organic compound; the first organic compound is strongly basic; the second organic compound has an electron-transport property; and the first organic compound has a higher LUMO level than the second organic compound.

20 Claims, 47 Drawing Sheets

(51) Int. Cl.

*H10K 50/16* (2023.01)
*H10K 50/19* (2023.01)
*H10K 101/30* (2023.01)
*H10K 101/40* (2023.01)

(52) U.S. Cl.

CPC ............. *H10K 50/19* (2023.02); *H10K 50/13* (2023.02); *H10K 2101/30* (2023.02); *H10K 2101/40* (2023.02)

(56) References Cited

U.S. PATENT DOCUMENTS

| | | | | |
|---|---|---|---|---|
| 10,263,194 | B2 | 4/2019 | Seo et al. | |
| 11,094,903 | B2 | 8/2021 | Ohsawa et al. | |
| 11,610,529 | B2 | 3/2023 | Watanabe et al. | |
| 2008/0238297 | A1 | 10/2008 | Oota | |
| 2011/0148290 | A1 | 6/2011 | Oota | |
| 2020/0354393 | A1 | 11/2020 | Bae et al. | |
| 2020/0395560 | A1 | 12/2020 | Bae et al. | |
| 2022/0181572 | A1 | 6/2022 | Ohsawa et al. | |
| 2022/0216445 | A1 | 7/2022 | Seo et al. | |
| 2023/0200104 | A1* | 6/2023 | Yamazaki | H10K 85/6572 257/40 |
| 2023/0200198 | A1* | 6/2023 | Yamazaki | H10K 71/231 438/39 |
| 2023/0232707 | A1* | 7/2023 | Watabe | H10K 85/342 257/40 |
| 2024/0224574 | A1* | 7/2024 | Watabe | H10K 50/11 |
| 2025/0248208 | A1* | 7/2025 | Sasaki | H10K 50/171 |
| 2025/0268013 | A1* | 8/2025 | Ohsawa | H10K 50/15 |
| 2025/0280654 | A1* | 9/2025 | Sasaki | H10K 50/166 |
| 2025/0331357 | A1* | 10/2025 | Ohsawa | H10K 50/11 |

OTHER PUBLICATIONS

Sasaki.T et al., "Unravelling the electron injection/transport mechanism in organic light-emitting diodes", Nature Communications, May 11, 2021, vol. 12, pp. 2706-1-2706-8.

Lamprecht.B et al., "Organic optoelectronic device fabrication using standard UV photolithography", Phys. Stat. Sol. (RRL) (Physica Status Solidi. Rapid Research Letters.), Oct. 30, 2007, vol. 2, No. 1, pp. 16-18.

* cited by examiner

Light-emitting device 7A

Light-emitting device 7B

Light-emitting device 7C

Light-emitting device 7D

Light-emitting device 7E

Light-emitting device 7F

Light-emitting device 7G

Light-emitting device 7H

Light-emitting device 7I

Light-emitting device 7J

Light-emitting device 7K

LIGHT-EMITTING DEVICE

BACKGROUND OF THE INVENTION

1. Field of the Invention

One embodiment of the present invention relates to an organic compound, a light-emitting device, a light-emitting apparatus, a light-emitting and light-receiving apparatus, a display apparatus, an electronic appliance, a lighting device, and an electronic device. Note that one embodiment of the present invention is not limited to the above technical field. The technical field of one embodiment of the invention disclosed in this specification and the like relates to an object, a driving method, or a manufacturing method. One embodiment of the present invention relates to a process, a machine, manufacture, or a composition of matter. Specifically, examples of the technical field of one embodiment of the present invention disclosed in this specification include a semiconductor device, a display apparatus, a liquid crystal display apparatus, a light-emitting apparatus, a lighting device, a power storage device, a memory device, an image capturing device, a driving method thereof, and a manufacturing method thereof.

2. Description of the Related Art

Light-emitting devices (organic EL devices) that include organic compounds and utilize electroluminescence (EL) have been put to practical use. In the basic structure of such light-emitting devices, an organic compound layer containing a light-emitting material (an EL layer) is held between a pair of electrodes. Carriers are injected by application of voltage to the device, and recombination energy of the carriers is used, whereby light emission can be obtained from the light-emitting material.

Such light-emitting devices are of self-luminous type and thus have advantages over liquid crystal devices, such as high visibility and no need for backlight when used in pixels of a display, and are suitable as flat panel display devices. Displays that include such light-emitting devices are also highly advantageous in that they can be thin and lightweight. Another feature of such light-emitting devices is that they have an extremely fast response speed.

Since light-emitting layers of such light-emitting devices can be formed two-dimensionally and continuously, planar light emission can be achieved. This feature is difficult to realize with point light sources typified by incandescent lamps and LEDs or linear light sources typified by fluorescent lamps; thus, the light-emitting devices also have great potential as planar light sources, which can be used for lighting devices and the like.

Displays or lighting devices that include light-emitting devices can be used suitably in a variety of electronic appliances as described above, and research and development of light-emitting devices have progressed for more favorable characteristics.

A variety of methods for manufacturing light-emitting devices are known. As a method for manufacturing a high-resolution light-emitting device, a method in which a light-emitting layer is formed without using a fine metal mask is known. An example of the method is a method for manufacturing an organic EL display described in Patent Document 1. The method includes a step of forming a first light-emitting layer as a continuous film crossing a display region including an electrode array by deposition of a first luminescent organic material containing a mixture of a host material and a dopant material over the electrode array that is formed over an insulating substrate and includes a first pixel electrode and a second pixel electrode; a step of irradiating part of the first light-emitting layer positioned over the second pixel electrode with ultraviolet light while part of the first light-emitting layer positioned over the first pixel electrode is not irradiated with ultraviolet light; a step of forming a second light-emitting layer as a continuous film crossing the display region by deposition of a second luminescent organic material, which contains a mixture of a host material and a dopant material but differs from the first luminescent organic material, over the first light-emitting layer; and a step of forming a counter electrode over the second light-emitting layer.

Non-Patent Document 1 discloses a method employing standard UV photolithography for manufacturing an organic optoelectronic device, which is one of organic EL devices (Non-Patent Document 1).

REFERENCE

[Patent Document 1] Japanese Published Patent Application No. 2012-160473

Non-Patent Document

[Non-Patent Document 1] B. Lamprecht et al., "Organic optoelectronic device fabrication using standard UV photolithography", phys. stat. sol. (RRL) 2, No. 1, pp. 16-18 (2008).

SUMMARY OF THE INVENTION

In general, an alkali metal with a low work function, such as lithium (Li), or a compound of such an alkali metal is used in an electron-injection layer of a light-emitting device. By using the alkali metal or the compound of the alkali metal, an excellent electron-injection property can be ensured. Interaction of the alkali metal or the compound of the alkali metal with an electron-transport material ensures charge-generation capability and enables electron injection to an electron-transport layer. In this manner, the use of the alkali metal or the compound of the alkali metal in the electron-injection layer lowers the voltage of the device.

However, the alkali metal or the compound of the alkali metal is easily oxidized and is an unstable material. Thus, any reaction of the alkali metal or the compound of the alkali metal with, for example, an atmospheric component such as water or oxygen in the manufacturing process of the light-emitting device causes a problem such as a significant driving voltage increase or a significant emission efficiency decrease in the light-emitting device. For this reason, an organic EL device needs to be manufactured in a vacuum or an atmosphere of an inert gas such as nitrogen.

In a tandem light-emitting device, specifically, a plurality of light-emitting layers are stacked in series with an intermediate layer therebetween, and the intermediate layer also has a structure that includes a layer containing an alkali metal or a compound of an alkali metal so that electrons can be injected to a light-emitting unit that is in contact with the anode side of the intermediate layer. Meanwhile, in a light-emitting device with a single structure, a structure that includes a layer containing an alkali metal or a compound of an alkali metal can be formed after an organic compound layer is processed into a predetermined shape. Thus, the probability that the layer containing the alkali metal or the compound of the alkali metal will react with an atmospheric component such as water or oxygen is higher in the tandem light-emitting device than in the light-emitting device with the single structure.

A vacuum evaporation method using a metal mask (mask vapor deposition) has been widely used as one of methods for forming an organic compound layer in a predetermined shape in recent years. However, in these days of higher density and higher resolution, mask vapor deposition has come close to the limit of increasing the resolution for various reasons such as the alignment accuracy and the distance between the mask and the substrate. Meanwhile, when a lithography method (e.g., a photolithography method or an electron beam lithography method) is used to process the shape of an organic compound film, a finer pattern can be formed. Moreover, because of the easiness of large-area processing, the processing of an organic compound film by a photolithography method is being researched.

During a processing step in manufacture of a tandem light-emitting device by a photolithography method, the intermediate layer is exposed to the air, a resist resin, water, a chemical solution, or the like. This step causes deterioration of an n-type layer that contains an alkali metal or a compound of an alkali metal and is included in the intermediate layer, resulting in significant deterioration of device characteristics. That is, the layer containing the alkali metal or the compound of the alkali metal in the intermediate layer subjected to the photolithography process causes a significant increase in driving voltage and a significant decrease in emission efficiency.

One object of one embodiment of the present invention is to provide a light-emitting device with high design flexibility. Another object of one embodiment of the present invention is to provide a light-emitting device with high design flexibility in a manufacturing process. Another object of one embodiment of the present invention is to provide a highly reliable light-emitting device. Another object of one embodiment of the present invention is to provide a light-emitting device, a light-emitting apparatus, an electronic appliance, a display apparatus, and an electronic device each having low power consumption. Another object of one embodiment of the present invention is to provide a light-emitting device, a light-emitting apparatus, an electronic appliance, a display apparatus, an electronic device, and a lighting device each having low power consumption and high reliability.

Note that the description of these objects does not preclude the existence of other objects. In one embodiment of the present invention, there is no need to achieve all these objects. Other objects will be apparent from and can be derived from the description of the specification, the drawings, the claims, and the like.

One embodiment of the present invention is a light-emitting device which includes an organic compound layer between a first electrode and a second electrode and in which the organic compound layer includes a first light-emitting unit, a second light-emitting unit, and an intermediate layer; the intermediate layer is between the first light-emitting unit and the second light-emitting unit; the intermediate layer includes a mixed layer containing a first organic compound and a second organic compound; the first organic compound is strongly basic and has an acid dissociation constant $pK_a$ higher than or equal to 8; the second organic compound has an electron-transport property; and the first organic compound has a higher LUMO level than the second organic compound.

One embodiment of the present invention is a light-emitting device which includes an organic compound layer between a first electrode and a second electrode and in which the organic compound layer includes a first light-emitting unit, a second light-emitting unit, and an intermediate layer; the intermediate layer is between the first light-emitting unit and the second light-emitting unit; the intermediate layer includes a mixed layer containing a first organic compound and a second organic compound; the first organic compound is strongly basic and has an acid dissociation constant $pK_a$ higher than or equal to 8; the second organic compound has an electron-transport property; the first organic compound has a higher LUMO level than the second organic compound; and the first organic compound has a higher HOMO level than the second organic compound.

In any of the above light-emitting devices, the first organic compound may have a LUMO level higher than a LUMO level of the second organic compound by greater than or equal to 0.05 eV.

In any of the above light-emitting devices, the first organic compound may have a LUMO level higher than a LUMO level of the second organic compound by greater than or equal to 0.05 eV, and the first organic compound may have a HOMO level higher than a HOMO level of the second organic compound by greater than or equal to 0.05 eV.

In any of the above light-emitting devices, the first organic compound may have a LUMO level higher than or equal to −2.50 eV and lower than or equal to −1.00 eV.

In any of the above light-emitting devices, the first organic compound may have a LUMO level higher than or equal to −2.50 eV and lower than or equal to −1.00 eV, and the first organic compound may have a HOMO level higher than or equal to −5.7 eV and lower than or equal to −4.8 eV.

In any of the above light-emitting devices, the first organic compound may have a LUMO level higher than or equal to −2.50 eV and lower than or equal to −1.00 eV, and the second organic compound may have a LUMO level higher than or equal to −3.25 eV and lower than or equal to −2.50 eV.

In any of the above light-emitting devices, the first organic compound may have a LUMO level higher than or equal to −2.50 eV and lower than or equal to −1.00 eV, the second organic compound may have a LUMO level higher than or equal to −3.25 eV and lower than or equal to −2.50 eV, the first organic compound may have a HOMO level higher than or equal to −5.7 eV and lower than or equal to −4.8 eV, and the second organic compound may have a HOMO level higher than or equal to −6.5 eV and lower than or equal to −5.7 eV.

In any of the above light-emitting devices, the second organic compound may be basic and have an acid dissociation constant $pK_a$ higher than or equal to 4 and lower than or equal to 8.

In any of the above light-emitting devices, the first organic compound may have no electron-donating property with respect to the second organic compound.

In any of the above light-emitting devices, the mixed layer containing the first organic compound and the second organic compound may have spin density lower than or equal to $1\times10^{17}$ spins/$cm^3$ measured by an electron spin resonance method.

In any of the above light-emitting devices, the first light-emitting unit and the second light-emitting unit may each include a light-emitting layer.

One embodiment of the present invention is a light-emitting apparatus that includes the light-emitting device having any of the above-described structures, and a transistor or a substrate.

One embodiment of the present invention can provide a light-emitting device having a novel tandem structure. One embodiment of the present invention can provide a highly efficient light-emitting device having a novel tandem structure. One embodiment of the present invention can provide a highly reliable light-emitting device having a novel tandem structure. One embodiment of the present invention can provide a highly reliable and efficient light-emitting device having a novel tandem structure.

One embodiment of the present invention can provide a light-emitting device with high design flexibility. One embodiment of the present invention can provide a light-emitting device with high design flexibility in a manufacturing process. One embodiment of the present invention can provide a highly reliable light-emitting device. One embodiment of the present invention can provide a light-emitting device, a light-emitting apparatus, an electronic appliance, a display apparatus, and an electronic device each having low power consumption. One embodiment of the present invention can provide a light-emitting device, a light-emitting apparatus, an electronic appliance, a display apparatus, an electronic device, and a lighting device each having low power consumption and high reliability.

Note that the description of these effects does not preclude the existence of other effects. One embodiment of the present invention does not necessarily have all these effects. Other effects will be apparent from and can be derived from the description of the specification, the drawings, the claims, and the like.

DETAILED DESCRIPTION OF THE INVENTION

Figure 1A:
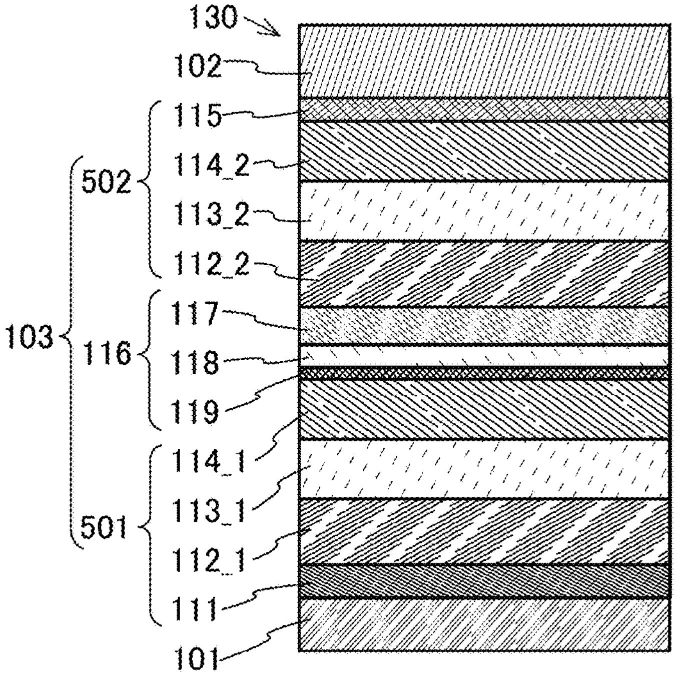
FIGS. 1A to 1C each illustrate a light-emitting device.

Embodiments will be described in detail with reference to the drawings. Note that the embodiments of the present invention are not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Note that in structures of the invention described below, the same portions or portions having similar functions are denoted by the same reference numerals in different drawings, and the description thereof is not repeated. The same hatching pattern is used for portions having similar functions, and the portions are not denoted by specific reference numerals in some cases.

The position, size, range, or the like of each component illustrated in drawings does not represent the actual position, size, range, or the like in some cases for easy understanding. Therefore, the disclosed invention is not necessarily limited to the position, size, range, or the like disclosed in the drawings.

In this specification and the like, a light-emitting device (also referred to as a light-emitting element) includes an EL layer between a pair of electrodes. The EL layer includes at least a light-emitting layer. In this specification and the like, a light-receiving device (also referred to as a light-receiving element) includes at least an active layer functioning as a photoelectric conversion layer between a pair of electrodes. In this specification and the like, one of the pair of electrodes may be referred to as a pixel electrode and the other may be referred to as a common electrode.

Note that the light-emitting apparatus in this specification includes, in its category, an image display device that uses an organic EL device. The light-emitting apparatus may also include a module in which an organic EL device is provided with a connector such as an anisotropic conductive film or a tape carrier package (TCP), a module in which a printed wiring board is provided at the end of a TCP, and a module in which an integrated circuit (IC) is directly mounted on an organic EL device by a chip on glass (COG) method. Furthermore, a lighting device or the like may include the light-emitting apparatus.

Embodiment 1

A light-emitting device includes an organic compound layer containing a light-emitting substance between electrodes (between a first electrode and a second electrode), and energy generated by recombination of carriers (holes and electrons) injected to the organic compound layer from the electrodes causes light emission.

FIG. 1A illustrates a light-emitting device 130 of one embodiment of the present invention. The light-emitting device of one embodiment of the present invention is a tandem light-emitting device and includes an organic compound layer 103 that includes a first light-emitting unit 501 including a first light-emitting layer 1131, a second light-emitting unit 502 including a second light-emitting layer 1132, and an intermediate layer 116, between a first electrode 101 including an anode and a second electrode 102 including a cathode. Note that the light-emitting unit is also referred to as an EL layer.

Although the light-emitting device includes one intermediate layer 116 and two light-emitting units in FIG. 1A, the light-emitting device may include n (n is an integer greater than or equal to 1) intermediate layers and (n+1) light-emitting units.

Figure 1B:
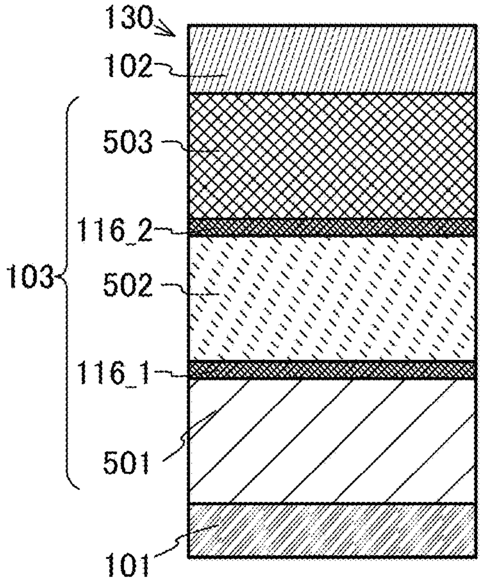

For example, the light-emitting device 130 illustrated in FIG. 1B is an example of a tandem light-emitting device with n=2 that includes the first light-emitting unit 501, a first intermediate layer 116_1, the second light-emitting unit 502, a second intermediate layer 116_2, and a third light-emitting unit 503. The intermediate layer 116 includes at least a charge-generation region 117 (hereinafter also referred to as a p-type layer) and an electron-injection buffer region 119. Between the electron-injection buffer region 119 and the charge-generation region 117, an electron-relay region 118 (hereinafter also referred to as an electron-relay layer) for smooth donation and acceptance of electrons between the two regions may be provided.

The color gamut of light emitted by a light-emitting layer in one light-emitting unit may be the same as or different from that of light emitted by a light-emitting layer in another light-emitting unit. In addition, the light-emitting layer may have either a single-layer structure or a stacked-layer structure. For example, white light emission can be achieved with a structure in which the first light-emitting unit and the third light-emitting unit emit light in a blue region and light-emitting layers in a stacked-layer structure of the second light-emitting unit emit light in a red region and light in a green region.

Here, it is preferable that at least the electron-injection buffer region 119 of the intermediate layer include a mixed layer containing at least two kinds of organic compounds: a strongly basic first organic compound (preferably having an acid dissociation constant $pK_a$ higher than or equal to 8) and a second organic compound the lowest unoccupied molecular orbital (LUMO) level of which is lower than that of the first organic compound. That is, the LUMO level of the strongly basic first organic compound is preferably higher than that of the second organic compound. This structure can inhibit emergence of the problems due to an alkali metal or a compound of an alkali metal, which has been conventionally used.

A tandem light-emitting device of one embodiment of the present invention whose intermediate layer contains a strongly basic organic compound with a high acid dissociation constant $pK_a$ (preferably, $pK_a$ higher than or equal to 8) is driven when holes injected from the first electrode 101 (anode) side pass through the first light-emitting unit 501 and are trapped or blocked by the strongly basic organic compound and then, electrons are injected from the charge-generation region 117 toward the electron-injection buffer region 119.

Note that the strongly basic organic compound blocks holes because such a high-$pK_a$ material has a large dipole moment. When this dipole moment interacts with holes, the electron-injection buffer region 119 can block holes.

A strongly basic organic compound has high nucleophilicity. Accordingly, a highly nucleophilic material may react with a molecule that has become a cation radical by accepting a hole, in which case a new molecule or an intermediate state may be generated. This reaction consumes holes and reduces the hole-transport property of the electron-injection buffer region 119 in some cases.

It is preferable that the above strongly basic organic compound not have a skeleton with an electron-transport property. When the above strongly basic organic compound does not have a skeleton with an electron-transport property, recombination of electrons injected to the electron-injection buffer region 119 and holes trapped by the strongly basic organic compound can be inhibited, enabling efficient electron injection to the first light-emitting unit 501.

Injection of holes and electrons to the highest occupied molecular orbital (HOMO) and LUMO levels of the strongly basic organic compound causes carrier recombination, which easily forms an unstable excited state. This leads to lower reliability of the organic compound and poorer characteristics of a light-emitting device.

In view of the above, the second organic compound, which is mixed into the electron-injection buffer region 119 formed using the strongly basic first organic compound, has an electron-transport property; accordingly, the first organic compound's function of trapping or blocking holes and the second organic compound's function of making electrons flow can be separated, and carrier recombination in the electron-injection buffer region and resulting formation of an unstable excited state are less likely to occur, leading to higher reliability of the organic compound. In other words, the mixed layer (the electron-injection buffer region 119) that is included in the intermediate layer and contains the first organic compound for trapping holes and the second organic compound for transporting electrons inhibits formation of an unstable excited state and increases the reliability of the organic compound.

Thus, the second organic compound with an electron-transport property preferably has a lower LUMO level than the strongly basic first organic compound. The second organic compound with an electron-transport property preferably has a lower HOMO level than the strongly basic first organic compound.

A larger thickness of the electron-injection buffer region 119 causes accumulated holes to be more distant from electrons attracted from the charge-generation region 117 in the electron-injection buffer region 119, relaxing the electric field of an electric double layer and increasing the voltage of the fabricated light-emitting device. Thus, the electron-injection buffer region 119 is preferably provided to have a thickness greater than or equal to 2 nm and less than or equal to 13 nm, further preferably greater than or equal to 5 nm and less than or equal to 10 nm.

The first organic compound preferably has a LUMO level higher than that of the second organic compound by greater than or equal to 0.05 eV. Alternatively, the first organic compound preferably has a LUMO level higher than that of the second organic compound by, preferably, greater than or equal to 0.1 eV, further preferably, greater than or equal to 0.2 eV. Such a difference in LUMO level makes it less likely that the first organic compound accepts electrons owing to the energy of room temperature or the influence of an electric field or the like.

The first organic compound preferably has a HOMO level higher than that of the second organic compound by greater than or equal to 0.05 eV. Alternatively, the first organic compound preferably has a HOMO level higher than that of the second organic compound by, preferably, greater than or equal to 0.1 eV, further preferably, greater than or equal to 0.2 eV. Such a difference in HOMO level makes it less likely that the second organic compound accepts holes owing to the energy of room temperature or the influence of an electric field or the like.

<First Organic Compound>

The LUMO level of the first organic compound is preferably higher than or equal to −2.50 eV and lower than or equal to −1.00 eV. The HOMO level of the first organic compound is preferably higher than or equal to −5.7 eV and lower than or equal to −4.8 eV.

It is preferable that the first organic compound not have a skeleton with an electron-transport property. The first organic is, for example, an organic compound whose aromatic ring contains no nitrogen atom (N).

The first organic compound is preferably a strongly basic organic compound with an acid dissociation constant $pK_a$ higher than or equal to 8. The first organic compound blocks holes because of its strong basicity and acid dissociation constant $pK_a$ higher than or equal to 8, so that holes can be accumulated in a later-described first electron-transport layer.

The acid dissociation constant $pK_a$ of the first organic compound is preferably higher than or equal to 8, further preferably higher than 10. The acid dissociation constant $pK_a$ of the first organic compound is still further preferably higher than or equal to 12, yet still further preferably higher than 13.

As the acid dissociation constant $pK_a$ of a basic skeleton, the acid dissociation constant value of the organic compound formed by substituting hydrogen for part of the skeleton can be used. As an indicator of acidity of an organic compound having a basic skeleton, the acid dissociation constant $pK_a$ of the basic skeleton can be used. As for an organic compound having a plurality of basic skeletons, the acid dissociation constant $pK_a$ of the basic skeleton having the highest acid dissociation constant $pK_a$ can be used as the indicator of acidity of the organic compound.

Alternatively, the acid dissociation constant $pK_a$ of an organic compound may be calculated in the following manner.

First, the initial structure of a molecule serving as a calculation model is the most stable structure (a singlet ground state) obtained from first-principles calculation.

For the first-principles calculation, Jaguar, which is the quantum chemical computational software manufactured by Schrödinger, Inc., is used, and the most stable structure in the singlet ground state is calculated by the density functional theory (DFT). As a basis function, 6-31G** is used, and as a functional, B3LYP-D3 is used. The structure subjected to quantum chemical calculation is sampled by conformational analysis in mixed torsional/low-mode sampling with Maestro GUI manufactured by Schrödinger, Inc.

In calculation of $pK_a$, one or more atoms of the molecule is designated as a basic site, Macro Model is used for searching for a structure that allows the protonated molecule to be stable in water, conformation is searched for with the use of the OPLS 2005 force field, and the lowest-energy conformational isomer thereby obtained is used. Structure optimization is performed by B3LYP/6-31G* using the $pK_a$ calculation module of Jaguar; then, single point calculation is performed with cc-pVTZ(+) to obtain a $pK_a$ value through empirical correction for a functional group. In the case where one or more atoms are designated as basic sites in a molecule, the largest of obtained values is used as a $pK_a$ value.

As specific examples of the organic compound with a high acid dissociation constant $pK_a$ usable for the first organic compound, organic compounds with basic skeletons represented by Structural Formulae (120) to (123) below can be given.

[Chemical Formula 1]

(120)

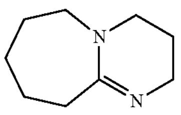

DBU (121)

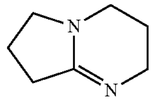

DBN (122)

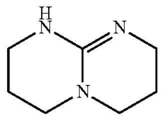

TBD (123)

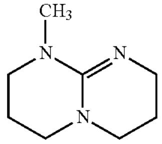

MTBD

It is preferable that the first organic compound be specifically an organic compound that includes a bicyclo ring structure having 2 or more nitrogen atoms in the bicyclo ring and a heteroaromatic hydrocarbon ring having 2 to 30 carbon atoms in the ring or an aromatic hydrocarbon ring having 6 to 30 carbon atoms in the ring, and more specifically be an organic compound that includes a 1,3,4,6,7,8-hexahydro-2H-pyrimido[1,2-a]pyrimidine skeleton and a heteroaromatic hydrocarbon ring having 2 to 30 carbon atoms in the ring or an aromatic hydrocarbon ring having 6 to 30 carbon atoms in the ring. An organic compound that includes a bicyclo ring structure having 2 or more nitrogen atoms in the bicyclo ring and a heteroaromatic hydrocarbon ring having 2 to 30 carbon atoms in the ring, more specifically an organic compound that includes a 1,3,4,6,7,8-hexahydro-2H-pyrimido[1,2-a]pyrimidine skeleton and a heteroaromatic hydrocarbon ring having 2 to 30 carbon atoms in the ring is further preferable. The first organic compound preferably has a guanidine skeleton.

Further specifically, the first organic compound is preferably an organic compound represented by General Formula (G1) below.

[Chemical Formula 2]

(G1)

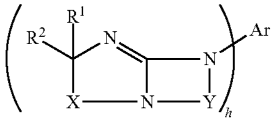

In the organic compound represented by General Formula (G1) above, X represents a group represented by General Formula (G1-1) below, and Y represents a group represented by General Formula (G1-2) below. $R^1$ and $R^2$ each independently represent hydrogen or deuterium, h represents an integer of 1 to 6, and Ar represents a substituted or unsubstituted heteroaromatic hydrocarbon ring having 2 to 30 carbon atoms in the ring or a substituted or unsubstituted aromatic hydrocarbon ring having 6 to 30 carbon atoms in the ring. Ar is preferably the substituted or unsubstituted heteroaromatic hydrocarbon ring having 2 to 30 carbon atoms in the ring.

[Chemical Formula 3]

(G1-1)

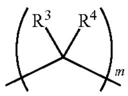

(G1-2)

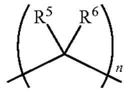

In General Formulae (G1-1) and (G1-2) above, $R^3$ to $R^6$ each independently represent hydrogen or deuterium, m represents an integer of 0 to 4, n represents an integer of 1 to 5, and $m+1 \geq n$ is satisfied. In the case where m or n is 2 or more, $R^3$s may be the same or different from each other, and the same applies to $R^4$s, $R^5$s, and $R^6$s. In the case where m is 0, carbon (C) and nitrogen (N) are preferably bonded to each other in General Formula (G1) above.

The organic compound represented by General Formula (G1) above is preferably any one of compounds represented by General Formulae (G2-1) to (G2-6) below.

[Chemical Formula 4]

(G2-1)

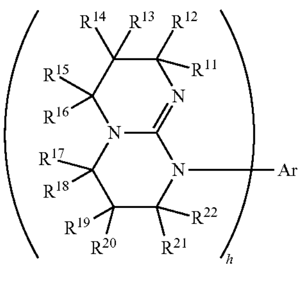

-continued (G2-2)

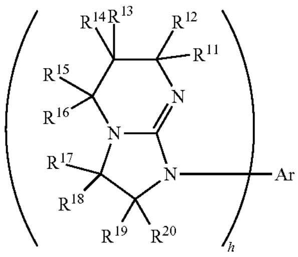

(G2-3)

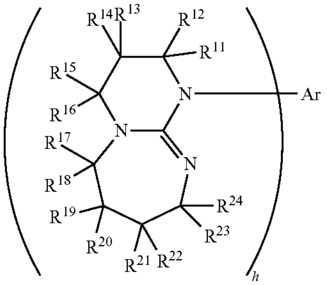

(G2-4)

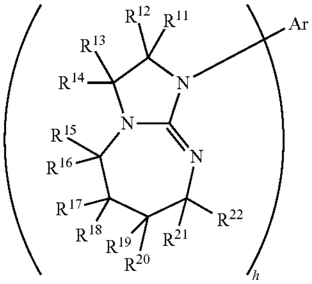

(G2-5)

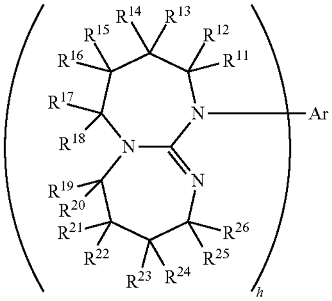

(G2-6)

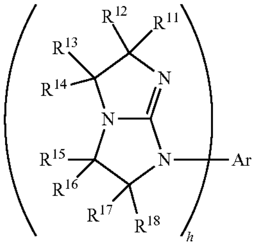

$R^{11}$ to $R^{26}$ each independently represent hydrogen or deuterium, h represents an integer of 1 to 6, and Ar represents a substituted or unsubstituted heteroaromatic hydrocarbon ring having 2 to 30 carbon atoms in the ring or a substituted or unsubstituted aromatic hydrocarbon ring having 6 to 30 carbon atoms in the ring. Ar is preferably the substituted or unsubstituted heteroaromatic hydrocarbon ring having 2 to 30 carbon atoms in the ring.

In General Formula (G1) and General Formulae (G2-1) to (G2-6) above, the substituted or unsubstituted heteroaromatic hydrocarbon ring having 2 to 30 carbon atoms in the ring or the substituted or unsubstituted aromatic hydrocarbon ring having 6 to 30 carbon atoms in the ring that is represented by Ar is specifically a pyridine ring, a bipyridine ring, a pyrimidine ring, a bipyrimidine ring, a pyrazine ring, a bipyrazine ring, a triazine ring, a quinoline ring, an isoquinoline ring, a benzoquinoline ring, a phenanthroline ring, a quinoxaline ring, a benzoquinoxaline ring, a dibenzoquinoxaline ring, an azofluorene ring, a diazofluorene ring, a carbazole ring, a benzocarbazole ring, a dibenzocarbazole ring, a dibenzofuran ring, a benzonaphthofuran ring, a dinaphthofuran ring, a dibenzothiophene ring, a benzonaphthothiophene ring, a dinaphthothiophene ring, a benzofuropyridine ring, a benzofuropyrimidine ring, a benzothiopyridine ring, a benzothiopyrimidine ring, a naphthofuropyridine ring, a naphthofuropyrimidine ring, a naphthothiopyridine ring, a naphthothiopyrimidine ring, an acridine ring, a xanthene ring, a phenothiazine ring, a phenoxazine ring, a phenazine ring, a triazole ring, an oxazole ring, an oxadiazole ring, a thiazole ring, a thiadiazole ring, an imidazole ring, a benzimidazole ring, a pyrazole ring, a pyrrole ring, a benzene ring, a naphthalene ring, a fluorene ring, a dimethylfluorene ring, a diphenylfluorene ring, a spirofluorene ring, an anthracene ring, a phenanthrene ring, a triphenylene ring, a pyrene ring, a tetracene ring, a chrysene ring, a benzo[a]anthracene ring, or the like. Ar is especially preferably the ring represented by any one of Structural Formulae (Ar-1) to (Ar-27) below.

[Chemical Formula 5]

(Ar-1)

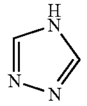

(Ar-2)

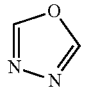

(Ar-3)

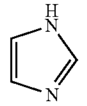

(Ar-4)

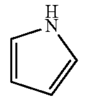

(Ar-5)

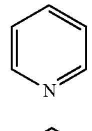

(Ar-6)

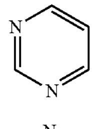

(Ar-7)

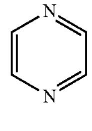

-continued
(Ar-8)
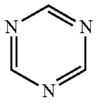
(Ar-9)
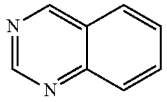
(Ar-10)
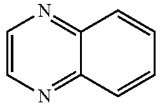
(Ar-11)
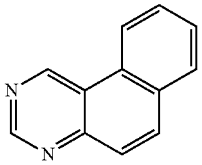
(Ar-12)
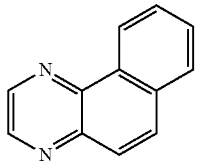
(Ar-13)
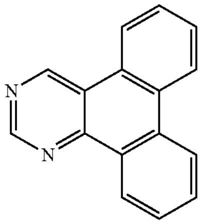
(Ar-14)
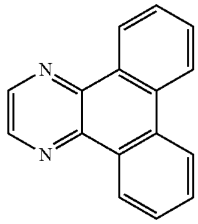
(Ar-15)
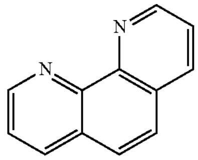
(Ar-16)
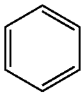
(Ar-17)
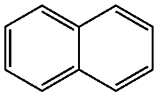
-continued
(Ar-18)
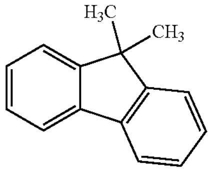
(Ar-19)
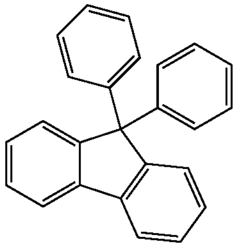
(Ar-20)
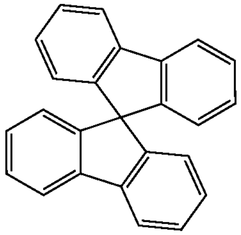
(Ar-21)
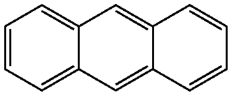
(Ar-22)
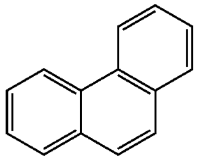
(Ar-23)
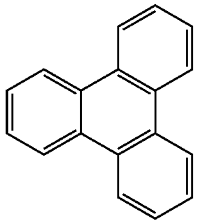
(Ar-24)
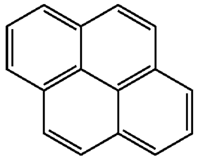
(Ar-25)
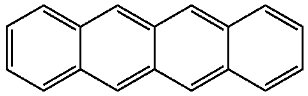

-continued (Ar-26)

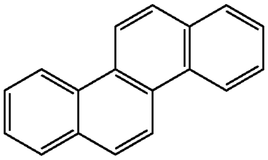

(Ar-27)

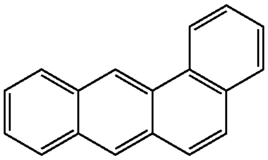

Note that Ar preferably has a nitrogen atom in its ring and is preferably bonded to the skeleton within parentheses in General Formula (G1) above by a bond of the nitrogen atom or a bond of a carbon atom adjacent to the nitrogen atom.

As specific examples of the organic compounds represented by General Formula (G1) and General Formulae (G2-1) to (G2-6) above, organic compounds represented by Structural Formulae (101) to (117) below, including 1,1'-(9,9'-spirobi[9H-fluorene]-2,7-diyl)bis(1,3,4,6,7,8-hexahydro-2H-pyrimido[1,2-a]pyrimidine) (abbreviation: 2,7hpp2SF) (Structural Formula 108) and 1-(9,9'-spirobi[9H-fluoren]-2-yl)-1,3,4,6,7,8-hexahydro-2H-pyrimido[1,2-a]pyrimidine (abbreviation: 2hppSF) (Structural Formula 109), can be given.

[Chemical Formula 6]

(101)

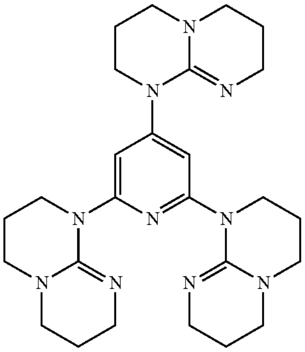

(102)

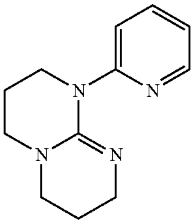

(103)

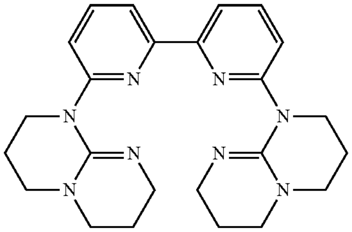

-continued (104)

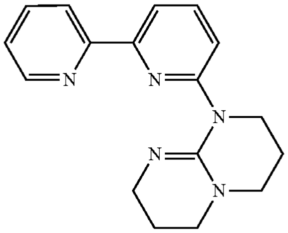

(105)

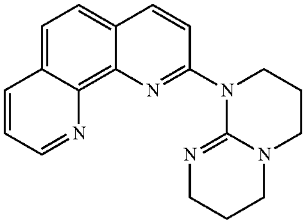

(106)

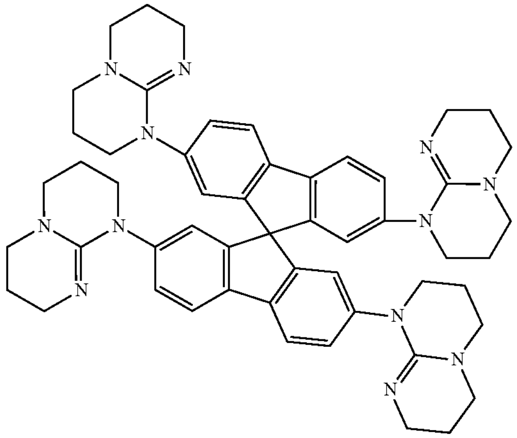

(107)

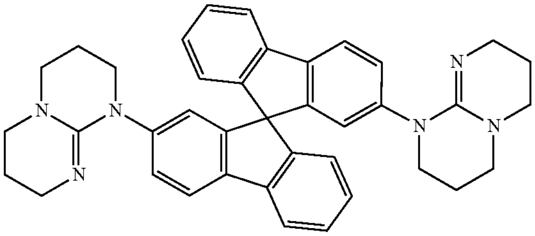

(108)

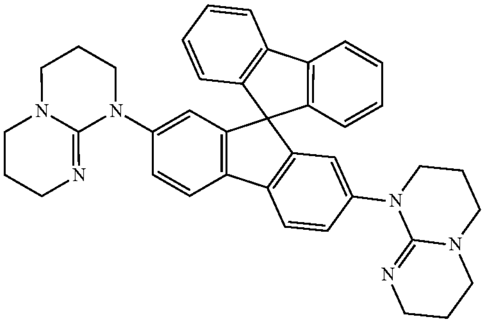

-continued
(109)
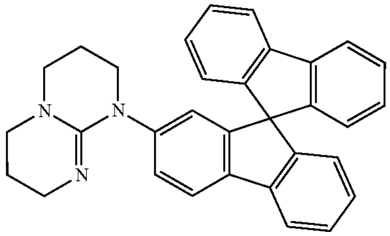
(110)
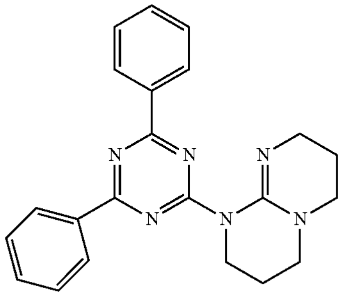
(111)
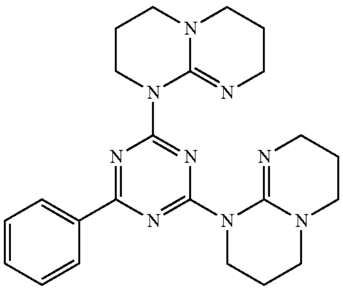
(112)
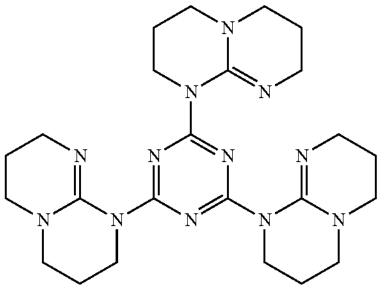
(113)
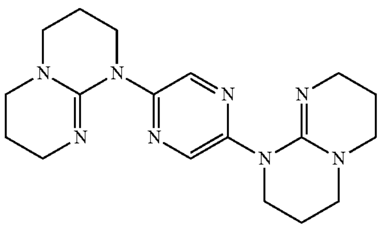
-continued
(114)
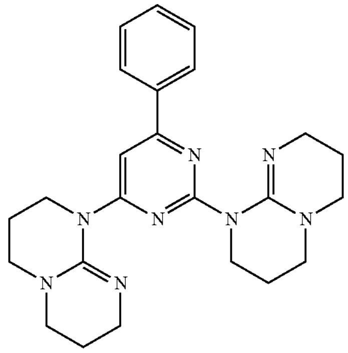
(115)
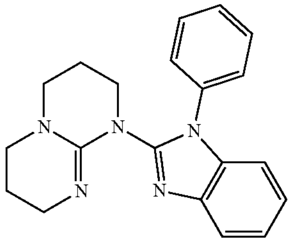
(116)
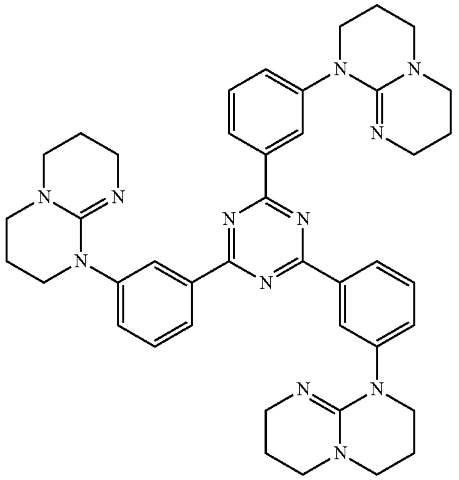
(117)
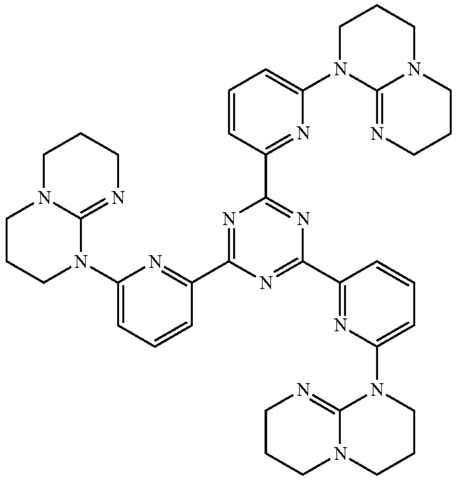
It is preferable that the strongly basic substance with an acid dissociation constant $pK_a$ higher than or equal to 8 not have a skeleton with an electron-transport property so that injected electrons and blocked holes can be inhibited from recombining on the strongly basic substance with an acid dissociation constant $pK_a$ higher than or equal to 8. As the strongly basic substance with an acid dissociation constant $pK_a$ higher than or equal to 8, specifically, an organic compound such as 1-(9,9'-spirobi[9H-fluoren]-2-yl)-1,3,4,6,7,8-hexahydro-2H-pyrimido[1,2-a]pyrimidine (abbreviation: 2hppSF), 2,9-bis(1,3,4,6,7,8-hexahydro-2H-pyrimido[1,2-a]pyrimidin-1-yl)-1,10-phenanthroline (abbreviation: 2,9hpp2Phen), 4,7-di-1-pyrrolidinyl-1,10-phenanthroline (abbreviation: Pyrrd-Phen), or 8,8'-pyridine-2,6-diyl-bis(5,6,7,8-tetrahydroimidazo[1,2-a]pyrimidine) (abbreviation: 2,6tip2Py) can be used, for example.

In the case where the light-emitting device is fabricated by a process involving exposure to the air, a washing step using an aqueous solution, or the like, the first organic compound preferably has low solubility. For example, the solubility of the first organic compound is affected by the number of hydrophilic groups such as 2H-pyrimido[1,2-a]pyrimidine groups (hpp groups) and the number of hydrophobic groups such as tert-butyl groups in the first organic compound. It is thus preferable that the number of hydrophilic groups in the first organic compound be smaller and be specifically 1. It is preferable that in the first organic compound, the number of hydrophobic groups be larger than that of hydrophilic groups and be specifically 2 or more.

Specifically, the solubility of the first organic compound is preferably lower than 0.77 mg/ml, further preferably lower than or equal to 0.065 mg/ml, still further preferably lower than or equal to 0.0023 mg/ml, yet still further preferably lower than or equal to $1\times10^{-5}$ mg/ml.

Even when the first organic compound has high solubility, adjusting the concentration of the first organic compound in the electron-injection buffer region 119 makes it possible to provide a favorable light-emitting device. Specifically, $y\leq-8.735\times\ln(x)-2.3154$ is preferably satisfied, where y is the concentration (weight %) of the first organic compound in the electron-injection buffer region 119 and x is the water solubility (mg/ml) of the first organic compound.

<Second Organic Compound>

The second organic compound has an electron-transport property. In a substance with a high electron-transport property, electron mobility is higher than hole mobility. Specifically, the electron mobility is preferably higher than or equal to $1\times10^{7}$ $cm^2/Vs$, further preferably higher than or equal to $1\times10^{-6}$ $cm^2/Vs$ in the case where the square root of the electric field strength [V/cm] is 600.

As the organic compound having a high electron-transport property, a heteroaromatic compound can be used, for example. The heteroaromatic compound refers to a cyclic compound containing at least two different kinds of elements in a ring. Examples of cyclic structures include a three-membered ring, a four-membered ring, a five-membered ring, and a six-membered ring, among which a five-membered ring and a six-membered ring are particularly preferable. The elements contained in the heteroaromatic compound are preferably one or more of nitrogen, oxygen, sulfur, and the like, in addition to carbon. In particular, a heteroaromatic compound containing nitrogen (a nitrogen-containing heteroaromatic compound) is preferable, and any of materials having a high electron-transport property (electron-transport materials), such as a nitrogen-containing heteroaromatic compound and an organic compound having a π-electron deficient heteroaromatic ring including the nitrogen-containing heteroaromatic compound, is preferably used.

It is preferable that the second organic compound not have a hole-transport skeleton. The second organic compound is, for example, an organic compound without an amine skeleton or an organic compound without a carbazole skeleton.

The LUMO level of the second organic compound is preferably higher than or equal to −3.25 eV and lower than or equal to −2.50 eV. The HOMO level of the second organic compound is preferably higher than or equal to −6.5 eV and lower than or equal to −5.7 eV.

The acid dissociation constant $pK_a$ of the second organic compound is preferably higher than or equal to 3 and lower than or equal to 8, further preferably higher than or equal to 4 and lower than or equal to 6.

The second organic compound preferably has a skeleton with an electron-transport property. As a material having an electron-transport property, for example, a metal complex such as bis(10-hydroxybenzo[h]quinolinato)beryllium(II) (abbreviation: $BeBq_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); or an organic compound having a π-electron deficient heteroaromatic ring is preferably used. Examples of the organic compound having a π-electron deficient heteroaromatic ring include an organic compound that includes a heteroaromatic ring having a polyazole skeleton, an organic compound that includes a heteroaromatic ring having a pyridine skeleton, an organic compound that includes a heteroaromatic ring having a diazine skeleton, and an organic compound that includes a heteroaromatic ring having a triazine skeleton.

Among the above materials, the organic compound that includes a heteroaromatic ring having a diazine skeleton (a pyrimidine skeleton, a pyrazine skeleton, or a pyridazine skeleton), the organic compound that includes a heteroaromatic ring having a pyridine skeleton, and the organic compound that includes a heteroaromatic ring having a triazine skeleton have high reliability and thus are preferable. In particular, the organic compound that includes a heteroaromatic ring having a diazine (pyrimidine or pyrazine) skeleton and the organic compound that includes a heteroaromatic ring having a triazine skeleton have a high electron-transport property to contribute to a reduction in driving voltage. A benzofuropyrimidine skeleton, a benzothienopyrimidine skeleton, a benzofuropyrazine skeleton, and a benzothienopyrazine skeleton are preferable because of their high reliability.

As the organic compound having a π-electron deficient heteroaromatic ring skeleton, it is possible to use any of materials given as examples of an electron-transport organic compound for the later-described first electron-transport layer. Among the materials, the organic compound that includes a heteroaromatic ring having a diazine skeleton, the organic compound that includes a heteroaromatic ring having a pyridine skeleton, and the organic compound that includes a heteroaromatic ring having a triazine skeleton have high reliability and thus are preferable. In particular, the organic compound that includes a heteroaromatic ring having a diazine (pyrimidine or pyrazine) skeleton and the organic compound that includes a heteroaromatic ring having a triazine skeleton have a high electron-transport property to contribute to a reduction in driving voltage. Specifically, 2,2'-(1,3-phenylene)bis(9-phenyl-1,10-phenanthroline) (abbreviation: mPPhen2P), 2-[3-(2-triphenylenyl)phenyl]-1,10-phenanthroline (abbreviation: mpPPhen), 2-[4-(9-phenanthrenyl)-1-naphthalenyl]-1,10- phenanthroline (abbreviation: PnNPhen), or any other organic compound having a phenanthroline skeleton is preferably used; it is further preferable to use mPPhen2P or any other organic compound having a phenanthroline dimer structure because such an organic compound has excellent stability. A material with a pyridine skeleton and a material with a phenanthroline skeleton have a high $pK_a$ and accordingly have a high hole-blocking property; thus, any of these materials is particularly preferably used as the electron-transport material that is the second organic compound in the light-emitting device of one embodiment of the present invention. A molecule having a larger number of pyridine skeletons or phenanthroline skeletons has a higher hole-blocking property and is thus particularly preferably used as the electron-transport material that is the second organic compound in the light-emitting device of one embodiment of the present invention.

A mixed layer of any of the organic compounds described in <First organic compound> and any of the organic compounds described in <Second organic compound> can be formed by co-evaporation thereof. Using the mixed layer as the electron-injection buffer region of the intermediate layer increases the reliability of the light-emitting device.

<Mechanism of Tandem Light-Emitting Device>

Figure 2A:
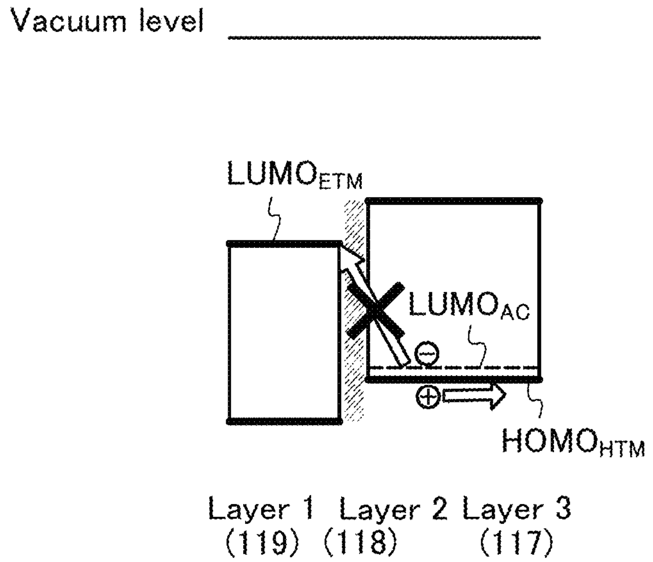
FIGS. 2A and 2B are band diagrams illustrating a driving mechanism of a light-emitting device of the present invention.
Figure 2B:
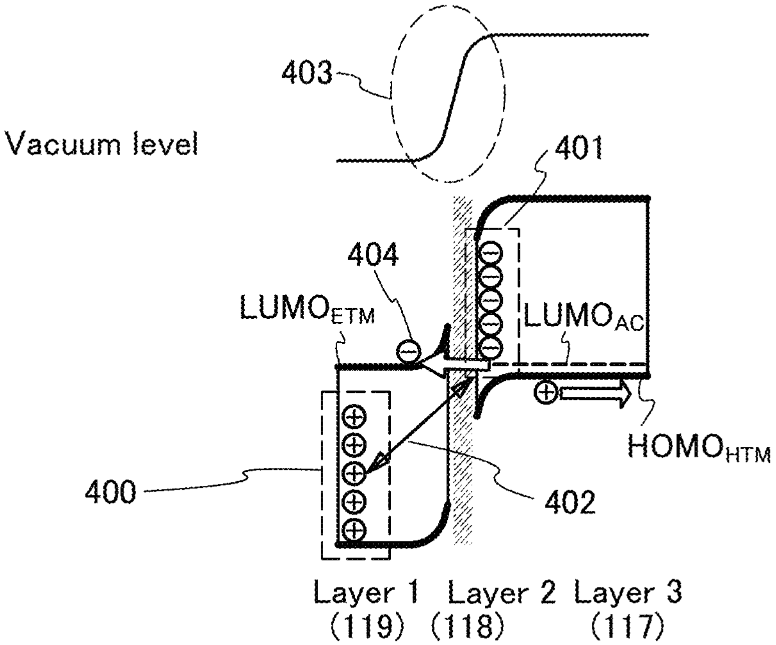

Here, the mechanism of the tandem light-emitting device of one embodiment of the present invention is described in detail with reference to FIGS. 2A and 2B.

In a typical tandem light-emitting device, charge separation occurs to make a Li compound in an n-type layer of an intermediate layer act as a donor and transport carriers to an electron-transport material. By contrast, no charge separation occurs and neither carriers nor electric charge is generated in the electron-injection buffer region 119 (layer 1) in one embodiment of the present invention.

In the charge-generation region 117 (layer 3), carriers (holes and electrons) are generated by voltage application, despite the electron-injection buffer region 119 (layer 1) generating no electric charge. However, injection of the elections generated in the charge-generation region 117 to the electron-injection buffer region 119 is hindered by a large potential gap between the LUMO level ($LUMO_{AC}$) of an acceptor material in the charge-generation region 117 and the LUMO level ($LUMO_{ETM}$) of the electron-transport material in the electron-injection buffer region 119, because the difference between the LUMO level of an electron-transport material and that of an acceptor material is usually large (FIG. 2A).

Thus, the electrons generated in the charge-generation region 117 are hardly injected to a first electron-transport layer 114_1 of the light-emitting unit (the first light-emitting unit 501) on the anode side since no electric charge is generated in the electron-injection buffer region 119, inhibiting the first light-emitting layer 1131 of the first light-emitting unit 501 from emitting light. Note that the holes generated in the charge-generation region 117 can be injected to the second light-emitting unit 502 without difficulty, because the HOMO level ($HOMO_{HTM}$) of a hole-transport material in the charge-generation region 117 and that of a hole-transport material in a second hole-transport layer 112_2 in the second light-emitting unit 502 can be equal or close to each other.

Despite the electron-injection buffer region 119 not serving as a charge-generation layer, the tandem light-emitting device of one embodiment of the present invention was found to work successfully. This can be explained referring to the driving mechanism of the tandem light-emitting device, which involves electric dipole generation due to electric charge accumulation and a resultant shift of the vacuum level.

First of all, no carriers are generated from the electron-injection buffer region 119 of the tandem light-emitting device of one embodiment of the present invention by voltage application, as described above. Meanwhile, the holes injected from the anode to the first light-emitting unit 501 are accumulated at the interface of the electron-injection buffer region 119 on the first electron-transport layer 114_1 side (region 400 in FIG. 2B) owing to the first electron-transport layer 114_1 that blocks holes or has a low hole-transport property. At this time, the electron-injection buffer region 119 blocks holes or has considerably low hole mobility, preventing passage of the holes and allowing the first light-emitting unit 501 to emit light efficiently.

The voltage application and the hole accumulation induce holes and electrons in the charge-generation region 117; however, the electrons induced in the charge-generation region 117 are not injected to the electron-injection buffer region 119 but are accumulated on the electron-injection buffer region 119 side of the charge-generation region 117 (region 401 in FIG. 2B) since the difference between the LUMO level of the acceptor material in the charge-generation region 117 and that of the second organic compound with an electron-transport property in the electron-injection buffer region 119 is large in a state where holes are not accumulated at the interface on the first electron-transport layer 114_1 side. The accumulated electrons form an electric double layer together with the holes accumulated on the first electron-transport layer 114_1 side of the electron-injection buffer region 119, so that electric dipoles are generated (arrow 402 in FIG. 2B).

Accordingly, the vacuum level shifts (region 403 in FIG. 2B), making the LUMO level of the acceptor material in the charge-generation region 117 close to that of the second organic compound with an electron-transport property in the electron-injection buffer region 119. This allows the electrons generated in the charge-generation region 117 to be injected to the electron-injection buffer region 119 (electron 404 in FIG. 2B). The electrons that have been injected to the electron-injection buffer region 119 are injected to the first light-emitting unit 501, reach the first light-emitting layer 1131, and are recombined with holes, enabling light emission in the first light-emitting unit 501. In this manner, the tandem light-emitting device of one embodiment of the present invention works.

An unstable element such as an alkali metal or an alkaline earth metal or a compound of such an element (e.g., Li or Li oxide) acts as a donor. A light-emitting device that includes an intermediate layer containing the element or the compound suffers from air-exposure-induced degradation. By contrast, a light-emitting device that includes the layer generating no electric charge (electron-injection buffer region 119) is unlikely to suffer from air-exposure-induced degradation. Thus, the light-emitting device of one embodiment of the present invention is unlikely to suffer from air-exposure-induced degradation even after passing through a processing step using a photolithography method, which involves air exposure, thereby having favorable characteristics.

The light-emitting device of one embodiment of the present invention with the above-described structure has high current efficiency and high reliability and is less likely to suffer from an increase in driving voltage.

One embodiment of the present invention, which is particularly suitable for a light-emitting device manufactured using a photolithography step, also contributes to cost reduction in a light-emitting device manufactured without using a photolithography step since one embodiment of the present invention enables the light-emitting device to be stable toward the air and accordingly have increased yield and eliminates the need for strict control of an atmosphere during a manufacturing process.

<Structure of Light-Emitting Device>

Structures of the light-emitting device 130 that includes the above-described organic compound other than the above-described structures are specifically described below.

The first light-emitting unit 501 and the second light-emitting unit 502 may include a functional layer in addition to the light-emitting layer. Although FIG. 1A illustrates the structure in which the first light-emitting unit 501 is provided with a hole-injection layer 111, a first hole-transport layer 112_1, and the first electron-transport layer 114_1 in addition to the first light-emitting layer 113_1 and the second light-emitting unit 502 is provided with the second hole-transport layer 1122, a second electron-transport layer 114_2, and an electron-injection layer 115 in addition to the second light-emitting layer 1132, the structure of the organic compound layer 103 in the present invention is not limited thereto and any of the layers may be omitted or other layers may be added. Typical examples of the other layers include a carrier-blocking layer and an exciton-blocking layer.

Since the intermediate layer 116 includes the electron-injection buffer region 119, the electron-injection buffer region 119 serves as an electron-injection layer for the light-emitting unit on the anode side. Therefore, an electron-injection layer may be provided as necessary in the light-emitting unit on the anode side (the first light-emitting unit 501 in FIG. 1A). Similarly, since the intermediate layer 116 includes the charge-generation region 117, the charge-generation region 117 serves as a hole-injection layer for the light-emitting unit on the cathode side. Therefore, a hole-injection layer may be provided as necessary in the light-emitting unit on the cathode side (the second light-emitting unit 502 in FIG. 1A).

[Intermediate Layer]

The structure of the intermediate layer 116 in the light-emitting device 130 is described below.

The electron-injection buffer region 119 is a layer containing the first organic compound with a basic skeleton and the second organic compound with an electron-transport property as described above. In this layer, one or more of a metal, a metal compound, and a metal complex may be mixed.

The first organic compound with a basic skeleton in the electron-injection buffer region 119 preferably has no electron-donating property. The first organic compound with a basic skeleton preferably shows no electron-donating property with respect to the second organic compound with an electron-transport property. When having an electron-donating property, the first organic compound with a basic skeleton more easily reacts with an atmospheric component such as water or oxygen and thus becomes unstable. The electron-injection buffer region 119 can have a considerably low hole-transport property by containing the first organic compound with a basic skeleton and the second organic compound with an electron-transport property and can thereby function as an intermediate layer of a tandem light-emitting device despite the first organic compound with a basic skeleton having no electron-donating property. Thus, the intermediate layer and the tandem light-emitting device can be stable toward an atmospheric component such as water or oxygen. It is preferable that a small signal or no signal be observed by an electron spin resonance (ESR) method in the electron-injection buffer region 119. For example, spin density derived from a signal observed at a g-factor of around 2.00 is preferably lower than or equal to $1\times10^{17}$ spins/$cm^3$, further preferably lower than $1\times10^{16}$ spins/$cm^3$.

The charge-generation region 117 that is a charge-generation layer is preferably formed using a composite material containing an acceptor material and a hole-transport organic compound.

The acceptor material in the charge-generation region 117 preferably has an electron-accepting property. The acceptor material preferably has an electron-accepting property with respect to the hole-transport organic compound. The acceptor material having an electron-accepting property causes charge separation in the charge-generation region 117, so that the charge-generation region 117 can function as a charge-generation layer and can thus function as an intermediate layer of a tandem light-emitting device. A signal is preferably observed by electron spin resonance in the charge-generation region 117. For example, spin density derived from the signal observed at a g-factor of around 2.00 is preferably higher than or equal to $1\times10^{16}$ spins/$cm^3$, further preferably higher than or equal to $1\times10^{17}$ spins/$cm^3$, still further preferably higher than or equal to $1\times10^{18}$ spins/$cm^3$, yet still further preferably higher than or equal to $1\times10^{19}$ spins/$cm^3$.

As the hole-transport organic compound used in the composite material, any of a variety of organic compounds such as aromatic amine compounds, heteroaromatic compounds, aromatic hydrocarbons, and high molecular compounds (e.g., oligomers, dendrimers, and polymers) can be used. Note that the hole-transport organic compound used in the composite material preferably has a hole mobility higher than or equal to $1\times10^{-6}$ $cm^2$/Vs. The hole-transport organic compound used in the composite material is preferably a compound having a condensed aromatic hydrocarbon ring or a π-electron rich heteroaromatic ring. As the condensed aromatic hydrocarbon ring, an anthracene ring, a naphthalene ring, or the like is preferable. As the π-electron rich heteroaromatic ring, a condensed aromatic ring having at least one of a pyrrole skeleton, a furan skeleton, and a thiophene skeleton is preferable; specifically, a carbazole ring, a dibenzothiophene ring, or a ring in which an aromatic ring or a heteroaromatic ring is further condensed to the carbazole ring or the dibenzothiophene ring is preferable.

Such a hole-transport organic compound further preferably has any of a carbazole skeleton, a dibenzofuran skeleton, a dibenzothiophene skeleton, and an anthracene skeleton. In particular, an aromatic amine having a substituent that includes a dibenzofuran ring or a dibenzothiophene ring, an aromatic monoamine that has a naphthalene ring, or an aromatic monoamine in which a 9-fluorenyl group is bonded to the nitrogen of the amine through an arylene group may be used. Note that the hole-transport organic compound preferably has an N,N-bis(4-biphenyl)amino group to enable fabricating a light-emitting device having a long lifetime.

Specific examples of the hole-transport organic compound include N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]

naphtho[2,3-d]furan-4-amine (abbreviation: BBABnf(II)(4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6;1'-binaphthyl-2-yl)triphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yltriphenylamine (abbreviation: BBAPβNB-03), 4,4'-diphenyl-4"-(6;2'-binaphthyl-2-yl)triphenylamine (abbreviation: BBA(βN2)B), 4,4'-diphenyl-4"-(7;2'-binaphthyl-2-yl)triphenylamine (abbreviation: BBA(βN2)B-03), 4,4'-diphenyl-4"-(4;2'-binaphthyl-1-yl)triphenylamine (abbreviation: BBAβNαNB), 4,4'-diphenyl-4"-(5;2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAPNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)triphenylamine (abbreviation: αNBAβBP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(biphenyl-4-yl)amine (abbreviation: YGTBi1BP-02), 4-[4'-(carbazol-9-yl)biphenyl-4-yl]-4'-(2-naphthyl)-4"-phenyltriphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis(biphenyl-4-yl)-9,9'-spirobi[9H-fluoren]-2-amine (abbreviation: BBASF), N,N-bis(biphenyl-4-yl)-9,9'-spirobi[9H-fluoren]-4-amine (abbreviation: BBASF(4)), N-(biphenyl-2-yl)-N-(9,9-dimethyl-9H-fluoren-2-yl)-9,9'-spirobi[9H-fluoren]-4-amine (abbreviation: oFBiSF), N-(biphenyl-4-yl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), N-phenyl-N-[4-(9-phenyl-9H-carbazol-3-yl)phenyl]-9,9'-spirobi[9H-fluoren]-2-amine (abbreviation: PCBASF), N-(biphenyl-4-yl)-N-[4-(9-phenyl-9H-carbazol-3-yl)phenyl]-9,9-dimethyl-9H-fluoren-2-amine (abbreviation: PCBBiF), N,N-bis(9,9-dimethyl-9H-fluoren-2-yl)-9,9'-spirobi[9H-fluoren]-4-amine, N,N-bis(9,9-dimethyl-9H-fluoren-2-yl)-9,9'-spirobi[9H-fluoren]-3-amine, N,N-bis(9,9-dimethyl-9H[fluoren]-2-yl)-9,9'-spirobi[9H-fluoren]-2-amine, N,N-bis(9,9-dimethyl-9H-fluoren-2-yl)-9,9'-spirobi[9H-fluoren]-1-amine, N-(9,9-diphenyl-9H-fluoren-2-yl)-N,9-diphenyl-9H-carbazol-3-amine (abbreviation: PCAFLP(2)), and N-(9,9-diphenyl-9H-fluoren-2-yl)-N,9-diphenyl-9H-carbazol-2-amine (abbreviation: PCAFLP(2)-02).

As the hole-transport organic compound, any of the following aromatic amine compounds can also be used: N,N-di(p-tolyl)-NN-diphenyl-p-phenylenediamine (abbreviation: DTDPPA), 4,4'-bis[N-(4-diphenylaminophenyl)-N-phenylamino]biphenyl (abbreviation: DPAB), 4,4'-bis(N-{4-[N-(3-methylphenyl)-N-phenylamino]phenyl}-N-phenylamino)biphenyl (abbreviation: DNTPD), and 1,3,5-tris[N-(4-diphenylaminophenyl)-N-phenylamino]benzene (abbreviation: DPA3B).

Examples of the acceptor material contained in the charge-generation region 117 include an organic compound having an electron-withdrawing group (e.g., a halogen group or a cyano group), such as 7,7,8,8-tetracyano-2,3,5,6-tetrafluoroquinodimethane (abbreviation: F4-TCNQ), chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), or 2-(7-dicyanomethylene-1,3,4,5,6,8,9,10-octafluoro-7H-pyren-2-ylidene)malononitrile. A compound in which electron-withdrawing groups are bonded to a condensed aromatic ring having a plurality of heteroatoms, such as HAT-CN, is particularly preferable because it is thermally stable. A [3]radialene derivative having an electron-withdrawing group (in particular, a cyano group or a halogen group such as a fluoro group) has a very high electron-accepting property and thus is preferable. Specific examples include α,α',α"-1,2,3-cyclopropanetriylidenetris[4-cyano-2,3,5,6-tetrafluorobenzeneacetonitrile], α,α',α,"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile]. As the acceptor material, a transition metal oxide such as molybdenum oxide, vanadium oxide, ruthenium oxide, tungsten oxide, or manganese oxide can also be used, other than the above-described organic compounds.

The electron-relay region 118 contains a substance having an electron-transport property and has a function of preventing an interaction between the electron-injection buffer region 119 and the charge-generation region 117 and smoothly transferring electrons. The LUMO level of the substance having an electron-transport property in the electron-relay region 118 is preferably between the LUMO level of the acceptor material in the charge-generation region 117 and the LUMO level of an organic compound contained in a layer that is included in the light-emitting unit on the first electrode 101 side and is in contact with the intermediate layer 116 (the first electron-transport layer 114_1 in the first light-emitting unit 501 in FIG. 1A). As a specific value of the energy level, the LUMO level of the substance having an electron-transport property in the electron-relay region 118 is preferably higher than or equal to −5.0 eV, further preferably higher than or equal to −5.0 eV and lower than or equal to −3.0 eV, still further preferably higher than or equal to −4.30 eV and lower than or equal to −3.00 eV, yet still further preferably higher than or equal to −4.30 eV and lower than or equal to −3.30 eV, in which case electrons generated in the charge-generation region 117 can be easily injected to the electron-injection buffer region 119 and accordingly an increase in driving voltage can be inhibited. Note that as the substance having an electron-transport property in the electron-relay region 118, a phthalocyanine-based material or a metal complex having a metal-oxygen bond and an aromatic ligand is preferably used.

Specifically, it is possible to use a perylenetetracarboxylic acid derivative such as diquinoxalino[2,3-a:2',3'-c]phenazine (abbreviation: HATNA), 2,3,8,9,14,15-hexafluorodiquinoxalino[2,3-a:2',3'-c]phenazine (abbreviation: HATNA-F6), 3,4,9,10-perylenetetracarboxylic diimide (abbreviation: PTCDI), or 3,4,9,10-perylenetetracarboxyl-bis-benzimidazole (abbreviation: PTCBI), (C60-Ih)[5,6]fullerene (abbreviation: C60), (C70-D5h)[5,6]fullerene (abbreviation: C70), or phthalocyanine (abbreviation: $H_2Pc$). Alternatively, it is possible to use a metal phthalocyanine containing copper, zinc, cobalt, iron, chromium, nickel, or the like or a derivative thereof, such as copper phthalocyanine (abbreviation: CuPc), zinc phthalocyanine (abbreviation: ZnPc), cobalt phthalocyanine (abbreviation: CoPc), iron phthalocyanine (abbreviation: FePc), tin phthalocyanine (abbreviation: SnPc), tin oxide phthalocyanine (abbreviation: SnOPc), titanium oxide phthalocyanine (abbreviation: TiOPc), or vanadium oxide phthalocyanine (abbreviation: VOPc). It is particularly preferable to use a phthalocyanine-based metal complex such as copper phthalocyanine or zinc phthalocyanine or 2,3,8,9,14,15-hexafluorodiquinoxalino[2,3-a:2',3'-c]phenazine. Among these materials, CuPc and ZnPc are preferable because they are inexpensive and have favorable characteristics. Using ZnPc, which has a low diffusion coefficient with respect to silicon, reduces the probability that metal diffusion to a semiconductor adversely affects the semiconductor characteristics; accordingly, ZnPc is particularly suitable for a display apparatus fabricated using a silicon semiconductor.

The thickness of the electron-relay region 118 is preferably greater than or equal to 1 nm and less than or equal to 10 nm, further preferably greater than or equal to 2 nm and less than or equal to 5 nm.

A tandem light-emitting device including the intermediate layer 116 does not suffer from a significant increase in driving voltage and a significant decrease in emission efficiency even when the organic compound layer 103 is processed by a photolithography method and thus has favorable characteristics.

[Electrode]

The structures of the first electrode 101 and the second electrode 102 in the light-emitting device 130 are described below.

The first electrode 101 includes an anode. The first electrode 101 may have a stacked-layer structure; in that case, a layer in contact with the organic compound layer 103 functions as an anode. The anode is preferably formed using any of metals, alloys, and conductive compounds with a high work function (specifically, higher than or equal to 4.0 eV), mixtures thereof, and the like. Specific examples include indium oxide-tin oxide (ITO: indium tin oxide), indium oxide-tin oxide containing silicon or silicon oxide, indium oxide-zinc oxide, and indium oxide containing tungsten oxide and zinc oxide (IWZO). Such conductive metal oxide films are usually formed by a sputtering method, but may be formed by application of a sol-gel method or the like. In an example of the formation method, indium oxide-zinc oxide is deposited by a sputtering method using a target obtained by adding 1 wt % to 20 wt % zinc oxide to indium oxide. Furthermore, indium oxide containing tungsten oxide and zinc oxide (IWZO) can be deposited by a sputtering method using a target in which tungsten oxide and zinc oxide are added to indium oxide at 0.5 wt % to 5 wt % and 0.1 wt % to 1 wt %, respectively. Alternatively, gold (Au), platinum (Pt), nickel (Ni), tungsten (W), chromium (Cr), molybdenum (Mo), iron (Fe), cobalt (Co), copper (Cu), palladium (Pd), a nitride of a metal material (e.g., titanium nitride), or the like can be used as a material of the anode. Graphene can also be used as a material of the anode. Note that when a composite material contained in the charge-generation region 117 in the intermediate layer 116 is used for a layer that is in contact with the anode (the layer is typically a hole-injection layer), an electrode material can be selected regardless of the work function.

The second electrode 102 includes a cathode. The second electrode 102 may have a stacked-layer structure; in that case, a layer in contact with the organic compound layer 103 functions as a cathode. As a substance of the cathode, any of metals, alloys, and electrically conductive compounds with a low work function (specifically, lower than or equal to 3.8 eV), mixtures thereof, and the like can be used. Specific examples of such a cathode material include elements belonging to Group 1 and Group 2 of the periodic table, such as alkali metals (e.g., lithium (Li) or cesium (Cs)), magnesium (Mg), calcium (Ca), and strontium (Sr), alloys containing any of these elements (e.g., MgAg and AlLi), rare earth metals such as europium (Eu) and ytterbium (Yb), and alloys containing any of these rare earth metals. However, when an electron-injection layer is provided between the second electrode 102 and the electron-transport layer, any of a variety of conductive materials such as Al, Ag, ITO, or indium oxide-tin oxide containing silicon or silicon oxide can be used for the cathode regardless of the work function.

When the second electrode 102 is formed using a material that transmits visible light, the light-emitting device can emit light from the second electrode 102 side.

Films of these conductive materials can be formed by a dry process such as a vacuum evaporation method or a sputtering method, an ink-jet method, a spin coating method, or the like. Alternatively, a wet process using a sol-gel method or a wet process using a paste of a metal material may be employed.

[Light-Emitting Unit]

The structures of the first light-emitting unit 501 and the second light-emitting unit 502 in the light-emitting device 130 are described below.

The organic compound layer 103 has a stacked-layer structure. As the stacked-layer structure, FIG. 1A illustrates the structure that includes the first light-emitting unit 501 including the first light-emitting layer 113_1, the intermediate layer 116, and the second light-emitting unit 502 including the second light-emitting layer 113_2. In the structure, two light-emitting units are stacked with the intermediate layer therebetween; however, three or more light-emitting units may be stacked. Also in that case, an intermediate layer is provided between the light-emitting units. Each of the light-emitting units also has a stacked-layer structure. The light-emitting units can include a variety of functional layers such as a hole-injection layer, a hole-transport layer, an electron-transport layer, an electron-injection layer, carrier-blocking layers (a hole-blocking layer and an electron-blocking layer), and an exciton-blocking layer as appropriate, without being limited to the structure illustrated in FIG. 1A.

The hole-injection layer 111 is provided in contact with the anode and has a function of facilitating injection of holes into the organic compound layer 103 (the first light-emitting unit 501). The hole-injection layer 111 can be formed using a phthalocyanine-based compound such as phthalocyanine (abbreviation: $H_2Pc$), a phthalocyanine-based complex compound such as copper phthalocyanine (abbreviation: CuPc), an aromatic amine compound such as 4,4'-bis[N-(4-diphenylaminophenyl)-N-phenylamino]biphenyl (abbreviation: DPAB) or 4,4'-bis(N-{4-[N-(3-methylphenyl)-N-phenylamino]phenyl}-N-phenylamino)biphenyl (abbreviation: DNTPD), or a high molecular compound such as poly(3,4-ethylenedioxythiophene)/poly(styrenesulfonic acid) (abbreviation: PEDOT/PSS).

The hole-injection layer 111 may be formed using a substance having an electron-accepting property. As the substance having an acceptor property, any of substances described as examples of the acceptor material that is used in the composite material contained in the charge-generation region 117 in the intermediate layer 116 can similarly be used.

Furthermore, the hole-injection layer 111 may be formed using the same composite material contained in the charge-generation region 117 in the intermediate layer 116.

Further preferably, in the hole-injection layer 111, the organic compound with a hole-transport property that is used in the composite material has a relatively low HOMO level higher than or equal to −5.7 eV and lower than or equal to −5.4 eV. When the organic compound with a hole-transport property that is used in the composite material has a relatively low HOMO level, holes can be easily injected into the hole-transport layer to easily provide a light-emitting device having a long lifetime. In addition, when the organic compound with a hole-transport property that is used in the composite material has a relatively low HOMO level, induction of holes can be inhibited properly, so that the light-emitting device can have a longer lifetime.

The formation of the hole-injection layer 111 can improve the hole-injection property, offering the light-emitting device with a low driving voltage.

Among substances having an acceptor property, an organic compound having an acceptor property is easy to use because it is easily deposited by evaporation.

Since the charge-generation region 117 in the intermediate layer 116 functions as a hole-injection layer, a hole-injection layer is not provided in the second light-emitting unit 502. However, a hole-injection layer may be provided in the second light-emitting unit 502.

The hole-transport layers (the first hole-transport layer 112_1 and the second hole-transport layer 112_2) each contain an organic compound having a hole-transport property. The organic compound having a hole-transport property preferably has a hole mobility higher than or equal to $1\times10^{-6}$ $cm^2/Vs$.

Examples of the organic compound having a hole-transport property include compounds having an aromatic amine skeleton, such as 4,4'-bis[N-(1-naphthyl)-N-phenylamino]biphenyl (abbreviation: NPB), N,N'-diphenyl-N,N-bis(3-methylphenyl)-4,4'-diaminobiphenyl (abbreviation: TPD), N,N-bis(9,9'-spirobi[9H-fluoren]-2-yl)-N,N-diphenyl-4,4'-diaminobiphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]-9,9'-spirobi[9H-fluoren]-2-amine (abbreviation: PCBASF); compounds having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 3,3'-bis(9-phenyl-9H-carbazole) (abbreviation: PCCP), 9,9'-bis(biphenyl-4-yl)-3,3'-bi-9H-carbazole (abbreviation: BisBPCz), 9,9'-bis(biphenyl-3-yl)-3,3'-bi-9H-carbazole (abbreviation: BismBPCz), and 9-(biphenyl-3-yl)-9'-(biphenyl-4-yl)-9H,9'H-3,3'-bicarbazole (abbreviation: mBPCCBP), 9-(2-naphthyl)-9'-phenyl-9H,9'H-3,3'-bicarbazole (abbreviation: PNCCP), 9-(3-biphenyl)-9'-(2-naphthyl)-3,3'-bi-9H-carbazole (abbreviation: PNCCmBP), 9-(4-biphenyl)-9'-(2-naphthyl)-3,3'-bi-9H-carbazole (abbreviation: PNCCBP), 9,9'-di-2-naphthyl-3,3'-9H,9'H-bicarbazole (abbreviation: BisPNCz), 9-(2-naphthyl)-9'-[1,1': 4',1"-terphenyl]-3-yl-3,3'-9H,9'H-bicarbazole, 9-(2-naphthyl)-9'-[1,1': 3',1"-terphenyl]-3-yl-3,3'-9H,9'H-bicarbazole, 9-(2-naphthyl)-9'-[1,1': 3',1"-terphenyl]-5'-yl-3,3'-9H,9'H-bicarbazole, 9-(2-naphthyl)-9'-[1,1': 4',1"-terphenyl]-4-yl-3,3'-9H,9'H-bicarbazole, 9-(2-naphthyl)-9'-[1,1': 3',1"-terphenyl]-4-yl-3,3'-9H,9'H-bicarbazole, 9-(2-naphthyl)-9'-(triphenylen-2-yl)-3,3'-9H,9'H-bicarbazole, 9-phenyl-9'-(triphenylen-2-yl)-3,3'-9H,9'H-bicarbazole (abbreviation: PCCzTp), 9,9'-bis(triphenylen-2-yl)-3,3'-9H,9'H-bicarbazole, 9-(4-biphenyl)-9'-(triphenylen-2-yl)-3,3'-9H,9'H-bicarbazole, and 9-(triphenylen-2-yl)-9'-[1,1': 3',1"-terphenyl]-4-yl-3,3'-9H,9'H-bicarbazole; compounds having a thiophene skeleton, such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton, such as 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the above materials, the compound having an aromatic amine skeleton and the compound having a carbazole skeleton are preferable because these compounds are highly reliable and have high hole-transport properties to contribute to a reduction in driving voltage. Note that any of the substances given as examples of the organic compound with a hole-transport property used in the composite material for the hole-injection layer 111 can also be suitably used as the material contained in the hole-transport layer 112.

The light-emitting layers (the first light-emitting layer 1131 and the second light-emitting layer 113_2) each preferably include a light-emitting substance and a host material. The light-emitting layer may additionally contain other materials. Alternatively, the light-emitting layer may be a stack of two layers with different compositions.

As the light-emitting substance, a fluorescent substance, a phosphorescent substance, a substance exhibiting thermally activated delayed fluorescence (TADF), or any of other light-emitting substances may be used.

Examples of the material that can be used as a fluorescent substance in the light-emitting layer are as follows. Other fluorescent substances can also be used.

The examples include 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N-diphenyl-N,N-bis[4-(9-phenyl-9H-fluoren-9-yl)phenyl]pyrene-1,6-diamine (abbreviation: 1,6FLPAPrn), N,N-bis(3-methylphenyl)-N,N-bis[3-(9-phenyl-9H-fluoren-9-yl)phenyl]pyrene-1,6-diamine (abbreviation: 1,6mMemFLPAPrn), N,N-bis[4-(9H-carbazol-9-yl)phenyl]-N,N-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl- 9H-carbazol-3-yl)triphenylamine (abbreviation: PCBAPA), N,N'-(2-tert-butylanthracene-9,10-diyldi-4,1-phenylene)bis(N,N,N-triphenyl-1,4-phenylenediamine) (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N,N-triphenyl-1,4-phenylenediamine (abbreviation: 2DPAPPA), N,N,N',N',N',N',N"N"-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(biphenyl-2-yl)-2-anthryl]-N,9-diphenyl-9H-carbazol-3-amine (abbreviation: 2PCABPhA), N-(9,10-diphenyl-2-anthryl)-N,N,N-triphenyl-1,4-phenylenediamine (abbreviation: 2DPAPA), N-[9,10-bis(biphenyl-2-yl)-2-anthryl]-N,N,N-triphenyl-1,4-phenylenediamine (abbreviation: 2DPABPhA), 9,10-bis(biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N-diphenylquinacridone (abbreviation: DPQd), rubrene, 5,12-bis(biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N,N-tetrakis(4-methylphenyl)tetracene-5,11-diamine (abbreviation: p-mPhTD), 7,14-diphenyl-N,N,N,N-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), N,N-diphenyl-N,N'-(1,6-pyrene-diyl)bis[(6-phenylbenzo[b]naphtho[1,2-d]furan)-8-amine] (abbreviation: 1,6BnfAPrn-03), 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02), and 3,10-bis[N-(dibenzofuran-3-yl)-N-phenylamino]naphtho[2,3-b;6,7-b']bisbenzofuran (abbreviation: 3,10FrA2Nbf(IV)-02). Condensed aromatic diamine compounds typified by pyrenediamine compounds such as 1,6FLPAPrn, 1,6mMemFLPAPrn, and 1,6BnfAPrn-03 are particularly preferable because of their high hole-trapping properties and high emission efficiency or reliability.

Examples of the material that can be used when a phosphorescent substance is used as the light-emitting substance in the light-emitting layer are as follows.

The examples include an organometallic iridium complex having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: $[Ir(mpptz\text{-}dmp)_3]$), tris(5-methyl-3,4-diphenyl-4H-1,2,4-triazolato)iridium(III) (abbreviation: $[Ir(Mptz)_3]$), or tris[4-(3-biphenyl)-5-isopropyl-3-phenyl-4H-1,2,4-triazolato]iridium(III) (abbreviation: $[Ir(iPrptz\text{-}3b)_3]$); an organometallic iridium complex having a 1H-triazole skeleton, such as tris[3-methyl-1-(2-methylphenyl)-5-phenyl-1H-1,2,4-triazolato]iridium(III) (abbreviation: $[Ir(Mptz1\text{-}mp)_3]$) or tris(1-methyl-5-phenyl-3-propyl-1H-1,2,4-triazolato)iridium(III) (abbreviation: $[Ir(Prptz1\text{-}Me)_3]$); an organometallic iridium complex having an imidazole skeleton, such as fac-tris[1-(2,6-diisopropylphenyl)-2-phenyl-1H-imidazole]iridium(III) (abbreviation: $[Ir(iPrpim)_3]$) or tris[3-(2,6-dimethylphenyl)-7-methylimidazo[1,2-f]phenanthridinato]iridium(III) (abbreviation: $[Ir(dmpimpt\text{-}Me)_3]$); and an organometallic iridium complex in which a phenylpyridine derivative having an electron-withdrawing group is a ligand, such as bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis{2-[3',5'-bis(trifluoromethyl)phenyl]pyridinato-N,$C^{2'}$}iridium(III) picolinate (abbreviation: $[Ir(CF_3ppy)_2(pic)]$), or bis[2-(4',6'-difluorophenyl)pyridinato-N,$C^{2'}$]iridium(III) acetylacetonate (abbreviation: FIracac). These compounds exhibit blue phosphorescence and have an emission peak in the wavelength range from 450 nm to 520 nm.

Other examples include an organometallic iridium complex having a pyrimidine skeleton, such as tris(4-methyl-6-phenylpyrimidinato)iridium(III) (abbreviation: $[Ir(mppm)_3]$), tris(4-t-butyl-6-phenylpyrimidinato)iridium(III) (abbreviation: $[Ir(tBuppm)_3]$), (acetylacetonato)bis(6-methyl-4-phenylpyrimidinato)iridium(III) (abbreviation: $[Ir(mppm)_2(acac)]$), (acetylacetonato)bis(6-tert-butyl-4-phenylpyrimidinato)iridium(III) (abbreviation: $[Ir(tBuppm)_2(acac)]$), (acetylacetonato)bis[6-(2-norbornyl)-4-phenylpyrimidinato]iridium(III) (abbreviation: $[Ir(nbppm)_2(acac)]$), (acetylacetonato)bis[5-methyl-6-(2-methylphenyl)-4-phenylpyrimidinato]iridium(III) (abbreviation: $[Ir(mpmppm)_2(acac)]$), or (acetylacetonato)bis(4,6-diphenylpyrimidinato)iridium(III) (abbreviation: $[Ir(dppm)_2(acac)]$); an organometallic iridium complex having a pyrazine skeleton, such as (acetylacetonato)bis(3,5-dimethyl-2-phenylpyrazinato)iridium(III) (abbreviation: $[Ir(mppr\text{-}Me)_2(acac)]$) or (acetylacetonato)bis(5-isopropyl-3-methyl-2-phenylpyrazinato)iridium(III) (abbreviation: $[Ir(mppr\text{-}iPr)_2(acac)]$); an organometallic iridium complex having a pyridine skeleton, such as tris(2-phenylpyridinato-N,$C^{2'}$)iridium(III) (abbreviation: $[Ir(ppy)_3]$), bis(2-phenylpyridinato-N,$C^{2'}$)iridium(III) acetylacetonate (abbreviation: $[Ir(ppy)_2(acac)]$), bis(benzo[h]quinolinato)iridium(III) acetylacetonate (abbreviation: $[Ir(bzq)_2(acac)]$), tris(benzo[h]quinolinato)iridium(III) (abbreviation: $[Ir(bzq)_3]$), tris(2-phenylquinolinato-N,$C^{2'}$)iridium(III) (abbreviation: $[Ir(pq)_3]$), bis(2-phenylquinolinato-N,$C^{2'}$)iridium(III) acetylacetonate (abbreviation: $[Ir(pq)_2(acac)]$), [2-d3-methyl-8-(2-pyridinyl-κN)benzofuro[2,3-b]pyridine-C]bis[2-(5-d3-methyl-2-pyridinyl-κN2)phenyl-κC]iridium(III) (abbreviation: $Ir(5mppy\text{-}d3)_2(mbfpypy\text{-}d3)$), {2-(methyl-d3)-8-[4-(1-methylethyl-1-d)-2-pyridinyl-κN]benzofuro[2,3-b]pyridin-7-yl-κC}bis{5-(methyl-d3)-2-[5-(methyl-d3)-2-pyridinyl-κN]phenyl-κC}iridium(III) (abbreviation: $Ir(5mtpy\text{-}d6)_2(mbfpypy\text{-}iPr\text{-}d4)$), [2-d3-methyl-(2-pyridinyl-κN)benzofuro[2,3-b]pyridine-κC]bis[2-(2-pyridinyl-κN)phenyl-κC]iridium(III) (abbreviation: $Ir(ppy)_2(mbfpypy\text{-}d3)$), or [2-(4-methyl-5-phenyl-2-pyridinyl-κN)phenyl-κC]bis[2-(2-pyridinyl-κN)phenyl-κC]iridium(III) (abbreviation: $Ir(ppy)_2(mdppy)$); and a rare earth metal complex such as tris(acetylacetonato)(monophenanthroline)terbium(III) (abbreviation: $[Tb(acac)_3(Phen)]$). These are mainly compounds that exhibit green phosphorescence and have an emission peak in the wavelength range from 500 nm to 600 nm. Note that organometallic iridium complexes having a pyrimidine skeleton have distinctively high reliability or emission efficiency and thus are particularly preferable.

Other examples include an organometallic iridium complex having a pyrimidine skeleton, such as (diisobutyrylmethanato)bis[4,6-bis(3-methylphenyl)pyrimidinato] iridium(III) (abbreviation: [Ir(5mdppm)$_2$(dibm)]), bis[4,6-bis(3-methylphenyl)pyrimidinato](dipivaloylmethanato) iridium(III) (abbreviation: [Ir(5mdppm)$_2$(dpm)]), or bis[4,6-di(naphthalen-1-yl)pyrimidinato](dipivaloylmethanato) iridium(III) (abbreviation: [Ir(d1npm)$_2$(dpm)]); an organometallic iridium complex having a pyrazine skeleton, such as (acetylacetonato)bis(2,3,5-triphenylpyrazinato) iridium(III) (abbreviation: [Ir(tppr)$_2$(acac)]), bis(2,3,5-triphenylpyrazinato)(dipivaloylmethanato)iridium(III) (abbreviation: [Ir(tppr)$_2$(dpm)]), or (acetylacetonato)bis[2,3-bis(4-fluorophenyl)quinoxalinato]iridium(III) (abbreviation: [Ir(Fdpq)$_2$(acac)]); an organometallic iridium complex having a pyridine skeleton, such as tris(1-phenylisoquinolinato-N,C$^{2'}$)iridium(III) (abbreviation: [Ir(piq)$_3$]) or bis(1-phenylisoquinolinato-N,C$^{2'}$)iridium(III) acetylacetonate (abbreviation: [Ir(piq)$_2$(acac)]); a platinum complex such as 2,3,7,8,12,13,17,18-octaethyl-21H,23H-porphyrinplatinum(II) (abbreviation: PtOEP); and a rare earth metal complex such as tris(1,3-diphenyl-1,3-propanedionato)(monophenanthroline)europium(III) (abbreviation: [Eu(DBM)$_3$(Phen)]) or tris[1-(2-thenoyl)-3,3,3-trifluoroacetonato](monophenanthroline)europium(III) (abbreviation: [Eu(TTA)$_3$(Phen)]). These compounds exhibit red phosphorescence and have an emission peak in the wavelength range from 600 nm to 700 nm. Organometallic iridium complexes having a pyrazine skeleton can provide red light emission with favorable chromaticity.

Besides the above phosphorescent compounds, known phosphorescent compounds may be selected and used.

Examples of the TADF material include a fullerene, a derivative thereof, an acridine, a derivative thereof, and an eosin derivative. Furthermore, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2OEP$), which are represented by the following structural formulae.

[Chemical Formula 7]

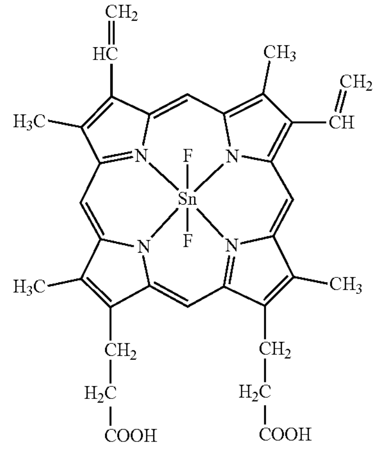

$SnF_2$(Proto IX)

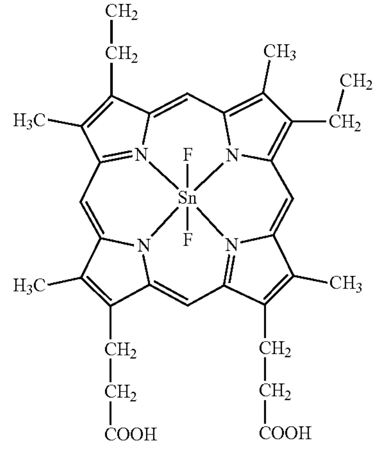

$SnF_2$(Meso IX)

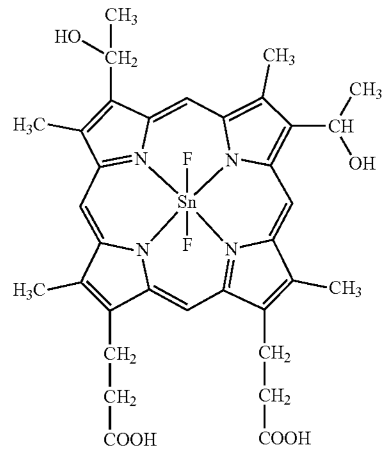

$SnF_2$(Hemato IX)

-continued

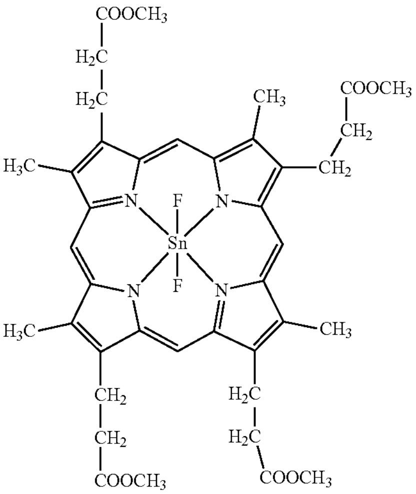

$SnF_2$(Copro III-4Me)

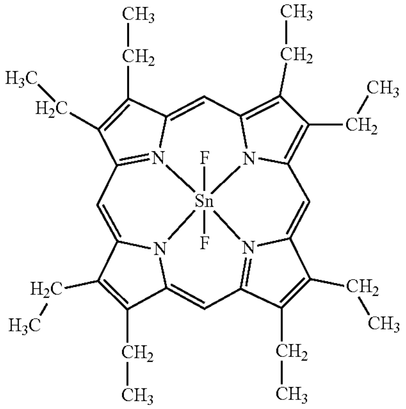

$SnF_2$(OEP)

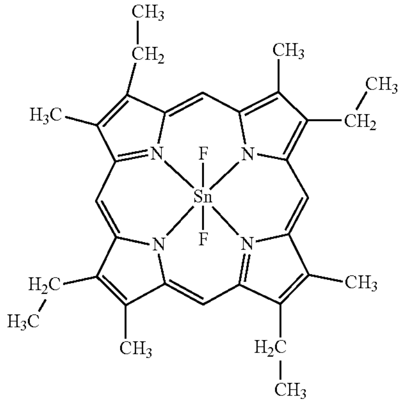

$SnF_2$(Etio I)

-continued

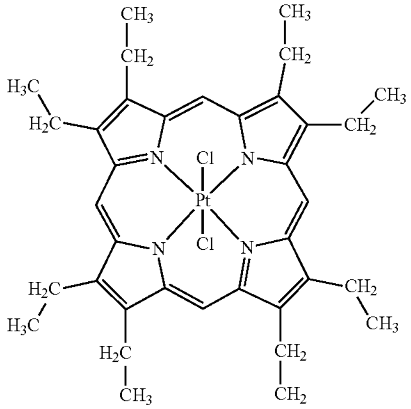

$PtCl_2OEP$

Alternatively, a heterocyclic compound having one or both of a π-electron rich heteroaromatic ring and a π-electron deficient heteroaromatic ring and represented by the following structural formulae, such as 2-(biphenyl-4-yl)-4,6-bis(12-phenylindolo[2,3-a]carbazol-11-yl)-1,3,5-triazine (abbreviation: PIC-TRZ), 9-(4,6-diphenyl-1,3,5-triazin-2-yl)-9'-phenyl-9H,9'H-3,3'-bicarbazole (abbreviation: PCCzTzn), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA) can be used. Such a heterocyclic compound is preferable because of having excellent electron-transport and hole-transport properties owing to a π-electron rich heteroaromatic ring and a π-electron deficient heteroaromatic ring. Among skeletons having the π-electron deficient heteroaromatic ring, a pyridine skeleton, a diazine skeleton (a pyrimidine skeleton, a pyrazine skeleton, and a pyridazine skeleton), and a triazine skeleton are preferable because of their high stability and reliability. In particular, a benzofuropyrimidine skeleton, a benzothienopyrimidine skeleton, a benzofuropyrazine skeleton, and a benzothienopyrazine skeleton are preferable because of their high acceptor properties and high reliability. Among skeletons having the π-electron rich heteroaromatic ring, an acridine skeleton, a phenoxazine skeleton, a phenothiazine skeleton, a furan skeleton, a thiophene skeleton, and a pyrrole skeleton have high stability and reliability; thus, at least one of these skeletons is preferably included. A dibenzofuran skeleton is preferable as a furan skeleton, and a dibenzothiophene skeleton is preferable as a thiophene skeleton. As a pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable. Note that a substance in which the π-electron rich heteroaromatic ring is directly bonded to the π-electron deficient heteroaromatic ring is particularly preferable because the electron-donating property of the π-electron rich heteroaromatic ring and the electron-accepting property of the π-electron deficient heteroaromatic ring are both improved, the energy difference between the S1 level and the T1 level becomes small, and thus thermally activated delayed fluorescence can be obtained with high efficiency. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used. As a π-electron deficient skeleton, a xanthene skeleton, a thioxanthene dioxide skeleton, an oxadiazole skeleton, a triazole skeleton, an imidazole skeleton, an anthraquinone skeleton, a skeleton containing boron such as phenylborane or boranthrene, an aromatic ring or a heteroaromatic ring having a cyano group or a nitrile group such as benzonitrile or cyanobenzene, a carbonyl skeleton such as benzophenone, a phosphine oxide skeleton, a sulfone skeleton, or the like can be used. As described above, a π-electron deficient skeleton and a π-electron rich skeleton can be used instead of at least one of the π-electron deficient heteroaromatic ring and the π-electron rich heteroaromatic ring.

[Chemical Formula 8]

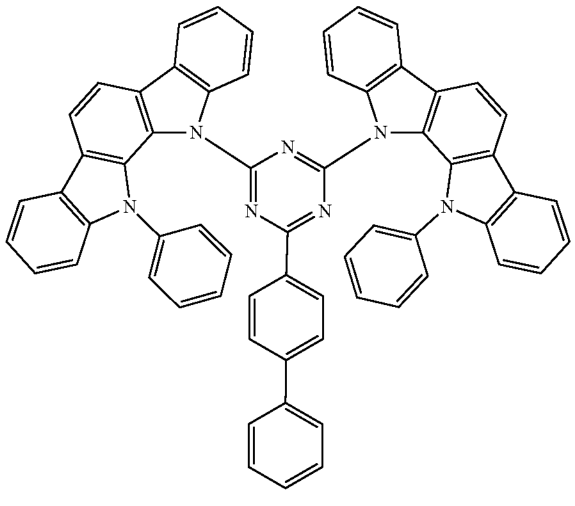

PIC-TRZ

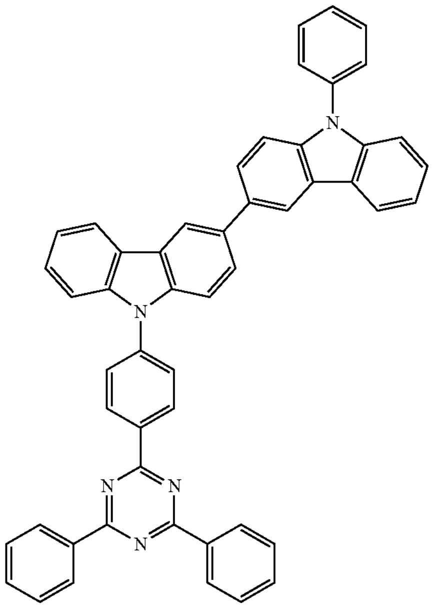

PCCzPTzn

-continued

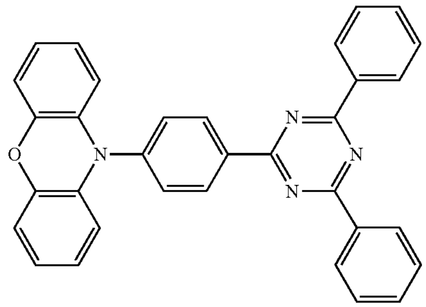

PXZ-TRZ

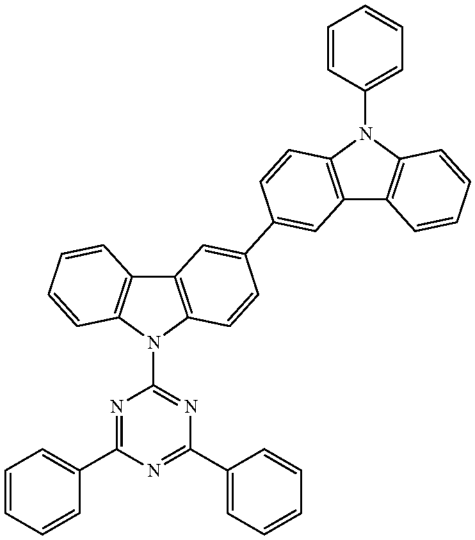

PCCzTzn

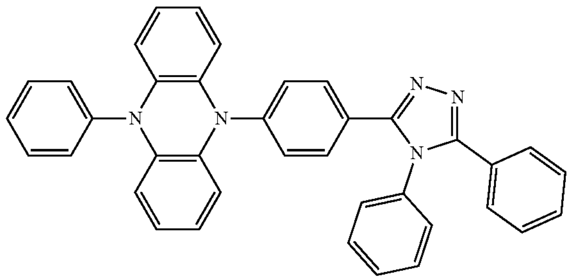

PPZ-3TPT

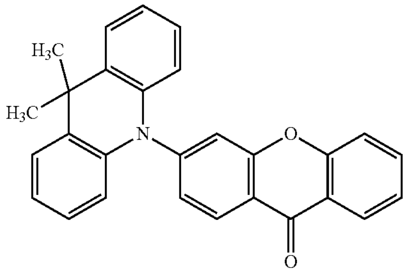

ACRXTN

-continued

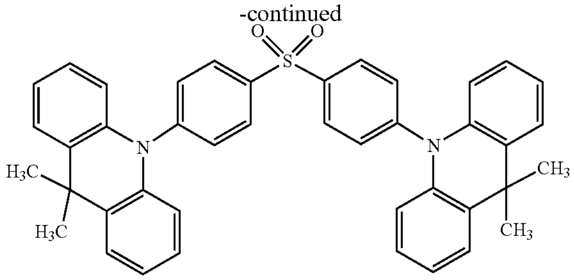

DMAC-DPS

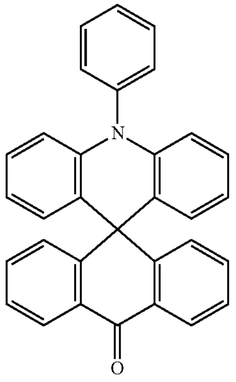

ACRSA

Alternatively, a TADF material whose singlet excited state and triplet excited state are in a thermal equilibrium state may be used. Such a TADF material has a short emission lifetime (excitation lifetime), which allows inhibition of a decrease in efficiency in a high-luminance region of a light-emitting device. Specifically, a material having the following molecular structure can be used.

[Chemical Formula 9]

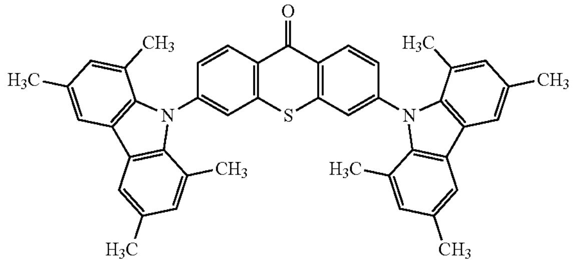

Note that a TADF material is a material having a small difference between the S1 level and the T1 level and a function of converting triplet excitation energy into singlet excitation energy by reverse intersystem crossing. Thus, a TADF material can upconvert triplet excitation energy into singlet excitation energy (i.e., reverse intersystem crossing) using a small amount of thermal energy and efficiently generate a singlet excited state. In addition, the triplet excitation energy can be converted into light.

An exciplex whose excited state is formed of two kinds of substances has an extremely small difference between the S1 level and the T1 level and functions as a TADF material capable of converting triplet excitation energy into singlet excitation energy.

A phosphorescence spectrum observed at a low temperature (e.g., 77 K to 10 K) is used for an index of the T1 level. When the level of energy with a wavelength of the line obtained by extrapolating a tangent to the fluorescence spectrum at a tail on the short wavelength side is the S1 level and the level of energy with a wavelength of the line obtained by extrapolating a tangent to the phosphorescence spectrum at a tail on the short wavelength side is the T1 level, the difference between the S1 level and the T1 level of the TADF material is preferably smaller than or equal to 0.3 eV, further preferably smaller than or equal to 0.2 eV.

When a TADF material is used as the light-emitting substance, the SI level of the host material is preferably higher than that of the TADF material. In addition, the T1 level of the host material is preferably higher than that of the TADF material.

As the host material in the light-emitting layer, any of various carrier-transport materials such as materials having an electron-transport property and/or materials having a hole-transport property, and the TADF materials can be used.

The material having a hole-transport property is preferably an organic compound having an amine skeleton or a π-electron rich heteroaromatic ring skeleton, for example. Examples of the material include compounds having an aromatic amine skeleton, such as 4,4'-bis[N-(I-naphthyl)-N-phenylamino]biphenyl (abbreviation: NPB), N,N-diphenyl-N,N'-bis(3-methylphenyl)-4,4'-diaminobiphenyl (abbreviation: TPD), N,N-bis(9,9'-spirobi[9H-fluoren]-2-yl)-N,N'-diphenyl-4,4'-diaminobiphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBAIBP), 4,4'-diphenyl-4"-(9-phenyl-9H-carbazol-3-yl) triphenylamine (abbreviation: PCBBiIBP), 4-(1-naphthyl)-4'-(9-phenyl-9H-carbazol-3-yl)triphenylamine (abbreviation: PCBANB), 4,4'-di(I-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl) phenyl]fluoren-2-amine (abbreviation: PCBAF), and N-phenyl-N-[4-(9-phenyl-9H-carbazol-3-yl)phenyl]-9,9'-spirobi [9H-fluoren]-2-amine (abbreviation: PCBASF); compounds having a carbazole skeleton, such as 1,3-bis(N-carbazolyl) benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), and 3,3'-bis(9-phenyl-9H-carbazole) (abbreviation: PCCP); compounds having a thiophene skeleton, such as 4,4',4"-(benzene-1,3,5-triyl)tri (dibenzothiophene) (abbreviation: DBT3P-II), 2,8-diphenyl-4-[4-(9-phenyl-9H-fluoren-9-yl)phenyl] dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton, such as 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the above materials, the compound having an aromatic amine skeleton and the compound having a carbazole skeleton are preferable because these compounds are highly reliable and have high hole-transport properties to contribute to a reduction in driving voltage. In addition, the organic compounds given as examples of the material with a hole-transport property that can be used for the hole-transport layer can also be used.

As the material having an electron-transport property, for example, a metal complex such as bis(10-hydroxybenzo[h] quinolinato)beryllium(II) (abbreviation: $BeBq_2$), bis(2-methyl-8-quinolinolato)(4-phenylphenolato)aluminum(III)

(abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); or an organic compound having a π-electron deficient heteroaromatic ring is preferably used. Examples of the organic compound having a π-electron deficient heteroaromatic ring include an organic compound having an azole skeleton, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), or 4,4'-bis(5-methylbenzoxazol-2-yl)stilbene (abbreviation: BzOs); an organic compound that includes a heteroaromatic ring having a pyridine skeleton, such as 3,5-bis[3-(9H-carbazol-9-yl)phenyl]pyridine (abbreviation: 35DCzPPy), 1,3,5-tri[3-(3-pyridyl)phenyl]benzene (abbreviation: TmPyPB), bathophenanthroline (abbreviation: BPhen), bathocuproine (abbreviation: BCP), 2,9-di(naphthalen-2-yl)-4,7-diphenyl-1,10-phenanthroline (abbreviation: NBPhen), 2,2'-(1,3-phenylene)bis(9-phenyl-1,10-phenanthroline) (abbreviation: mPPhen2P), or 2,2'-biphenyl-4,4'-diylbis(1,10-phenanthroline) (abbreviation: Phen2BP), an organic compound having a diazine skeleton, such as 2-[3-(dibenzothiophen-4-yl)phenyl]dibenzo[f,h]quinoxaline (abbreviation: 2mDBTPDBq-II), 2-[3-(3'-dibenzothiophen-4-yl)biphenyl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4'-(9-phenyl-9H-carbazol-3-yl)-3,1'-biphenyl-1-yl]dibenzo[f,h]quinoxaline (abbreviation: 2mpPCBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 9-[3'-(dibenzothiophen-4-yl)biphenyl-3-yl]naphtho[1',2':4,5]furo[2,3-b]pyrazine (abbreviation: 9mDBtBPNfpr), 9-[3'-(dibenzothiophen-4-yl)biphenyl-4-yl]naphtho[1',2':4,5]furo[2,3-b]pyrazine (abbreviation: 9pmDBtBPNfpr), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), 9,9'-[pyrimidine-4,6-diylbis(biphenyl-3,3'-diyl)]bis(9H-carbazole) (abbreviation: 4,6mCzBP2Pm), 8-(biphenyl-4-yl)-4-[3-(dibenzothiophen-4-yl)phenyl]-[1]benzofuro[3,2-d]pyrimidine (abbreviation: 8BP-4mDBtPBfpm), 3,8-bis[3-(dibenzothiophen-4-yl)phenyl]benzofuro[2,3-b]pyrazine (abbreviation: 3,8mDBtP2Bfpr), 4,8-bis[3-(dibenzothiophen-4-yl)phenyl]-[1]benzofuro[3,2-d]pyrimidine (abbreviation: 4,8mDBtP2Bfpm), 8-[3'-(dibenzothiophen-4-yl)(biphenyl-3-yl)]naphtho[1',2':4,5]furo[3,2-d]pyrimidine (abbreviation: 8mDBtBPNfpm), 8-[(2,2'-binaphthalen)-6-yl)]-4-[3-(dibenzothiophen-4-yl)phenyl]-[1]benzofuro[3,2-d]pyrimidine (abbreviation: 8(PN2)-4mDBtPBfpm), 2,2'-(pyridine-2,6-diyl)bis(4-phenylbenzo[h]quinazoline) (abbreviation: 2,6(P-Bqn)2Py), 2,2'-(pyridine-2,6-diyl)bis{4-[4-(2-naphthyl)phenyl]-6-phenylpyrimidine} (abbreviation: 2,6(NP-PPm)2Py), 6-(biphenyl-3-yl)-4-[3,5-bis(9H-carbazol-9-yl)phenyl]-2-phenylpyrimidine (abbreviation: 6mBP-4Cz2PPm), 2,6-bis(4-naphthalen-1-ylphenyl)-4-[4-(3-pyridyl)phenyl]pyrimidine (abbreviation: 2,4NP-6PyPPm), 4-[3,5-bis(9H-carbazol-9-yl)phenyl]-2-phenyl-6-(biphenyl-4-yl)pyrimidine (abbreviation: 6BP-4Cz2PPm), or 7-[4-(9-phenyl-9H-carbazol-2-yl)quinazolin-2-yl]-7H-dibenzo[c,g]carbazole (abbreviation: PC-cgDBCzQz); and an organic compound that includes a heteroaromatic ring having a triazine skeleton, such as 2-(biphenyl-4-yl)-4-phenyl-6-(9,9'-spirobi[9H-fluoren]-2-yl)-1,3,5-triazine (abbreviation: BP-SFTzn), 2-{3-[3-(benzo[b]naphtho[1,2-d]furan-8-yl)phenyl]phenyl}-4,6-diphenyl-1,3,5-triazine (abbreviation: mBnfBPTzn), 2-{3-[3-(benzo[b]naphtho[1,2-d]furan-6-yl)phenyl]phenyl}-4,6-diphenyl-1,3,5-triazine (abbreviation: mBnfBPTzn-02), 2-{4-[3-(N-phenyl-9H-carbazol-3-yl)-9H-carbazol-9-yl]phenyl}-4,6-diphenyl-1,3,5-triazine (abbreviation: PCCzPTzn), 9-[3-(4,6-diphenyl-1,3,5-triazin-2-yl)phenyl]-9'-phenyl-2,3'-bi-9H-carbazole (abbreviation: mPCCzPTzn-02), 2-[3'-(9,9-dimethyl-9H-fluoren-2-yl)biphenyl-3-yl]-4,6-diphenyl-1,3,5-triazine (abbreviation: mFBPTzn), 5-[3-(4,6-diphenyl-1,3,5-triazin-2-yl)phenyl]-7,7-dimethyl-5H,7H-indeno[2,1-b]carbazole (abbreviation: mINc(II)PTzn), 2-{3-[3-(dibenzothiophen-4-yl)phenyl]phenyl}-4,6-diphenyl-1,3,5-triazine (abbreviation: mDBtBPTzn), 2,4,6-tris[3'-(pyridin-3-yl)biphenyl-3-yl]-1,3,5-triazine (abbreviation: TmPPPyTz), 2-[3-(2,6-dimethyl-3-pyridinyl)-5-(9-phenanthrenyl)phenyl]-4,6-diphenyl-1,3,5-triazine (abbreviation: mPn-mDMePyPTzn), 11-[4-(biphenyl-4-yl)-6-phenyl-1,3,5-triazin-2-yl]-11,12-dihydro-12-phenylindolo[2,3-a]carbazole (abbreviation: BP-Icz(II)Tzn), 2-[3'-(triphenylen-2-yl)biphenyl-3-yl]-4,6-diphenyl-1,3,5-triazine (abbreviation: mTpBPTzn), 3-[9-(4,6-diphenyl-1,3,5-triazin-2-yl)-2-dibenzofuranyl]-9-phenyl-9H-carbazole (abbreviation: PCDBfTzn), or 2-(biphenyl-3-yl)-4-phenyl-6-{8-[(1,1': 4',1"-terphenyl)-4-yl]-1-dibenzofuranyl}-1,3,5-triazine (abbreviation: mBP-TPDBfTzn). Among the above materials, the organic compound that includes a heteroaromatic ring having a diazine skeleton, the organic compound that includes a heteroaromatic ring having a pyridine skeleton, and the organic compound that includes a heteroaromatic ring having a triazine skeleton have high reliability and thus are preferable. In particular, the organic compound that includes a heteroaromatic ring having a diazine (pyrimidine or pyrazine) skeleton and the organic compound that includes a heteroaromatic ring having a triazine skeleton have a high electron-transport property to contribute to a reduction in driving voltage.

As the TADF material that can be used as the host material, the above materials mentioned as the TADF material can also be used. When the TADF material is used as the host material, triplet excitation energy generated in the TADF material is converted into singlet excitation energy by reverse intersystem crossing and transferred to the light-emitting substance, whereby the emission efficiency of the light-emitting device can be increased. Here, the TADF material functions as an energy donor, and the light-emitting substance functions as an energy acceptor.

This is very effective in the case where the light-emitting substance is a fluorescent substance. In that case, the S1 level of the TADF material is preferably higher than that of the fluorescent substance in order that high emission efficiency can be achieved. Furthermore, the T1 level of the TADF material is preferably higher than the S1 level of the fluorescent substance. Therefore, the T1 level of the TADF material is preferably higher than that of the fluorescent substance.

It is also preferable to use a TADF material that emits light whose wavelength overlaps with the wavelength of a lowestenergy-side absorption band of the fluorescent substance, in which case excitation energy is transferred smoothly from the TADF material to the fluorescent substance and light emission can be obtained efficiently.

In addition, in order to efficiently generate singlet excitation energy from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably has a protective group around a luminophore (a skeleton which causes light emission) of the fluorescent substance. As the protective group, a substituent having no π bond and a saturated hydrocarbon are preferably used. Specific examples include an alkyl group having 3 to 10 carbon atoms, a substituted or unsubstituted cycloalkyl group having 3 to 12 carbon atoms, and a trialkylsilyl group having 3 to 10 carbon atoms. It is further preferable that the fluorescent substance have a plurality of protective groups. The substituents having no 7*r* bond are poor in carrier transport performance, whereby the TADF material and the luminophore of the fluorescent substance can be made away from each other with little influence on carrier transport or carrier recombination. Here, the luminophore refers to an atomic group (skeleton) that causes light emission in a fluorescent substance. The luminophore is preferably a skeleton having a π bond, further preferably includes an aromatic ring, and still further preferably includes a condensed aromatic ring or a condensed heteroaromatic ring. Examples of such a luminophore include a phenanthrene skeleton, a stilbene skeleton, an acridone skeleton, a phenoxazine skeleton, a phenothiazine skeleton, a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton. Specifically, a fluorescent substance having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferable because of its high fluorescence quantum yield.

In the case where a fluorescent substance is used as the light-emitting substance, a material having an anthracene skeleton is suitably used as the host material. The use of a substance having an anthracene skeleton as the host material for the fluorescent substance makes it possible to obtain a light-emitting layer with high emission efficiency and high durability. Among the substances having an anthracene skeleton, a substance having a diphenylanthracene skeleton, in particular, a substance having a 9,10-diphenylanthracene skeleton, is chemically stable and thus is preferably used as the host material. The host material preferably has a carbazole skeleton to have higher hole-injection and hole-transport properties; further preferably, the host material has a benzocarbazole skeleton in which a benzene ring is further condensed to a carbazole skeleton, because the HOMO level of the host material having a benzocarbazole skeleton is higher than that of the host material having a carbazole skeleton by approximately 0.1 eV and the host material having a benzocarbazole skeleton is thus easier for holes to enter than the host material having a carbazole skeleton. In particular, the host material preferably has a dibenzocarbazole skeleton, because the HOMO level of the host material having a dibenzocarbazole skeleton is higher than that of the host material having a carbazole skeleton by approximately 0.1 eV, the host material having a dibenzocarbazole skeleton is thus easier for holes to enter than the host material having a carbazole skeleton, and the host material having a dibenzocarbazole skeleton has a higher hole-transport property and higher heat resistance than the host material having a carbazole skeleton. Accordingly, a substance that has both a 9,10-diphenylanthracene skeleton and a carbazole skeleton (or a benzocarbazole or dibenzocarbazole skeleton) is further preferable as the host material. Note that in terms of the hole-injection and hole-transport properties described above, instead of a carbazole skeleton, a benzofluorene skeleton or a dibenzofluorene skeleton may be used. Examples of such a substance include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-[4-(9-phenyl-9H-fluoren-9-yl)biphenyl-4'-yl]anthracene (abbreviation: FLPPA), 9-(1-naphthyl)-10-[4-(2-naphthyl)phenyl]anthracene (abbreviation: α,N-PNPAnth), 9-(1-naphthyl)-10-(2-naphthyl)anthracene (abbreviation: α,βADN), 2-(10-phenylanthracen-9-yl)dibenzofuran, 2-(10-phenyl-9-anthracenyl)-benzo[b]naphtho[2,3-d]furan (abbreviation: Bnf(II)PhA), 9-(2-naphthyl)-10-[3-(2-naphthyl)phenyl]anthracene (abbreviation: PN-mPNPAnth), and 1-[4-(10-biphenyl-4-yl-9-anthracenyl)phenyl]-2-ethyl-1H-benzimidazole (abbreviation: EtBImPBPhA). In particular, CzPA, cgDBCzPA, 2mBnfPPA, and PCzPA exhibit excellent properties and thus are preferably selected.

Note that the host material may be a mixture of a plurality of kinds of substances; in the case of using a mixed host material, it is preferable to mix a material having an electron-transport property with a material having a hole-transport property. By mixing the material having an electron-transport property with the material having a hole-transport property, the transport property of the light-emitting layer 113 can be easily adjusted and a recombination region can be easily controlled. The weight ratio of the content of the material having a hole-transport property to the content of the material having an electron-transport property may be 1:19 to 19:1.

Note that a phosphorescent substance can be used as part of the mixed material. When a fluorescent substance is used as the light-emitting substance, a phosphorescent substance can be used as an energy donor for supplying excitation energy to the fluorescent substance.

An exciplex may be formed by these mixed materials. These mixed materials are preferably selected so as to form an exciplex that exhibits light emission whose wavelength overlaps with the wavelength of a lowest-energy-side absorption band of the light-emitting substance, in which case energy can be transferred smoothly and light emission can be obtained efficiently. Such a structure is preferably used to reduce the driving voltage.

Note that at least one of the materials forming an exciplex may be a phosphorescent substance. In this case, triplet excitation energy can be efficiently converted into singlet excitation energy by reverse intersystem crossing.

Combination of a material having an electron-transport property and a material having a hole-transport property whose HOMO level is higher than or equal to that of the material having an electron-transport property is preferable for forming an exciplex efficiently. In addition, the LUMO level of the material having a hole-transport property is preferably higher than or equal to that of the material having an electron-transport property. Note that the LUMO levels and the HOMO levels of the materials can be derived from the electrochemical characteristics (the reduction potentials and the oxidation potentials) of the materials that are measured by cyclic voltammetry (CV).

The formation of an exciplex can be confirmed by a phenomenon in which the electroluminescence spectrum of the mixed film in which the material having a hole-transport property and the material having an electron-transport property are mixed is shifted to the longer wavelength side than the electroluminescence spectrum of each of the materials (or has another peak on the longer wavelength side) observed by comparison of the electroluminescence spectra of the material having a hole-transport property, the material having an electron-transport property, and the mixed film of these materials, for example. Alternatively, the formation of an exciplex can be confirmed by a difference in transient response, such as a phenomenon in which the transient photoluminescence (PL) lifetime of the mixed film has longer lifetime components or has a larger proportion of delayed components than that of each of the materials, observed by comparison of transient PL of the material having a hole-transport property, the material having an electron-transport property, and the mixed film of these materials. The transient PL can be rephrased as transient electroluminescence (EL). That is, the formation of an exciplex can also be confirmed by a difference in transient response observed by comparison of the transient EL of the material having a hole-transport property, the material having an electron-transport property, and the mixed film of these materials.

The electron-transport layers (the first electron-transport layer 114_1 and the second electron-transport layer 114_2) each contain a substance having an electron-transport property. The electron mobility of the substance having an electron-transport property is preferably higher than or equal to $1\times10^{-7}$ $cm^2/Vs$, further preferably higher than or equal to $1\times10^{-6}$ $cm^2/Vs$ in the case where the square root of the electric field strength [V/cm] is 600. Note that any other substance can also be used as long as the substance has an electron-transport property higher than a hole-transport property. An organic compound having a π-electron deficient heteroaromatic ring is preferable as the above organic compound. The organic compound having a π-electron deficient heteroaromatic ring is preferably one or more of an organic compound that includes a heteroaromatic ring having a polyazole skeleton, an organic compound that includes a heteroaromatic ring having a pyridine skeleton, an organic compound that includes a heteroaromatic ring having a diazine skeleton, and an organic compound that includes a heteroaromatic ring having a triazine skeleton.

As the organic compound with an electron-transport property that can be used in the electron-transport layer, any of the above-described materials with an electron-transport property and the organic compounds that can be used as the organic compound having an electron-transport property in the electron-injection buffer region of the intermediate layer 116 can be similarly used. Among the materials, the organic compound that includes a heteroaromatic ring having a diazine skeleton, the organic compound that includes a heteroaromatic ring having a pyridine skeleton, and the organic compound that includes a heteroaromatic ring having a triazine skeleton have high reliability and thus are preferable. In particular, the organic compound that includes a heteroaromatic ring having a diazine (pyrimidine or pyrazine) skeleton and the organic compound that includes a heteroaromatic ring having a triazine skeleton have a high electron-transport property to contribute to a reduction in driving voltage.

The electron mobility of the electron-transport layer in the case where the square root of the electric field strength [V/cm] is 600 is preferably higher than or equal to $1\times10^{-7}$ $cm^2/Vs$ and lower than or equal to $5\times10^{-5}$ $cm^2/Vs$. The amount of electrons injected into the light-emitting layer can be controlled by the reduction in the electron-transport property of the electron-transport layer 114, whereby the light-emitting layer can be prevented from having excess electrons. It is particularly preferable to employ this structure when the hole-injection layer is formed using a composite material that includes a material having a hole-transport property with a relatively low HOMO level higher than or equal to −5.7 eV and lower than or equal to −5.4 eV, in which case a long lifetime can be achieved. In this case, the material having an electron-transport property preferably has a HOMO level higher than or equal to −6.0 eV.

As the electron-injection layer 115, a layer containing an alkali metal, an alkaline earth metal, a rare earth metal, a compound thereof, or a complex thereof, such as lithium fluoride (LiF), cesium fluoride (CsF), calcium fluoride ($CaF_2$), 8-hydroxyquinolinato-lithium (abbreviation: Liq), or ytterbium (Yb) in addition to the above-described organic compound having a basic skeleton, can be used. An electride or a layer that is formed using a substance having an electron-transport property and that contains an alkali metal, an alkaline earth metal, or a compound thereof can be used as the electron-injection layer 115. Examples of the electride include a substance in which electrons are added at high concentration to calcium oxide-aluminum oxide.

Note that as the electron-injection layer 115, it is possible to use a layer including a substance that has an electron-transport property (preferably an organic compound having a bipyridine skeleton) and includes a fluoride of the alkali metal or the alkaline earth metal at a concentration higher than or equal to that at which the electron-injection layer 115 becomes in a microcrystalline state (50 wt % or higher). Since the layer has a low refractive index, a light-emitting device including the layer can have high external quantum efficiency.

The organic compound layer 103 can be formed by any of a variety of methods, including a dry process and a wet process. For example, a vacuum evaporation method, a gravure printing method, an offset printing method, a screen printing method, an ink-jet method, a spin coating method, or the like may be used.

Different methods may be used to form the electrodes or the layers described above.

Figure 1C:
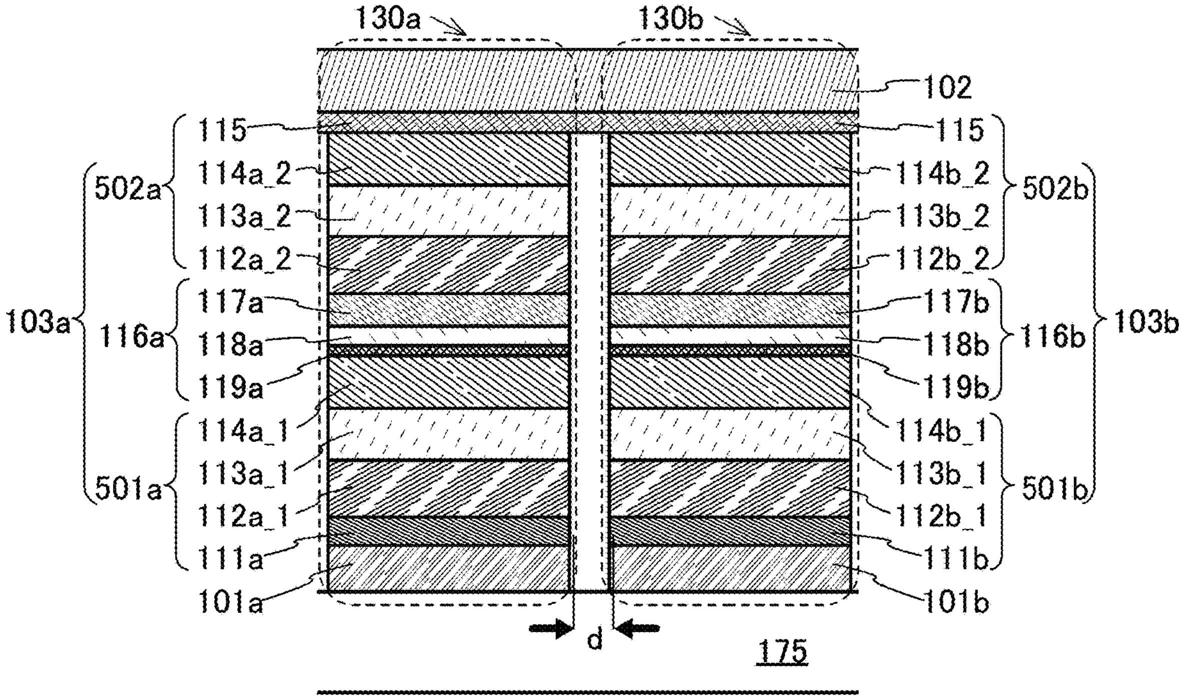

FIG. 1C illustrates two adjacent light-emitting devices (a light-emitting device **130*a* and a light-emitting device 130*b***) included in the light-emitting apparatus of one embodiment of the present invention.

The light-emitting device **130*a* includes an organic compound layer 103*a* between a first electrode 101*a* and the second electrode 102 over an insulating layer 175. The organic compound layer 103*a* has a structure in which a first light-emitting unit 501*a* and a second light-emitting unit 502*a* are stacked with an intermediate layer 116*a* therebetween. Although FIG. 1C illustrates the structure in which two light-emitting units are stacked, three or more light-emitting units may be stacked. The first light-emitting unit 501*a* includes a hole-injection layer 111*a*, a first hole-transport layer 112*a*_1, a first light-emitting layer 113*a*_1, and a first electron-transport layer 114*a*_1. The intermediate layer 116***a* includes a charge-generation region 117*a*, an electron-relay region 118*a*, and an electron-injection buffer region 119*a*. The electron-relay region 118*a* may or may not be provided. The second light-emitting unit 502*a* includes a second hole-transport layer 112*a*_2, a second light-emitting layer 113*a*_2, a second electron-transport layer 114*a*_2, and the electron-injection layer 115.

The light-emitting device 130*b* includes an organic compound layer 103*b* between a first electrode 101*b* and the second electrode 102 over the insulating layer 175. The organic compound layer 103*b* has a structure in which a first light-emitting unit 501*b* and a second light-emitting unit 502*b* are stacked with an intermediate layer 116*b* therebetween. Although FIG. 1C illustrates the structure in which two light-emitting units are stacked, three or more light-emitting units may be stacked. The first light-emitting unit 501*b* includes a hole-injection layer 111*b*, a first hole-transport layer 112*b*_1, a first light-emitting layer 113*b*_1, and a first electron-transport layer 114*b*_1. The intermediate layer 116*b* includes a charge-generation region 117*b*, an electron-relay region 118*b*, and an electron-injection buffer region 119*b*. The electron-relay region 118*b* may or may not be provided. The second light-emitting unit 502*b* includes a second hole-transport layer 112*b*_2, a second light-emitting layer 113*b*_2, a second electron-transport layer 114*b*_2, and the electron-injection layer 115.

The electron-injection layer 115 and the second electrode 102 are each preferably one layer shared by the light-emitting device 130*a* and the light-emitting device 130*b*. The organic compound layer 103*a* and the organic compound layer 103*b*, except for the electron-injection layer 115, are processed by a photolithography method after the layer to be the second electron-transport layer 114*a*_2 is formed and after the layer to be the second electron-transport layer 114*b*_2 is formed and thus are independent of each other. Since the edge (contour) of the organic compound layer 103*a* except for the electron-injection layer 115 is processed by a photolithography method, the edges of the layers in the organic compound layer 103*a* except for the electron-injection layer 115 are substantially aligned in the direction perpendicular to the substrate surface. Furthermore, since the edge (contour) of the organic compound layer 103*b* except for the electron-injection layer 115 is processed by a photolithography method, the edges of the layers in the organic compound layer 103*b* except for the electron-injection layer 115 are substantially aligned in the direction perpendicular to the substrate surface.

Since the organic compound layers are processed by a photolithography method, a distance d between the first electrode 101*a* and the first electrode 101*b* can be smaller than that of the case where the light-emitting devices are formed by mask vapor deposition. The distance d can be more than or equal to 2 μm and less than or equal to 5 μm.

The structure of this embodiment can be used in combination with any of the other structures as appropriate.

Embodiment 2

Figure 3A:
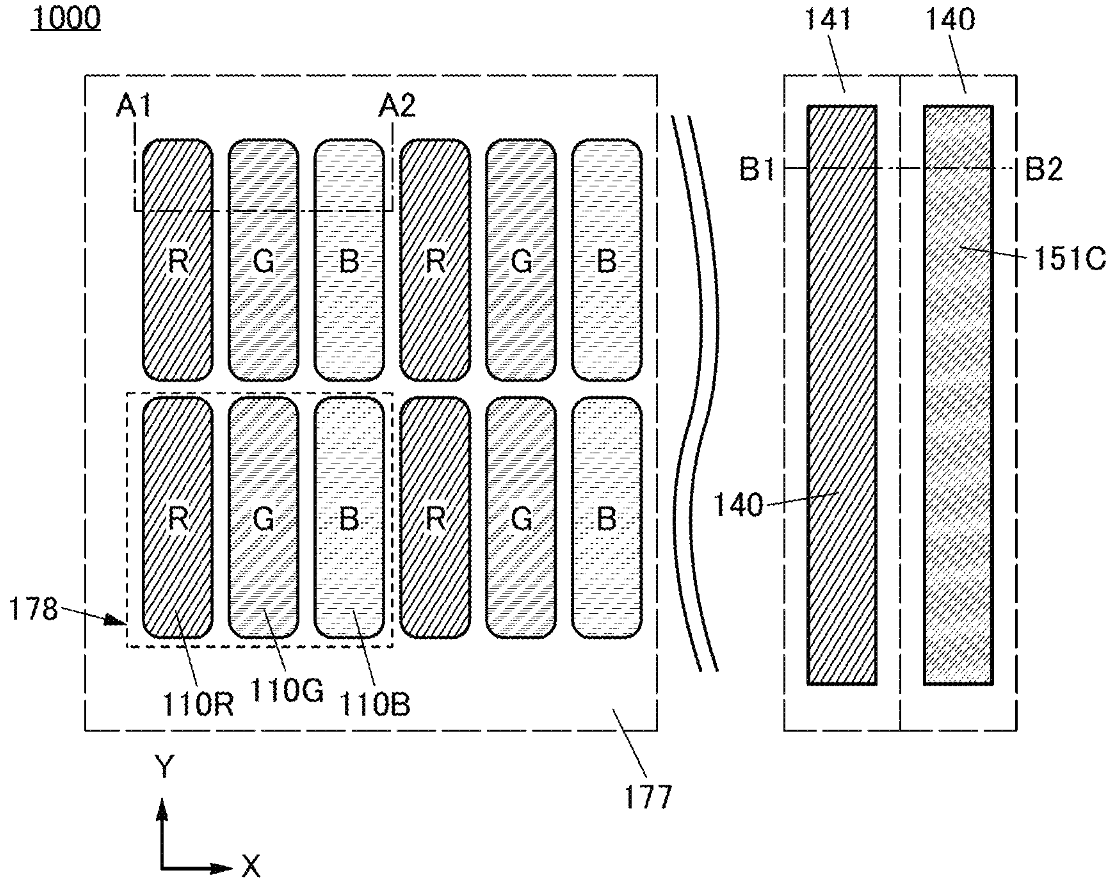
FIGS. 3A and 3B are a top view and a cross-sectional view, respectively, of a light-emitting apparatus.
Figure 3B:
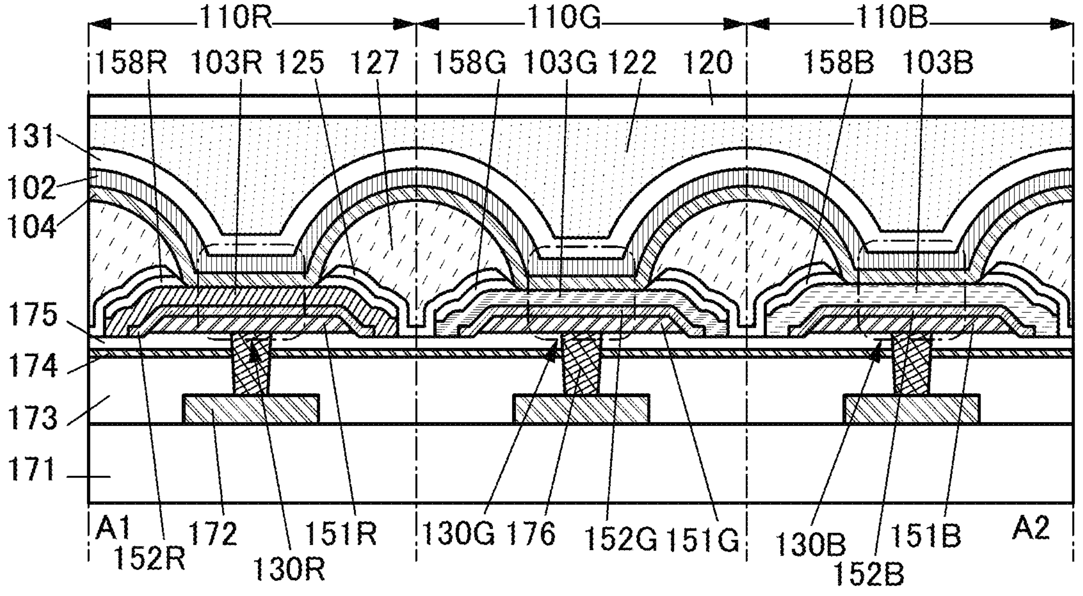

As illustrated as an example in FIGS. 3A and 3B, a plurality of the light-emitting devices 130 described in the above embodiment are formed over the insulating layer 175 to constitute a light-emitting apparatus. In this embodiment, the light-emitting apparatus of one embodiment of the present invention will be described in detail.

A light-emitting apparatus 1000 includes a pixel portion 177 in which a plurality of pixels 178 are arranged in matrix. The pixel 178 includes a subpixel 110R, a subpixel 110G, and a subpixel 110B.

In this specification and the like, for example, matters common to the subpixels 110R, 110G, and 110B are sometimes described using the collective term "subpixel 110". As for components that are distinguished from each other using letters of the alphabet, matters common to the components are sometimes described using reference numerals excluding the letters of the alphabet.

The subpixel 110R emits red light, the subpixel 110G emits green light, and the subpixel 110B emits blue light. Thus, an image can be displayed on the pixel portion 177. Note that in this embodiment, three colors of red (R), green (G), and blue (B) are given as examples of colors of light emitted by subpixels; however, the structure of the present invention is not limited to this structure. That is, subpixels of a different combination of colors may be employed. The number of subpixels is not limited to three, and four or more subpixels may be used, for example. Examples of four subpixels include subpixels emitting light of four colors of R, G, B, and white (W), subpixels emitting light of four colors of R, G, B, and yellow (Y), and four subpixels emitting light of R, G, and B and infrared light (IR).

In this specification and the like, the row direction and the column direction are sometimes referred to as the X direction and the Y direction, respectively. The X direction and the Y direction intersect with each other and are perpendicular to each other, for example.

FIG. 3A illustrates an example where subpixels of different colors are arranged in the X direction and subpixels of the same color are arranged in the Y direction. Note that subpixels of different colors may be arranged in the Y direction, and subpixels of the same color may be arranged in the X direction.

A connection portion 140 and a region 141 may be provided outside the pixel portion 177. The region 141 is preferably positioned between the pixel portion 177 and the connection portion 140, for example. The organic compound layer 103 is provided in the region 141. A conductive layer 151C is provided in the connection portion 140.

Although FIG. 3A illustrates an example where the region 141 and the connection portion 140 are positioned on the right side of the pixel portion 177, there is no particular limitation on the positions of the region 141 and the connection portion 140. The number of regions 141 and the number of connection portions 140 can each be one or more.

FIG. 3B is an example of a cross-sectional view along the dashed-dotted line A1-A2 in FIG. 3A. As illustrated in FIG. 3B, the light-emitting apparatus 1000 includes an insulating layer 171, a conductive layer 172 over the insulating layer 171, an insulating layer 173 over the insulating layer 171 and the conductive layer 172, an insulating layer 174 over the insulating layer 173, and the insulating layer 175 over the insulating layer 174. The insulating layer 171 is preferably provided over a substrate (not illustrated). An opening reaching the conductive layer 172 is provided in the insulating layers 175, 174, and 173, and a plug 176 is provided to fill the opening.

In the pixel portion 177, the light-emitting device 130 is provided over the insulating layer 175 and the plug 176. A protective layer 131 is provided to cover the light-emitting device 130. A substrate 120 is bonded to the protective layer 131 with a resin layer 122. An inorganic insulating layer 125 and an insulating layer 127 over the inorganic insulating layer 125 may be provided between adjacent light-emitting devices 130.

Although FIG. 3B illustrates cross sections of a plurality of the inorganic insulating layers 125 and a plurality of the insulating layers 127, the inorganic insulating layers 125 are preferably connected to each other and the insulating layers 127 are preferably connected to each other when the light-emitting apparatus 1000 is seen from above. That is, the inorganic insulating layer 125 and the insulating layer 127 preferably have openings above first electrodes.

In FIG. 3B, a light-emitting device 130R, a light-emitting device 130G, and a light-emitting device 130B are each illustrated as the light-emitting device 130. The light-emitting devices 130R, 130G, and 130B emit light of different colors. For example, the light-emitting device 130R can emit red light, the light-emitting device 130G can emit green light, and the light-emitting device 130B can emit blue light. Alternatively, the light-emitting device 130R, the light-emitting device 130G, or the light-emitting device 130B may emit visible light of another color or infrared light.

Note that the organic compound layer 103 at least includes a light-emitting layer and can include other functional layers (a hole-injection layer, a hole-transport layer, a hole-blocking layer, an electron-blocking layer, an electron-transport layer, an electron-injection layer, and the like). A combination of the organic compound layer 103 and a common layer 104 may constitute functional layers (a hole-injection layer, a hole-transport layer, a hole-blocking layer, a light-emitting layer, an electron-blocking layer, an electron-transport layer, an electron-injection layer, and the like) of the light-emitting device.

The light-emitting apparatus of one embodiment of the present invention can be, for example, a top-emission light-emitting apparatus where light is emitted in the direction opposite to a substrate over which light-emitting devices are formed. Note that the light-emitting apparatus of one embodiment of the present invention may be of a bottom-emission type.

The light-emitting device 130 (130R, 130G, or 130B) has a structure as described in Embodiment 1. The light-emitting device 130 (130R, 130G, or 130B) includes the first electrode (pixel electrode) including a conductive layer 151 (151R, 151G, or 151B) and a conductive layer 152 (152R, 152G, or 152B), the organic compound layer 103 (103R, 103G, or 103B) over the first electrode, the common layer 104 over the organic compound layer 103 (103R, 103G, or 103B), and the second electrode (common electrode) 102 over the common layer 104.

Note that the common layer 104 is not necessarily provided. The common layer 104 can reduce damage to the organic compound layer 103R caused in a later step. In the case where the common layer 104 is provided, the common layer 104 may function as an electron-injection layer. In the case where the common layer 104 functions as an electron-injection layer, a stack of the organic compound layer 103R and the common layer 104 corresponds to the organic compound layer 103 in Embodiment 1.

In the light-emitting device, one of the pixel electrode and the common electrode functions as an anode and the other functions as a cathode. Hereinafter, description is made on the assumption that the pixel electrode functions as the anode and the common electrode functions as the cathode unless otherwise specified.

The organic compound layer 103R, the organic compound layer 103G, and the organic compound layer 103B are island-shaped layers that are independent of one another. Alternatively, an organic compound layer of the light-emitting devices of one emission color may be independent of an organic compound layer of the light-emitting devices of another emission color. Providing the island-shaped organic compound layer 103 in each of the light-emitting devices 130 can suppress leakage current between the adjacent light-emitting devices 130 even in a high-resolution light-emitting apparatus. This can prevent crosstalk, so that a light-emitting apparatus with extremely high contrast can be obtained. Specifically, a light-emitting apparatus having high current efficiency at low luminance can be obtained.

The organic compound layer 103 may be provided to cover the top and side surfaces of the first electrode (pixel electrode) of the light-emitting device 130. In that case, the aperture ratio of the light-emitting apparatus 1000 can be easily increased as compared to the structure where an edge portion of the organic compound layer 103 is positioned inward from an edge portion of the pixel electrode. Covering the side surface of the pixel electrode of the light-emitting device 130 with the organic compound layer 103 can inhibit the pixel electrode from being in contact with the second electrode 102; hence, a short circuit of the light-emitting device 130 can be inhibited. Furthermore, the distance between a light-emitting region (i.e., a region overlapping with the pixel electrode) in the organic compound layer 103 and the edge portion of the organic compound layer 103 can be increased. Since the edge portion of the organic compound layer 103 might be damaged by processing, using a region that is away from the edge portion of the organic compound layer 103 as the light-emitting region can increase the reliability of the light-emitting device 130.

In the light-emitting apparatus of one embodiment of the present invention, the first electrode (pixel electrode) of the light-emitting device may have a stacked-layer structure. For example, in the example illustrated in FIG. 3B, the first electrode of the light-emitting device 130 is a stack of the conductive layer 151 and the conductive layer 152.

In the case where the light-emitting apparatus 1000 is a top-emission light-emitting apparatus, for example, in the pixel electrode of the light-emitting device 130, the conductive layer 151 preferably has high visible light reflectance and the conductive layer 152 preferably has a visible-light-transmitting property and a high work function. The higher the visible light reflectance of the pixel electrode is, the higher the efficiency of extraction of the light emitted by the organic compound layer 103 is. In the case where the pixel electrode functions as an anode, the higher the work function of the pixel electrode is, the easier it is to inject holes into the organic compound layer 103. Accordingly, when the pixel electrode of the light-emitting device 130 is a stack of the conductive layer 151 with high visible light reflectance and the conductive layer 152 with a high work function, the light-emitting device 130 can have high light extraction efficiency and a low driving voltage.

Specifically, the visible light reflectance of the conductive layer 151 is preferably higher than or equal to 40% and lower than or equal to 100%, further preferably higher than or equal to 70% and lower than or equal to 100%, for example. When the conductive layer 152 is used as an electrode having a visible-light-transmitting property, the visible light transmittance is preferably higher than or equal to 40%, for example.

In the case where a film formed after the formation of the pixel electrode having a stacked-layer structure is removed by a wet etching method, for example, the stack might be impregnated with a chemical solution used for the etching. When the chemical solution reaches the pixel electrode, galvanic corrosion between a plurality of layers constituting the pixel electrode might occur, leading to deterioration of the pixel electrode.

In view of the above, the conductive layer 152 is preferably formed to cover the top and side surfaces of the conductive layer 151. When the conductive layer 151 is covered with the conductive layer 152, the chemical solution does not reach the conductive layer 151; thus, occurrence of galvanic corrosion in the pixel electrode can be inhibited. This allows the light-emitting apparatus 1000 to be fabricated by a high-yield method and to be accordingly inexpensive. In addition, generation of a defect in the light-emitting apparatus 1000 can be inhibited, which makes the light-emitting apparatus 1000 highly reliable.

A metal material can be used for the conductive layer 151, for example. Specifically, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals, for example.

For the conductive layer 152, an oxide containing one or more selected from indium, tin, zinc, gallium, titanium, aluminum, and silicon can be used. For example, it is preferable to use a conductive oxide containing one or more of indium oxide, indium tin oxide, indium zinc oxide, zinc oxide, zinc oxide containing gallium, titanium oxide, indium zinc oxide containing gallium, indium zinc oxide containing aluminum, indium tin oxide containing silicon, indium zinc oxide containing silicon, and the like. In particular, indium tin oxide containing silicon can be suitably used for the conductive layer 152 because of having a high work function, for example, a work function higher than or equal to 4.0 eV.

The conductive layer 151 and the conductive layer 152 may each be a stack of a plurality of layers containing different materials. In that case, the conductive layer 151 may include a layer formed using a material that can be used for the conductive layer 152, such as a conductive oxide. Furthermore, the conductive layer 152 may include a layer formed using a material that can be used for the conductive layer 151, such as a metal material. In the case where the conductive layer 151 is a stack of two or more layers, for example, a layer in contact with the conductive layer 152 can contain the same material as a layer of the conductive layer 152 that is in contact with the conductive layer 151.

The conductive layer 151 preferably has an edge portion with a tapered shape. Specifically, the edge portion of the conductive layer 151 preferably has a tapered shape with a taper angle less than 90°. In that case, the conductive layer 152 provided along the side surface of the conductive layer 151 also has a tapered shape. When an edge portion of the conductive layer 152 has a tapered shape, coverage with the organic compound layer 103 provided along the side surface of the conductive layer 152 can be improved.

In the case where the conductive layer 151 or the conductive layer 152 has a stacked-layer structure, at least one of the stacked layers preferably has a tapered side surface. The stacked layers of the conductive layer(s) may have different tapered shapes.

Figure 4A:
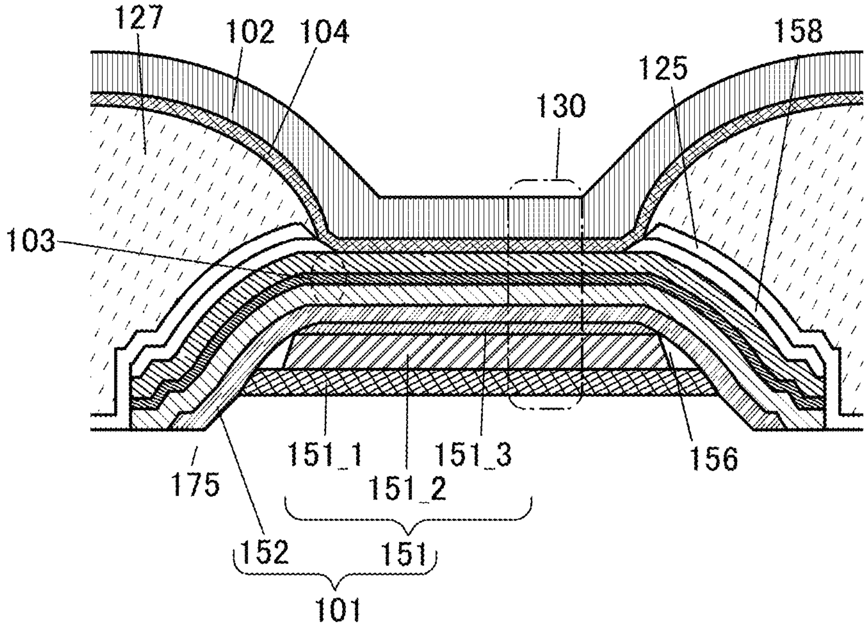
FIGS. 4A to 4D each illustrate a light-emitting device.

FIG. 4A illustrates the case where the conductive layer 151 has a stacked-layer structure of a plurality of layers containing different materials. As illustrated in FIG. 4A, the conductive layer 151 includes a conductive layer 151_1, a conductive layer 151_2 over the conductive layer 151_1, and a conductive layer 1513 over the conductive layer 151_2. In other words, the conductive layer 151 illustrated in FIG. 4A has a three-layer structure. In the case where the conductive layer 151 is a stack of a plurality of layers as described above, the visible light reflectance of at least one of the layers included in the conductive layer 151 is made higher than that of the conductive layer 152.

In the example illustrated in FIG. 4A, the conductive layer 1512 is interposed between the conductive layers 151_1 and 151_3. A material that is less likely to change in quality than the material for the conductive layer 151_2 is preferably used for the conductive layers 151_1 and 151_3. The conductive layer 151_1 can be formed using, for example, a material that is less likely to migrate owing to contact with the insulating layer 175 than the material for the conductive layer 151_2. The conductive layer 151_3 can be formed using a material an oxide of which has lower electrical resistivity than an oxide of the material used for the conductive layer 151_2 and which is less likely to be oxidized than the conductive layer 151_2.

In this manner, the structure in which the conductive layer 151_2 is interposed between the conductive layers 151_1 and 151_3 can expand the range of choices for the material for the conductive layer 151_2. The conductive layer 1512, for example, can thus have higher visible light reflectance than at least one of the conductive layers 151_1 and 151_3. For example, aluminum can be used for the conductive layer 151_2. The conductive layer 151_2 may be formed using an alloy containing aluminum. The conductive layer 1511 can be formed using titanium; titanium has lower visible light reflectance than aluminum but is less likely to migrate by contact with the insulating layer 175 than aluminum. Furthermore, the conductive layer 151_3 can be formed using titanium; titanium is less likely to be oxidized than aluminum and an oxide of titanium has lower electrical resistivity than aluminum oxide, although titanium has lower visible light reflectance than aluminum.

The conductive layer 151_3 may be formed using silver or an alloy containing silver. Silver is characterized by its visible light reflectance higher than that of titanium. In addition, silver is characterized by being less likely to be oxidized than aluminum, and silver oxide is characterized by its electrical resistivity lower than that of aluminum oxide. Thus, the conductive layer 1513 formed using silver or an alloy containing silver can favorably increase the visible light reflectance of the conductive layer 151 and inhibit an increase in the electric resistance of the pixel electrode due to oxidation of the conductive layer 1512. Here, as the alloy containing silver, an alloy of silver, palladium, and copper (Ag—Pd—Cu, also referred to as APC) can be used, for example. When the conductive layer 151_3 is formed using silver or an alloy containing silver and the conductive layer 1512 is formed using aluminum, the visible light reflectance of the conductive layer 1513 can be higher than that of the conductive layer 151_2. Here, the conductive layer 151_2 may be formed using silver or an alloy containing silver. The conductive layer 151_1 may be formed using silver or an alloy containing silver.

Meanwhile, a film formed using titanium has better processability in etching than a film formed using silver. Thus, use of titanium for the conductive layer 151_3 can facilitate formation of the conductive layer 151_3. Note that a film formed using aluminum also has better processability in etching than a film formed using silver.

The conductive layer 151 having a stacked-layer structure of a plurality of layers as described above can improve the characteristics of the light-emitting apparatus. For example, the light-emitting apparatus 1000 can have high light extraction efficiency and high reliability.

Here, in the case where the light-emitting device 130 has a microcavity structure, use of silver or an alloy containing silver, i.e., a material with high visible light reflectance, for the conductive layer 151_3 can favorably increase the light extraction efficiency of the light-emitting apparatus 1000.

Depending on the selected material or the processing method of the conductive layer 151, the side surface of the conductive layer 151_2 is positioned inward from the side surfaces of the conductive layer 151_1 and the conductive layer 151_3 and a protruding portion might be formed as illustrated in FIG. 4A. This might impair coverage of the conductive layer 151 with the conductive layer 152 to cause step disconnection of the conductive layer 152.

Thus, an insulating layer 156 is preferably provided as illustrated in FIG. 4A. FIG. 4A illustrates an example in which the insulating layer 156 is provided over the conductive layer 151_1 to include a region overlapping with the side surface of the conductive layer 151_2. Such a structure can inhibit occurrence of the step disconnection or a reduction in the thickness of the conductive layer 152 due to the protruding portion; thus, connection defects or an increase in driving voltage can be inhibited.

Although FIG. 4A illustrates the structure in which the side surface of the conductive layer 1512 is entirely covered with the insulating layer 156, part of the side surface the conductive layer 151_2 is not necessarily covered with the insulating layer 156. Also in a pixel electrode with a later-described structure, part of the side surface of the conductive layer 151_2 is not necessarily covered with the insulating layer 156.

The insulating layer 156 preferably has a curved surface as illustrated in FIG. 4A. In that case, step disconnection in the conductive layer 152 covering the insulating layer 156 is less likely to occur than in the case where the insulating layer 156 has a perpendicular side surface (a side surface parallel to the Z direction), for example. In addition, step disconnection in the conductive layer 152 covering the insulating layer 156 is less likely to occur also in the case where the side surface of the insulating layer 156 has a tapered shape, or specifically, a tapered shape with a taper angle less than 90°, than in the case where the insulating layer 156 has a perpendicular side surface, for example. As described above, the light-emitting apparatus 1000 can be fabricated by a high-yield method. Moreover, the light-emitting apparatus 1000 can have high reliability since generation of defects is inhibited therein.

Figure 4B:
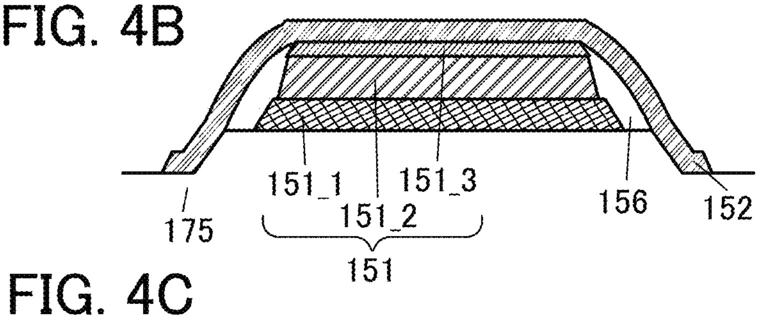
Figure 4C:
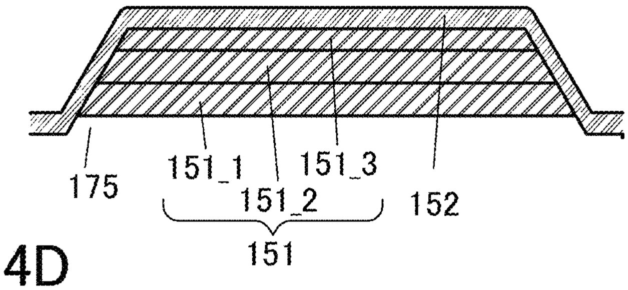
Figure 4D:
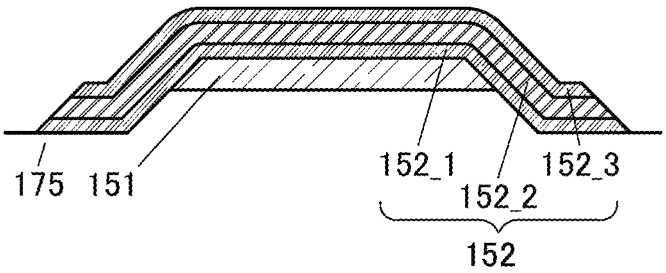

Note that one embodiment of the present invention is not limited thereto. FIGS. 4B to 4D illustrate other examples of the structure of the first electrode 101.

FIG. 4B illustrates a variation structure of the first electrode 101 in FIG. 4A, in which the insulating layer 156 covers the side surfaces of the conductive layers 151_1, 151_2, and 151_3 instead of covering only the side surface of the conductive layer 151_2.

FIG. 4C illustrates a variation structure of the first electrode 101 in FIG. 4A, in which the insulating layer 156 is not provided.

FIG. 4D illustrates a variation structure of the first electrode 101 in FIG. 4A, in which the conductive layer 151 does not have a stacked-layer structure but the conductive layer 152 has a stacked-layer structure.

A conductive layer 152_1 has higher adhesion to a conductive layer 152_2 than the insulating layer 175 does, for example. For the conductive layer 152_1, an oxide containing one or more selected from indium, tin, zinc, gallium, titanium, aluminum, and silicon, for example, can be used. For example, it is preferable to use a conductive oxide containing one or more of indium oxide, indium tin oxide, indium zinc oxide, zinc oxide, zinc oxide containing gallium, titanium oxide, indium titanium oxide, zinc titanate, aluminum zinc oxide, indium zinc oxide containing gallium, indium zinc oxide containing aluminum, indium tin oxide containing silicon, indium zinc oxide containing silicon, and the like. Accordingly, peeling of the conductive layer 152_2 can be inhibited. The conductive layer 152_2 is not in contact with the insulating layer 175.

The conductive layer 152_2 is a layer whose visible light reflectance (e.g., reflectance with respect to light with a predetermined wavelength longer than or equal to 400 nm and shorter than 750 nm) is higher than that of the conductive layers 151, 152_1, and 152_3. The visible light reflectance of the conductive layer 152_2 can be, for example, higher than or equal to 70% and lower than or equal to 100%, and is preferably higher than or equal to 80% and lower than or equal to 100%, further preferably higher than or equal to 90% and lower than or equal to 100%. For the conductive layer 152_2, silver or an alloy containing silver can be used, for example. An example of the alloy containing silver is an alloy of silver, palladium, and copper (APC). In the above manner, the light-emitting apparatus 1000 can have high light extraction efficiency. Note that a metal other than silver may be used for the conductive layer 152_2.

When the conductive layers 151 and 152 serve as the anode, a layer having a high work function is preferably used as the conductive layer 152_3. The conductive layer 152_3 has a higher work function than the conductive layer 152_2, for example. For the conductive layer 152_3, a material similar to the material usable for the conductive layer 152_1 can be used, for example. For example, the conductive layers 152_1 and 152_3 can be formed using the same kind of material.

When the conductive layers 151 and 152 serve as the cathode, a layer having a low work function is preferably used as the conductive layer 152_3. The conductive layer 152_3 has a lower work function than the conductive layer 152_2, for example.

The conductive layer 152_3 is preferably a layer having high visible light transmittance (e.g., transmittance with respect to light with a predetermined wavelength longer than or equal to 400 nm and shorter than 750 nm). For example, the visible light transmittance of the conductive layer 152_3 is preferably higher than that of the conductive layers 151 and 152_2. The visible light transmittance of the conductive layer 152_3 can be, for example, higher than or equal to 60% and lower than or equal to 100%, and is preferably higher than or equal to 70% and lower than or equal to 100% further preferably higher than or equal to 80% and lower than or equal to 100%. Accordingly, the amount of light absorbed by the conductive layer 152_3 among light emitted from the organic compound layer 103 can be reduced. As described above, the conductive layer 152_2 under the conductive layer 152_3 can be a layer having high visible light reflectance. Thus, the light-emitting apparatus 1000 can have high light extraction efficiency.

Next, an example method for fabricating the light-emitting apparatus 1000 having the structure illustrated in FIGS. 3A and 3B is described with reference to FIGS. 5A to 5E, FIGS. 6A to 6E, FIGS. 7A to 7C, FIGS. 8A to 8C, FIGS. 9A to 9C, FIGS. 10A to 10C, and FIGS. 11A to 11C.

[Fabrication Method Example]

Thin films included in the light-emitting apparatus (e.g., insulating films, semiconductor films, and conductive films)

can be formed by a sputtering method, a chemical vapor deposition (CVD) method, a vacuum evaporation method, a pulsed laser deposition (PLD) method, an ALD method, or the like. Examples of a CVD method include a plasma-enhanced CVD (PECVD) method and a thermal CVD method. An example of a thermal CVD method is a metal organic CVD (MOCVD) method.

Thin films included in the light-emitting apparatus (e.g., insulating films, semiconductor films, and conductive films) can also be formed by a wet process such as spin coating, dipping, spray coating, ink-jetting, dispensing, screen printing, offset printing, doctor blade coating, slit coating, roll coating, curtain coating, or knife coating.

Specifically, for fabrication of the light-emitting device, a vacuum process such as an evaporation method and a solution process such as a spin coating method or an ink-jet method can be used. Examples of an evaporation method include physical vapor deposition methods (PVD methods) such as a sputtering method, an ion plating method, an ion beam evaporation method, a molecular beam evaporation method, and a vacuum evaporation method, and a chemical vapor deposition method (CVD method). Specifically, the functional layers (e.g., the hole-injection layer, the hole-transport layer, the hole-blocking layer, the light-emitting layer, the electron-blocking layer, the electron-transport layer, and the electron-injection layer) included in the organic compound layer can be formed by an evaporation method (e.g., a vacuum evaporation method), a coating method (e.g., a dip coating method, a die coating method, a bar coating method, a spin coating method, or a spray coating method), a printing method (e.g., ink-jetting, screen printing (stencil), offset printing (planography), flexography (relief printing), gravure printing, or micro-contact printing), or the like.

Thin films included in the light-emitting apparatus can be processed by a photolithography method, for example. Alternatively, a nanoimprinting method, a sandblasting method, a lift-off method, or the like may be used to process thin films. Alternatively, island-shaped thin films may be directly formed by a film formation method using a shielding mask such as a metal mask.

There are two typical examples of photolithography methods. In one of the methods, a resist mask is formed over a thin film that is to be processed, the thin film is processed by etching, for example, and then the resist mask is removed. In the other method, a photosensitive thin film is formed and then processed into a desired shape by light exposure and development.

For etching of thin films, a dry etching method, a wet etching method, a sandblast method, or the like can be used.

Figure 5A:
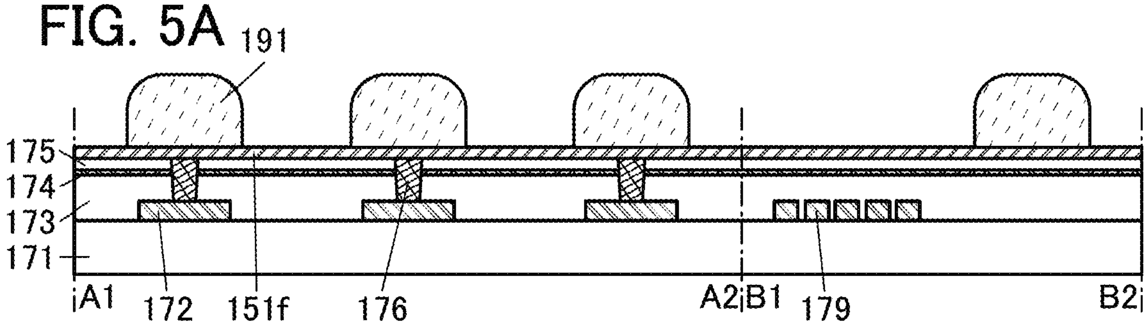
FIGS. 5A to 5E are cross-sectional views illustrating an example of a method for manufacturing a light-emitting apparatus.

First, as illustrated in FIG. 5A, the insulating layer 171 is formed over a substrate (not illustrated). Next, the conductive layer 172 and a conductive layer 179 are formed over the insulating layer 171, and the insulating layer 173 is formed over the insulating layer 171 so as to cover the conductive layer 172 and the conductive layer 179. Then, the insulating layer 174 is formed over the insulating layer 173, and the insulating layer 175 is formed over the insulating layer 174.

As the substrate, a substrate that has heat resistance high enough to withstand at least heat treatment performed later can be used. When an insulating substrate is used, it is possible to use a glass substrate, a quartz substrate, a sapphire substrate, a ceramic substrate, an organic resin substrate, or the like. Alternatively, it is possible to use a semiconductor substrate such as a single crystal semiconductor substrate or a polycrystalline semiconductor substrate of silicon, silicon carbide, or the like, a compound semiconductor substrate of silicon germanium or the like, or an SOI substrate.

Next, as illustrated in FIG. 5A, openings reaching the conductive layer 172 are formed in the insulating layers 175, 174, and 173. Then, the plugs 176 are formed to fill the openings.

Next, as illustrated in FIG. 5A, a conductive film 151*f* to be the conductive layers 151R, 151G, 151B, and 151C is formed over the plugs 176 and the insulating layer 175. The conductive film 151*f* can be formed by a sputtering method or a vacuum evaporation method, for example. A metal material can be used for the conductive film 151*f*, for example.

Subsequently, a resist mask 191 is formed over the conductive film 151*f*, for example, as illustrated in FIG. 5A. The resist mask 191 can be formed by application of a photosensitive material (photoresist), light exposure, and development.

Figure 5B:
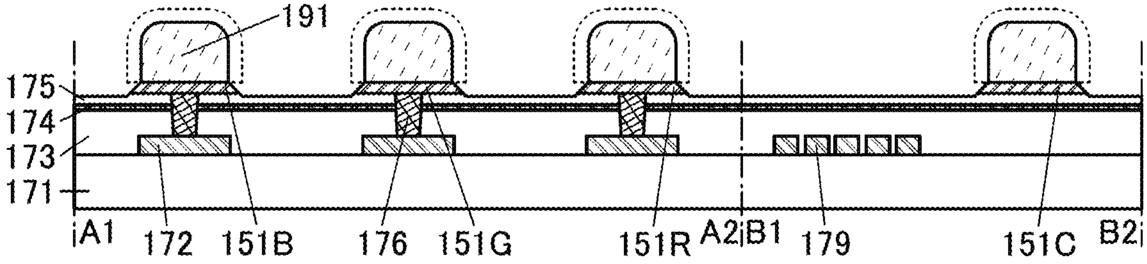

Subsequently, as illustrated in FIG. 5B, the conductive film 151*f* in a region that does not overlap with the resist mask 191, for example, is removed by an etching method, specifically, a dry etching method, for instance. Note that in the case where the conductive film 151*f* includes a layer formed using a conductive oxide such as indium tin oxide, for example, the layer may be removed by a wet etching method. In this manner, the conductive layer 151 is formed. In the case where part of the conductive film 151*f* is removed by a dry etching method, for example, a recessed portion (also referred to as a depression) may be formed in a region of the insulating layer 175 that does not overlap with the conductive layer 151.

Figure 5C:
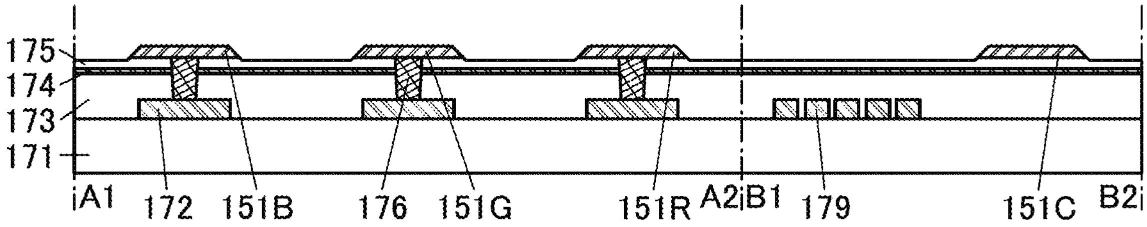

Next, the resist mask 191 is removed as illustrated in FIG. 5C. The resist mask 191 can be removed by ashing using oxygen plasma, for example. Alternatively, an oxygen gas and any of $CF_4$, $C_4F_8$, $SF_6$, $CHF_3$, $Cl_2$, $H_2O$, $BCl_3$, and a Group 18 element such as He may be used. Alternatively, the resist mask 191 may be removed by wet etching.

Figure 5D:
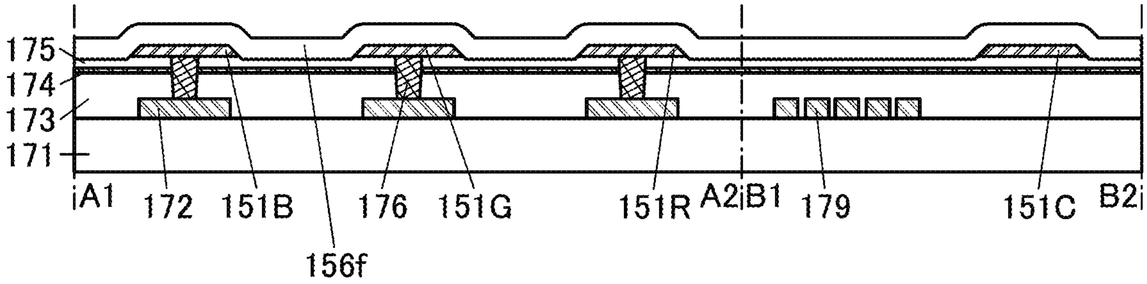

Then, as illustrated in FIG. 5D, an insulating film 156*f* to be an insulating layer 156R, an insulating layer 156G, an insulating layer 156B, and an insulating layer 156C is formed over the conductive layer 151R, the conductive layer 151G, the conductive layer 151B, the conductive layer 151C, and the insulating layer 175. The insulating film 156*f* can be formed by a CVD method, an ALD method, a sputtering method, or a vacuum evaporation method, for example.

For the insulating film 156*f*, an inorganic material can be used. As the insulating film 156*f*, an inorganic insulating film such as an oxide insulating film, a nitride insulating film, an oxynitride insulating film, or a nitride oxide insulating film can be used, for example. For example, an oxide insulating film containing silicon, a nitride insulating film containing silicon, an oxynitride insulating film containing silicon, a nitride oxide insulating film containing silicon, or the like can be used as the insulating film 156*f*. For the insulating film 156*f*, silicon oxynitride can be used, for example.

Figure 5E:
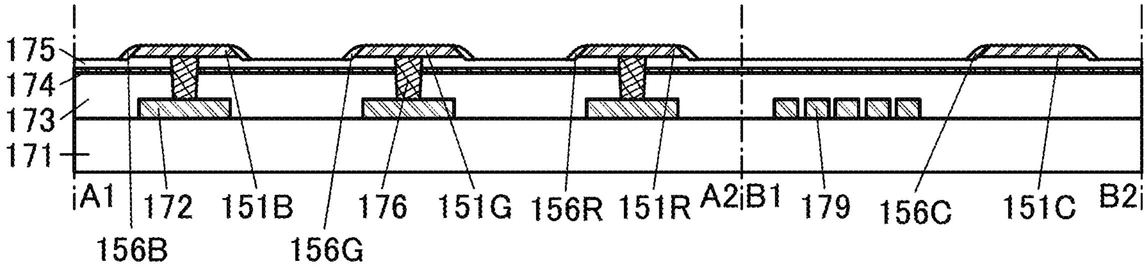

Subsequently, as illustrated in FIG. 5E, the insulating film 156*f* is processed to form the insulating layers 156R, 156G, 156B, and 156C. The insulating layer 156 can be formed by performing etching substantially uniformly on the top surface of the insulating film 156*f*, for example. Such uniform etching for planarization is also referred to as etch back treatment. Note that the insulating layer 156 may be formed by a photolithography method.

Figure 6A:
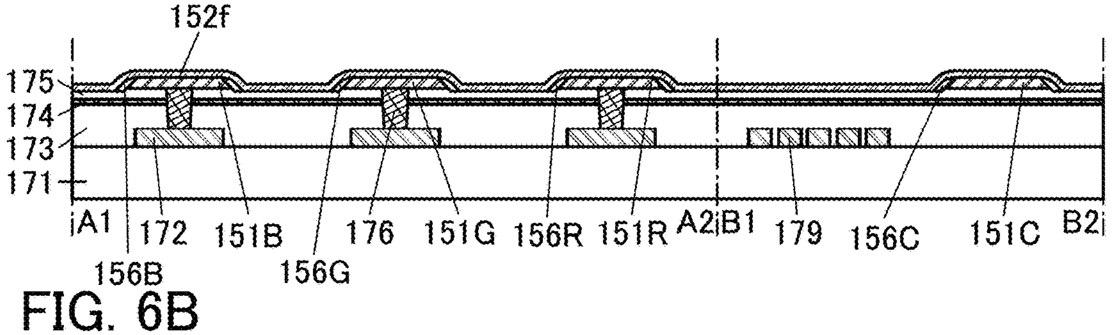
FIGS. 6A to 6E are cross-sectional views illustrating an example of a method for manufacturing a light-emitting apparatus.

Then, as illustrated in FIG. 6A, a conductive film 152*f* to be the conductive layers 152R, 152G, 152B and a conductive layer 152C is formed over the conductive layers 151R, 151G, 151B, and 151C and the insulating layers 156R, 156G, 156B, 156C, and 175. Specifically, the conductive film 152*f* is formed to cover the conductive layers 151R, 151G, 151B, and 151C and the insulating layers 156R, 156G, 156B, and 156C, for example.

The conductive film 152*f* can be formed by a sputtering method or a vacuum evaporation method, for example. The conductive film 152*f* can be formed by an ALD method. A conductive oxide can be used for the conductive film 152*f*, for example. The conductive film 152*f* can be a stack of a film formed using a metal material and a film formed thereover using a conductive oxide. For example, the conductive film 152*f* can be a stack of a film formed using titanium, silver, or an alloy containing silver and a film formed thereover using a conductive oxide.

Figure 6B:
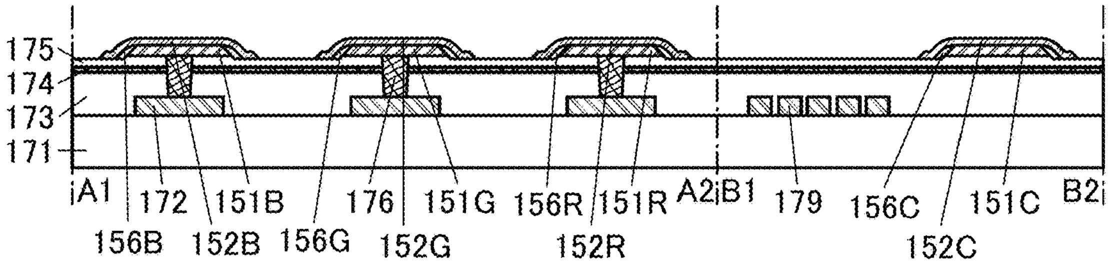

Then, as illustrated in FIG. 6B, the conductive film 152*f* is processed by a photolithography method, for example, so that the conductive layers 152R, 152G, 152B, and 152C are formed. Specifically, after a resist mask is formed, part of the conductive film 152*f* is removed by an etching method, for example. The conductive film 152*f* can be removed by a wet etching method, for example. The conductive film 152*f* may be removed by a dry etching method. Through the above steps, the pixel electrode including the conductive layer 151 and the conductive layer 152 is formed.

Next, hydrophobization treatment is preferably performed on the conductive layer 152. The hydrophobization treatment can change the hydrophilic properties of the subject surface to hydrophobic properties or increase the hydrophobic properties of the subject surface. The hydrophobization treatment for the conductive layer 152 can increase the adhesion between the conductive layer 152 and the organic compound layer 103 formed in a later step and inhibit film peeling. Note that the hydrophobization treatment is not necessarily performed.

Figure 6C:
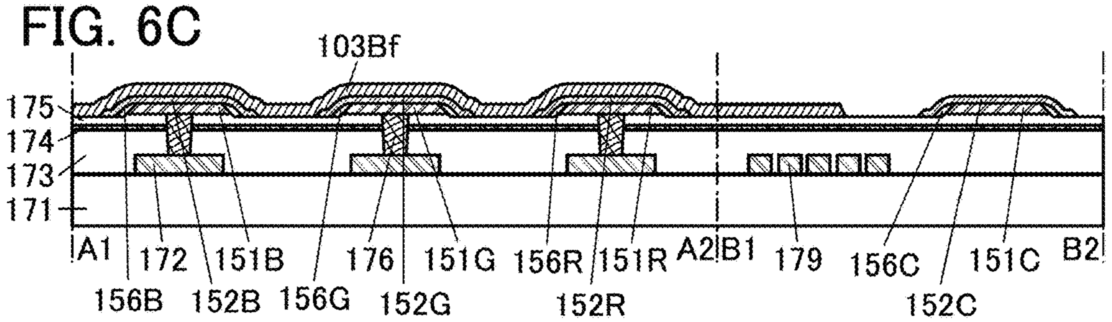

Next, as illustrated in FIG. 6C, an organic compound film 103Bf to be the organic compound layer 103B is formed over the conductive layers 152B, 152G, and 152R and the insulating layer 175.

Note that in the present invention, the organic compound film 103Bf includes a plurality of organic compound layers including at least one light-emitting layer. The structure of the light-emitting device 130 described in Embodiment 1 can be referred to for the specific structure. The plurality of organic compound layers including at least one light-emitting layer may be stacked with an intermediate layer positioned therebetween.

As illustrated in FIG. 6C, the organic compound film 103Bf is not formed over the conductive layer 152C. For example, a mask for defining a film formation area (also referred to as an area mask, a rough metal mask, or the like to be distinguished from a fine metal mask) is used, so that the organic compound film 103Bf can be formed only in a desired region. Employing a film formation step using an area mask and a processing step using a resist mask enables a light-emitting device to be fabricated by a relatively easy process.

The organic compound film 103Bf can be formed by an evaporation method, specifically a vacuum evaporation method, for example. The organic compound film 103Bf may be formed by a transfer method, a printing method, an ink-jet method, a coating method, or the like.

Figure 6D:
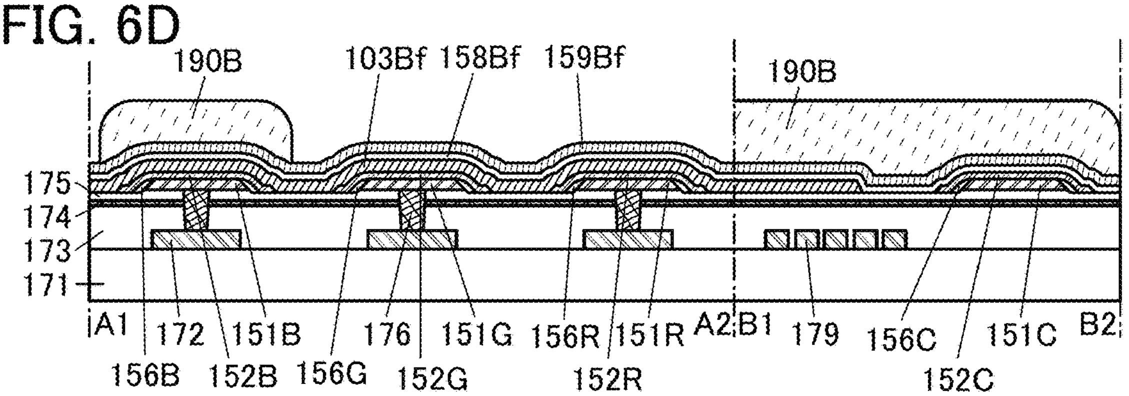

Next, as illustrated in FIG. 6D, a sacrificial film 158Bf to be a sacrificial layer 158B and a mask film 159Bf to be a mask layer 159B are sequentially formed over the organic compound film 103Bf.

The sacrificial film 158Bf and the mask film 159Bf can be formed by a sputtering method, an ALD method (including a thermal ALD method and a PEALD method), a CVD method, or a vacuum evaporation method, for example. Alternatively, the sacrificial film 158Bf and the mask film 159Bf may be formed by the above-described wet process.

The sacrificial film 158Bf and the mask film 159Bf are formed at a temperature lower than the upper temperature limit of the organic compound film 103Bf. The typical substrate temperatures in formation of the sacrificial film 158Bf and the mask film 159Bf are each lower than or equal to 200° C., preferably lower than or equal to 150° C., further preferably lower than or equal to 120° C., still further preferably lower than or equal to 100° C., yet still further preferably lower than or equal to 80° C.

Although this embodiment shows an example where a mask film having a two-layer structure of the sacrificial film 158Bf and the mask film 159Bf is formed, a mask film may have a single-layer structure or a stacked-layer structure of three or more layers.

Providing the sacrificial film over the organic compound film 103Bf can reduce damage to the organic compound film 103Bf in the fabrication process of the light-emitting apparatus, resulting in an increase in reliability of the light-emitting device.

As the sacrificial film 158Bf, a film that is highly resistant to the process conditions for the organic compound film 103Bf, specifically, a film having high etching selectivity with respect to the organic compound film 103Bf is used. For the mask film 159Bf, a film having high etching selectivity with respect to the sacrificial film 158Bf is used.

The sacrificial film 158Bf and the mask film 159Bf are preferably films that can be removed by a wet etching method. The use of a wet etching method can reduce damage to the organic compound film 103Bf in processing of the sacrificial film 158Bf and the mask film 159Bf, as compared to the case of using a dry etching method.

In the case where a wet etching method is employed, it is particularly preferable to use an acidic chemical solution. As an acidic chemical solution, a chemical solution containing one of phosphoric acid, hydrofluoric acid, nitric acid, acetic acid, oxalic acid, sulfuric acid, and the like or a mixed chemical solution (also referred to as a mixed acid) that contains two or more of these acids is preferably used.

As each of the sacrificial film 158Bf and the mask film 159Bf, one or more of a metal film, an alloy film, a metal oxide film, a semiconductor film, an organic insulating film, and an inorganic insulating film, for example, can be used.

When a film containing a material having a property of blocking ultraviolet rays is used as each of the sacrificial film 158Bf and the mask film 159Bf, the organic compound layer can be inhibited from being irradiated with ultraviolet rays in a light exposure step, for example. When the organic compound layer is inhibited from being damaged by ultraviolet rays, the reliability of the light-emitting device can be improved.

Note that the same effect is obtained when a film containing a material having a property of blocking ultraviolet rays is used for an inorganic insulating film 125*f* described later.

For each of the sacrificial film 158Bf and the mask film 159Bf, it is possible to use a metal material such as gold, silver, platinum, magnesium, nickel, tungsten, chromium, molybdenum, iron, cobalt, copper, palladium, titanium, aluminum, yttrium, zirconium, or tantalum or an alloy material containing any of the metal materials, for example. It is particularly preferable to use a low-melting-point material such as aluminum or silver.

The sacrificial film 158Bf and the mask film 159Bf can each be formed using a metal oxide such as In—Ga—Zn oxide, indium oxide, In—Zn oxide, In—Sn oxide, indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or indium tin oxide containing silicon.

In place of gallium described above, an element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used.

The sacrificial film 158Bf and the mask film 159Bf are preferably formed using a semiconductor material such as silicon or germanium, for example, for excellent compatibility with a semiconductor manufacturing process. An oxide or a nitride of the semiconductor material can be used. A non-metallic material such as carbon or a compound thereof can be used. A metal such as titanium, tantalum, tungsten, chromium, or aluminum or an alloy containing at least one of these metals can be used. Alternatively, an oxide containing the above-described metal, such as titanium oxide or chromium oxide, or a nitride such as titanium nitride, chromium nitride, or tantalum nitride can be used.

As each of the sacrificial film 158Bf and the mask film 159Bf, any of a variety of inorganic insulating films can be used. In particular, an oxide insulating film is preferable because its adhesion to the organic compound film 103Bf is higher than that of a nitride insulating film. For example, an inorganic insulating material such as aluminum oxide, hafnium oxide, or silicon oxide can be used for the sacrificial film 158Bf and the mask film 159Bf. As the sacrificial film 158Bf and the mask film 159Bf, aluminum oxide films can be formed by an ALD method, for example. An ALD method is preferably used, in which case damage to a base (in particular, the organic compound layer) can be reduced.

One or both of the sacrificial film 158Bf and the mask film 159Bf may be formed using an organic material. For example, as the organic material, a material that can be dissolved in a solvent chemically stable with respect to at least the uppermost film of the organic compound film 103Bf may be used. Specifically, a material that will be dissolved in water or an alcohol can be suitably used. In forming a film of such a material, it is preferable to apply the material dissolved in a solvent such as water or an alcohol by a wet process and then perform heat treatment for evaporating the solvent. At this time, the heat treatment is preferably performed in a reduced-pressure atmosphere, in which case the solvent can be removed at a low temperature in a short time and thermal damage to the organic compound film 103Bf can be reduced accordingly.

The sacrificial film 158Bf and the mask film 159Bf may be formed using an organic resin such as polyvinyl alcohol (PVA), polyvinyl butyral, polyvinylpyrrolidone, polyethylene glycol, polyglycerin, pullulan, water-soluble cellulose, an alcohol-soluble polyamide resin, or a fluorine resin like perfluoropolymer.

For example, an organic film (e.g., a PVA film) formed by an evaporation method or the above wet process can be used as the sacrificial film 158Bf, and an inorganic film (e.g., a silicon nitride film) formed by a sputtering method can be used as the mask film 159Bf.

Subsequently, a resist mask 190B is formed over the mask film 159Bf as illustrated in FIG. 6D. The resist mask 190B can be formed by application of a photosensitive material (photoresist), light exposure, and development.

The resist mask 190B may be formed using either a positive resist material or a negative resist material.

The resist mask 190B is provided at a position overlapping with the conductive layer 152B. The resist mask 190B is preferably provided also at a position overlapping with the conductive layer 152C. This can inhibit the conductive layer 152C from being damaged during the fabrication process of the light-emitting apparatus. Note that the resist mask 190B is not necessarily provided over the conductive layer 152C. The resist mask 190B is preferably provided to cover the area from the edge portion of the organic compound film 103Bf to the edge portion of the conductive layer 152C (the edge portion closer to the organic compound film 103Bf), as illustrated in the cross-sectional view along the line B1-B2 in FIG. 6C.

Figure 6E:
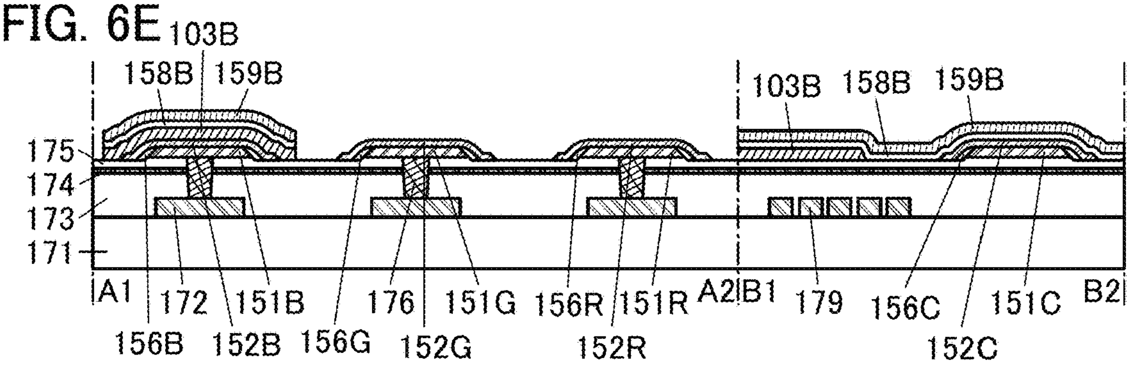

Next, as illustrated in FIG. 6E, part of the mask film 159Bf is removed using the resist mask 190B, so that the mask layer 159B is formed. The mask layer 159B remains over the conductive layers 152B and 152C. After that, the resist mask 190B is removed. Then, part of the sacrificial film 158Bf is removed using the mask layer 159B as a mask (also referred to as a hard mask), so that the sacrificial layer 158B is formed.

Each of the sacrificial film 158Bf and the mask film 159Bf can be processed by a wet etching method or a dry etching method. The sacrificial film 158Bf and the mask film 159Bf are preferably processed by wet etching.

The use of a wet etching method can reduce damage to the organic compound film 103Bf in processing of the sacrificial film 158Bf and the mask film 159Bf, as compared to the case of using a dry etching method. In the case of using a wet etching method, it is preferable to use a developer, an aqueous solution of tetramethylammonium hydroxide (TMAH), dilute hydrofluoric acid, oxalic acid, phosphoric acid, acetic acid, nitric acid, or a chemical solution containing a mixed solution of any of these acids, for example.

Since the organic compound film 103Bf is not exposed in the processing of the mask film 159Bf, the range of choice for a processing method for the mask film 159Bf is wider than that for the sacrificial film 158Bf. Specifically, even in the case where a gas containing oxygen is used as the etching gas in the processing of the mask film 159Bf, deterioration of the organic compound film 103Bf can be suppressed.

In the case where a wet etching method is employed, it is particularly preferable to use an acidic chemical solution. As an acidic chemical solution, a chemical solution containing one of phosphoric acid, hydrofluoric acid, nitric acid, acetic acid, oxalic acid, sulfuric acid, and the like or a mixed chemical solution (also referred to as a mixed acid) that contains two or more of these acids is preferably used.

In the case of using a dry etching method to process the sacrificial film 158Bf, deterioration of the organic compound film 103Bf can be suppressed by not using a gas containing oxygen as the etching gas. In the case of using a dry etching method, it is preferable to use a gas containing $CF_4$, $C_4F_8$, $SF_6$, $CHF_3$, $Cl_2$, $H_2O$, $BCl_3$, or a Group 18 element such as He, for example, as the etching gas.

The resist mask 190B can be removed by a method similar to that for the resist mask 191. At this time, the sacrificial film 158Bf is positioned on the outermost surface, and the organic compound film 103Bf is not exposed; thus, the organic compound film 103Bf can be inhibited from being damaged in the step of removing the resist mask 190B. In addition, the range of choice of the method for removing the resist mask 190B can be widened.

Next, as illustrated in FIG. 6E, the organic compound film 103Bf is processed to form the organic compound layer 103B. For example, part of the organic compound film 103Bf is removed using the mask layer 159B and the sacrificial layer 158B as hard masks to form the organic compound layer 103B.

Accordingly, as illustrated in FIG. 6E, the stacked-layer structure of the organic compound layer 103B, the sacrificial layer 158B, and the mask layer 159B remains over the conductive layer 152B. The conductive layers 152G and 152R are exposed.

The organic compound film 103Bf can be processed by dry etching or wet etching. In the case where the processing is performed by a dry etching method, for example, an etching gas containing oxygen can be used. When the etching gas contains oxygen, the etching rate can be increased. Thus, the etching can be performed under a low-power condition while an adequately high etching rate is maintained. Accordingly, damage to the organic compound film 103Bf can be inhibited. Furthermore, a defect such as attachment of a reaction product generated during the etching can be inhibited.

An etching gas that does not contain oxygen may be used. In that case, deterioration of the organic compound film 103Bf can be inhibited, for example.

As described above, in one embodiment of the present invention, the mask layer 159B is formed in the following manner: the resist mask 190B is formed over the mask film 159Bf and part of the mask film 159Bf is removed using the resist mask 190B. After that, part of the organic compound film 103Bf is removed using the mask layer 159B as a hard mask, so that the organic compound layer 103B is formed. In other words, the organic compound layer 103B is formed by processing the organic compound film 103Bf by a photolithography method. Note that part of the organic compound film 103Bf may be removed using the resist mask 190B. Then, the resist mask 190B may be removed.

Here, hydrophobization treatment for the conductive layer 152G may be performed as necessary. At the time of processing the organic compound film 103Bf, the properties of a surface of the conductive layer 152G change to hydrophilic properties in some cases, for example. The hydrophobization treatment for the conductive layer 152G, for example, can increase the adhesion between the conductive layer 152G and a layer to be formed in a later step (which is the organic compound layer 103G here) and inhibit film peeling.

Figure 7A:
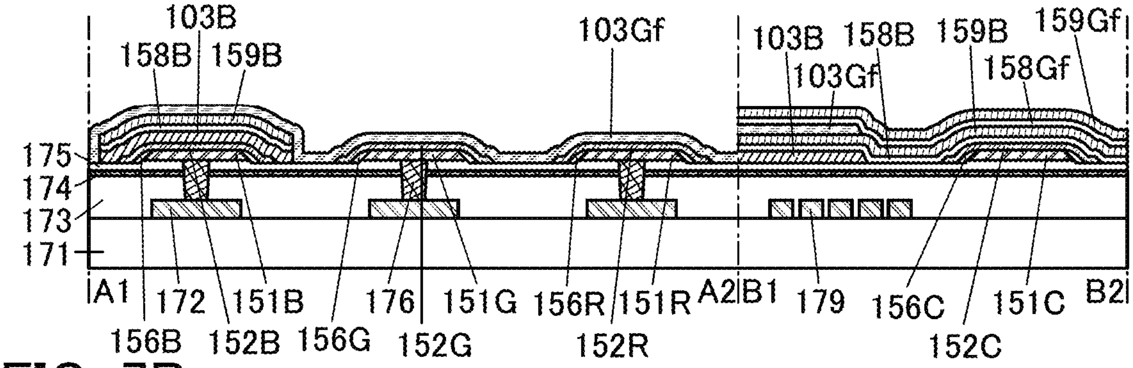
FIGS. 7A to 7C are cross-sectional views illustrating an example of a method for manufacturing a light-emitting apparatus.

Next, as illustrated in FIG. 7A, an organic compound film 103Gf to be the organic compound layer 103G is formed over the conductive layer 152G, the conductive layer 152R, the mask layer 159B, and the insulating layer 175.

The organic compound film 103Gf can be formed by a method similar to that for forming the organic compound film 103Bf. The organic compound film 103Gf can have a structure similar to that of the organic compound film 103Bf.

Figure 7B:
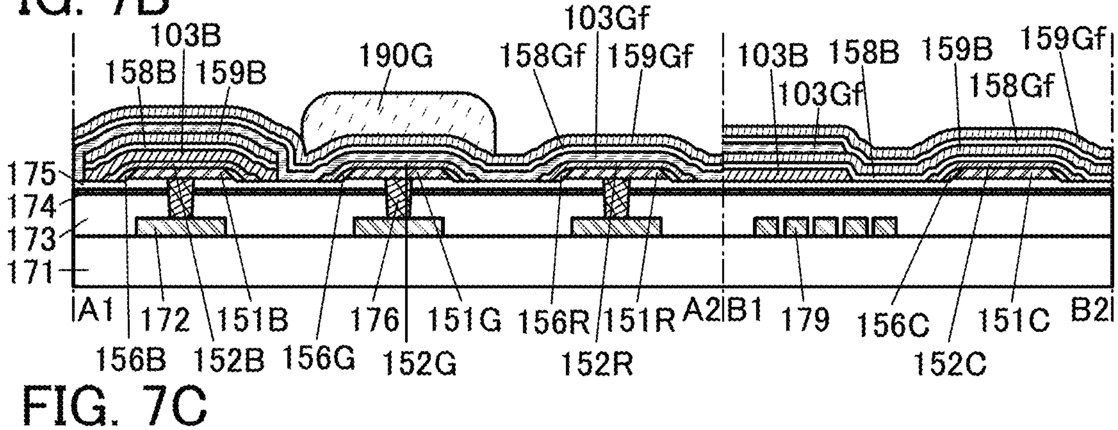

Then, as illustrated in FIG. 7B, a sacrificial film 158Gf to be a sacrificial layer 158G and a mask film 159Gf to be a mask layer 159G are sequentially formed over the organic compound film 103Gf and the mask layer 159B. After that, a resist mask 190G is formed. The materials and the formation methods of the sacrificial film 158Gf and the mask film 159Gf are similar to those for the sacrificial film 158Bf and the mask film 159Bf. The material and the formation method of the resist mask 190G are similar to those for the resist mask 190B.

The resist mask 190G is provided at a position overlapping with the conductive layer 152G.

Figure 7C:
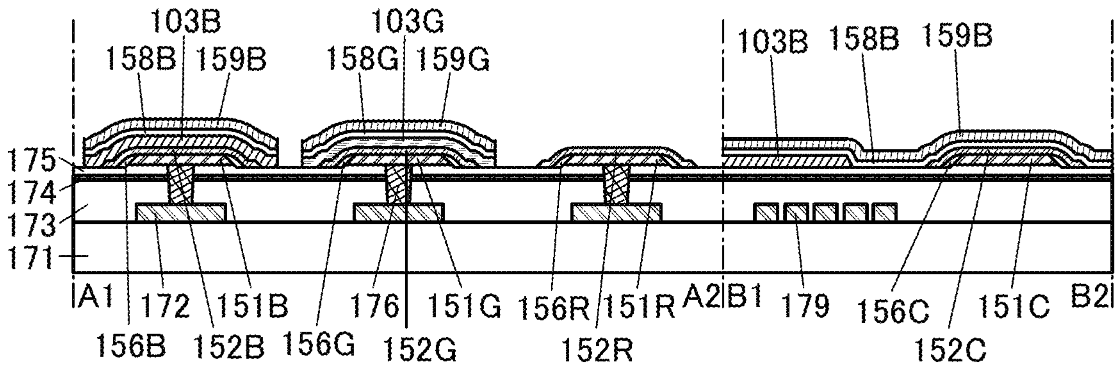

Subsequently, as illustrated in FIG. 7C, part of the mask film 159Gf is removed using the resist mask 190G, whereby the mask layer 159G is formed. The mask layer 159G remains over the conductive layer 152G. After that, the resist mask 190G is removed. Then, part of the sacrificial film 158Gf is removed using the mask layer 159G as a mask, so that the sacrificial layer 158G is formed. Next, the organic compound film 103Gf is processed to form the organic compound layer 103G. For example, part of the organic compound film 103Gf is removed using the mask layer 159G and the sacrificial layer 158G as hard masks to form the organic compound layer 103G.

Accordingly, as illustrated in FIG. 7C, the stacked-layer structure of the organic compound layer 103G, the sacrificial layer 158G, and the mask layer 159G remains over the conductive layer 152G. The mask layer 159B and the conductive layer 152R are exposed.

Hydrophobization treatment for the conductive layer 152R may be performed, for example.

Figure 8A:
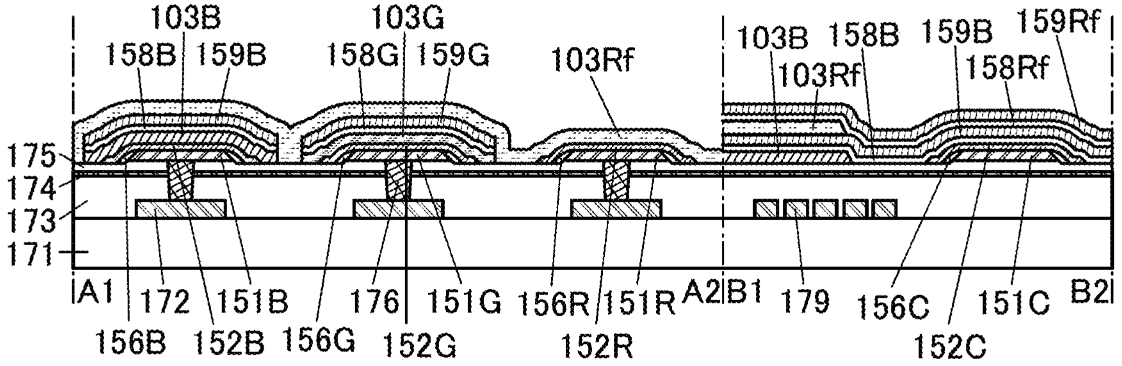
FIGS. 8A to 8C are cross-sectional views illustrating an example of a method for manufacturing a light-emitting apparatus.

Next, as illustrated in FIG. 8A, an organic compound film 103Rf to be the organic compound layer 103R is formed over the conductive layer 152R, the mask layer 159G, the mask layer 159B, and the insulating layer 175.

The organic compound film 103Rf can be formed by a method similar to that for forming the organic compound film 103Gf. The organic compound film 103Rf can have a structure similar to that of the organic compound film 103Gf.

Figure 8B:
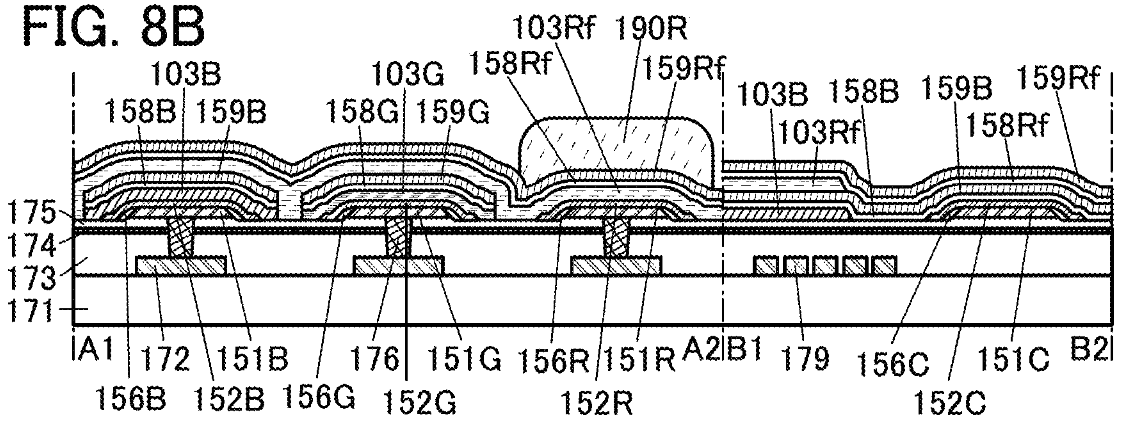
Figure 8C:
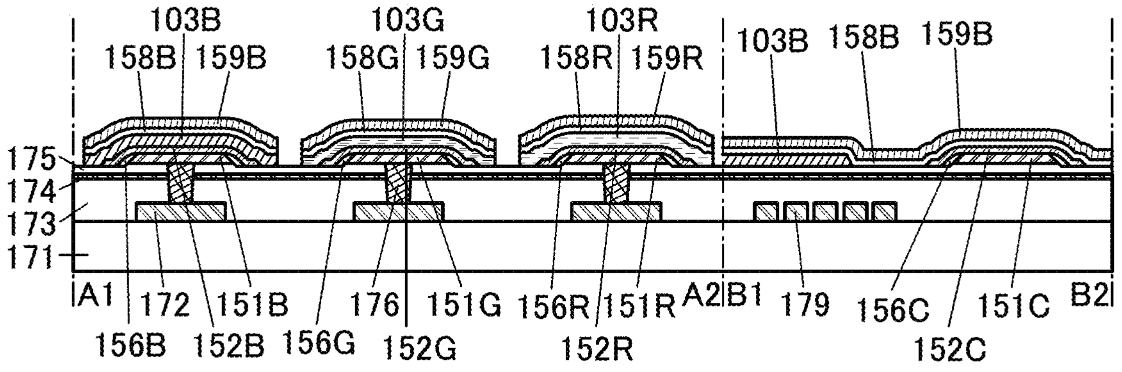

Subsequently, as illustrated in FIGS. 8B and 8C, a sacrificial layer 158R, a mask layer 159R, and the organic compound layer 103R are formed from a sacrificial film 158Rf, a mask film 159Rf, and the organic compound film 103Rf, respectively, using a resist mask 190R. For the formation methods of the resist mask 190R, the sacrificial layer 158R, the mask layer 159R, and the organic compound layer 103R, the description for the organic compound layer 103G can be referred to.

Note that the side surfaces of the organic compound layers 103B, 103G, and 103R are preferably perpendicular or substantially perpendicular to their formation surfaces. For example, the angle between the formation surfaces and these side surfaces is preferably greater than or equal to 60° and less than or equal to 90°.

The distance between two adjacent layers among the organic compound layers 103B, 103G, and 103R, which are formed by a photolithography method as described above, can be reduced to less than or equal to 8 μm, less than or equal to 5 μm, less than or equal to 3 μm, less than or equal to 2 μm, or less than or equal to 1 μm. Here, the distance can be determined, for example, by the distance between opposite edge portions of two adjacent layers among the organic compound layers 103B, 103G, and 103R. Reducing the distance between the island-shaped organic compound layers can provide a light-emitting apparatus having high resolution and a high aperture ratio. In addition, the distance between the first electrodes of adjacent light-emitting devices can also be shortened to be, for example, less than or equal to 10 μm, less than or equal to 8 μm, less than or equal to 5 μm, less than or equal to 3 μm, or less than or equal to 2 μm. Note that the distance between the first electrodes of adjacent light-emitting devices is preferably greater than or equal to 2 μm and less than or equal to 5 μm.

Figure 9A:
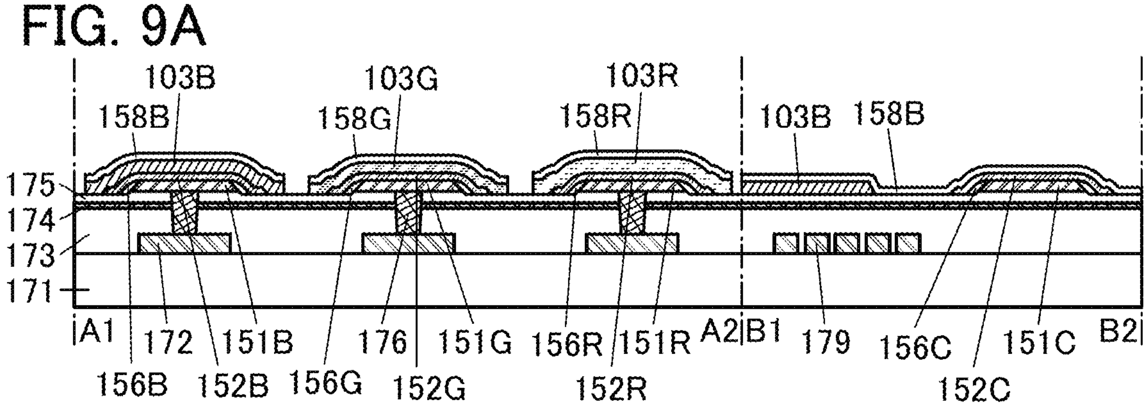
FIGS. 9A to 9C are cross-sectional views illustrating an example of a method for manufacturing a light-emitting apparatus.

Next, as illustrated in FIG. 9A, the mask layers 159B, 159G, and 159R are removed.

This embodiment describes an example where the mask layers 159B, 159G, and 159R are removed; however, the mask layers 159B, 159G, and 159R are not necessarily removed. For example, in the case where the mask layers 159B, 159G, and 159R contain the above-described material having a property of blocking ultraviolet rays, the procedure preferably proceeds to the next step without removing the mask layers 159B, 159G, and 159R, in which case the organic compound layers can be protected from light irradiation (including lighting).

The step of removing the mask layers can be performed by a method similar to that for the step of processing the mask films. Specifically, by using a wet etching method, damage applied to the organic compound layers 103B, 103G, and 103R at the time of removing the mask layers can be reduced as compared to the case of using a dry etching method.

The mask layers may be removed by being dissolved in a solvent such as water or an alcohol. Examples of an alcohol include ethyl alcohol, methyl alcohol, isopropyl alcohol (IPA), and glycerin.

After the mask layers are removed, drying treatment may be performed in order to remove water included in the organic compound layers 103B, 103G, and 103R and water adsorbed on surfaces of the organic compound layers 103B, 103G, and 103R. For example, heat treatment in an inert atmosphere or a reduced-pressure atmosphere can be performed. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 120° C. The heat treatment is preferably performed in a reduced-pressure atmosphere, in which case drying at a lower temperature is possible.

Figure 9B:
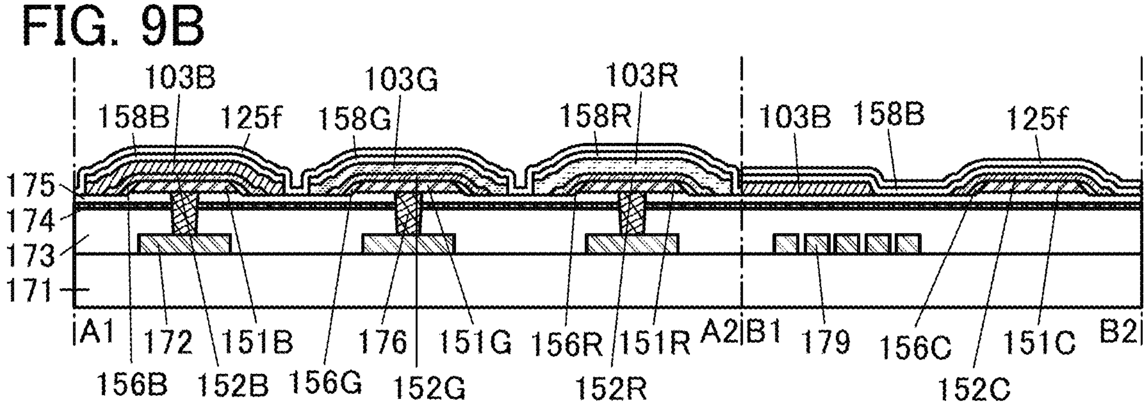

Next, as illustrated in FIG. 9B, the inorganic insulating film 125*f* to be the inorganic insulating layer 125 is formed to cover the organic compound layers 103B, 103G, and 103R and the sacrificial layers 158B, 158G, and 158R.

As described later, an insulating film to be the insulating layer 127 is formed in contact with the top surface of the inorganic insulating film 125*f*. Thus, the top surface of the inorganic insulating film 125*f* preferably has a high affinity for the material used for the insulating film to be the insulating layer 127 (e.g., a photosensitive resin composition containing an acrylic resin). To improve the affinity, surface treatment may be performed on the top surface of the inorganic insulating film 125*f*. Specifically, a surface of the inorganic insulating film 125*f* is preferably made hydrophobic (or its hydrophobic property is preferably improved). For example, it is preferable to perform the treatment using a silylation agent such as hexamethyldisilazane (HMDS). By making the top surface of the inorganic insulating film 125*f* hydrophobic in such a manner, an insulating film 127*f* can be formed with favorable adhesion.

Figure 9C:
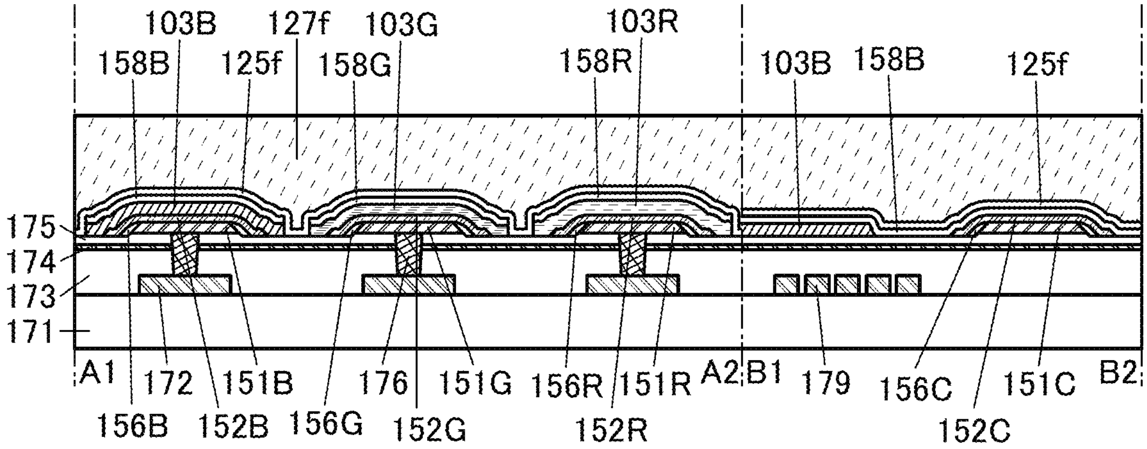

Then, as illustrated in FIG. 9C, an insulating film 127*f* to be the insulating layer 127 is formed over the inorganic insulating film 125*f*.

The inorganic insulating film 125*f* and the insulating film 127*f* are preferably formed by a formation method by which the organic compound layers 103B, 103G, and 103R are less damaged. The inorganic insulating film 125*f*, which is formed in contact with the side surfaces of the organic compound layers 103B, 103G, and 103R, is particularly preferably formed by a formation method that causes less damage to the organic compound layers 103B, 103G, and 103R than the method of forming the insulating film 127*f*.

Each of the inorganic insulating film 125*f* and the insulating film 127*f* is formed at a temperature lower than the upper temperature limit of the organic compound layers 103B, 103G, and 103R. When the inorganic insulating film 125*f* is formed at a high substrate temperature, the formed inorganic insulating film 125*f*, even with a small thickness, can have a low impurity concentration and a high barrier property against at least one of water and oxygen.

The substrate temperature at the time of forming the inorganic insulating film 125*f* and the insulating film 127*f* is preferably higher than or equal to 60° C., higher than or equal to 80° C., higher than or equal to 100° C., or higher than or equal to 120° C. and lower than or equal to 200° C., lower than or equal to 180° C., lower than or equal to 160° C., lower than or equal to 150° C., or lower than or equal to 140° C.

As the inorganic insulating film 125*f*, an insulating film having a thickness greater than or equal to 3 nm, greater than or equal to 5 nm, or greater than or equal to 10 nm and less than or equal to 200 nm, less than or equal to 150 nm, less than or equal to 100 nm, or less than or equal to 50 nm is preferably formed in the above-described range of the substrate temperature.

The inorganic insulating film 125*f* is preferably formed by an ALD method, for example. An ALD method is preferably used, in which case damage due to film formation is reduced and a film with good coverage can be formed. As the inorganic insulating film 125*f*, an aluminum oxide film is preferably formed by an ALD method, for example.

Alternatively, the inorganic insulating film 125*f* may be formed by a sputtering method, a CVD method, or a PECVD method, each of which has a higher deposition rate than an ALD method. In that case, a highly reliable light-emitting apparatus can be fabricated with high productivity.

The insulating film 127*f* is preferably formed by the aforementioned wet process. The insulating film 127*f* is preferably formed by spin coating using a photosensitive material, for example, and specifically preferably formed using a photosensitive resin composition containing an acrylic resin.

The insulating film 127*f* is preferably formed using a resin composition containing a polymer, an acid-generating agent, and a solvent, for example. The polymer is formed using one or more kinds of monomers and has a structure where one or more kinds of structural units (also referred to as building blocks) are repeated regularly or irregularly. As the acid-generating agent, one or both of a compound that generates an acid by light irradiation and a compound that generates an acid by heating can be used. The resin composition may also include one or more of a photosensitizing agent, a sensitizer, a catalyst, an adhesive aid, a surface-active agent, and an antioxidant.

Heat treatment (also referred to as prebaking) is preferably performed after the insulating film 127*f* is formed. The heat treatment is performed at a temperature lower than the upper temperature limit of the organic compound layers 103B, 103G, and 103R. The substrate temperature in the heat treatment is preferably higher than or equal to 50° C. and lower than or equal to 200° C., further preferably higher than or equal to 60° C. and lower than or equal to 150° C., still further preferably higher than or equal to 70° C. and lower than or equal to 120° C. Accordingly, the solvent contained in the insulating film 127*f* can be removed.

Then, part of the insulating film 127*f* is exposed to visible light or ultraviolet rays. Here, when a positive photosensitive resin composition containing an acrylic resin is used for the insulating film 127*f*, a region where the insulating layer 127 is not formed in a later step is irradiated with visible light or ultraviolet rays. The insulating layer 127 is formed in regions that are sandwiched between any two of the conductive layers 152B, 152G, and 152R and around the conductive layer 152C. Thus, the top surfaces of the conductive layers 152B, 152G, 152R, and 152C are irradiated with visible light or ultraviolet rays. Note that when a negative photosensitive material is used for the insulating film 127*f*, the region where the insulating layer 127 is to be formed is irradiated with visible light or ultraviolet rays.

The width of the insulating layer 127 formed later can be controlled in accordance with the exposed region of the insulating film 127*f*. In this embodiment, processing is performed such that the insulating layer 127 includes a portion overlapping with the top surface of the conductive layer 151.

Here, when a barrier insulating layer against oxygen (e.g., an aluminum oxide film) is provided as one or both of the sacrificial layer 158 (the sacrificial layers 158B, 158G, and 158R) and the inorganic insulating film 125*f*, diffusion of oxygen to the organic compound layers 103B, 103G, and 103R can be inhibited. When the organic compound layer is irradiated with light (visible light or ultraviolet rays), the organic compound contained in the organic compound layer is brought into an excited state and a reaction between the organic compound and oxygen in the atmosphere is promoted in some cases. Specifically, when the organic compound layer is irradiated with light (visible light or ultraviolet rays) in an atmosphere containing oxygen, oxygen might be bonded to the organic compound contained in the organic compound layer. By providing the sacrificial layer 158 and the inorganic insulating film 125*f* over the island-shaped organic compound layer, bonding of oxygen in the atmosphere to the organic compound contained in the organic compound layer can be inhibited.

Figure 10A:
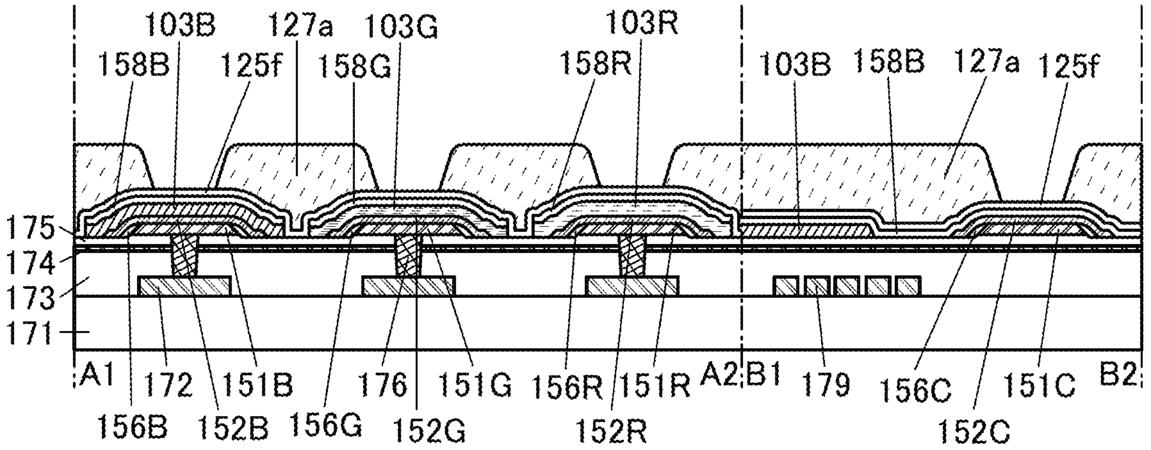
FIGS. 10A to 10C are cross-sectional views illustrating an example of a method for manufacturing a light-emitting apparatus.

Next, as illustrated in FIG. 10A, development is performed to remove the exposed region of the insulating film 127*f*, so that an insulating layer 127*a* is formed. The insulating layer 127*a* is formed in regions that are sandwiched between any two of the conductive layers 152B, 152G, and 152R and a region surrounding the conductive layer 152C. Here, when an acrylic resin is used for the insulating film 127*f*, an alkaline solution, such as TMAH, can be used as a developer.

Figure 10B:
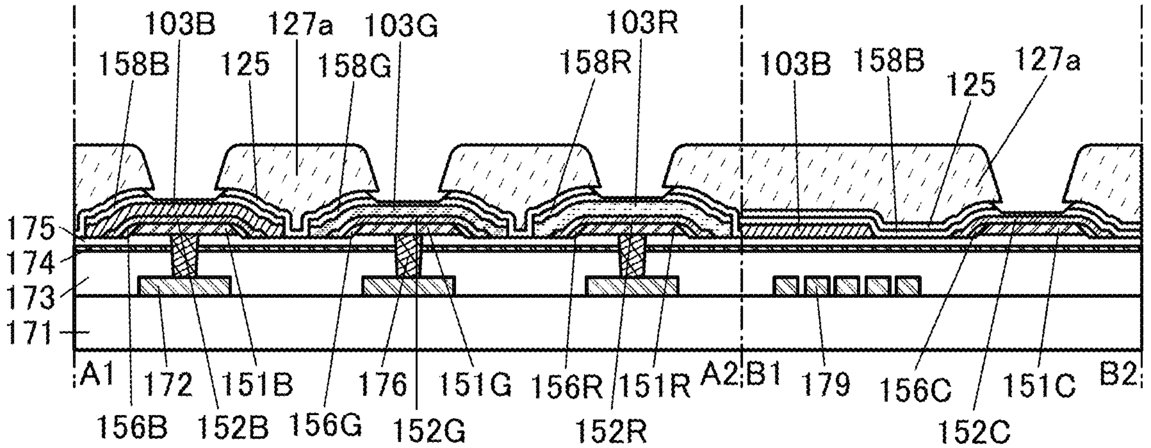

Next, as illustrated in FIG. 10B, etching treatment is performed with the insulating layer 127*a* as a mask to remove part of the inorganic insulating film 125*f* and reduce the thicknesses of parts of the sacrificial layers 158B, 158G, and 158R. Thus, the inorganic insulating layer 125 is formed under the insulating layer 127*a*. Note that the etching treatment for processing the inorganic insulating film 125*f* using the insulating layer 127*a* as a mask may be hereinafter referred to as first etching treatment.

In other words, the sacrificial layers 158B, 158G, and 158R are not removed completely by the first etching treatment, and the etching treatment is stopped when the thicknesses of the sacrificial layers 158B, 158G, and 158R are reduced. The sacrificial layers 158B, 158G, and 158R remain over the corresponding organic compound layers 103B, 103G, and 103R in this manner, whereby the organic compound layers 103B, 103G, and 103R can be prevented from being damaged by treatment in a later step.

The first etching treatment can be performed by dry etching or wet etching. Note that the inorganic insulating film 125*f* is preferably formed using a material similar to that of the sacrificial layers 158B, 158G, and 158R, in which case the processing of the inorganic insulating film 125*f* and thinning of the exposed part of the sacrificial layer 158 can be concurrently performed by the first etching treatment.

By etching using the insulating layer 127*a* with a tapered side surface as a mask, the side surface of the inorganic insulating layer 125 and upper edge portions of the side surfaces of the sacrificial layers 158B, 158G, and 158R can be made to have a tapered shape relatively easily.

In the case where the first etching treatment is performed by dry etching, for example, a chlorine-based gas can be used. As the chlorine-based gas, one of $Cl_2$, $BCl_3$, $SiCl_4$, $CCl_4$, and the like or a mixture of two or more of them can be used. Moreover, one of an oxygen gas, a hydrogen gas, a helium gas, an argon gas, and the like or a mixture of two or more of them can be added as appropriate to the chlorine-based gas. By the dry etching, the thin regions of the sacrificial layers 158B, 158G, and 158R can be formed with favorable in-plane uniformity.

The first etching treatment can be performed by wet etching, for example. The use of wet etching can reduce damage to the organic compound layers 103B, 103G, and 103R, as compared to the case of using dry etching.

The wet etching is preferably performed using an acidic chemical solution. As an acidic chemical solution, a chemical solution containing one of phosphoric acid, hydrofluoric acid, nitric acid, acetic acid, oxalic acid, sulfuric acid, and the like or a mixed chemical solution (also referred to as a mixed acid) that contains two or more of these acids is preferably used.

The wet etching can be performed using an alkaline solution. For instance, TMAH, which is an alkaline solution, can be used for the wet etching of an aluminum oxide film. In that case, puddle wet etching can be performed.

Figure 10C:
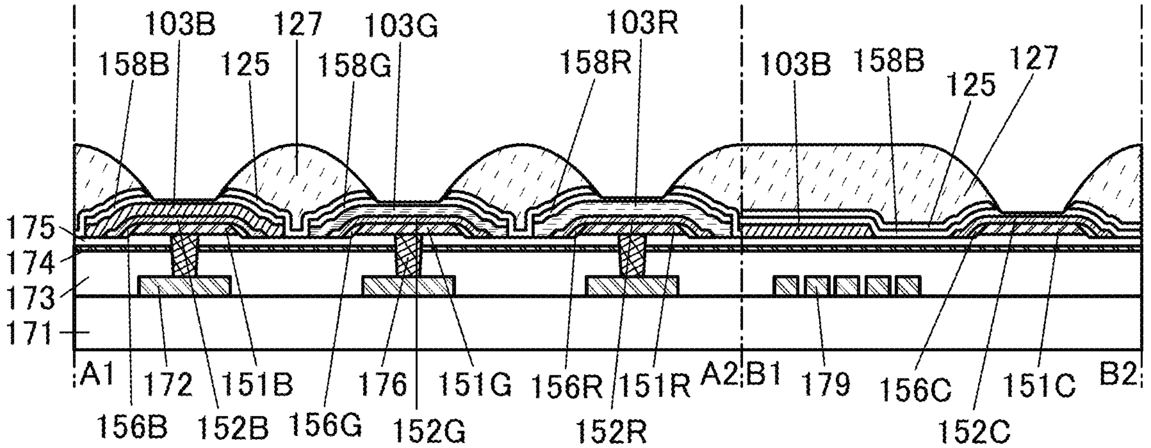

Then, heat treatment (also referred to as post-baking) is performed. The heat treatment can change the insulating layer 127*a* into the insulating layer 127 having a tapered side surface (FIG. 10C). The heat treatment is conducted at a temperature lower than the upper temperature limit of the organic compound layer. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 130° C. The heating atmosphere may be an air atmosphere or an inert atmosphere. Moreover, the heating atmosphere may be an atmospheric-pressure atmosphere or a reduced-pressure atmosphere. The substrate temperature in the heat treatment of this step is preferably higher than that in the heat treatment (prebaking) after the formation of the insulating film 127*f*.

The heat treatment can improve adhesion between the insulating layer 127 and the inorganic insulating layer 125 and increase corrosion resistance of the insulating layer 127. Furthermore, owing to the change in shape of the insulating layer 127*a*, an edge portion of the inorganic insulating layer 125 can be covered with the insulating layer 127.

When the sacrificial layers 158B, 158G, and 158R are not completely removed by the first etching treatment and the thinned sacrificial layers 158B, 158G, and 158R are left, the organic compound layers 103B, 103G, and 103R can be prevented from being damaged and deteriorating in the heat treatment. This increases the reliability of the light-emitting device.

Figure 11A:
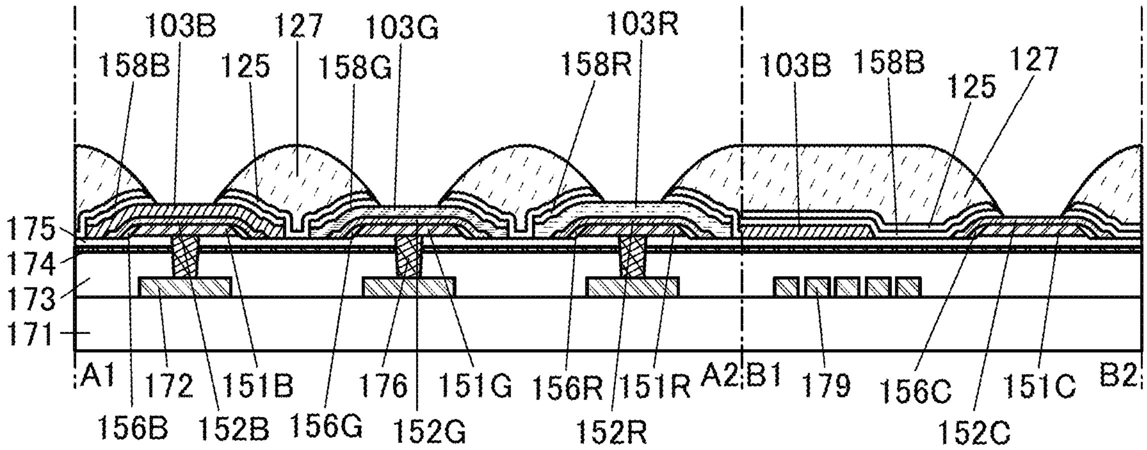
FIGS. 11A to 11C are cross-sectional views illustrating an example of a method for manufacturing a light-emitting apparatus.

Next, as illustrated in FIG. 11A, etching treatment is performed with the insulating layer 127 as a mask to remove parts of the sacrificial layers 158B, 158G, and 158R. At this time, part of the inorganic insulating layer 125 is also removed in some cases. By the etching treatment, openings are formed in the sacrificial layers 158B, 158G, and 158R, and the top surfaces of the organic compound layers 103B, 103G, and 103R and the conductive layer 152C are exposed in the openings. Note that the etching treatment for exposing the organic compound layers 103B, 103G, and 103R using the insulating layer 127 as a mask may be hereinafter referred to as second etching treatment.

The second etching treatment is performed by wet etching. The use of wet etching can reduce damage to the organic compound layers 103B, 103G, and 103R, as compared to the case of using dry etching. The wet etching can be performed using an acidic chemical solution or an alkaline solution as in the first etching treatment.

Heat treatment may be performed after the organic compound layers 103B, 103G, and 103R are partly exposed. By the heat treatment, water included in the organic compound layer and water adsorbed on a surface of the organic compound layer, for example, can be removed. The shape of the insulating layer 127 may be changed by the heat treatment. Specifically, the insulating layer 127 may be widened to cover at least one of the edge portion of the inorganic insulating layer 125, the edge portions of the sacrificial layers 158B, 158G, and 158R, and the top surfaces of the organic compound layers 103B, 103G, and 103R.

FIG. 11A illustrates an example in which part of the edge portion of the sacrificial layer 158G (specifically a tapered portion formed by the first etching treatment) is covered with the insulating layer 127 and a tapered portion formed by the second etching treatment is exposed (see FIG. 4A).

The insulating layer 127 may cover the entire edge portion of the sacrificial layer 158G. For example, an edge portion of the insulating layer 127 may droop to cover the edge portion of the sacrificial layer 158G. For another example, the edge portion of the insulating layer 127 may be in contact with the top surface of at least one of the organic compound layers 103B, 103G, and 103R.

Figure 11B:
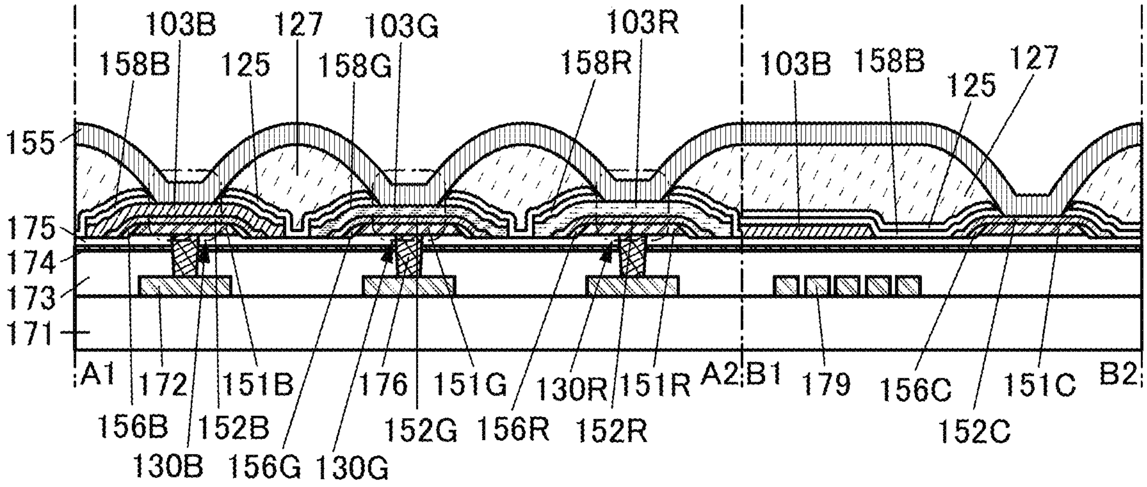

Next, as illustrated in FIG. 11B, a common electrode 155 is formed over the organic compound layers 103B, 103G, and 103R, the conductive layer 152C, and the insulating layer 127. The common electrode 155 can be formed by a sputtering method, a vacuum evaporation method, or the like. Alternatively, the common electrode 155 may be formed by stacking a film formed by an evaporation method and a film formed by a sputtering method.

Figure 11C:
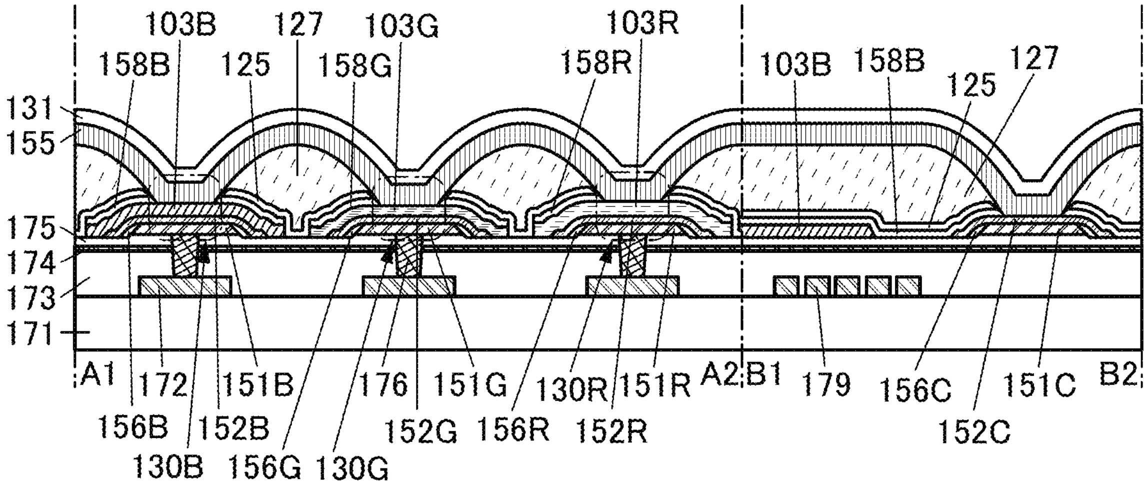

Next, as illustrated in FIG. 11C, the protective layer 131 is formed over the common electrode 155. The protective layer 131 can be formed by a vacuum evaporation method, a sputtering method, a CVD method, an ALD method, or the like.

Then, the substrate 120 is bonded over the protective layer 131 using the resin layer 122, so that the light-emitting apparatus can be fabricated. In the method for fabricating the light-emitting apparatus of one embodiment of the present invention, the insulating layer 156 is formed to include a region overlapping with the side surface of the conductive layer 151 and the conductive layer 152 is formed to cover the conductive layer 151 and the insulating layer 156 as described above. This can increase the yield of the light-emitting apparatus and inhibit generation of defects.

As described above, in the method for fabricating the light-emitting apparatus of one embodiment of the present invention, the island-shaped organic compound layers 103B, 103G, and 103R are formed not by using a fine metal mask but by processing a film formed on the entire surface; thus, the island-shaped layers can be formed to have a uniform thickness. Consequently, a high-resolution light-emitting apparatus or a light-emitting apparatus with a high aperture ratio can be obtained. Furthermore, even when the resolution or the aperture ratio is high and the distance between the subpixels is extremely short, the organic compound layers 103B, 103G, and 103R can be inhibited from being in contact with each other in the adjacent subpixels. As a result, generation of a leakage current between the subpixels can be inhibited. This can prevent crosstalk, so that a light-emitting apparatus with extremely high contrast can be obtained. Moreover, even a light-emitting apparatus that includes tandem light-emitting devices formed by a photolithography method can have favorable characteristics.

Embodiment 3

In this embodiment, the light-emitting apparatus of one embodiment of the present invention will be described with reference to FIGS. 12A to 12G and FIGS. 13A to 13I.

[Pixel Layout]

In this embodiment, pixel layouts different from that in FIGS. 4A and 4B will be mainly described. There is no particular limitation on the arrangement of subpixels, and a variety of methods can be employed. Examples of the arrangement of subpixels include stripe arrangement, S-stripe arrangement, matrix arrangement, delta arrangement, Bayer arrangement, and PenTile arrangement.

In this embodiment, the top surface shapes of the subpixels shown in the diagrams correspond to top surface shapes of light-emitting regions.

Examples of a top surface shape of the subpixel include polygons such as a triangle, a tetragon (including a rectangle and a square), and a pentagon; these polygons with rounded corners; an ellipse; and a circle.

The circuit constituting the subpixel is not necessarily placed within the dimensions of the subpixel illustrated in the diagrams and may be placed outside the subpixel.

Figure 12A:
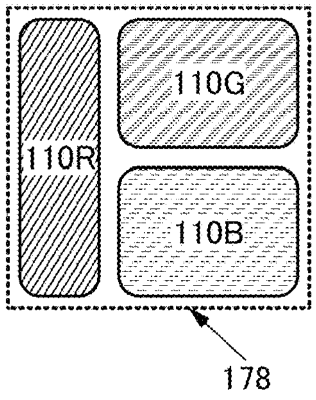
FIGS. 12A to 12G are top views each illustrating a structure example of a pixel.

The pixel 178 illustrated in FIG. 12A employs S-stripe arrangement. The pixel 178 illustrated in FIG. 12A includes three subpixels, the subpixel 110R, the subpixel 110G, and the subpixel 110B.

Figure 12B:
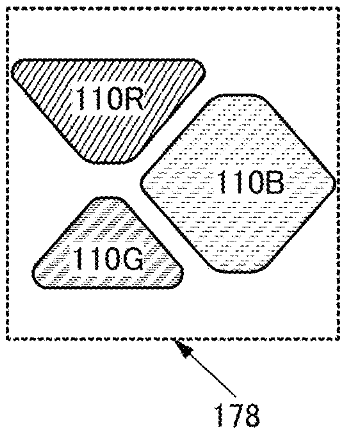

The pixel 178 illustrated in FIG. 12B includes the subpixel 110R whose top 30 surface has a rough trapezoidal shape with rounded corners, the subpixel 110G whose top surface has a rough triangle shape with rounded corners, and the subpixel 110B whose top surface has a rough tetragonal or rough hexagonal shape with rounded corners. The subpixel 110R has a larger light-emitting area than the subpixel 110G. In this manner, the shapes and sizes of the subpixels can be determined independently. For example, the size of a subpixel including a light-emitting device with higher reliability can be smaller.

Figure 12C:
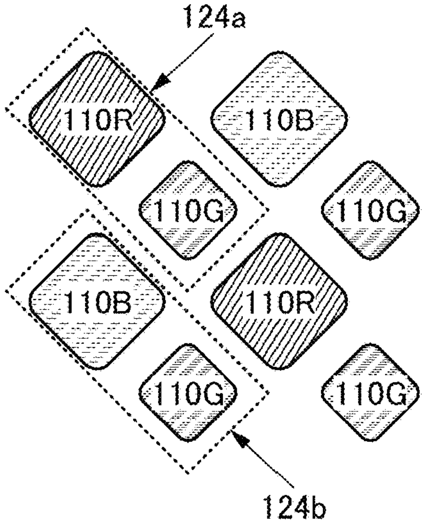

Pixels 124*a* and 124*b* illustrated in FIG. 12C employ PenTile arrangement. FIG. 12C illustrates an example in which the pixels 124*a* including the subpixels 110R and 110G and the pixels 124*b* including the subpixels 110G and 110B are alternately arranged.

Figure 12D:
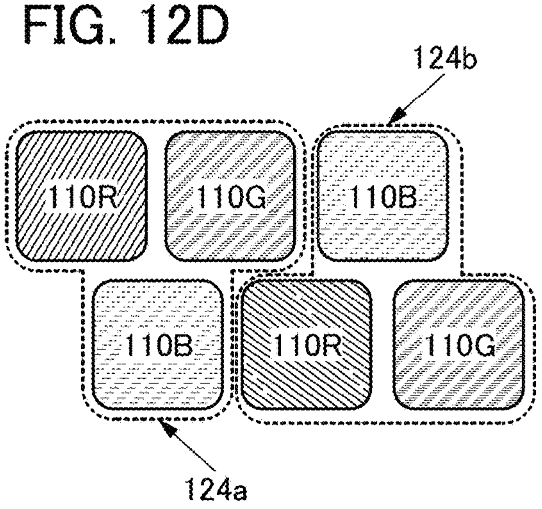
Figure 12E:
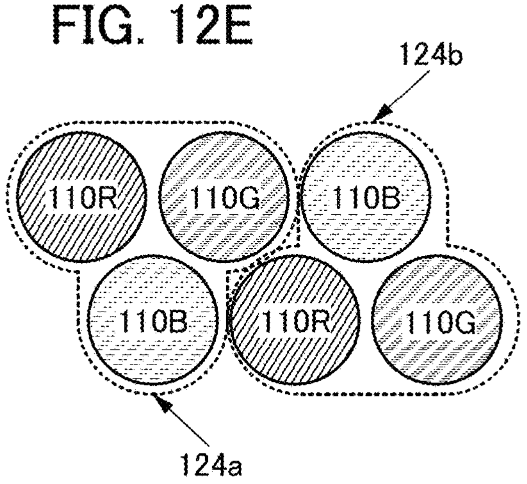
Figure 12F:
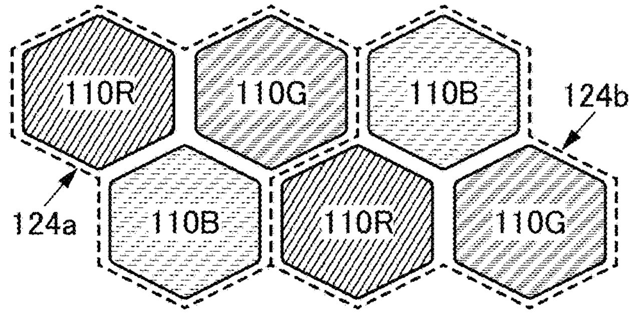

The pixels 124*a* and 124*b* illustrated in FIGS. 12D to 12F employ delta arrangement. The pixel 124*a* includes two subpixels (the subpixels 110R and 110G) in the upper row (first row) and one subpixel (the subpixel 110B) in the lower row (second row). The pixel 124*b* includes one subpixel (the subpixel 110B) in the upper row (first row) and two subpixels (the subpixels 110R and 110G) in the lower row (second row).

FIG. 12D illustrates an example where the top surface of each subpixel has a rough tetragonal shape with rounded corners. FIG. 12E illustrates an example where the top surface of each subpixel is circular. FIG. 12F illustrates an example where the top surface of each subpixel has a rough hexagonal shape with rounded corners.

In FIG. 12F, each subpixel is placed inside one of close-packed hexagonal regions. Focusing on one of the subpixels, the subpixel is placed so as to be surrounded by six subpixels. The subpixels are arranged such that subpixels that emit light of the same color are not adjacent to each other. For example, focusing on the subpixel 110R, the subpixel 110R is surrounded by three subpixels 110G and three subpixels 110B that are alternately arranged.

Figure 12G:
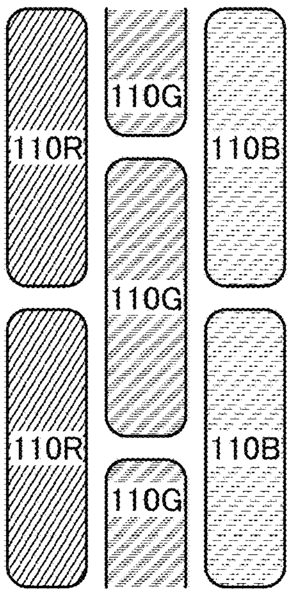

FIG. 12G illustrates an example where subpixels of different colors are arranged in a zigzag manner. Specifically, the positions of the top sides of two subpixels arranged in the row direction (e.g., the subpixels 110R and 110G or the subpixels 110G and 1101B) are not aligned in the top view.

In the pixels illustrated in FIGS. 12A to 12G, for example, it is preferable that the subpixel 110R be a subpixel R that emits red light, the subpixel 110G be a subpixel G that emits green light, and the subpixel 110B be a subpixel B that emits blue light. Note that the structures of the subpixels are not limited thereto, and the colors and the order of the subpixels can be determined as appropriate. For example, the subpixel 110G may be the subpixel R that emits red light, and the subpixel 110R may be the subpixel G that emits green light.

In a photolithography method, as a pattern to be formed by processing becomes finer, the influence of light diffraction becomes more difficult to ignore; therefore, the fidelity in transferring a photomask pattern by light exposure is degraded, and it becomes difficult to process a resist mask into a desired shape. Thus, a pattern with rounded corners is likely to be formed even with a rectangular photomask pattern. Consequently, the top surface of a subpixel may have a polygonal shape with rounded corners, an elliptical shape, a circular shape, or the like.

Furthermore, in the method for fabricating the light-emitting apparatus of one embodiment of the present invention, the organic compound layer is processed into an island shape with the use of a resist mask. A resist film formed over the organic compound layer needs to be cured at a temperature lower than the upper temperature limit of the organic compound layer. Therefore, the resist film is insufficiently cured in some cases depending on the upper temperature limit of the material of the organic compound layer and the curing temperature of the resist material. An insufficiently cured resist film may have a shape different from a desired shape by processing. As a result, the top surface of the organic compound layer may have a polygonal shape with rounded corners, an elliptical shape, a circular shape, or the like. For example, when a resist mask with a square top surface is intended to be formed, a resist mask with a circular top surface may be formed, and the top surface of the organic compound layer may be circular.

To obtain a desired top surface shape of the organic compound layer, a technique of correcting a mask pattern in advance so that a transferred pattern agrees with a design pattern (an optical proximity correction (OPC) technique) may be used. Specifically, with the OPC technique, a pattern for correction is added to a corner portion of a figure on a mask pattern, for example.

As illustrated in FIGS. 13A to 13I, the pixel can include four types of subpixels.

Figure 13A:
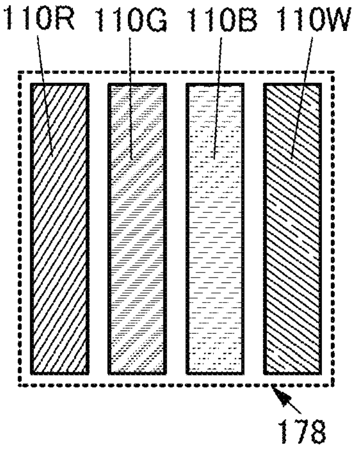
FIGS. 13A to 13I are top views each illustrating a structure example of a pixel.
Figure 13B:
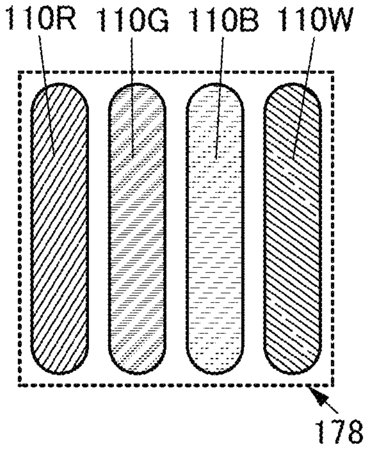
Figure 13C:
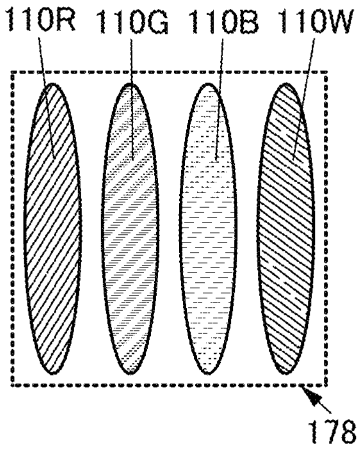

The pixels 178 illustrated in FIGS. 13A to 13C employ stripe arrangement.

FIG. 13A illustrates an example where each subpixel has a rectangular top surface shape. FIG. 13B illustrates an example where each subpixel has a top surface shape formed by combining two half circles and a rectangle. FIG. 13C illustrates an example where each subpixel has an elliptical top surface shape.

Figure 13D:
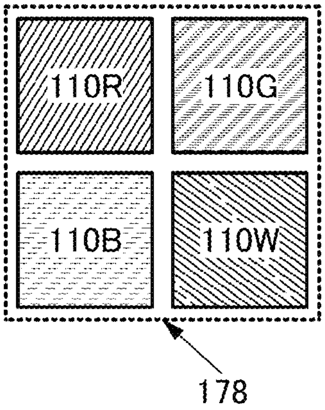
Figure 13E:
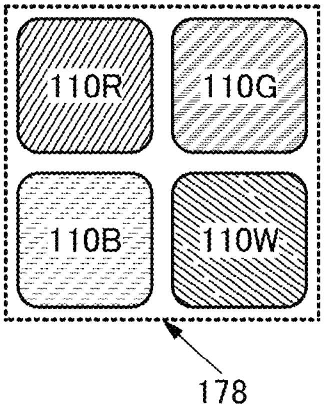
Figure 13F:
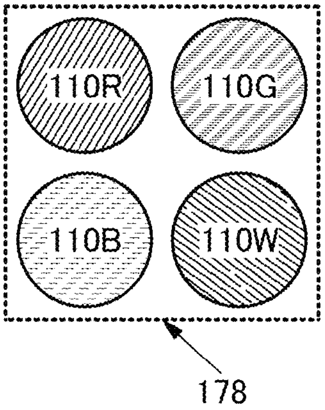

The pixels 178 illustrated in FIGS. 13D to 13F employ matrix arrangement.

FIG. 13D illustrates an example where each subpixel has a square top surface shape. FIG. 13E illustrates an example where each subpixel has a substantially square top surface shape with rounded corners. FIG. 13F illustrates an example where each subpixel has a circular top surface shape.

Figure 13G:
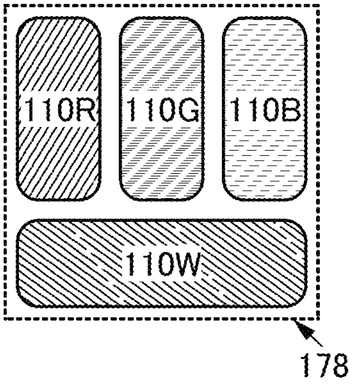
Figure 13H:
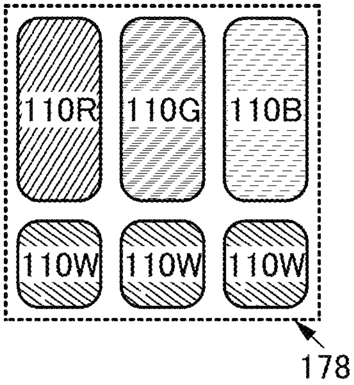

FIGS. 13G and 13H each illustrate an example where one pixel 178 is composed of two rows and three columns.

The pixel 178 illustrated in FIG. 13G includes three subpixels (the subpixels 110R, 110G, and 110B) in the upper row (first row) and one subpixel (a subpixel 110W) in the lower row (second row). In other words, the pixel 178 includes the subpixel 110R in the left column (first column), the subpixel 110G in the middle column (second column), the subpixel 110B in the right column (third column), and the subpixel 110W across these three columns.

The pixel 178 illustrated in FIG. 13H includes three subpixels (the subpixels 110R, 110G, and 110B) in the upper row (first row) and three of the subpixels 110W in the lower row (second row). In other words, the pixel 178 includes the subpixels 110R and 110W in the left column (first column), the subpixels 110G and 110W in the middle column (second column), and the subpixels 110B and 110W in the right column (third column). Matching the positions of the subpixels in the upper row and the lower row as illustrated in FIG. 13H enables dust that would be produced in the fabrication process, for example, to be removed efficiently. Thus, a light-emitting apparatus having high display quality can be provided.

In the pixel 178 illustrated in FIGS. 13G and 13H, the subpixels 110R, 110G, and 110B are arranged in a stripe pattern, whereby the display quality can be improved.

Figure 13I:
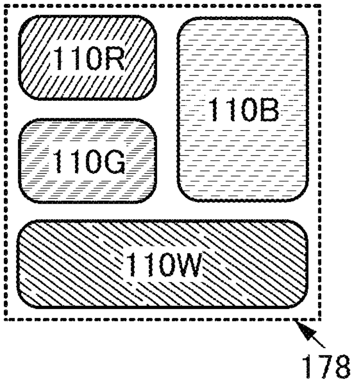

FIG. 13I illustrates an example where one pixel 178 is composed of three rows and two columns.

The pixel 178 illustrated in FIG. 13I includes the subpixel 110R in the upper row (first row), the subpixel 110G in the middle row (second row), the subpixel 110B across the first row and the second row, and one subpixel (the subpixel 110W) in the lower row (third row). In other words, the pixel 178 includes the subpixels 110R and 110G in the left column (first column), the subpixel 110B in the right column (second column), and the subpixel 110W across these two columns.

In the pixel 178 illustrated in FIG. 13I, the subpixels 110R, 110G, and 110B are arranged in what is called an S-stripe pattern, whereby the display quality can be improved.

The pixel 178 illustrated in each of FIGS. 13A to 13I is composed of four subpixels, which are the subpixels 110R, 110G, 110B, and 110W. For example, the subpixel 110R can be a subpixel that emits red light, the subpixel 110G can be a subpixel that emits green light, the subpixel 110B can be a subpixel that emits blue light, and the subpixel 110W can be a subpixel that emits white light. Note that at least one of the subpixels 110R, 110G, 110B, and 110W may be a subpixel that emits cyan light, magenta light, yellow light, or near-infrared light.

As described above, the pixel composed of the subpixels each including the light-emitting device can employ any of a variety of layouts in the light-emitting apparatus of one embodiment of the present invention.

This embodiment can be combined as appropriate with the other embodiments or examples. In this specification, in the case where a plurality of structure examples are shown in one embodiment, the structure examples can be combined as appropriate.

Embodiment 4

In this embodiment, a light-emitting apparatus of one embodiment of the present invention will be described.

The light-emitting apparatus in this embodiment can be a high-resolution light-emitting apparatus. Thus, the light-emitting apparatus in this embodiment can be used for display portions of information terminals (wearable devices) such as watch-type and bracelet-type information terminals and display portions of wearable devices capable of being worn on a head, such as a VR device like a head mounted display (HMD) and a glasses-type AR device.

The light-emitting apparatus in this embodiment can be a high-definition light-emitting apparatus or a large-sized light-emitting apparatus. Accordingly, the light-emitting apparatus in this embodiment can be used for display portions of a digital camera, a digital video camera, a digital photo frame, a mobile phone, a portable game console, a portable information terminal, and an audio reproducing device, in addition to display portions of electronic appliances with a relatively large screen, such as a television device, desktop and notebook personal computers, a monitor of a computer and the like, digital signage, and a large game machine such as a pachinko machine.

[Display Module]

Figure 14A:
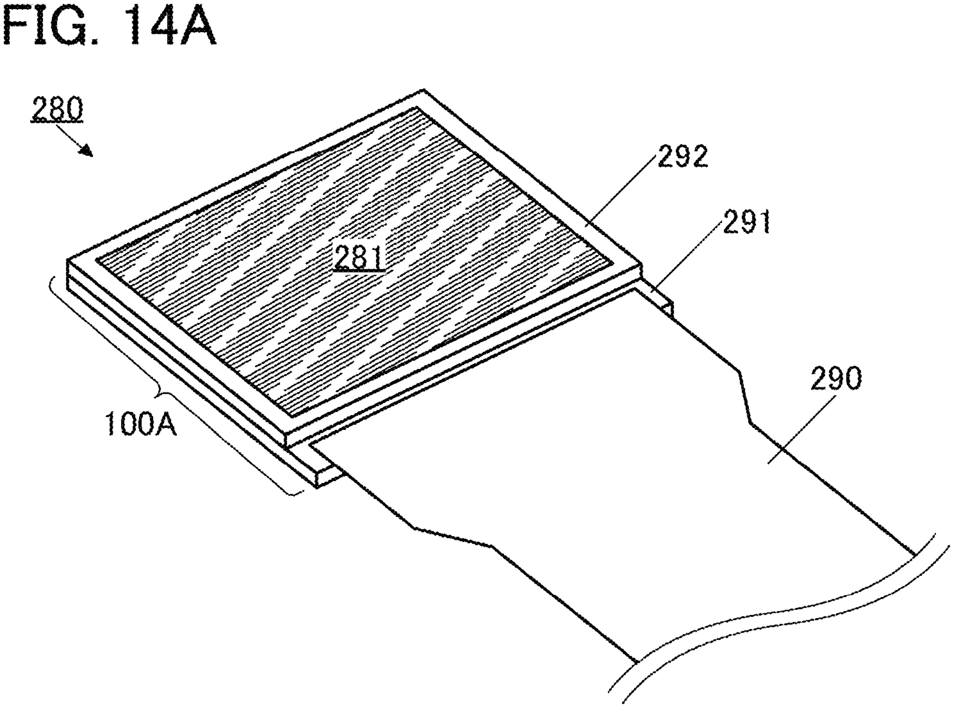
FIGS. 14A and 14B are perspective views illustrating a structure example of a display module.

FIG. 14A is a perspective view of a display module 280. The display module 280 includes a light-emitting apparatus 100A and an FPC 290. Note that the light-emitting apparatus included in the display module 280 is not limited to the light-emitting apparatus 100A and may be any of light-emitting apparatuses 100B and 100C described later.

The display module 280 includes a substrate 291 and a substrate 292. The display module 280 includes a display portion 281. The display portion 281 is a region of the display module 280 where an image is displayed, and is a region where light emitted from pixels provided in a pixel portion 284 described later can be seen.

Figure 14B:
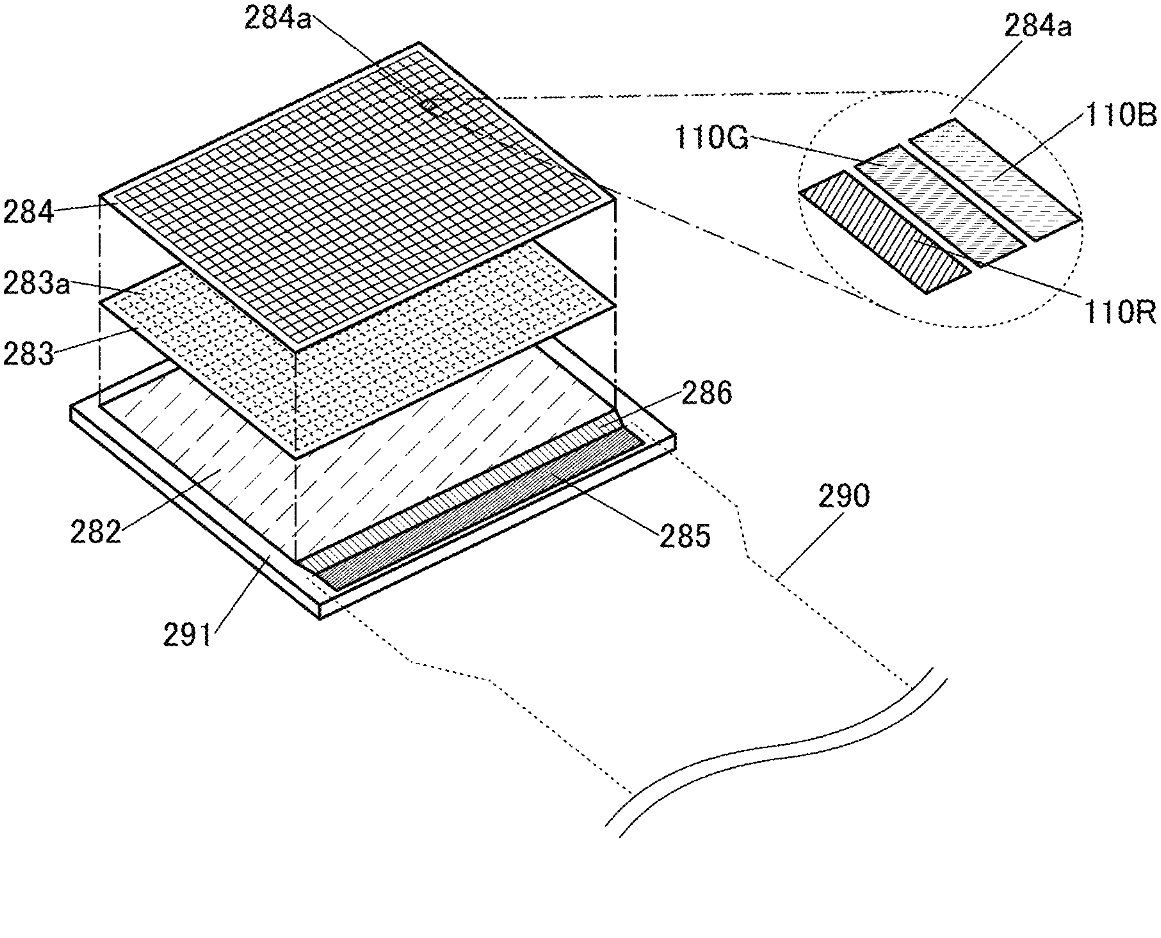

FIG. 14B is a perspective view schematically illustrating the structure on the substrate 291 side. Over the substrate 291, a circuit portion 282, a pixel circuit portion 283 over the circuit portion 282, and the pixel portion 284 over the pixel circuit portion 283 are stacked. In addition, a terminal portion 285 for connection to the FPC 290 is included in a portion not overlapping with the pixel portion 284 over the substrate 291. The terminal portion 285 and the circuit portion 282 are electrically connected to each other through a wiring portion 286 formed of a plurality of wirings.

The pixel portion 284 includes a plurality of pixels 284*a* arranged periodically. An enlarged view of one pixel 284*a* is illustrated on the right side in FIG. 14B. The pixels 284*a* can employ any of the structures described in the above embodiments. FIG. 14B illustrates an example where the pixel 284*a* has a structure similar to that of the pixel 178 illustrated in FIGS. 3A and 3B.

The pixel circuit portion 283 includes a plurality of pixel circuits 283*a* arranged periodically.

One pixel circuit 283*a* is a circuit that controls driving of a plurality of elements included in one pixel 284*a*. One pixel circuit 283*a* can be provided with three circuits each of which controls light emission of one light-emitting device. For example, the pixel circuit 283*a* can include at least one selection transistor, one current control transistor (driving transistor), and a capacitor for one light-emitting device. A gate signal is input to a gate of the selection transistor, and a video signal is input to a source or a drain of the selection transistor. With such a structure, an active-matrix light-emitting apparatus is obtained.

The circuit portion 282 includes a circuit for driving the pixel circuits 283*a* in the pixel circuit portion 283. For example, the circuit portion 282 preferably includes one or both of a gate line driver circuit and a source line driver circuit. The circuit portion 282 may also include at least one of an arithmetic circuit, a memory circuit, a power supply circuit, and the like.

The FPC 290 functions as a wiring for supplying a video signal, a power supply potential, or the like to the circuit portion 282 from the outside. An IC may be mounted on the FPC 290.

The display module 280 can have a structure in which one or both of the pixel circuit portion 283 and the circuit portion 282 are stacked below the pixel portion 284; hence, the aperture ratio (effective display area ratio) of the display portion 281 can be significantly high. For example, the aperture ratio of the display portion 281 can be higher than or equal to 40% and lower than 100%, preferably higher than or equal to 50% and lower than or equal to 95%, further preferably higher than or equal to 60% and lower than or equal to 95%. Furthermore, the pixels 284*a* can be arranged extremely densely and thus the display portion 281 can have significantly high resolution. For example, the pixels 284*a* are preferably arranged in the display portion 281 with a resolution higher than or equal to 2000 ppi, further preferably higher than or equal to 3000 ppi, still further preferably higher than or equal to 5000 ppi, yet still further preferably higher than or equal to 6000 ppi, and lower than or equal to 20000 ppi or lower than or equal to 30000 ppi.

Such a display module 280 has extremely high resolution, and thus can be suitably used for a VR device such as an HMD or a glasses-type AR device. For example, even in the case of a structure in which the display portion of the display module 280 is seen through a lens, pixels of the extremely-high-resolution display portion 281 included in the display module 280 are prevented from being recognized when the display portion is enlarged by the lens, so that display providing a high sense of immersion can be performed. Without being limited thereto, the display module 280 can be suitably used for electronic appliances including a relatively small display portion. For example, the display module 280 can be favorably used in a display portion of a wearable electronic appliance, such as a wrist watch.

[Light-Emitting Apparatus 100A]

Figure 15A:
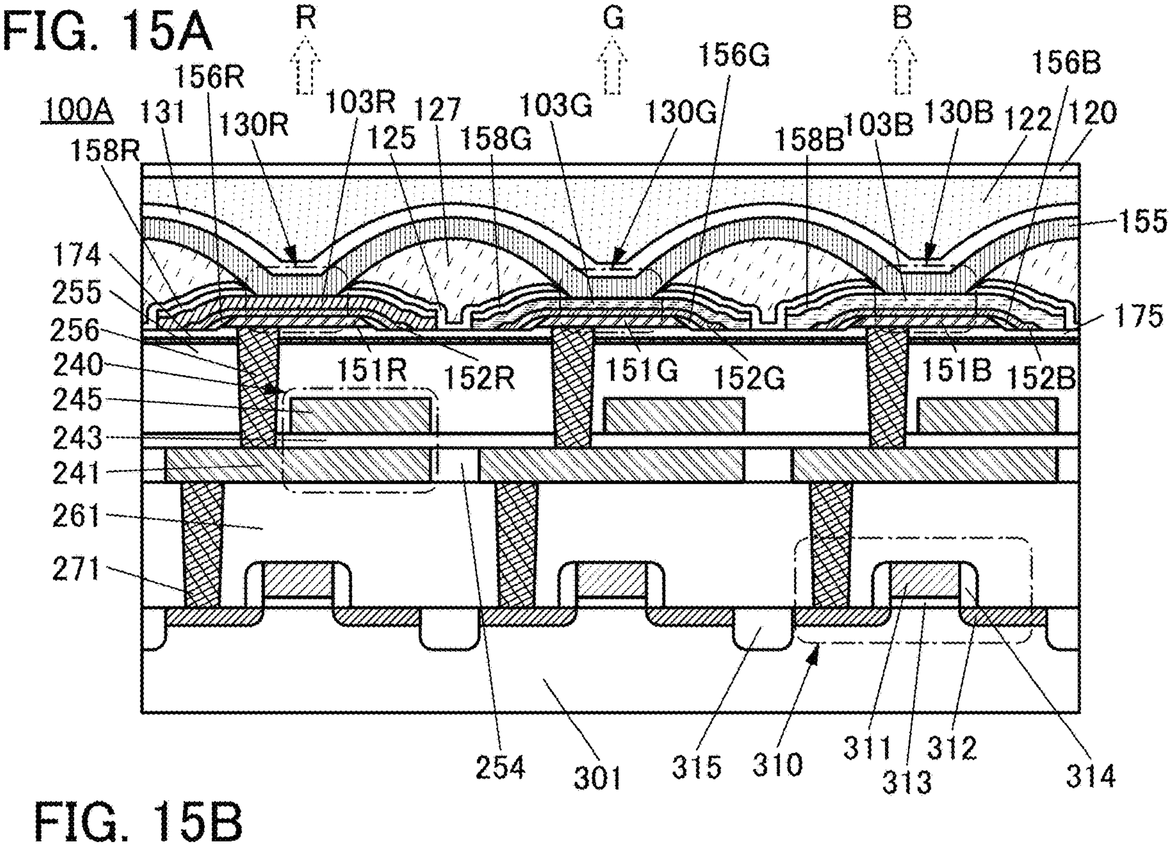
FIGS. 15A and 15B are cross-sectional views each illustrating a structure example of a light-emitting apparatus.

The light-emitting apparatus 100A illustrated in FIG. 15A includes a substrate 301, the light-emitting devices 130R, 130G, and 130B, a capacitor 240, and a transistor 310.

The substrate 301 corresponds to the substrate 291 in FIGS. 14A and 14B. The transistor 310 includes a channel formation region in the substrate 301. As the substrate 301, a semiconductor substrate such as a single crystal silicon substrate can be used, for example. The transistor 310 includes part of the substrate 301, a conductive layer 311, a low-resistance region 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as a source or a drain. The insulating layer 314 is provided to cover the side surface of the conductive layer 311.

An element isolation layer 315 is provided between two adjacent transistors 310 to be embedded in the substrate 301.

An insulating layer 261 is provided to cover the transistor 310, and the capacitor 240 is provided over the insulating layer 261.

The capacitor 240 includes a conductive layer 241, a conductive layer 245, and an insulating layer 243 between the conductive layers 241 and 245. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

An insulating layer 255 is provided to cover the capacitor 240. The insulating layer 174 is provided over the insulating layer 255. The insulating layer 175 is provided over the insulating layer 174. The light-emitting devices 130R, 130G, and 130B are provided over the insulating layer 175. FIG. 15A illustrates an example in which the light-emitting devices 130R, 130G, and 130B each have the stacked-layer structure illustrated in FIG. 4B. An insulator is provided in regions between adjacent light-emitting devices. For example, in FIG. 15A, the inorganic insulating layer 125 and the insulating layer 127 over the inorganic insulating layer 125 are provided in those regions.

The insulating layer 156R is provided to include a region overlapping with the side surface of the conductive layer 151R of the light-emitting device 130R. The insulating layer 156G is provided to include a region overlapping with the side surface of the conductive layer 151G of the light-emitting device 130G. The insulating layer 156B is provided to include a region overlapping with the side surface of the conductive layer 151B of the light-emitting device 130B. The conductive layer 152R is provided to cover the conductive layer 151R and the insulating layer 156R. The conductive layer 152G is provided to cover the conductive layer 151G and the insulating layer 156G. The conductive layer 152B is provided to cover the conductive layer 151B and the insulating layer 156B. The sacrificial layer 158R is positioned over the organic compound layer 103R of the light-emitting device 130R. The sacrificial layer 158G is positioned over the organic compound layer 103G of the light-emitting device 130G. The sacrificial layer 158B is positioned over the organic compound layer 103B of the light-emitting device 130B.

Each of the conductive layers 151R, 151G, and 151B is electrically connected to one of the source and the drain of the corresponding transistor 310 through a plug 256 embedded in the insulating layers 243, 255, 174, and 175, the conductive layer 241 embedded in the insulating layer 254, and the plug 271 embedded in the insulating layer 261. The top surface of the insulating layer 175 and the top surface of the plug 256 are level with or substantially level with each other. Any of a variety of conductive materials can be used for the plugs.

The protective layer 131 is provided over the light-emitting devices 130R, 130G, and 130B. The substrate 120 is bonded to the protective layer 131 with the resin layer 122. Embodiment 2 can be referred to for the details of the light-emitting device 130 and the components thereover up to the substrate 120. The substrate 120 corresponds to the substrate 292 in FIG. 14A.

Figure 15B:
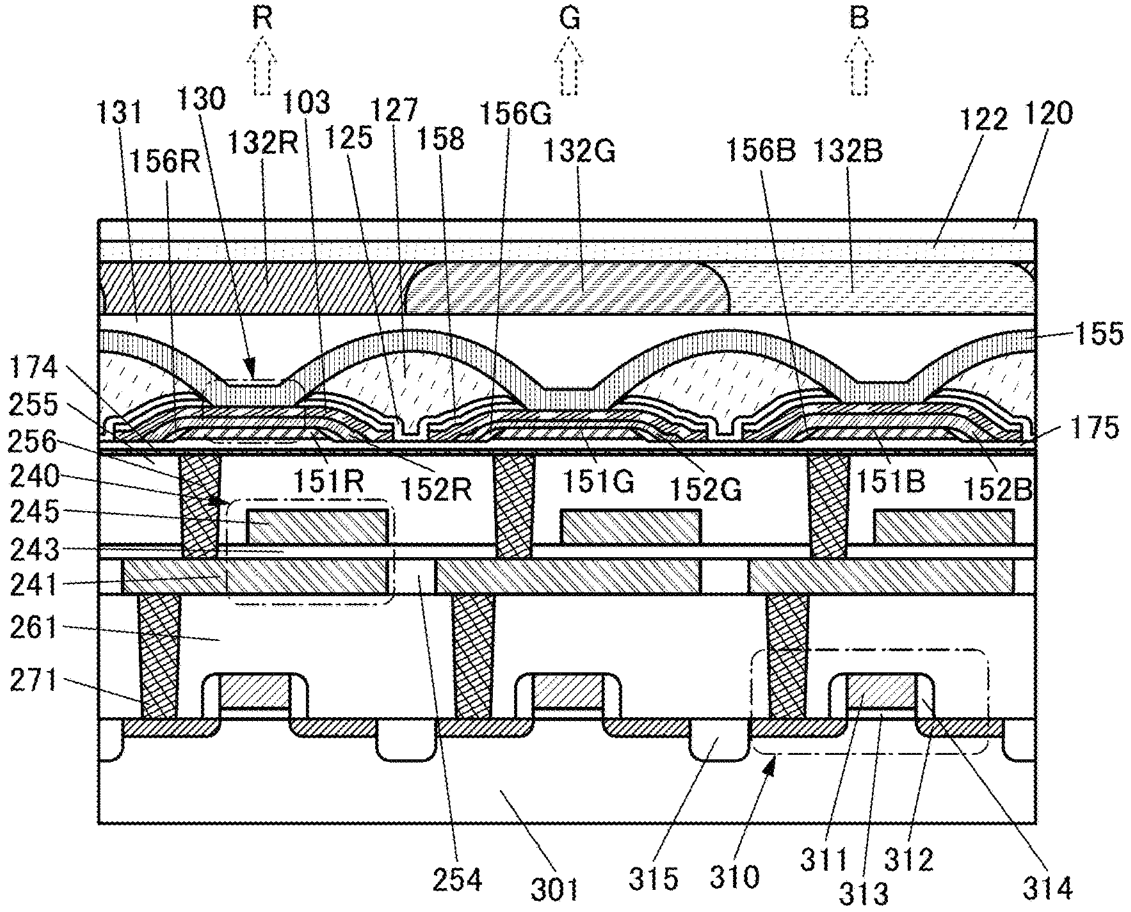

FIG. 15B illustrates a variation example of the light-emitting apparatus 100A illustrated in FIG. 15A. The light-emitting apparatus illustrated in FIG. 15B includes the coloring layers 132R, 132G, and 132B, and each of the light-emitting devices 130 includes a region overlapping with one of the coloring layers 132R, 132G, and 132B. In the light-emitting apparatus illustrated in FIG. 15B, the light-emitting device 130 can emit white light, for example. For example, the coloring layer 132R, the coloring layer 132G, and the coloring layer 132B can transmit red light, green light, and blue light, respectively.

[Light-Emitting Apparatus 100B]

Figure 16:
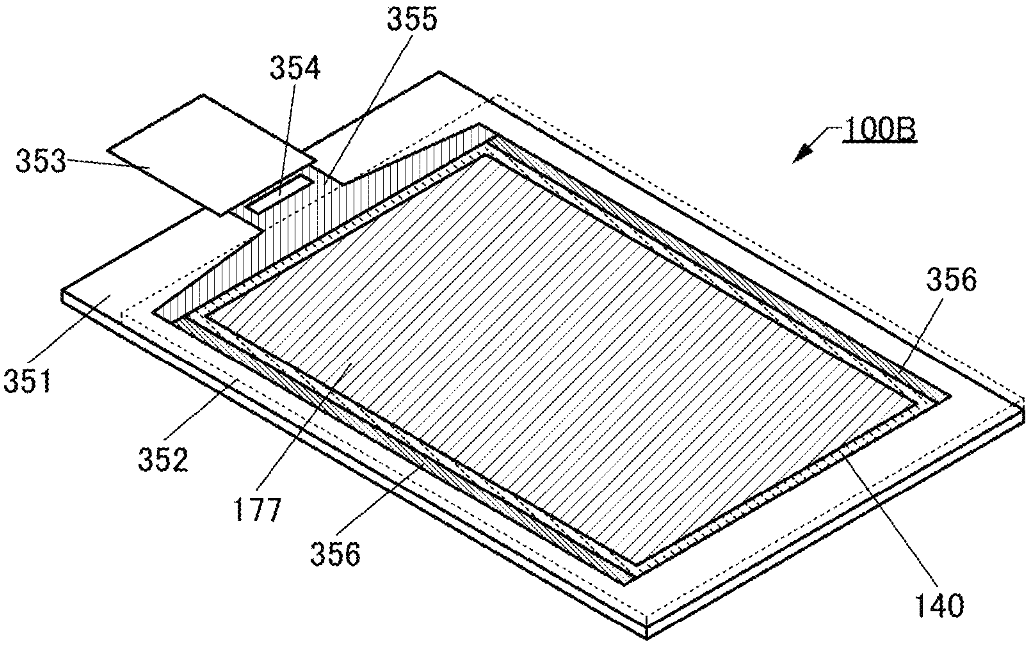
FIG. 16 is a perspective view illustrating a structure example of a light-emitting apparatus.
Figures 17A, 17B, 17C:
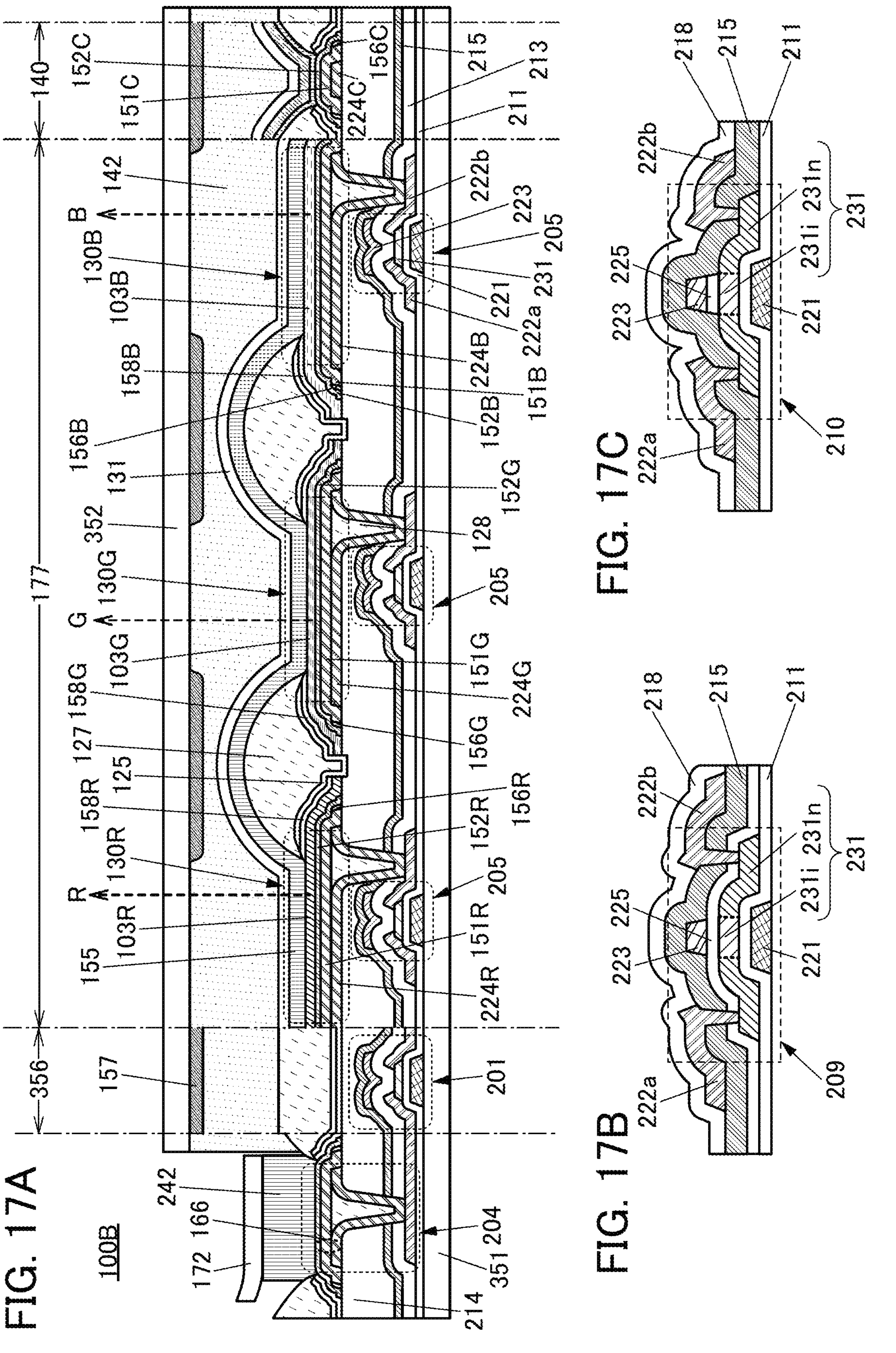
FIG. 17A is a cross-sectional view illustrating a structure example of a light-emitting apparatus.
FIGS. 17B and 17C are cross-sectional views each illustrating a structure example of a transistor.

FIG. 16 is a perspective view of the light-emitting apparatus 100B, and FIG. 17A is a cross-sectional view of the light-emitting apparatus 100B.

In the light-emitting apparatus 100B, a substrate 352 and a substrate 351 are bonded to each other. In FIG. 16, the substrate 352 is denoted by a dashed line.

The light-emitting apparatus 100B includes the pixel portion 177, the connection portion 140, a circuit 356, a wiring 355, and the like. FIG. 16 illustrates an example in which an IC 354 and an FPC 353 are mounted on the light-emitting apparatus 100B. Thus, the structure illustrated in FIG. 16 can be regarded as a display module including the light-emitting apparatus 100B, the integrated circuit (IC), and the FPC. Here, a light-emitting apparatus in which a substrate is equipped with a connector such as an FPC or mounted with an IC is referred to as a display module.

The connection portion 140 is provided outside the pixel portion 177. The connection portion 140 can be provided along one side or a plurality of sides of the pixel portion 177. The number of connection portions 140 may be one or more. FIG. 16 illustrates an example in which the connection portion 140 is provided to surround the four sides of the pixel portion 177. In the connection portion 140, a common electrode of a light-emitting device is electrically connected to a conductive layer, so that a potential can be supplied to the common electrode.

As the circuit 356, a scan line driver circuit can be used, for example.

The wiring 355 has a function of supplying a signal and power to the pixel portion 177 and the circuit 356. The signal and power are input to the wiring 355 from the outside through the FPC 353 or from the IC 354.

FIG. 16 illustrates an example in which the IC 354 is provided over the substrate 351 by a chip on glass (COG) method, a chip on film (COF) method, or the like. An IC including a scan line driver circuit, a signal line driver circuit, or the like can be used as the IC 354, for example. Note that the light-emitting apparatus 100B and the display module are not necessarily provided with an IC. Alternatively, the IC may be mounted on the FPC by a COF method, for example.

FIG. 17A illustrates an example of cross sections of part of a region including the FPC 353, part of the circuit 356, part of the pixel portion 177, part of the connection portion 140, and part of a region including an edge portion of the light-emitting apparatus 100B.

The light-emitting apparatus 100B illustrated in FIG. 17A includes a transistor 201, a transistor 205, the light-emitting device 130R that emits red light, the light-emitting device 130G that emits green light, the light-emitting device 130B that emits blue light, and the like between the substrate 351 and the substrate 352.

The stacked-layer structure of each of the light-emitting devices 130R, 130G, and 130B is the same as that illustrated in FIG. 4B except for the structure of the pixel electrode. The above embodiments can be referred to for the details of the light-emitting devices.

The light-emitting device 130R includes a conductive layer 224R, the conductive layer 151R over the conductive layer 224R, and the conductive layer 152R over the conductive layer 151R. The light-emitting device 130G includes a conductive layer 224G, the conductive layer 151G over the conductive layer 224G, and the conductive layer 152G over the conductive layer 151G. The light-emitting device 130B includes a conductive layer 224B, the conductive layer 151B over the conductive layer 224B, and the conductive layer 152B over the conductive layer 151B. Here, the conductive layers 224R, 151R, and 152R can be collectively referred to as the pixel electrode of the light-emitting device 130R; the conductive layers 151R and 152R excluding the conductive layer 224R can also be referred to as the pixel electrode of the light-emitting device 130R. Similarly, the conductive layers 224G, 151G, and 152G can be collectively referred to as the pixel electrode of the light-emitting device 130G; the conductive layers 151G and 152G excluding the conductive layer 224G can also be referred to as the pixel electrode of the light-emitting device 130G. The conductive layers 224B, 151B, and 152B can be collectively referred to as the pixel electrode of the light-emitting device 130B; the conductive layers 151B and 152B excluding the conductive layer 224B can also be referred to as the pixel electrode of the light-emitting device 130B.

The conductive layer 224R is connected to a conductive layer 222*b* included in the transistor 205 through the opening provided in an insulating layer 214. The edge portion of the conductive layer 151R is positioned outward from an edge portion of the conductive layer 224R. The insulating layer 156R is provided to include a region that is in contact with the side surface of the conductive layer 151R, and the conductive layer 152R is provided to cover the conductive layer 151R and the insulating layer 156R.

The conductive layers 224G, 151G, and 152G and the insulating layer 156G in the light-emitting device 130G are not described in detail because they are respectively similar to the conductive layers 224R, 151R, and 152R and the insulating layer 156R in the light-emitting device 130R; the same applies to the conductive layers 224B, 151B, and 152B and the insulating layer 156B in the light-emitting device 130B.

The conductive layers 224R, 224G, and 224B each have a depression portion covering an opening provided in the insulating layer 214. A layer 128 is embedded in the depression portion.

The layer 128 has a function of filling the depression portions of the conductive layers 224R, 224G, and 224B to enable planarity. Over the conductive layers 224R, 224G, and 224B and the layer 128, the conductive layers 151R, 151G, and 151B that are respectively electrically connected to the conductive layers 224R, 224G, and 224B are provided. Thus, the regions overlapping with the depression portions of the conductive layers 224R, 224G, and 224B can also be used as light-emitting regions, whereby the aperture ratio of the pixel can be increased.

The layer 128 may be an insulating layer or a conductive layer. Any of a variety of inorganic insulating materials, organic insulating materials, and conductive materials can be used for the layer 128 as appropriate. Specifically, the layer 128 is preferably formed using an insulating material and is particularly preferably formed using an organic insulating material. The layer 128 can be formed using an organic insulating material usable for the insulating layer 127, for example.

The protective layer 131 is provided over the light-emitting devices 130R, 130G, and 130B. The protective layer 131 and the substrate 352 are bonded to each other with an adhesive layer 142. The substrate 352 is provided with a light-blocking layer 157. A solid sealing structure, a hollow sealing structure, or the like can be employed to seal the light-emitting device 130. In FIG. 17A, a solid sealing structure is employed, in which a space between the substrate 352 and the substrate 351 is filled with the adhesive layer 142. Alternatively, the space may be filled with an inert gas (e.g., nitrogen or argon), i.e., a hollow sealing structure may be employed. In that case, the adhesive layer 142 may be provided not to overlap with the light-emitting device. Alternatively, the space may be filled with a resin other than the frame-shaped adhesive layer 142.

FIG. 17A illustrates an example in which the connection portion 140 includes a conductive layer 224C obtained by processing the same conductive film as the conductive layers 224R, 224G, and 224B; the conductive layer 151C obtained by processing the same conductive film as the conductive layers 151R, 151G, and 151B; and the conductive layer 152C obtained by processing the same conductive film as the conductive layers 152R, 152G, and 152B. In the example illustrated in FIG. 17A, the insulating layer 156C is provided to include a region overlapping with the side surface of the conductive layer 151C.

The light-emitting apparatus 100B has a top-emission structure. Light from the light-emitting device is emitted toward the substrate 352. For the substrate 352, a material having a high visible-light-transmitting property is preferably used. The pixel electrode contains a material that reflects visible light, and the counter electrode (the common electrode 155) contains a material that transmits visible light.

The transistor 201 and the transistor 205 are formed over the substrate 351. These transistors can be fabricated using the same materials in the same steps.

An insulating layer 211, an insulating layer 213, an insulating layer 215, and the insulating layer 214 are provided in this order over the substrate 351. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or more.

A material through which impurities such as water and hydrogen do not easily diffuse is preferably used for at least one of the insulating layers covering the transistors. This is because such an insulating layer can function as a barrier layer. Such a structure can effectively inhibit diffusion of impurities to the transistors from the outside and increase the reliability of the light-emitting apparatus.

An inorganic insulating film is preferably used as each of the insulating layers 211, 213, and 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

An organic insulating layer is suitable for the insulating layer 214 functioning as a planarization layer. Examples of materials that can be used for the organic insulating layer include an acrylic resin, a polyimide resin, an epoxy resin, a polyamide resin, a polyimide-amide resin, a siloxane resin, a benzocyclobutene-based resin, a phenol resin, and precursors of these resins. The insulating layer 214 may have a stacked-layer structure of an organic insulating layer and an inorganic insulating layer. The outermost layer of the insulating layer 214 preferably functions as an etching protective layer. This can inhibit formation of a recessed portion in the insulating layer 214 at the time of processing of the conductive layer 224R, 151R, or 152R or the like. Alternatively, a recessed portion may be provided in the insulating layer 214 at the time of processing of the conductive layer 224R, 151R, or 152R or the like.

Each of the transistors 201 and 205 includes a conductive layer 221 functioning as a gate, the insulating layer 211 functioning as a gate insulating layer, a conductive layer 222*a* and a conductive layer 222*b* functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the light-emitting apparatus of this embodiment. For example, a planar transistor, a staggered transistor, or an inverted staggered transistor can be used. A top-gate transistor or a bottom-gate transistor can be used. Alternatively, gates may be provided above and below a semiconductor layer where a channel is formed.

The structure in which the semiconductor layer where a channel is formed is provided between two gates is used for the transistors 201 and 205. The two gates may be connected to each other and supplied with the same signal to operate the transistor. Alternatively, the threshold voltage of the transistor may be controlled by applying a potential for controlling the threshold voltage to one of the two gates and a potential for driving to the other of the two gates.

There is no particular limitation on the crystallinity of a semiconductor material used for the transistors, and either an amorphous semiconductor or a semiconductor having crystallinity (a microcrystalline semiconductor, a polycrystalline semiconductor, a single crystal semiconductor, or a semiconductor partly including crystal regions) can be used. A semiconductor having crystallinity is preferably used, in which case deterioration of transistor characteristics can be suppressed.

The semiconductor layer of the transistor preferably includes a metal oxide. That is, a transistor including a metal oxide in its channel formation region (hereinafter, also referred to as an OS transistor) is preferably used in the light-emitting apparatus of this embodiment.

Examples of an oxide semiconductor having crystallinity include a c-axis-aligned crystalline oxide semiconductor (CAAC-OS) and a nanocrystalline oxide semiconductor (nc-OS).

Alternatively, a transistor including silicon in its channel formation region (a Si transistor) may be used. Examples of silicon include single crystal silicon, polycrystalline silicon, and amorphous silicon. In particular, a transistor containing low-temperature polysilicon (LTPS) in its semiconductor layer (hereinafter also referred to as an LTPS transistor) can be used. The LTPS transistor has high field-effect mobility and excellent frequency characteristics.

With the use of Si transistors such as LTPS transistors, a circuit required to be driven at a high frequency (e.g., a source driver circuit) can be formed on the same substrate as the display portion. This allows for simplification of an external circuit mounted on the light-emitting apparatus and a reduction in costs of parts and mounting costs.

An OS transistor has much higher field-effect mobility than a transistor containing amorphous silicon. In addition, the OS transistor has an extremely low leakage current between a source and a drain in an off state (hereinafter also referred to as an off-state current), and electric charge accumulated in a capacitor that is connected in series to the transistor can be held for a long period. Furthermore, the power consumption of the light-emitting apparatus can be reduced with the OS transistor.

To increase the luminance of the light-emitting device included in the pixel circuit, the amount of current fed through the light-emitting device needs to be increased. To increase the current amount, the source-drain voltage of a driving transistor included in the pixel circuit needs to be increased. An OS transistor has a higher breakdown voltage between a source and a drain than a Si transistor; hence, a high voltage can be applied between the source and the drain of the OS transistor. Therefore, when an OS transistor is used as the driving transistor in the pixel circuit, the amount of current flowing through the light-emitting device can be increased, so that the luminance of the light-emitting device can be increased.

When transistors operate in a saturation region, a change in a source-drain current relative to a change in a gate-source voltage can be smaller in an OS transistor than in a Si transistor. Accordingly, when an OS transistor is used as the driving transistor in the pixel circuit, a current flowing between the source and the drain can be set minutely by a change in a gate-source voltage; hence, the amount of current flowing through the light-emitting device can be controlled. Consequently, the number of gray levels in the pixel circuit can be increased.

Regarding saturation characteristics of a current flowing when transistors operate in a saturation region, even in the case where the source-drain voltage of an OS transistor increases gradually, a more stable current (saturation current) can be fed through the OS transistor than through a Si transistor. Thus, by using an OS transistor as the driving transistor, a stable current can be fed through light-emitting devices even when the current-voltage characteristics of the light-emitting devices vary, for example. In other words, when the OS transistor operates in the saturation region, the source-drain current hardly changes with an increase in the source-drain voltage; hence, the luminance of the light-emitting device can be stable.

As described above, by using OS transistors as the driving transistors included in the pixel circuits, it is possible to inhibit black-level degradation, increase the luminance, increase the number of gray levels, and suppress variations in light-emitting devices, for example.

The semiconductor layer preferably contains indium, M (M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more of aluminum, gallium, yttrium, and tin.

It is particularly preferable that an oxide containing indium (In), gallium (Ga), and zinc (Zn) (also referred to as IGZO) be used for the semiconductor layer. It is preferable to use an oxide containing indium, tin, and zinc. It is preferable to use an oxide containing indium, gallium, tin, and zinc. It is preferable to use an oxide containing indium (In), aluminum (Al), and zinc (Zn) (also referred to as IAZO). It is preferable to use an oxide containing indium (In), aluminum (Al), gallium (Ga), and zinc (Zn) (also referred to as IAGZO).

When the semiconductor layer is an In-M-Zn oxide, the atomic proportion of In is preferably higher than or equal to the atomic proportion of M in the In-M-Zn oxide. Examples of the atomic ratio of the metal elements in such an In-M-Zn oxide are In:M:Zn=1:1:1, 1:1:1.2, 2:1:3, 3:1:2, 4:2:3, 4:2:4.1, 5:1:3, 5:1:6, 5:1:7, 5:1:8, 6:1:6, and 5:2:5 and a composition in the neighborhood of any of the above atomic ratios. Note that the neighborhood of the atomic ratio includes ±30% of an intended atomic ratio.

For example, when the atomic ratio is described as In:Ga:Zn=4:2:3 or a composition in the neighborhood thereof, the case is included where the atomic proportion of Ga is greater than or equal to 1 and less than or equal to 3 and the atomic proportion of Zn is greater than or equal to 2 and less than or equal to 4 with the atomic proportion of In being 4. In addition, when the atomic ratio is described as In:Ga:Zn=5:1:6 or a composition in the neighborhood thereof, the case is included where the atomic proportion of Ga is greater than 0.1 and less than or equal to 2 and the atomic proportion of Zn is greater than or equal to 5 and less than or equal to 7 with the atomic proportion of In being 5. Furthermore, when the atomic ratio is described as In:Ga:Zn=1:1:1 or a composition in the neighborhood thereof, the case is included where the atomic proportion of Ga is greater than 0.1 and less than or equal to 2 and the atomic proportion of Zn is greater than 0.1 and less than or equal to 2 with the atomic proportion of In being 1.

The transistors included in the circuit 356 and the transistors included in the pixel portion 177 may have the same structure or different structures. One structure or two or more kinds of structures may be employed for a plurality of transistors included in the circuit 356. Similarly, one structure or two or more kinds of structures may be employed for a plurality of transistors included in the pixel portion 177.

All transistors included in the pixel portion 177 may be OS transistors, or all transistors included in the pixel portion 177 may be S1 transistors. Alternatively, some of the transistors included in the pixel portion 177 may be OS transistors and the others may be S1 transistors.

For example, when both an LTPS transistor and an OS transistor are used in the pixel portion 177, the light-emitting apparatus can have low power consumption and high driving capability. Note that a structure in which an LTPS transistor and an OS transistor are used in combination is referred to as LTPO in some cases. For example, it is preferable that an OS transistor be used as a transistor functioning as a switch for controlling electrical continuity between wirings and an LTPS transistor be used as a transistor for controlling a current.

For example, one transistor included in the pixel portion 177 functions as a transistor for controlling a current flowing through the light-emitting device and can be referred to as a driving transistor. One of a source and a drain of the driving transistor is electrically connected to the pixel electrode of the light-emitting device. An LTPS transistor is preferably used as the driving transistor. In that case, the amount of current flowing through the light-emitting device can be increased in the pixel circuit.

Another transistor included in the pixel portion 177 functions as a switch for controlling selection or non-selection of a pixel and can be referred to as a selection transistor. A gate of the selection transistor is electrically connected to a gate line, and one of a source and a drain thereof is electrically connected to a source line (signal line). An OS transistor is preferably used as the selection transistor. In that case, the gray level of the pixel can be maintained even with an extremely low frame frequency (e.g., lower than or equal to 1 fps); thus, power consumption can be reduced by stopping the driver in displaying a still image.

As described above, the light-emitting apparatus of one embodiment of the present invention can have all of a high aperture ratio, high resolution, high display quality, and low power consumption.

Note that the light-emitting apparatus of one embodiment of the present invention has a structure including the OS transistor and the light-emitting device having a metal maskless (MML) structure. This structure can significantly reduce a leakage current that would flow through a transistor and a leakage current that would flow between adjacent light-emitting devices (sometimes referred to as a horizontal leakage current or a lateral leakage current). Displaying images on the light-emitting apparatus having this structure can bring one or more of image crispness, image sharpness, high color saturation, and a high contrast ratio to the viewer. When a leakage current that would flow through the transistor and a lateral leakage current that would flow between the light-emitting devices are extremely low, leakage of light at the time of black display (black-level degradation) or the like can be minimized.

In particular, in the case where a light-emitting device having an MML structure employs a side-by-side (SBS) structure, which is the above-described structure for separately forming or coloring light-emitting layers, a layer provided between light-emitting devices (for example, also referred to as an organic layer or a common layer which is shared by the light-emitting devices) is disconnected; accordingly, side leakage can be prevented or be made extremely low.

FIGS. 17B and 17C illustrate other structure examples of transistors.

Transistors 209 and 210 each include the conductive layer 221 functioning as a gate, the insulating layer 211 functioning as a gate insulating layer, the semiconductor layer 231 including a channel formation region 231*i* and a pair of low-resistance regions 231*n*, the conductive layer 222*a* connected to one of the pair of low-resistance regions 231*n*, the conductive layer 222*b* connected to the other of the pair of low-resistance regions 231*n*, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned at least between the conductive layer 223 and the channel formation region 231*i*. Furthermore, an insulating layer 218 covering the transistor may be provided.

FIG. 17B illustrates an example of the transistor 209 in which the insulating layer 225 covers the top and side surfaces of the semiconductor layer 231. The conductive layer 222*a* and the conductive layer 222*b* are connected to the corresponding low-resistance regions 231*n* through openings provided in the insulating layer 225 and the insulating layer 215. One of the conductive layers 222*a* and 222*b* functions as a source, and the other functions as a drain.

In the transistor 210 illustrated in FIG. 17C, the insulating layer 225 overlaps with the channel formation region 231*i* of the semiconductor layer 231 and does not overlap with the low-resistance regions 231*n*. The structure illustrated in FIG. 17C is obtained by processing the insulating layer 225 with the conductive layer 223 as a mask, for example. In FIG. 17C, the insulating layer 215 is provided to cover the insulating layer 225 and the conductive layer 223, and the conductive layer 222*a* and the conductive layer 222*b* are connected to the corresponding low-resistance regions 231*n* through openings in the insulating layer 215.

A connection portion 204 is provided in a region of the substrate 351 where the substrate 352 does not overlap. In the connection portion 204, the wiring 355 is electrically connected to the FPC 353 through a conductive layer 166 and a connection layer 242. An example is described in which the conductive layer 166 has a stacked-layer structure of a conductive film obtained by processing the same conductive film as the conductive layers 224R, 224G, and 224B; a conductive film obtained by processing the same conductive film as the conductive layers 151R, 151G, and 151B; and a conductive film obtained by processing the same conductive film as the conductive layers 152R, 152G, and 152B. On the top surface of the connection portion 204, the conductive layer 166 is exposed. Thus, the connection portion 204 and the FPC 353 can be electrically connected to each other through the connection layer 242.

The light-blocking layer 157 is preferably provided on the surface of the substrate 352 on the substrate 351 side. The light-blocking layer 157 can be provided over a region between adjacent light-emitting devices, in the connection portion 140, in the circuit 356, and the like. A variety of optical members can be arranged on the outer surface of the substrate 352.

A material that can be used for the substrate 120 can be used for each of the substrates 351 and 352.

A material that can be used for the resin layer 122 can be used for the adhesive layer 142.

As the connection layer 242, an anisotropic conductive film (ACF), an anisotropic conductive paste (ACP), or the like can be used.

[Light-Emitting Apparatus 100H]

Figure 18:
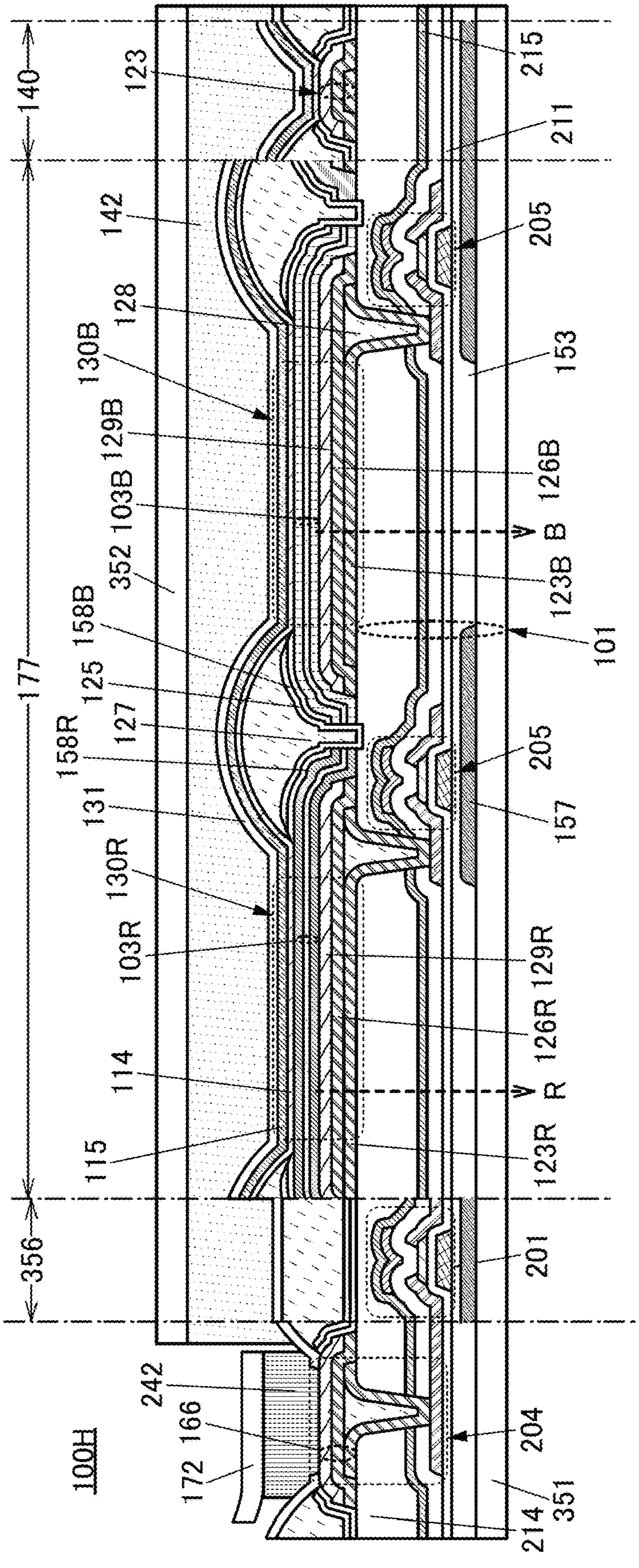
FIG. 18 is a cross-sectional view illustrating a structure example of a light-emitting apparatus.

A light-emitting apparatus 100H illustrated in FIG. 18 differs from the light-emitting apparatus 100B illustrated in FIG. 17A mainly in having a bottom-emission structure.

Light from the light-emitting device is emitted toward the substrate 351. For the substrate 351, a material having a high visible-light-transmitting property is preferably used. By contrast, there is no limitation on the light-transmitting property of a material used for the substrate 352.

The light-blocking layer 157 is preferably formed between the substrate 351 and the transistor 201 and between the substrate 351 and the transistor 205. FIG. 18 illustrates an example in which the light-blocking layer 157 is provided over the substrate 351, an insulating layer 153 is provided over the light-blocking layer 157, and the transistors 201 and 205 and the like are provided over the insulating layer 153.

The light-emitting device 130R includes a conductive layer 123R, a conductive layer 126R over the conductive layer 123R, and a conductive layer 129R over the conductive layer 126R.

The light-emitting device 130B includes a conductive layer 123B, a conductive layer 126B over the conductive layer 123B, and a conductive layer 129B over the conductive layer 126B.

A material having a high visible-light-transmitting property is used for each of the conductive layers 123R, 123B, 126R, 126B, 129R, and 129B. A material that reflects visible light is preferably used for the common electrode 155. A conductive layer 123 provided in the connection portion 140 is preferably formed using the same material through the same process as the conductive layers 123R, 126R, and 129R.

Although not illustrated in FIG. 18, the light-emitting device 130G is also provided.

Although FIG. 18 and the like illustrate an example in which the top surface of the layer 128 includes a flat portion, the shape of the layer 128 is not particularly limited.

[Light-Emitting Apparatus 100C]

Figures 19A, 19B, 19C, 19D:
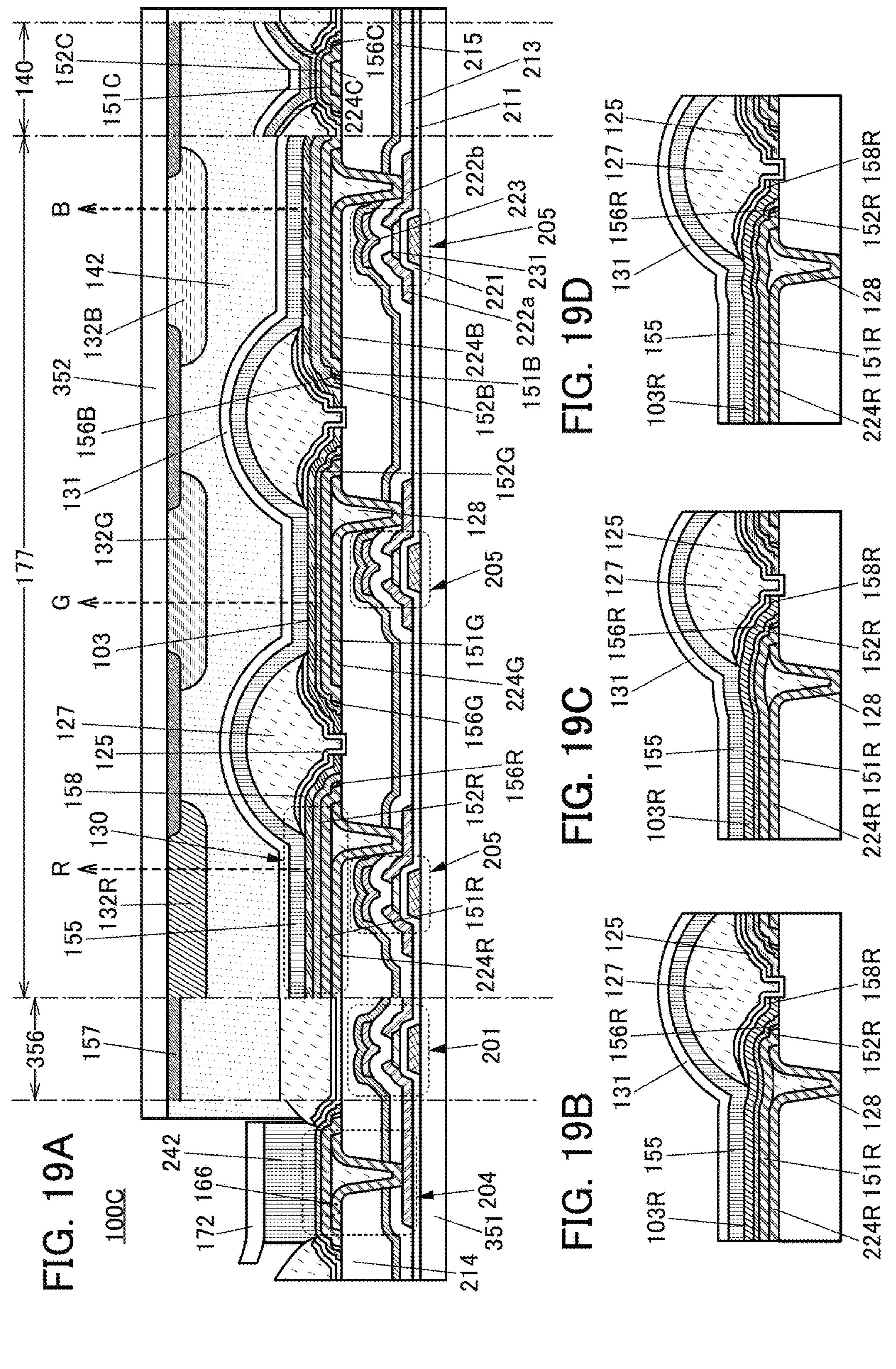
FIGS. 19A to 19D are cross-sectional views each illustrating a structure example of a light-emitting apparatus.

The light-emitting apparatus 100C illustrated in FIG. 19A is a variation example of the light-emitting apparatus 100B illustrated in FIG. 17A and differs from the light-emitting apparatus 100B mainly in including the coloring layers 132R, 132G, and 132B.

In the light-emitting apparatus 100C, the light-emitting device 130 includes a region overlapping with one of the coloring layers 132R, 132G, and 132B. The coloring layers 132R, 132G, and 132B can be provided on the surface of the substrate 352 on the substrate 351 side. Edge portions of the coloring layers 132R, 132G, and 132B can overlap with the light-blocking layer 157.

In the light-emitting apparatus 100C, the light-emitting device 130 can emit white light, for example. The coloring layer 132R, the coloring layer 132G, and the coloring layer 132B can transmit red light, green light, and blue light, respectively, for example. Note that in the light-emitting apparatus 100C, the coloring layers 132R, 132G, and 132B may be provided between the protective layer 131 and the adhesive layer 142.

Although FIG. 17A, FIG. 19A, and the like each illustrate an example in which the top surface of the layer 128 includes a flat portion, the shape of the layer 128 is not particularly limited. FIGS. 19B to 19D illustrate variation examples of the layer 128.

As illustrated in FIGS. 19B and 19D, the top surface of the layer 128 can have a shape in which its center and the vicinity thereof are depressed, i.e., a shape including a concave surface, in a cross-sectional view.

As illustrated in FIG. 19C, the top surface of the layer 128 can have a shape in which its center and the vicinity thereof bulge, i.e., a shape including a convex surface, in a cross-sectional view.

The top surface of the layer 128 may include one or both of a convex surface and a concave surface. The number of convex surfaces and the number of concave surfaces included in the top surface of the layer 128 are not limited and can each be one or more.

The level of the top surface of the layer 128 and the level of the top surface of the conductive layer 224R may be the same or substantially the same, or may be different from each other. For example, the level of the top surface of the layer 128 may be either lower or higher than the level of the top surface of the conductive layer 224R.

FIG. 19B can be regarded as illustrating an example in which the layer 128 fits in the depression portion of the conductive layer 224R. By contrast, as illustrated in FIG. 19D, the layer 128 may exist also outside the depression portion of the conductive layer 224R, i.e., the top surface of the layer 128 may extend beyond the depression portion.

This embodiment can be combined as appropriate with the other embodiments or examples. In this specification, in the case where a plurality of structure examples are shown in one embodiment, the structure examples can be combined as appropriate.

Embodiment 5

In this embodiment, electronic appliances of embodiments of the present invention will be described.

Electronic appliances of this embodiment include the light-emitting apparatus of one embodiment of the present invention in their display portions. The light-emitting apparatus of one embodiment of the present invention is highly reliable and can be easily increased in resolution and definition. Thus, the light-emitting apparatus of one embodiment of the present invention can be used for display portions of a variety of electronic appliances.

Examples of the electronic appliances include a digital camera, a digital video camera, a digital photo frame, a mobile phone, a portable game console, a portable information terminal, and an audio reproducing device, in addition to electronic appliances with a relatively large screen, such as a television device, desktop and notebook personal computers, a monitor of a computer and the like, digital signage, and a large game machine such as a pachinko machine.

In particular, the light-emitting apparatus of one embodiment of the present invention can have high resolution, and thus can be favorably used for an electronic appliance having a relatively small display portion. Examples of such an electronic appliance include watch-type and bracelet-type information terminal devices (wearable devices) and wearable devices capable of being worn on a head, such as a VR device like a head-mounted display, a glasses-type AR device, and an MR device.

The definition of the light-emitting apparatus of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, definition of 4K, 8K, or higher is preferable. The pixel density (resolution) of the light-emitting apparatus of one embodiment of the present invention is preferably higher than or equal to 100 ppi, further preferably higher than or equal to 300 ppi, further preferably higher than or equal to 500 ppi, further preferably higher than or equal to 1000 ppi, still further preferably higher than or equal to 2000 ppi, still further preferably higher than or equal to 3000 ppi, still further preferably higher than or equal to 5000 ppi, yet further preferably higher than or equal to 7000 ppi. With such a light-emitting apparatus having one or both of high definition and high resolution, the electronic appliance can provide higher realistic sensation, sense of depth, and the like in personal use such as portable use or home use. There is no particular limitation on the screen ratio (aspect ratio) of the light-emitting apparatus of one embodiment of the present invention. For example, the light-emitting apparatus is compatible with a variety of screen ratios such as 1:1 (a square), 4:3, 16:9, and 16:10.

The electronic appliance in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, odor, or infrared rays).

The electronic appliance in this embodiment can have a variety of functions. For example, the electronic appliance in this embodiment can have a function of displaying a variety of information (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium.

Examples of head-mounted wearable devices are described with reference to FIGS. 20A to 20D. These wearable devices have at least one of a function of displaying AR contents, a function of displaying VR contents, a function of displaying SR contents, and a function of displaying MR contents. The electronic appliance having a function of displaying contents of at least one of AR, VR, SR, MR, and the like enables the user to feel a higher level of immersion.

Figure 20A:
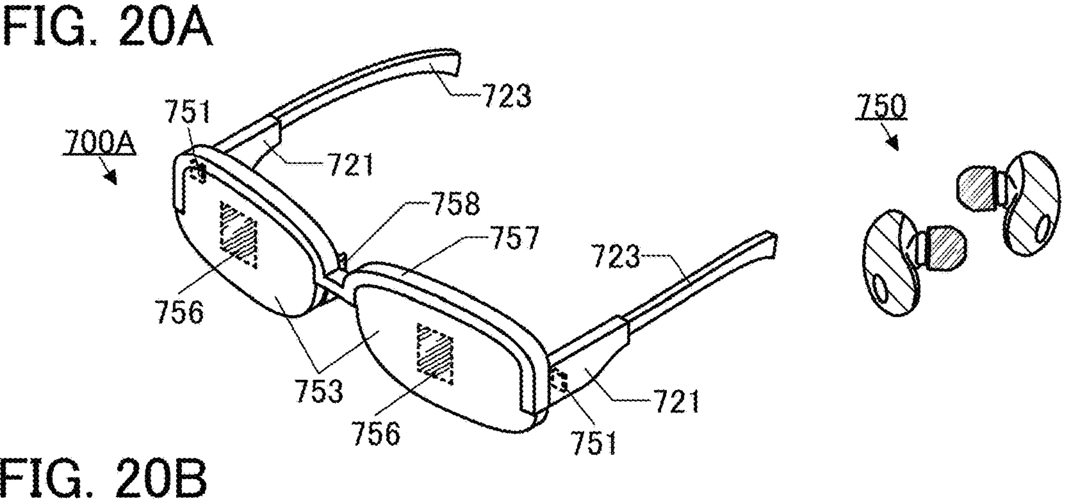
FIGS. 20A to 20D each illustrate an example of an electronic appliance.
Figure 20B:
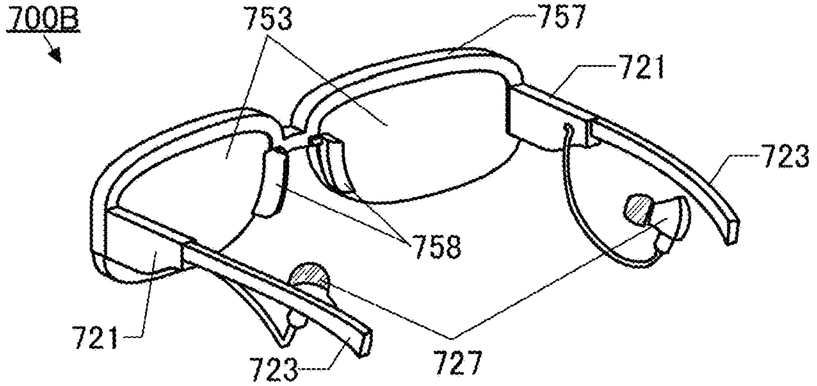

An electronic appliance 700A illustrated in FIG. 20A and an electronic appliance 700B illustrated in FIG. 20B each include a pair of display panels 751, a pair of housings 721, a communication portion (not illustrated), a pair of wearing portions 723, a control portion (not illustrated), an image capturing portion (not illustrated), a pair of optical members 753, a frame 757, and a pair of nose pads 758.

The light-emitting apparatus of one embodiment of the present invention can be used for the display panels 751. Thus, a highly reliable electronic appliance is obtained.

The electronic appliances 700A and 700B can each project images displayed on the display panels 751 onto display regions 756 of the optical members 753. Since the optical members 753 have a light-transmitting property, the user can see images displayed on the display regions, which are superimposed on transmission images seen through the optical members 753. Accordingly, the electronic appliances 700A and 700B are electronic appliances capable of AR display.

In the electronic appliances 700A and 700B, a camera capable of capturing images of the front side may be provided as the image capturing portion. Furthermore, when the electronic appliances 700A and 700B are provided with an acceleration sensor such as a gyroscope sensor, the orientation of the user's head can be sensed and an image corresponding to the orientation can be displayed on the display regions 756.

The communication portion includes a wireless communication device, and a video signal, for example, can be supplied by the wireless communication device. Instead of or in addition to the wireless communication device, a connector that can be connected to a cable for supplying a video signal and a power supply potential may be provided.

The electronic appliances 700A and 700B are provided with a battery, so that they can be charged wirelessly and/or by wire.

A touch sensor module may be provided in the housing 721. The touch sensor module has a function of detecting a touch on the outer surface of the housing 721. Detecting a tap operation, a slide operation, or the like by the user with the touch sensor module enables various types of processing. For example, a moving image can be paused or restarted by a tap operation, and can be fast-forwarded or fast-reversed by a slide operation. When the touch sensor module is provided in each of the two housings 721, the range of the operation can be increased.

Various touch sensors can be applied to the touch sensor module. For example, any of touch sensors of the following types can be used: a capacitive type, a resistive type, an infrared type, an electromagnetic induction type, a surface acoustic wave type, and an optical type. In particular, a capacitive sensor or an optical sensor is preferably used for the touch sensor module.

In the case of using an optical touch sensor, a photoelectric conversion device (also referred to as a photoelectric conversion element) can be used as a light-receiving element. One or both of an inorganic semiconductor and an organic semiconductor can be used for an active layer of the photoelectric conversion device.

Figure 20C:
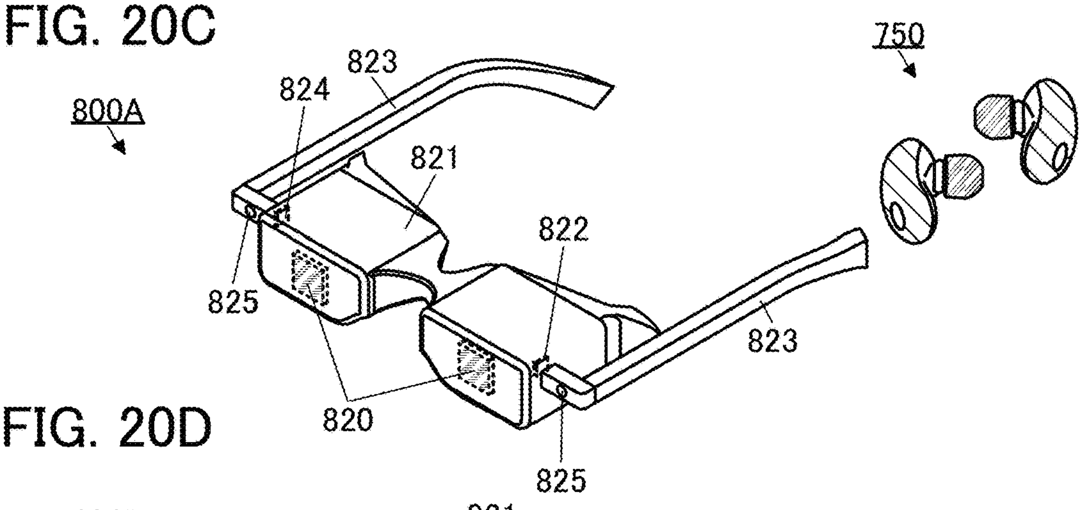
Figure 20D:
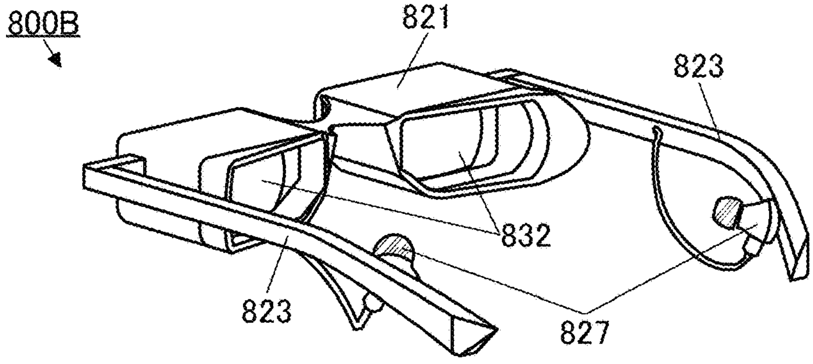

An electronic appliance 800A illustrated in FIG. 20C and an electronic appliance 800B illustrated in FIG. 20D each include a pair of display portions 820, a housing 821, a communication portion 822, a pair of wearing portions 823, a control portion 824, a pair of image capturing portions 825, and a pair of lenses 832.

The light-emitting apparatus of one embodiment of the present invention can be used in the display portions 820. Thus, a highly reliable electronic appliance is obtained.

The display portions 820 are positioned inside the housing 821 so as to be seen through the lenses 832. When the pair of display portions 820 display different images, three-dimensional display using parallax can be performed.

The electronic appliances 800A and 800B can be regarded as electronic appliances for VR. The user who wears the electronic appliance 800A or the electronic appliance 800B can see images displayed on the display portions 820 through the lenses 832.

The electronic appliances 800A and 800B preferably include a mechanism for adjusting the lateral positions of the lenses 832 and the display portions 820 so that the lenses 832 and the display portions 820 are positioned optimally in accordance with the positions of the user's eyes. Moreover, the electronic appliances 800A and 800B preferably include a mechanism for adjusting focus by changing the distance between the lenses 832 and the display portions 820.

The electronic appliance 800A or the electronic appliance 800B can be mounted on the user's head with the wearing portions 823. FIG. 20C, for instance, shows an example where the wearing portion 823 has a shape like a temple of glasses; however, one embodiment of the present invention is not limited thereto. The wearing portion 823 can have any shape with which the user can wear the electronic appliance, for example, a shape of a helmet or a band.

The image capturing portion 825 has a function of obtaining information on the external environment. Data obtained by the image capturing portion 825 can be output to the display portion 820. An image sensor can be used for the image capturing portion 825. Moreover, a plurality of cameras may be provided so as to cover a plurality of fields of view, such as a telescope field of view and a wide field of view.

Although an example where the image capturing portions 825 are provided is described here, a range sensor (hereinafter also referred to as a sensing portion) capable of measuring the distance between the user and an object just needs to be provided. In other words, the image capturing portion 825 is one embodiment of the sensing portion. As the sensing portion, an image sensor or a range image sensor such as a light detection and ranging (LiDAR) sensor can be used, for example. By using images obtained by the camera and images obtained by the range image sensor, more information can be obtained and a gesture operation with higher accuracy is possible.

The electronic appliance 800A may include a vibration mechanism that functions as bone-conduction earphones. For example, at least one of the display portion 820, the housing 821, and the wearing portion 823 can include the vibration mechanism. Thus, without additionally requiring an audio device such as headphones, earphones, or a speaker, the user can enjoy video and sound only by wearing the electronic appliance 800A.

The electronic appliances 800A and 800B may each include an input terminal. To the input terminal, a cable for supplying a video signal from a video output device or the like, power for charging a battery provided in the electronic appliance, and the like can be connected.

The electronic appliance of one embodiment of the present invention may have a function of performing wireless communication with earphones 750. The earphones 750 include a communication portion (not illustrated) and has a wireless communication function. The earphones 750 can receive information (e.g., audio data) from the electronic appliance with the wireless communication function. For example, the electronic appliance 700A in FIG. 20A has a function of transmitting information to the earphones 750 with the wireless communication function. For another example, the electronic appliance 800A in FIG. 20C has a function of transmitting information to the earphones 750 with the wireless communication function.

The electronic appliance may include an earphone portion. The electronic appliance 700B in FIG. 20B includes earphone portions 727. For example, the earphone portion 727 can be connected to the control portion by wire. Part of a wiring that connects the earphone portion 727 and the control portion may be positioned inside the housing 721 or the wearing portion 723.

Similarly, the electronic appliance 800B in FIG. 20D includes earphone portions 827. For example, the earphone portion 827 can be connected to the control portion 824 by wire. Part of a wiring that connects the earphone portion 827 and the control portion 824 may be positioned inside the housing 821 or the wearing portion 823. Alternatively, the earphone portions 827 and the wearing portions 823 may include magnets. This is preferable because the earphone portions 827 can be fixed to the wearing portions 823 with magnetic force and thus can be easily housed.

The electronic appliance may include an audio output terminal to which earphones, headphones, or the like can be connected. The electronic appliance may include one or both of an audio input terminal and an audio input mechanism. As the audio input mechanism, a sound collecting device such as a microphone can be used, for example. The electronic appliance may have a function of a headset by including the audio input mechanism.

As described above, both the glasses-type device (e.g., the electronic appliances 700A and 700B) and the goggles-type device (e.g., the electronic appliances 800A and 800B) are preferable as the electronic appliance of one embodiment of the present invention.

The electronic appliance of one embodiment of the present invention can transmit information to earphones by wire or wirelessly.

Figure 21A:
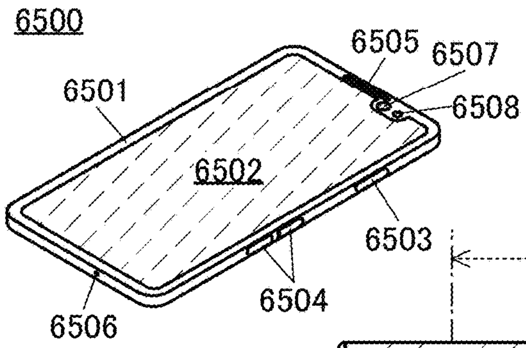
FIGS. 21A to 21F each illustrate an example of an electronic appliance.

An electronic appliance 6500 illustrated in FIG. 21A is a portable information terminal that can be used as a smartphone.

The electronic appliance 6500 includes a housing 6501, a display portion 6502, a power button 6503, buttons 6504, a speaker 6505, a microphone 6506, a camera 6507, a light source 6508, and the like. The display portion 6502 has a touch panel function.

The light-emitting apparatus of one embodiment of the present invention can be used in the display portion 6502. Thus, a highly reliable electronic appliance is obtained.

Figure 21B:
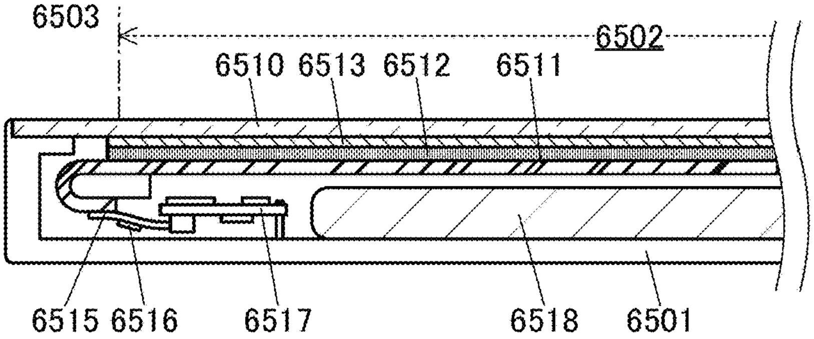

FIG. 21B is a schematic cross-sectional view including an edge portion of the housing 6501 on the microphone 6506 side.

A protection member 6510 having a light-transmitting property is provided on the display surface side of the housing 6501. A display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

The light-emitting apparatus of one embodiment of the present invention can be used in the display panel 6511. Thus, an extremely lightweight electronic appliance can be obtained. Since the display panel 6511 is extremely thin, the battery 6518 with high capacity can be mounted without an increase in the thickness of the electronic appliance. An electronic appliance with a narrow bezel can be obtained when part of the display panel 6511 is folded back so that the portion connected to the FPC 6515 is provided on the back side of a pixel portion.

Figure 21C:
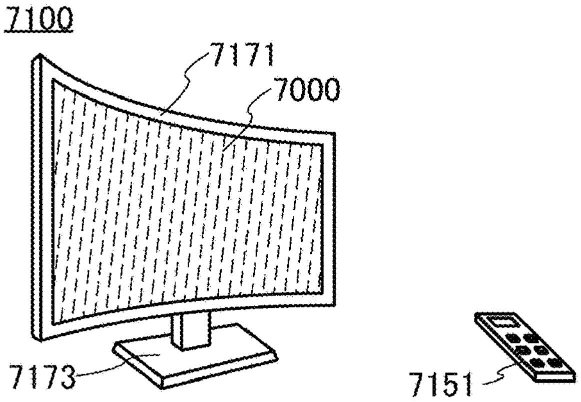

FIG. 21C illustrates an example of a television device. In a television device 7100, a display portion 7000 is incorporated in a housing 7171. Here, the housing 7171 is supported by a stand 7173.

The light-emitting apparatus of one embodiment of the present invention can be used in the display portion 7000. Thus, a highly reliable electronic appliance is obtained.

Operation of the television device 7100 illustrated in FIG. 21C can be performed with an operation switch provided in the housing 7171 and a separate remote control 7151. Alternatively, the display portion 7000 may include a touch sensor, and the television device 7100 may be operated by touch on the display portion 7000 with a finger or the like. The remote control 7151 may be provided with a display portion for displaying information output from the remote control 7151. With operation keys or a touch panel of the remote control 7151, channels and volume can be controlled and video displayed on the display portion 7000 can be controlled.

Note that the television device 7100 includes a receiver, a modem, and the like. A general television broadcast can be received with the receiver. When the television device is connected to a communication network with or without wires via the modem, one-way (from a transmitter to a receiver) or two-way (e.g., between a transmitter and a receiver or between receivers) information communication can be performed.

Figure 21D:
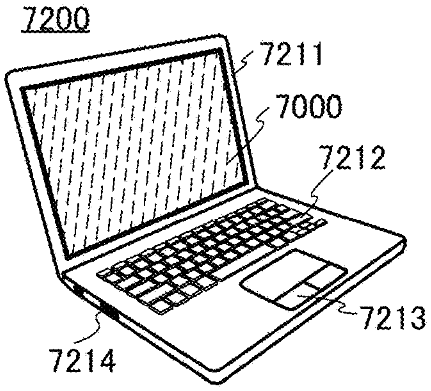

FIG. 21D illustrates an example of a notebook personal computer. A notebook personal computer 7200 includes a housing 7211, a keyboard 7212, a pointing device 7213, an external connection port 7214, and the like. The display portion 7000 is incorporated in the housing 7211.

The light-emitting apparatus of one embodiment of the present invention can be used in the display portion 7000. Thus, a highly reliable electronic appliance is obtained.

Figure 21E:
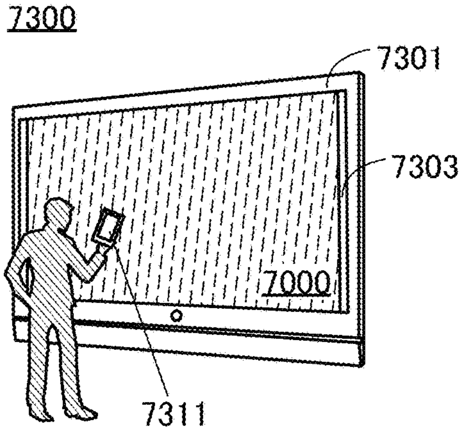
Figure 21F:
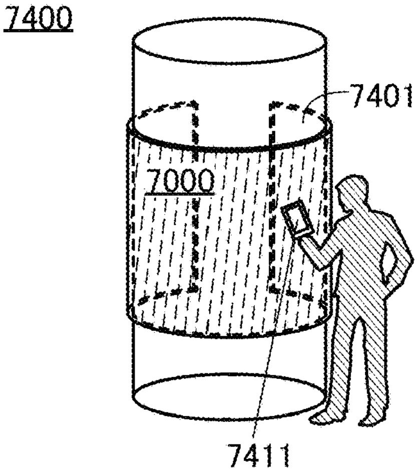

FIGS. 21E and 21F illustrate examples of digital signage.

Digital signage 7300 illustrated in FIG. 21E includes a housing 7301, the display portion 7000, a speaker 7303, and the like. The digital signage 7300 can also include an LED lamp, operation keys (including a power switch or an operation switch), a connection terminal, a variety of sensors, a microphone, and the like.

FIG. 21F shows digital signage 7400 attached to a cylindrical pillar 7401. The digital signage 7400 includes the display portion 7000 provided along a curved surface of the pillar 7401.

In FIGS. 21E and 21F, the light-emitting apparatus of one embodiment of the present invention can be used in the display portion 7000. Thus, a highly reliable electronic appliance is obtained.

A larger area of the display portion 7000 can increase the amount of information that can be provided at a time. The display portion 7000 having a larger area attracts more attention, so that the effectiveness of the advertisement can be increased, for example.

The touch panel is preferably used in the display portion 7000, in which case in addition to display of still or moving images on the display portion 7000, intuitive operation by a user is possible. Moreover, in the case of an application for providing information such as route information or traffic information, usability can be enhanced by intuitive operation.

As illustrated in FIGS. 21E and 21F, it is preferable that the digital signage 7300 or the digital signage 7400 can work with an information terminal 7311 or an information terminal 7411, such as a smartphone that a user has, through wireless communication. For example, information of an advertisement displayed on the display portion 7000 can be displayed on a screen of the information terminal 7311 or the information terminal 7411. By operation of the information terminal 7311 or the information terminal 7411, a displayed image on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Electronic appliances illustrated in FIGS. 22A to 22G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone 9008, and the like.

The electronic appliances illustrated in FIGS. 22A to 22G have a variety of functions. For example, the electronic appliances can have a function of displaying a variety of information (e.g., a still image, a moving image, and a text image) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic appliances are not limited thereto, and the electronic appliances can have a variety of functions. The electronic appliances may include a plurality of display portions. The electronic appliances may be provided with a camera or the like and have a function of taking a still image or a moving image, a function of storing the taken image in a storage medium (an external storage medium or a storage medium incorporated in the camera), a function of displaying the taken image on the display portion, and the like.

The electronic appliances in FIGS. 22A to 22G are described in detail below.

Figure 22A:
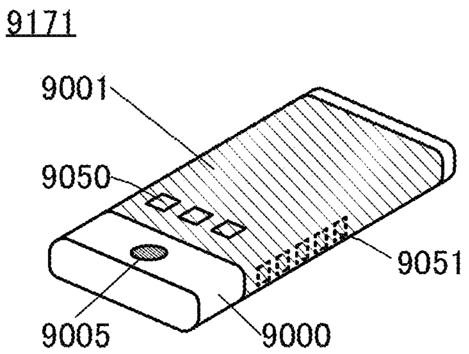
FIGS. 22A to 22G each illustrate an example of an electronic appliance.

FIG. 22A is a perspective view of a portable information terminal 9171. The portable information terminal 9171 can be used as a smartphone, for example. The portable information terminal 9171 may include the speaker 9003, the connection terminal 9006, the sensor 9007, or the like. The portable information terminal 9171 can display text and image information on its plurality of surfaces. FIG. 22A illustrates an example in which three icons 9050 are displayed. Furthermore, information 9051 indicated by dashed rectangles can be displayed on another surface of the display portion 9001. Examples of the information 9051 include notification of reception of an e-mail, an SNS message, an incoming call, or the like, the title and sender of an e-mail, an SNS message, or the like, the date, the time, remaining battery, and the radio field intensity. Alternatively, the icon 9050 or the like may be displayed at the position where the information 9051 is displayed.

Figure 22B:
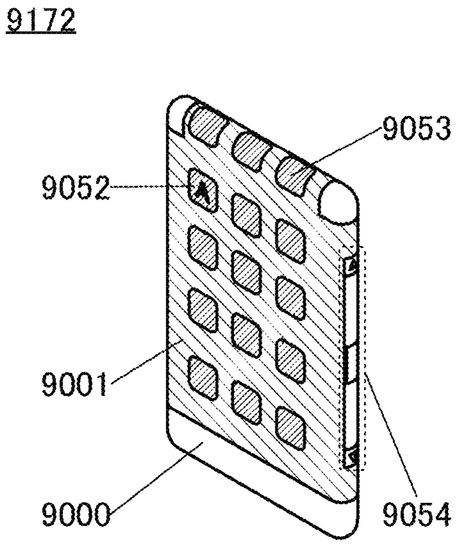

FIG. 22B is a perspective view of a portable information terminal 9172. The portable information terminal 9172 has a function of displaying information on three or more surfaces of the display portion 9001. Here, an example in which information 9052, information 9053, and information 9054 are displayed on different surfaces is described. For example, the user of the portable information terminal 9172 can check the information 9053 displayed such that it can be seen from above the portable information terminal 9172, with the portable information terminal 9172 put in a breast pocket of his/her clothes. Thus, the user can see the display without taking out the portable information terminal 9172 from the pocket and decide whether to answer the call, for example.

Figure 22C:
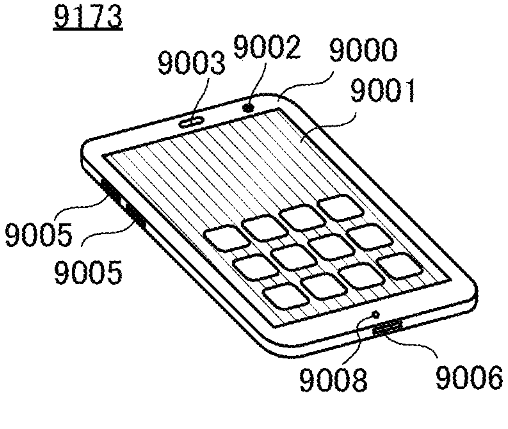

FIG. 22C is a perspective view of a tablet terminal 9173. The tablet terminal 9173 is capable of executing a variety of applications such as mobile phone calls, e-mailing, viewing and editing texts, music reproduction, Internet communication, and a computer game, for example. The tablet terminal 9173 includes the display portion 9001, the camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

Figure 22D:
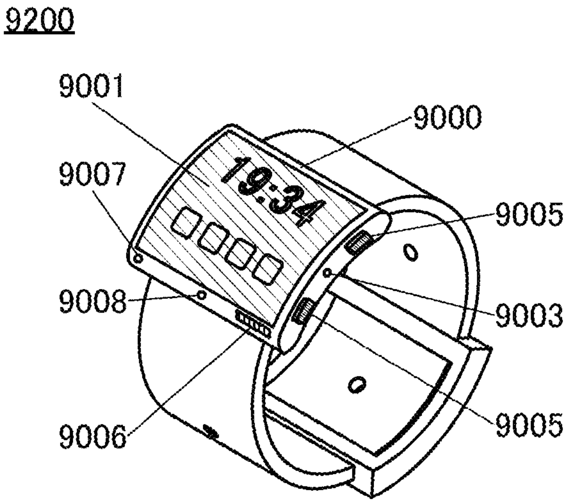

FIG. 22D is a perspective view of a watch-type portable information terminal 9200. The portable information terminal 9200 can be used as a Smartwatch (registered trademark), for example. The display surface of the display portion 9001 is curved, and an image can be displayed on the curved display surface. Furthermore, for example, mutual communication between the portable information terminal 9200 and a headset capable of wireless communication can be performed, and thus hands-free calling is possible. With the connection terminal 9006, the portable information terminal 9200 can perform mutual data transmission with another information terminal and charging. Note that the charging operation may be performed by wireless power feeding.

Figure 22E:
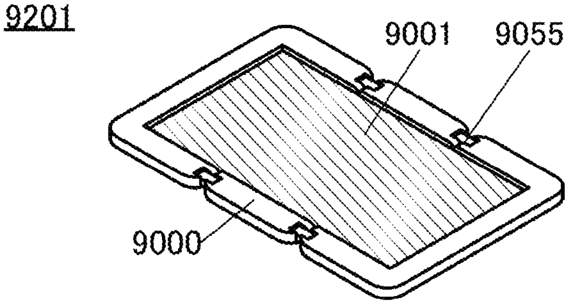
Figure 22F:
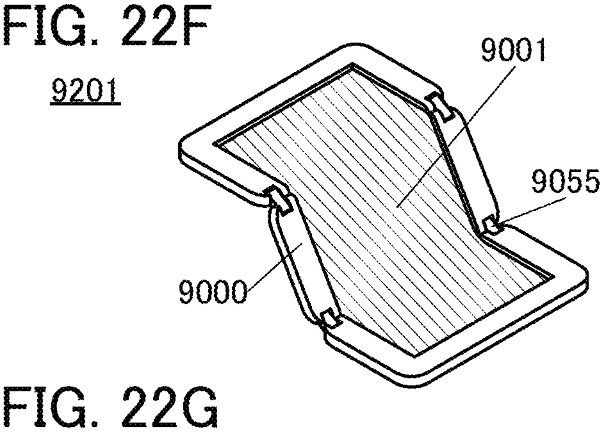
Figure 22G:
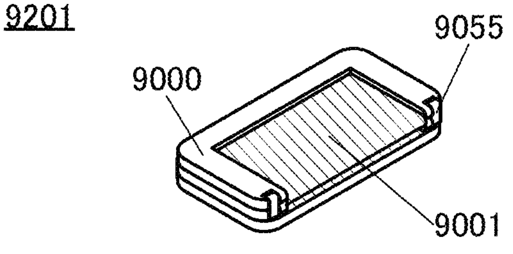

FIGS. 22E to 22G are perspective views of a foldable portable information terminal 9201. FIG. 22E is a perspective view showing the portable information terminal 9201 that is opened. FIG. 22G is a perspective view showing the portable information terminal 9201 that is folded. FIG. 22F is a perspective view showing the portable information terminal 9201 that is shifted from one of the states in FIGS. 22E and 22G to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. The display portion 9001 can be folded with a radius of curvature greater than or equal to 0.1 mm and less than or equal to 150 mm, for example.

This embodiment can be combined as appropriate with the other embodiments or examples. In this specification, in the case where a plurality of structure examples are shown in one embodiment, the structure examples can be combined as appropriate.

Example 1

In this example, a light-emitting device 1A of one embodiment of the present invention and a comparative light-emitting device 1B were fabricated by a vacuum multi-chamber process, and the evaluated characteristics of the light-emitting devices are described.

The structural formulae of organic compounds used in the light-emitting device 1A and the comparative light-emitting device 1B are shown below.

[Chemical Formula 10]

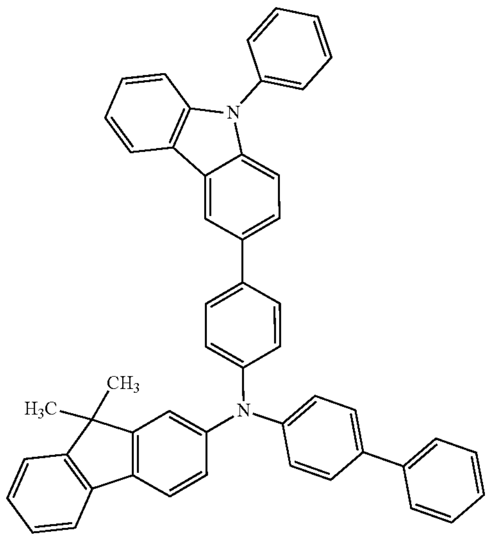

PCBBiF

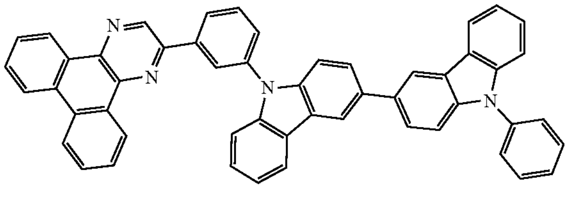

2mPCCzPDBq

-continued

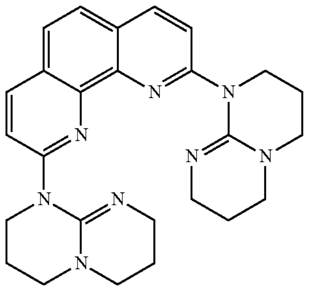

2.9hpp2Phen

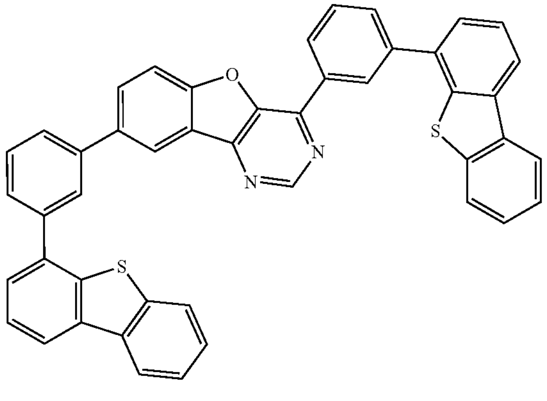

4,8mDBtP2Bfpm

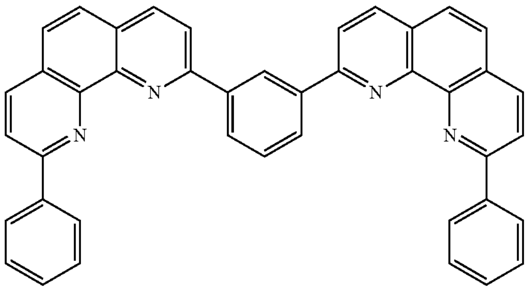

mPPhen2P

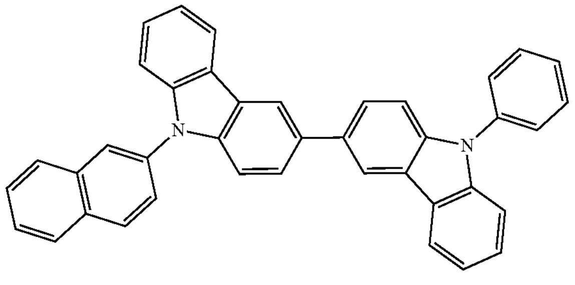

β NCCP

-continued

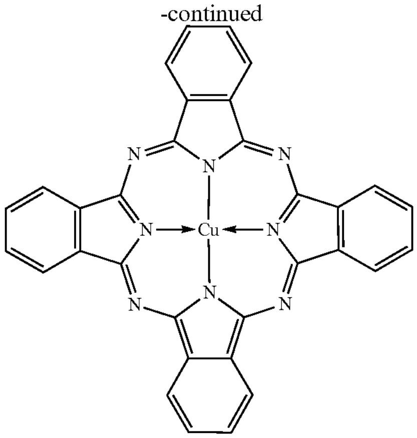

CuPc

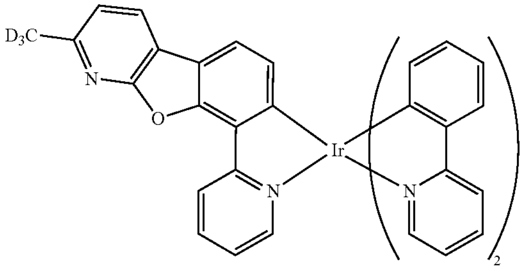

$Ir(ppy)_2(mbfpypy\text{-}d3)$

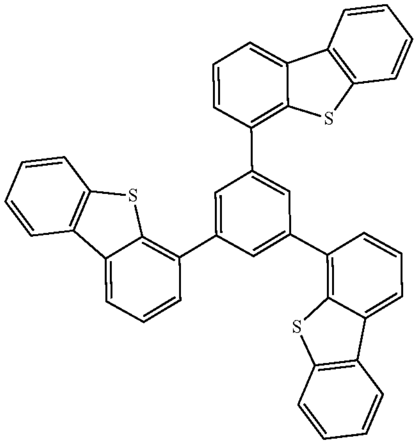

DBT3P-II

Figure 23:
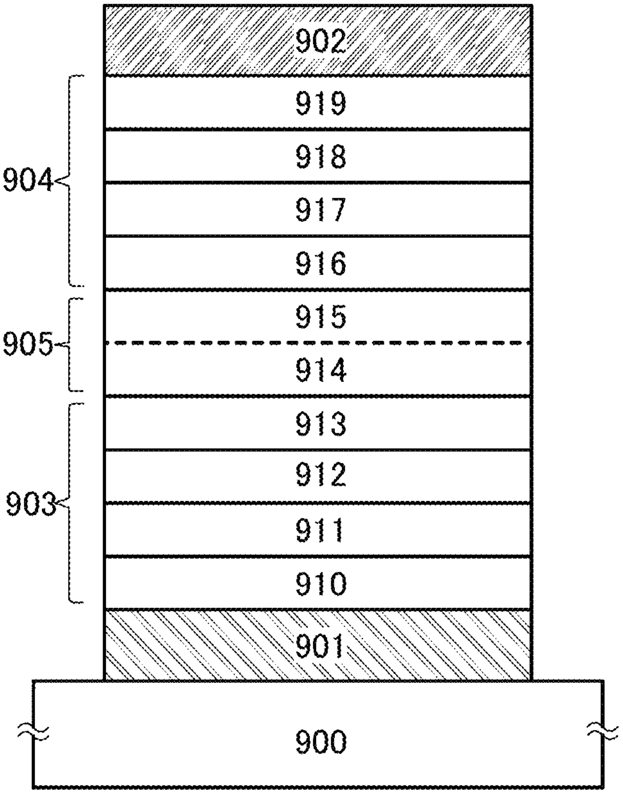
FIG. 23 illustrates a structure of samples in examples.

As illustrated in FIG. 23, the light-emitting device 1A and the comparative light-emitting device 1B have a tandem structure in which a first EL layer 903, an intermediate layer 905, a second EL layer 904, and a second electrode 902 are stacked over a first electrode 901 formed over a substrate 900 that is a glass substrate.

The first EL layer 903 has a structure in which a hole-injection layer 910, a first hole-transport layer 911, a first light-emitting layer 912, and a first electron-transport layer 913 are stacked in this order. The intermediate layer 905 includes an electron-injection buffer region 914 and a layer 915 including an electron-relay region and a charge-generation region. The second EL layer 904 has a structure in which a second hole-transport layer 916, a second light-emitting layer 917, a second electron-transport layer 918, and an electron-injection layer 919 are stacked in this order.

<Method for Fabricating Light-Emitting Device 1A>

First, as a reflective electrode, silver (Ag) was deposited over the substrate 900 that is a glass substrate to a thickness of 100 nm by a sputtering method, and then, as a transparent electrode, indium tin oxide containing silicon oxide (ITSO) was deposited to a thickness of 10 nm by a sputtering method, so that the first electrode 901 was formed. The electrode area was set to 4 $mm^2$ (2 mm×2 mm). Note that the first electrode 901 is a transparent electrode, and the transparent electrode and the reflective electrode can be collectively regarded as the first electrode 901.

Next, the first EL layer 903 was provided. First, in pretreatment for forming the light-emitting device 1A over the substrate, a surface of the substrate was washed with water and baking was performed at 200° C. for 1 hour. Then, the substrate was transferred into a vacuum evaporation apparatus where the pressure was reduced to approximately $1\times10^{-4}$ Pa, and vacuum baking was performed at 170° C. for 30 minutes in a heating chamber of the vacuum evaporation apparatus. After that, natural cooling was performed for approximately 30 minutes.

Then, the substrate provided with the first electrode 901 was fixed to a substrate holder provided in the vacuum evaporation apparatus such that the surface on which the first electrode 901 was formed faced downward. Over the first electrode 901, N-(biphenyl-4-yl)-N-[4-(9-phenyl-9H-carbazol-3-yl)phenyl]-9,9-dimethyl-9H-fluoren-2-amine (abbreviation: PCBBiF) and a fluorine-containing electron acceptor material with a molecular weight of 672 (OCHD-003) were deposited by co-evaporation using resistance heating to a thickness of 10 nm such that the weight ratio of PCBBiF to OCHD-003 was 1:0.03, whereby the hole-injection layer 910 was formed.

Next, PCBBiF was deposited by evaporation to a thickness of 20 nm over the hole-injection layer 910, so that the first hole-transport layer 911 was formed.

Next, the first light-emitting layer 912 was formed over the first hole-transport layer 911. Using resistance heating, 4,8-bis[3-(dibenzothiophen-4-yl)phenyl]-[1]benzofuro[3,2-d]pyrimidine (abbreviation: 4,8mDBtP2Bfpm), 9-(2-naphthyl)-9'-phenyl-9H,9'H-3,3'-bicarbazole (abbreviation: PNCCP), and [2-d3-methyl-(2-pyridinyl-κN)benzofuro[2,3-b]pyridine-κC]bis[2-(2-pyridinyl-κN)phenyl-κC]iridium (III) (abbreviation: $Ir(ppy)_2$(mbfpypy-d3)) were deposited by co-evaporation to a thickness of 40 nm such that the weight ratio of 4,8mDBtP2Bfpm to PNCCP and $Ir(ppy)_2$ (mbfpypy-d3) was 5:5:1, whereby the first light-emitting layer 912 was formed.

Then, over the first light-emitting layer 912, 2-{3-[3-(N-phenyl-9H-carbazol-3-yl)-9H-carbazol-9-yl]phenyl}dibenzo[f,h]quinoxaline (abbreviation: 2mPCCzPDBq) was deposited by evaporation to a thickness of 25 nm, so that the first electron-transport layer 913 was formed.

Next, the intermediate layer 905 was provided. First, over the first electron-transport layer 913, 2,2'-(1,3-phenylene)bis(9-phenyl-1,10-phenanthroline) (abbreviation: mPPhen2P) and 2,9-bis(1,3,4,6,7,8-hexahydro-2H-pyrimido[1,2-a]pyrimidin-1-yl)-1,10-phenanthroline (abbreviation: 2,9hpp2Phen) were deposited by co-evaporation using resistance heating to a thickness of 5 nm such that the weight ratio of mPPhen2P to 2,9hpp2Phen was 1:1, whereby a layer serving as the electron-injection buffer region 914 was formed.

Then, as the electron-relay region, copper phthalocyanine (abbreviation: CuPc) was deposited to a thickness of 2 nm. Next, as the charge-generation region, N-(biphenyl-4-yl)-N-[4-(9-phenyl-9H-carbazol-3-yl)phenyl]-9,9-dimethyl-9H-fluoren-2-amine (abbreviation: PCBBiF) and a fluorine-containing electron acceptor material with a molecular weight of 672 (OCHD-003) were deposited by co-evaporation using resistance heating to a thickness of 10 nm such that the weight ratio of PCBBiF to OCHD-003 was 1:0.15, whereby the layer 915 including the electron-relay region and the charge-generation region was formed.

Next, the second EL layer 904 was provided. First, PCBBiF was deposited by evaporation to a thickness of 40 nm, so that the second hole-transport layer 916 was formed.

Next, 4,8-bis[3-(dibenzothiophen-4-yl)phenyl]-[1]benzofuro[3,2-d]pyrimidine (abbreviation: 4,8mDBtP2Bfpm), 9-(2-naphthyl)-9'-phenyl-9H,9'H-3,3'-bicarbazole (abbreviation: PNCCP), and [2-d3-methyl-(2-pyridinyl-κN)benzofuro[2,3-b]pyridine-κC]bis[2-(2-pyridinyl-κN)phenyl-κC]iridium(III) (abbreviation: $Ir(ppy)_2$(mbfpypy-d3)) were deposited by co-evaporation using resistance heating to a thickness of 40 nm such that the weight ratio of 4,8mDBtP2Bfpm to PNCCP and $Ir(ppy)_2$(mbfpypy-d3) was 5:5:1, whereby the second light-emitting layer 917 was formed.

Next, over the second light-emitting layer 917, 2-{3-[3-(N-phenyl-9H-carbazol-3-yl)-9H-carbazol-9-yl]phenyl}dibenzo[f,h]quinoxaline (abbreviation: 2mPCCzPDBq) was deposited by evaporation to a thickness of 20 nm, and then 2,2'-(1,3-phenylene)bis(9-phenyl-1,10-phenanthroline) (abbreviation: mPPhen2P) was deposited by evaporation to a thickness of 20 nm, so that the second electron-transport layer 918 was formed.

Next, over the second electron-transport layer 918, lithium fluoride (LiF) and ytterbium (Yb) were deposited by co-evaporation to a thickness of 1.5 nm such that the volume ratio of LiF to Yb was 2:1, whereby the electron-injection layer 919 was formed.

Next, over the electron-injection layer 919, Ag and Mg were deposited by co-evaporation to a thickness of 15 nm such that the volume ratio of Ag to Mg was 1:0.1, whereby the second electrode 902 was formed. Note that the second electrode 902 is a semi-transmissive and semi-reflective electrode having functions of transmitting light and reflecting light.

Then, as a cap layer, 4,4',4"-(benzene-1,3,5-triyl)tri(dibenzothiophene) (abbreviation: DBT3P-II) was deposited by evaporation to a thickness of 70 nm.

Through the above process, the light-emitting device 1A was fabricated.

<Method for Fabricating Comparative Light-Emitting Device 1B>

Next, a method for fabricating the comparative light-emitting device 1B is described.

The comparative light-emitting device 1B is different from the light-emitting device 1A in the structure of the electron-injection buffer region 914 in the intermediate layer 905. Specifically, in the comparative light-emitting device 1B, 2,9-bis(1,3,4,6,7,8-hexahydro-2H-pyrimido[1,2-a]pyrimidin-1-yl)-1,10-phenanthroline (abbreviation: 2,9hpp2Phen) was deposited over the first EL layer 903 (the first electron-transport layer 913) by evaporation using resistance heating to a thickness of 5 nm, so that a layer serving as the electron-injection buffer region 914 was formed.

Other components were fabricated in a manner similar to that for the light-emitting device 1A.

The structures of the light-emitting device 1A and the comparative light-emitting device 1B are listed in the table below. In the light-emitting device 1A, a mixed layer of mPPhen2P and 2,9hpp2Phen was used as the electron-injection buffer region 914, which is part of the intermediate layer 905; mPPhen2P has an electron-transport property and an acid dissociation constant $pK_a$ of 5.16 and 2,9hpp2Phen is a strongly basic material and has an acid dissociation constant $pK_a$ of 13.35. In the comparative light-emitting device n, a layer consisting of the strongly basic material 2,9hpp2Phen was used as the electron-injection buffer region 914.

TABLE 1

| | Thickness [nm] | Light-emitting device 1A | Comparative light-emitting device 1B |
|---|---|---|---|
| Cap layer | 70 | DBT3P-II | |
| Second electrode | 15 | Ag:Mg□(1:0.1) | |
| Electron-injection layer | 1.5 | LiF:Yb (2:1) | |
| Second electron-transport | 20 | mPPhen2P | |
| layer | 20 | 2mPCCzPDBq | |
| Second light-emitting layer | 40 | 4,8mDBtP2Bfpm:βNCCP:$Ir(ppy)_2$(mbfpypy-d3) (5:5:1) | |
| Second hole-transport layer | 40 | PCBBiF | |
| Charge-generation region | 10 | PCBBiF:OCHD-003 (1:0.15) | |
| Electron-relay region | 2 | CuPc | |
| Electron-injection buffer region | 5 | mPPhen2P:2,9hpp2Phen (1:1) | 2,9hpp2Phen |
| First electron-transport layer | 25 | 2mPCCzPDBq | |
| First light-emitting layer | 40 | 4,8mDBtP2Bfpm:βNCCP:$Ir(ppy)_2$(mbfpypy-d3) (5:5:1) | |
| First hole-transport layer | 20 | PCBBiF | |
| Hole-injection layer | 10 | PCBBiF:OCHD-003 (1:0.03) | |
| First electrode | 10 | ITSO | |
| | 100 | Ag | |

<Device Characteristics>

The light-emitting device 1A and the comparative light-emitting device 1B were sealed using a glass substrate in a glove box containing a nitrogen atmosphere so as not to be exposed to the air (a sealing material was applied to surround the devices and UV treatment and heat treatment at 80° C. for 1 hour were performed at the time of sealing). Then, the emission characteristics of the light-emitting device 1A and the comparative light-emitting device 1B were measured.

Figure 24:
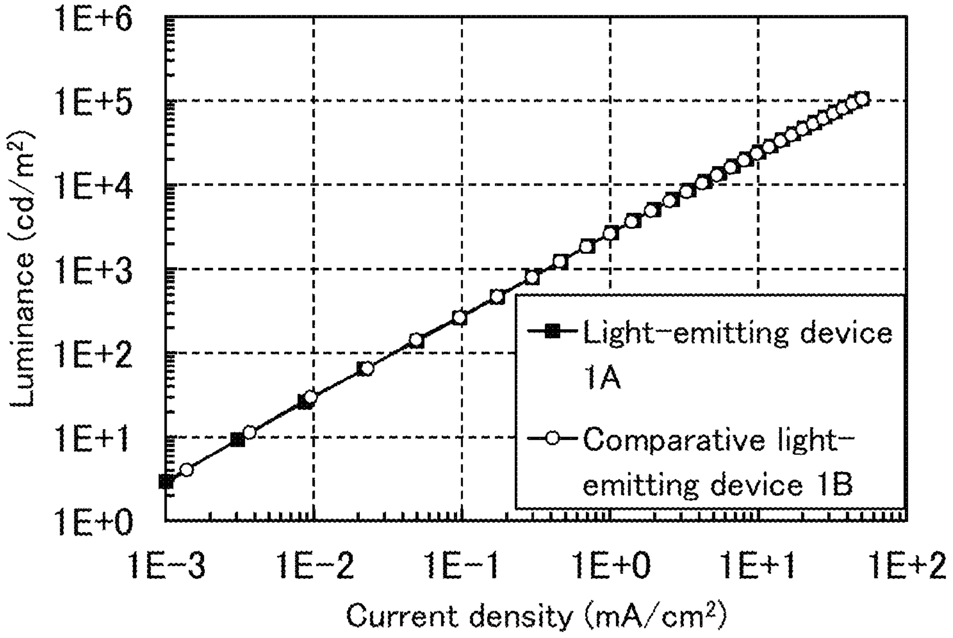
FIG. 24 is a graph showing luminance-current density characteristics of samples in an example.
Figure 25:
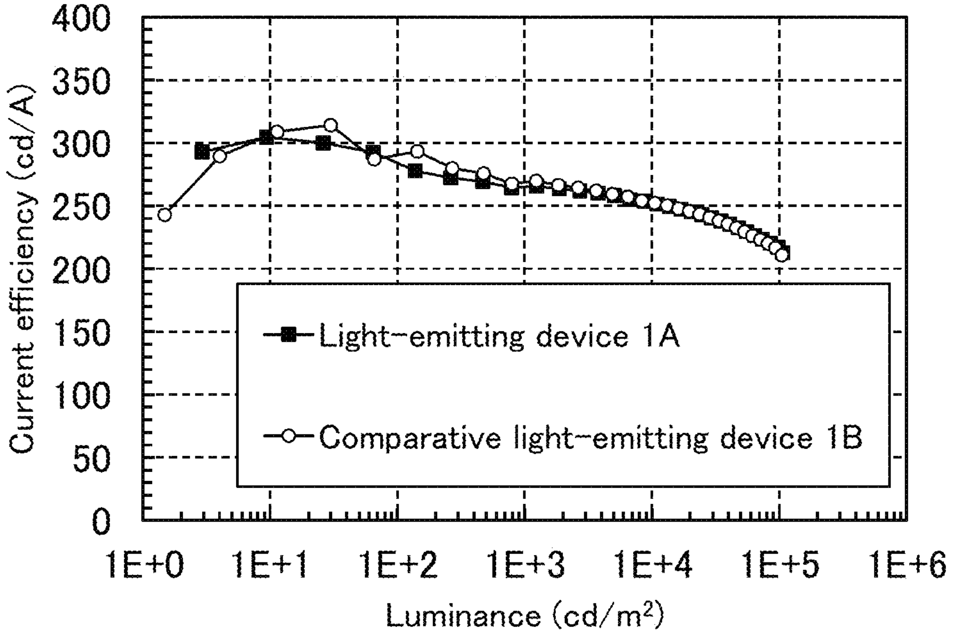
FIG. 25 is a graph showing current efficiency-luminance characteristics of samples in an example.
Figure 26:
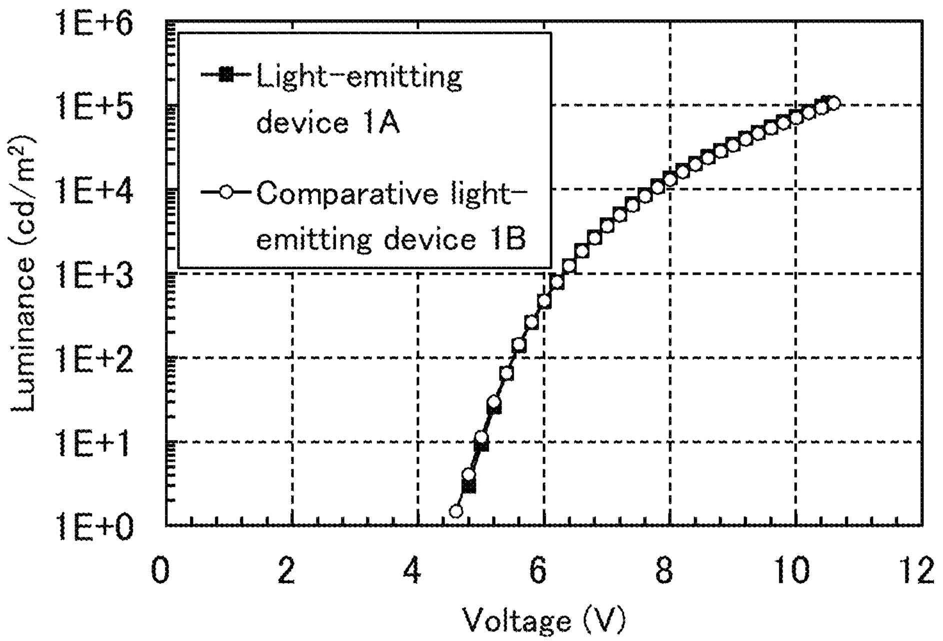
FIG. 26 is a graph showing luminance-voltage characteristics of samples in an example.
Figure 27:
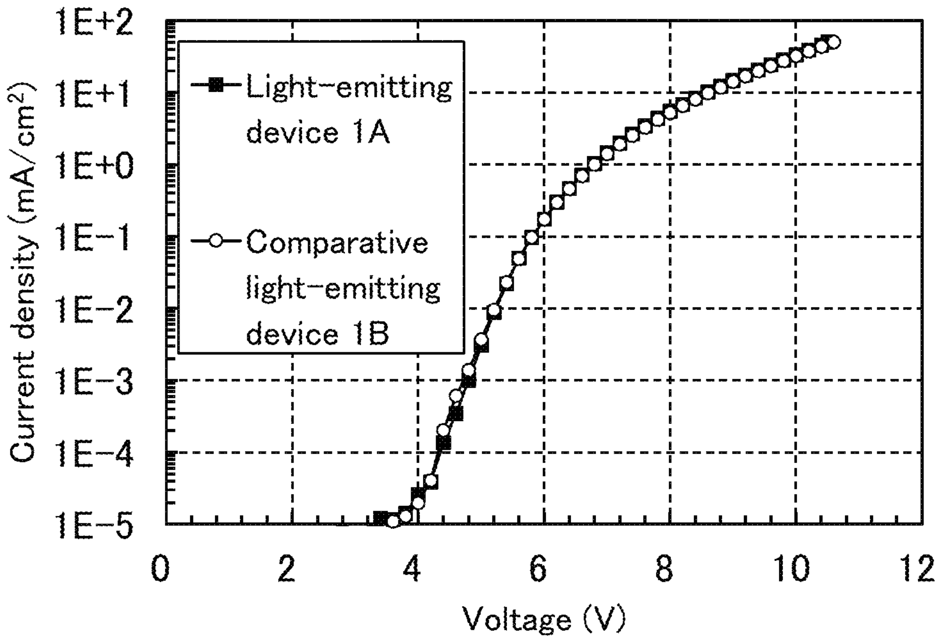
FIG. 27 is a graph showing current density-voltage characteristics of samples in an example.
Figure 28:
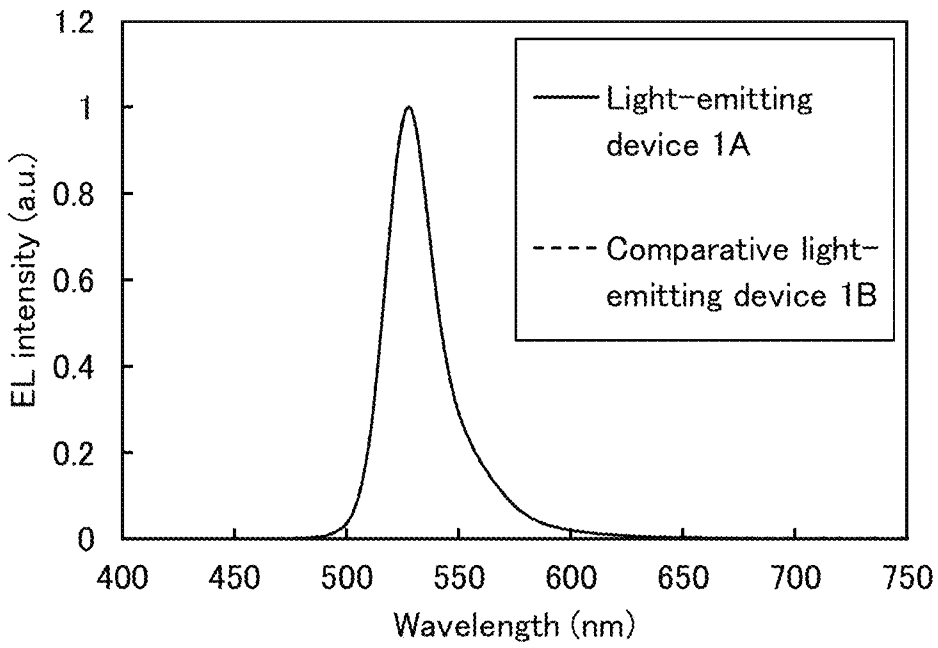
FIG. 28 is a graph showing electroluminescence spectra of samples in an example.

FIG. 24 shows the luminance-current density characteristics of the light-emitting device 1A and the comparative light-emitting device 1B. FIG. 25 shows the current efficiency-luminance characteristics thereof. FIG. 26 shows the luminance-voltage characteristics thereof. FIG. 27 shows the current density-voltage characteristics thereof. FIG. 28 shows the electroluminescence spectra thereof. The main characteristics of the light-emitting device 1A and the comparative light-emitting device 1B at a luminance of approximately 500 $cd/m^2$ are shown in the table below. The luminance, CIE chromaticity, and electroluminescence spectra were measured with a spectroradiometer (SR-UL1R produced by TOPCON TECHNOHOUSE CORPORATION). The external quantum efficiency was calculated from the luminance and the electroluminescence spectra measured with the spectroradiometer, on the assumption that the light-emitting devices had Lambertian light-distribution characteristics.

As shown in FIG. 28, the peak wavelengths in the electroluminescence spectra of the light-emitting device 1A and the comparative light-emitting device 1B are around 550 nm, and the light-emitting device 1A and the comparative light-emitting device 1B emitted green light.

<Reliability Test Result>

Figure 29:
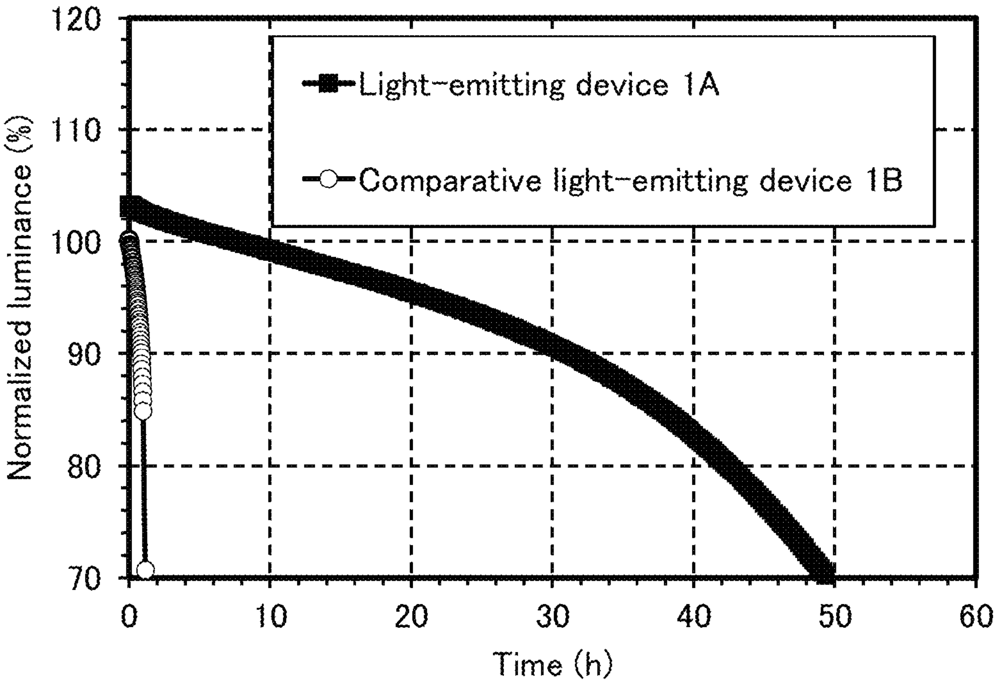
FIG. 29 is a graph showing time dependence of normalized luminance of samples in an example.

Moreover, a reliability test was conducted on the light-emitting device 1A and the comparative light-emitting device 1B. FIG. 29 shows a time-dependent change in normalized luminance at the time of constant current density driving (50 [$mA/cm^2$]). In FIG. 29, the vertical axis represents the luminance (%) normalized with the luminance at the time of the start of light emission being regarded as 100%, and the horizontal axis represents time (h).

In FIG. 29, LT70 (h), which is the time required for the measured luminance to decrease to 70% of the initial luminance, of the light-emitting device 1A is approximately 50 hours. LT70 of the comparative light-emitting device 1B is approximately 1.1 hours.

In this manner, the light-emitting device 1A, in which the intermediate layer 905 was the mixed layer of the electron-transport material and the strongly basic material, had much higher reliability than the comparative light-emitting device 1, in which the intermediate layer 905 was the layer consisting of the strongly basic material, although the initial characteristics of these light-emitting devices were substantially the same.

TABLE 2

| | Voltage (V) | Current density ($mA/cm^2$) | Chromaticity x | Chromaticity y | Luminance ($cd/m^2$) | Current efficiency (cd/A) | External quantum efficiency (%) |
|---|---|---|---|---|---|---|---|
| Light-emitting device 1A | 6.00 | 0.1736 | 0.222 | 0.732 | 467.7 | 269.4 | 65.32 |
| Comparative light-emitting device 1B | 6.00 | 0.1724 | 0.222 | 0.733 | 475.3 | 275.7 | 67.76 |

According to FIG. 24 to FIG. 27 and the above table, the light-emitting device 1A and the comparative light-emitting device 1B show equivalent chromaticities and equivalent high current efficiencies. Thus, the light-emitting device 1A and the comparative light-emitting device 1B both function as tandem light-emitting devices that emit light from the first light-emitting layer and the second light-emitting layer.

Here, the HOMO and LUMO levels of 2,9hpp2Phen were calculated with the use of cyclic voltammetry (CV) measurement. An electrochemical analyzer (ALS model 600A or 600C, manufactured by BAS Inc.) was used for the measurement. The solvent of the 2,9hpp2Phen solution used in the measurement was dehydrated dimethylformamide (DMF). In the measurement, the potential of a working electrode with respect to a reference electrode was changed within an appropriate range, so that the oxidation peak potential and the reduction peak potential were obtained. A platinum electrode (PTE platinum electrode, manufactured by BAS Inc.) was used as the working electrode, another platinum electrode (Pt counter electrode for VC-3 (5 cm), manufactured by BAS Inc.) was used as an auxiliary electrode, and an $Ag/Ag^{+}$ electrode (RE7 reference electrode for nonaqueous solvent, manufactured by BAS Inc.) was used as the reference electrode. The HOMO and LUMO levels of the compound were calculated from the estimated redox potential of the reference electrode of −4.94 eV and the obtained peak potentials. The HOMO level and the LUMO level of 2,9hpp2Phen were found to be −5.6 eV and −2.3 eV, respectively. This shows that 2,9hpp2Phen has a high HOMO level and a high LUMO level. The LUMO level of mPPhen2P was −2.71 eV.

Accordingly, in the intermediate layer 905 of the light-emitting device 1A emitting light, the electron-transport material transports electrons and the strongly basic material traps holes, meaning that the holes are accepted by one molecule and the electrons are accepted by another molecule. This structure presumably lowered the probability of recombination of holes and electrons and inhibited formation of an unstable excited state that would readily cause material deterioration, leading to the higher reliability.

It was found from the above that a highly reliable light-emitting device can be provided by using one embodiment of the present invention.

Example 2

In this example, light-emitting devices 2 (light-emitting devices 2B to 2F) of embodiments of the present invention and a comparative light-emitting device 2A were fabricated by a vacuum multi-chamber process, and the evaluated characteristics of the light-emitting devices are described.

The organic compounds whose structural formulae are shown below were used in all of the light-emitting devices 2B to 2F and the comparative light-emitting device 2A.

[Chemical Formula 11]

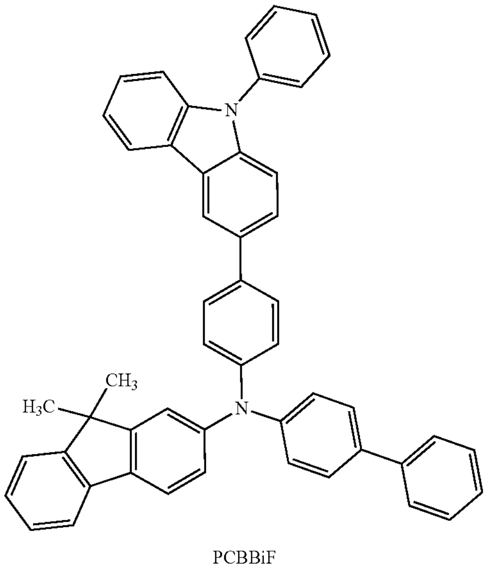

PCBBiF

-continued

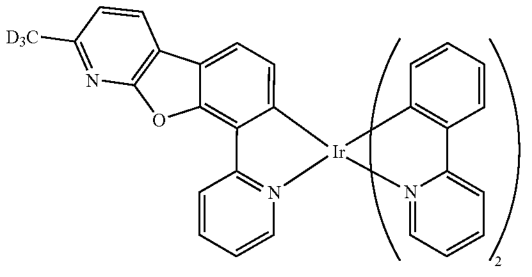

$Ir(ppy)_2(mbfpypy-d3)$

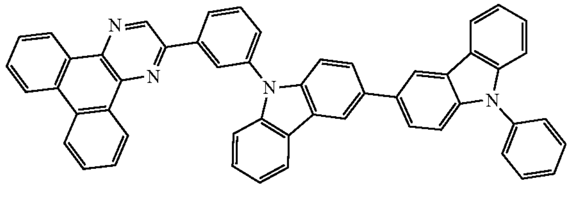

2mPCCzPDBq

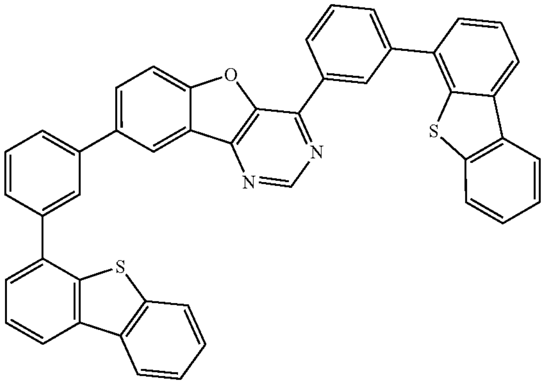

4,8mDBtP2Bfpm

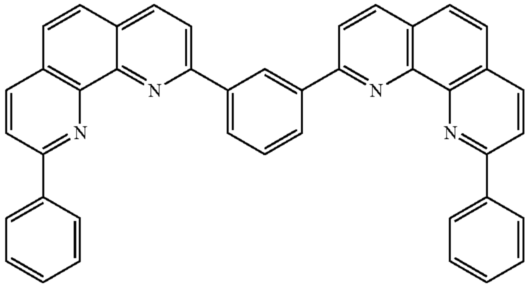

mPPhen2P

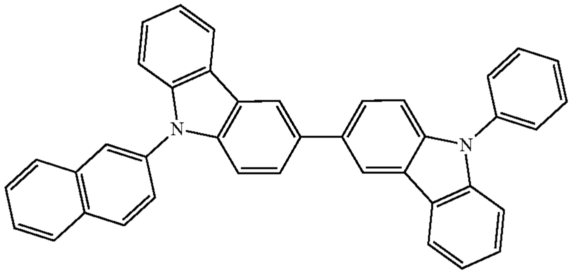

β NCCP

-continued

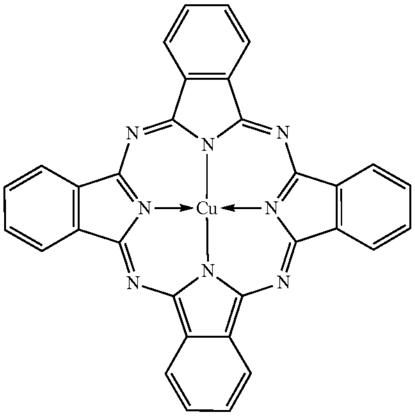

CuPc

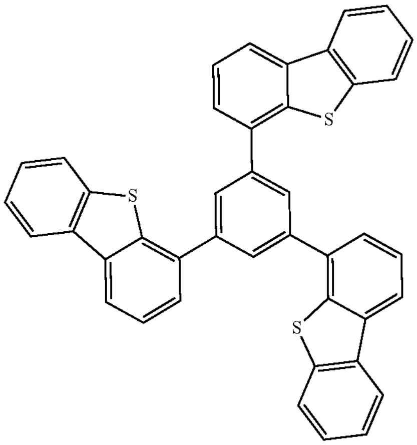

DBT3P-II

The organic compounds whose structural formulae are shown below were used in the respective light-emitting devices.

[Chemical Formula 12]

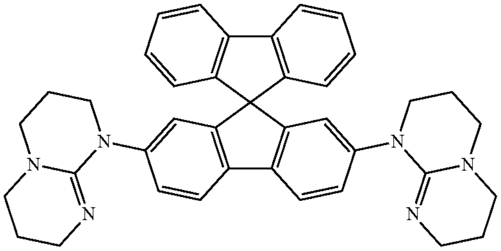

2.7hpp2SF
Light-emitting device 2B

-continued

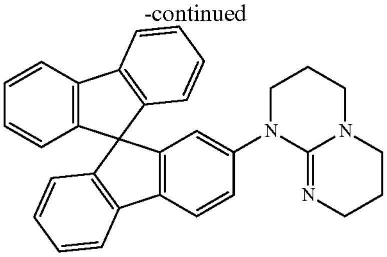

2hppSF
Light-emitting device 2C

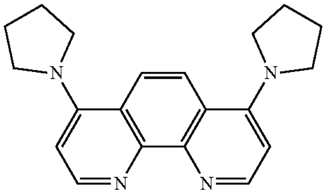

Pyrrd-Phen
Light-emitting device 2D

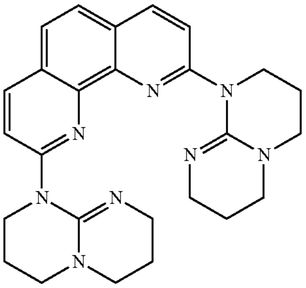

2,9hpp2Phen
Light-emitting device 2E

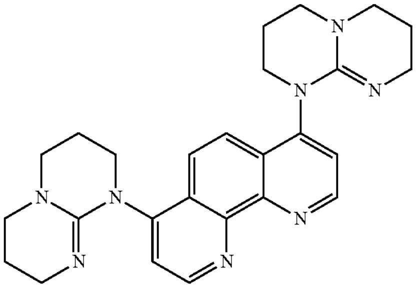

4,7hpp2Phen
Light-emitting device 2F

As illustrated in FIG. 23, the light-emitting devices 2B to 2F and the comparative light-emitting device 2A have a tandem structure in which the first EL layer 903, the intermediate layer 905, the second EL layer 904, and the second electrode 902 are stacked over the first electrode 901 formed over the substrate 900 that is a glass substrate.

The first EL layer 903 has a structure in which the hole-injection layer 910, the first hole-transport layer 911, the first light-emitting layer 912, and the first electron-transport layer 913 are stacked in this order. The intermediate layer 905 includes the electron-injection buffer region 914 and the layer 915 including an electron-relay region and a charge-generation region. The second EL layer 904 has a structure in which the second hole-transport layer 916, the second light-emitting layer 917, the second electron-transport layer 918, and the electron-injection layer 919 are stacked in this order.

<Method for Fabricating Light-Emitting Devices 2>

First, as a reflective electrode, silver (Ag) was deposited over the substrate 900 that is a glass substrate to a thickness of 100 nm by a sputtering method, and then, as a transparent electrode, indium tin oxide containing silicon oxide (ITSO) was deposited to a thickness of 10 nm by a sputtering method, so that the first electrode 901 was formed. The electrode area was set to 4 $mm^2$ (2 mm×2 mm). Note that the first electrode 901 is a transparent electrode, and the transparent electrode and the reflective electrode can be collectively regarded as the first electrode 901.

Next, the first EL layer 903 was provided. First, in pretreatment for forming each of the light-emitting devices 2 and the comparative light-emitting device 2A over the substrate, a surface of the substrate was washed with water and baking was performed at 200° C. for 1 hour. Then, the substrate was transferred into a vacuum evaporation apparatus where the pressure was reduced to approximately $1\times10^{-4}$ Pa, and vacuum baking was performed at 170° C. for 30 minutes in a heating chamber of the vacuum evaporation apparatus. After that, natural cooling was performed for approximately 30 minutes.

Then, the substrate provided with the first electrode 901 was fixed to a substrate holder provided in the vacuum evaporation apparatus such that the surface on which the first electrode 901 was formed faced downward. Over the first electrode 901, N-(biphenyl-4-yl)-N-[4-(9-phenyl-9H-carbazol-3-yl)phenyl]-9,9-dimethyl-9H-fluoren-2-amine (abbreviation: PCBBiF) and a fluorine-containing electron acceptor material with a molecular weight of 672 (OCHD-003) were deposited by co-evaporation using resistance heating to a thickness of 10 nm such that the weight ratio of PCBBiF to OCHD-003 was 1:0.03, whereby the hole-injection layer 910 was formed.

Next, PCBBiF was deposited by evaporation to a thickness of 20 nm over the hole-injection layer 910, so that the first hole-transport layer 911 was formed.

Next, the first light-emitting layer 912 was formed over the first hole-transport layer 911. Using resistance heating, 4,8-bis[3-(dibenzothiophen-4-yl)phenyl]-[1]benzofuro[3,2-d]pyrimidine (abbreviation: 4,8mDBtP2Bfpm), 9-(2-naphthyl)-9'-phenyl-9H,9'H-3,3'-bicarbazole (abbreviation: PNCCP), and [2-d3-methyl-(2-pyridinyl-κN)benzofuro[2,3-b]pyridine-κC]bis[2-(2-pyridinyl-κN)phenyl-κC]iridium (III) (abbreviation: $Ir(ppy)_2$(mbfpypy-d3)) were deposited by co-evaporation to a thickness of 40 nm such that the weight ratio of 4,8mDBtP2Bfpm to PNCCP and $Ir(ppy)_2$(mbfpypy-d3) was 5:5:1, whereby the first light-emitting layer 912 was formed.

Then, over the first light-emitting layer 912, 2-{3-[3-(N-phenyl-9H-carbazol-3-yl)-9H-carbazol-9-yl]phenyl}dibenzo[f,h]quinoxaline (abbreviation: 2mPCCzPDBq) was deposited by evaporation to a thickness of 35 nm, so that the first electron-transport layer 913 was formed.

Next, the intermediate layer 905 was provided. First, over the first electron-transport layer 913, 2,2'-(1,3-phenylene)bis(9-phenyl-1,10-phenanthroline) (abbreviation: mPPhen2P) and a strongly basic material were deposited by co-evaporation using resistance heating to a thickness of 5 nm under any of conditions 2X, which are listed in Table 4, so that a layer serving as the electron-injection buffer region 914 was formed.

The material co-evaporated together with mPPhen2P was 1,1'-(9,9'-spirobi[9H-fluorene]-2,7-diyl)bis(1,3,4,6,7,8-hexahydro-2H-pyrimido[1,2-a]pyrimidine) (abbreviation: 2,7hpp2SF) in the light-emitting device 2B, 1-(9,9'-spirobi[9H-fluoren]-2-yl)-1,3,4,6,7,8-hexahydro-2H-pyrimido[1,2-a]pyrimidine (abbreviation: 2hppSF) in the light-emitting device 2C, 4,7-di-1-pyrrolidinyl-1,10-phenanthroline (abbreviation: Pyrrd-Phen) in the light-emitting device 2D, 2,9-bis(1,3,4,6,7,8-hexahydro-2H-pyrimido[1,2-a]pyrimidin-1-yl)-1,10-phenanthroline (abbreviation: 2,9hpp2Phen) in the light-emitting device 2E, and 4,7-bis(1,3,4,6,7,8-hexahydro-2H-pyrimido[1,2-a]pyrimidin-1-yl)-1,10-phenanthroline (abbreviation: 4,7hpp2Phen) in the light-emitting device 2F. In the comparative light-emitting device 2A, mPPhen2P and lithium oxide ($Li_2O$) were deposited by co-evaporation.

Then, as the electron-relay region, copper phthalocyanine (abbreviation: CuPc) was deposited to a thickness of 2 nm. Next, as the charge-generation region, N-(biphenyl-4-yl)-N-[4-(9-phenyl-9H-carbazol-3-yl)phenyl]-9,9-dimethyl-9H-fluoren-2-amine (abbreviation: PCBBiF) and a fluorine-containing electron acceptor material with a molecular weight of 672 (OCHD-003) were deposited by co-evaporation using resistance heating to a thickness of 10 nm such that the weight ratio of PCBBiF to OCHD-003 was 1:0.15, whereby the layer 915 including the electron-relay region and the charge-generation region was formed.

Next, the second EL layer 904 was provided. First, PCBBiF was deposited by evaporation to a thickness of 40 nm, so that the second hole-transport layer 916 was formed.

Next, 4,8-bis[3-(dibenzothiophen-4-yl)phenyl]-[1]benzofuro[3,2-d]pyrimidine (abbreviation: 4,8mDBtP2Bfpm), 9-(2-naphthyl)-9'-phenyl-9H,9'H-3,3'-bicarbazole (abbreviation: PNCCP), and [2-d3-methyl-(2-pyridinyl-κN)benzofuro[2,3-b]pyridine-κC]bis[2-(2-pyridinyl-κN)phenyl-κC]iridium(III) (abbreviation: $Ir(ppy)_2$(mbfpypy-d3)) were deposited by co-evaporation using resistance heating to a thickness of 40 nm such that the weight ratio of 4,8mDBtP2Bfpm to PNCCP and $Ir(ppy)_2$(mbfpypy-d3) was 5:5:1, whereby the second light-emitting layer 917 was formed.

Next, over the second light-emitting layer 917, 2-{3-[3-(N-phenyl-9H-carbazol-3-yl)-9H-carbazol-9-yl]phenyl}dibenzo[f,h]quinoxaline (abbreviation: 2mPCCzPDBq) was deposited by evaporation to a thickness of 20 nm, and then 2,2'-(1,3-phenylene)bis(9-phenyl-1,10-phenanthroline) (abbreviation: mPPhen2P) was deposited by evaporation to a thickness of 20 nm, so that the second electron-transport layer 918 was formed.

Next, over the second electron-transport layer 918, lithium fluoride (LiF) and ytterbium (Yb) were deposited by co-evaporation to a thickness of 1.5 nm such that the volume ratio of LiF to Yb was 2:1, whereby the electron-injection layer 919 was formed.

Next, over the electron-injection layer 919, Ag and Mg were deposited by co-evaporation to a thickness of 15 nm such that the volume ratio of Ag to Mg was 1:0.1, whereby the second electrode 902 was formed. Note that the second electrode 902 is a semi-transmissive and semi-reflective electrode having functions of transmitting light and reflecting light.

Then, as a cap layer, 4,4',4''-(benzene-1,3,5-triyl)tri(dibenzothiophene) (abbreviation: DBT3P-II) was deposited by evaporation to a thickness of 70 nm.

Through the above process, the light-emitting devices 2 and the comparative light-emitting device 2A were fabricated.

The structures of the light-emitting devices 2 and the comparative light-emitting device 2A are listed in the table below.

TABLE 3

| | Thickness [nm] | Light-emitting device 2 and comparative light-emitting device 2A |
|---|---|---|
| Cap layer | 70 | DBT3P-II |
| Second electrode | 15 | Ag:Mg (1:0.1) |
| Electron-injection layer | 1.5 | LiF:Yb (2:1) |
| Second electron-transport layer | 20 | mPPhen2P |
| | 20 | 2mPCCzPDBq |
| Second light-emitting layer | 40 | 4,8mDBtP2Bfpm:βNCCP:Ir(ppy)$_2$(mbfpypy-d3) (5:5:1) |
| Second hole-transport layer | 40 | PCBBiF |
| Charge-generation region | 10 | PCBBiF:OCHD-003 (1:0.15) |
| Electron-relay region | 2 | CuPc |
| Electron-injection buffer region | 5 | Condition 2X |
| First electron-transport layer | 35 | 2mPCCzPDBq |
| First light-emitting layer | 40 | 4,8mDBtP2Bfpm:βNCCP:Ir(ppy)$_2$(mbfpypy-d3) (5:5:1) |
| First hole-transport layer | 20 | PCBBiF |
| Hole-injection layer | 10 | PCBBiF:OCHD-003 (1:0.03) |
| First electrode | 10 | ITSO |
| | 100 | Ag |

The table below lists the conditions 2X for the electron-injection buffer regions 914 of the light-emitting devices 2B to 2F and the comparative light-emitting device 2A. The table also lists the acid dissociation constants p$K_a$ of the strongly basic materials mixed in the intermediate layers 905.

TABLE 4

| | Condition 2X | | Strongly basic material mixed | |
|---|---|---|---|---|
| | Material | Weight ratio | | p$K_a$ |
| Comparative light-emitting device 2A | mPPhen2P:$Li_2O$ | (1:0.01) | | — |
| Light-emitting device 2B | mPPhen2P:2,7hpp2SF | (1:1) | 2,7hpp2SF | 14.83 |
| Light-emitting device 2C | mPPhen2P:2hppSF | (1:1) | 2hppSF | 13.95 |
| Light-emitting device 2D | mPPhen2P:Pyrrd-Phen | (1:1) | Pyrrd-Phen | 11.23 |
| Light-emitting device 2E | mPPhen2P:2,9hpp2Phen | (1:1) | 2,9hpp2Phen | 13.35 |
| Light-emitting device 2F | mPPhen2P:4,7hpp2Phen | (1:1) | 4,7hpp2Phen | 13.42 |

<Device Characteristics>

The light-emitting devices 2B to 2F and the comparative light-emitting device 2A were sealed using a glass substrate in a glove box containing a nitrogen atmosphere so as not to be exposed to the air (a sealing material was applied to surround the devices and UV treatment and heat treatment at 80° C. for 1 hour were performed at the time of sealing). Then, the emission characteristics of the light-emitting devices 2B to 2F and the comparative light-emitting device 2A were measured.

Figure 30:
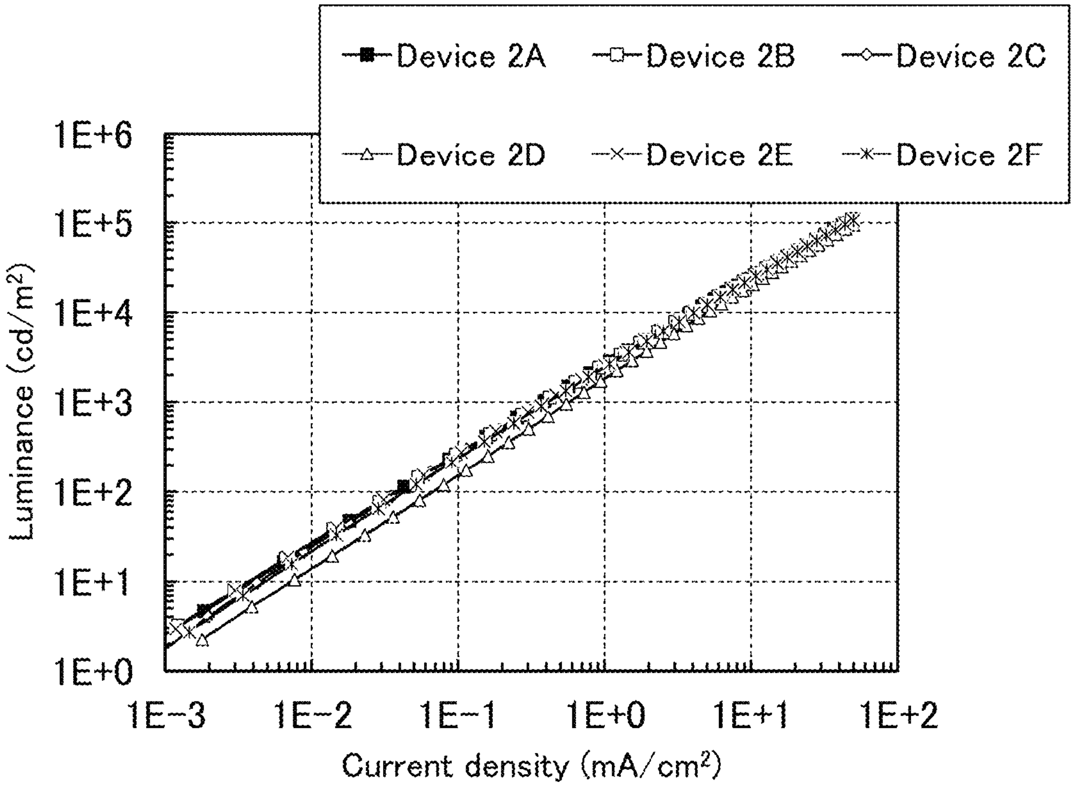
FIG. 30 is a graph showing luminance-current density characteristics of samples in an example.
Figure 31:
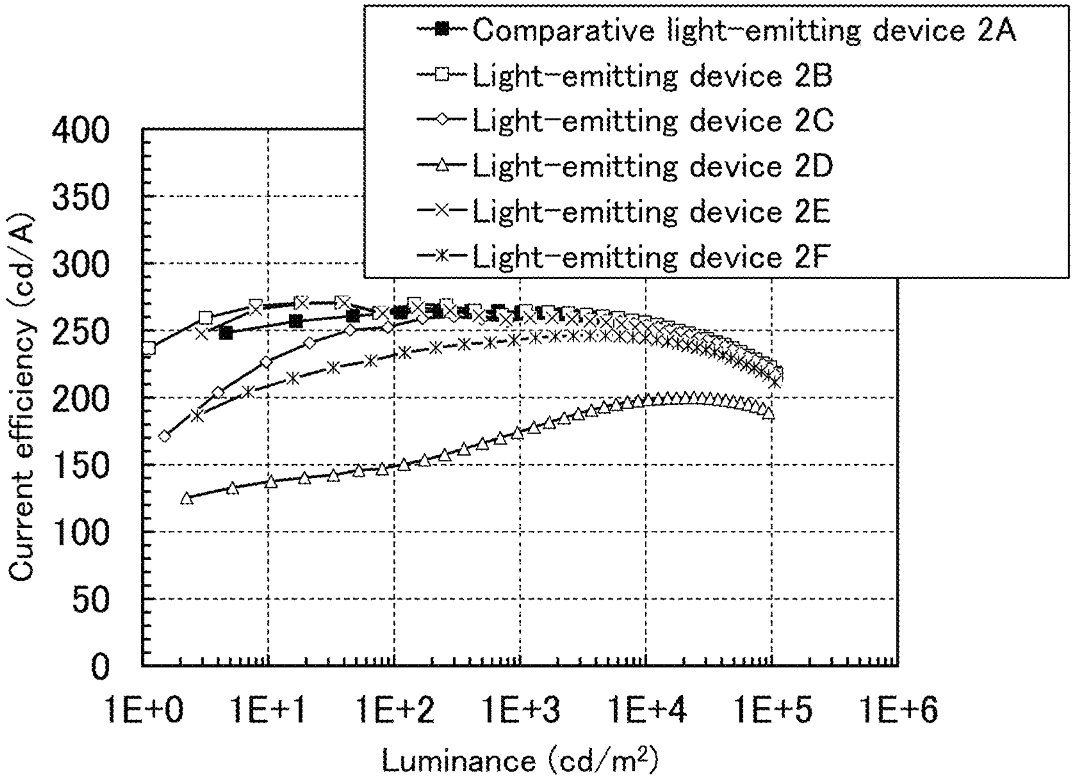
FIG. 31 is a graph showing current efficiency-luminance characteristics of samples in an example.
Figure 32:
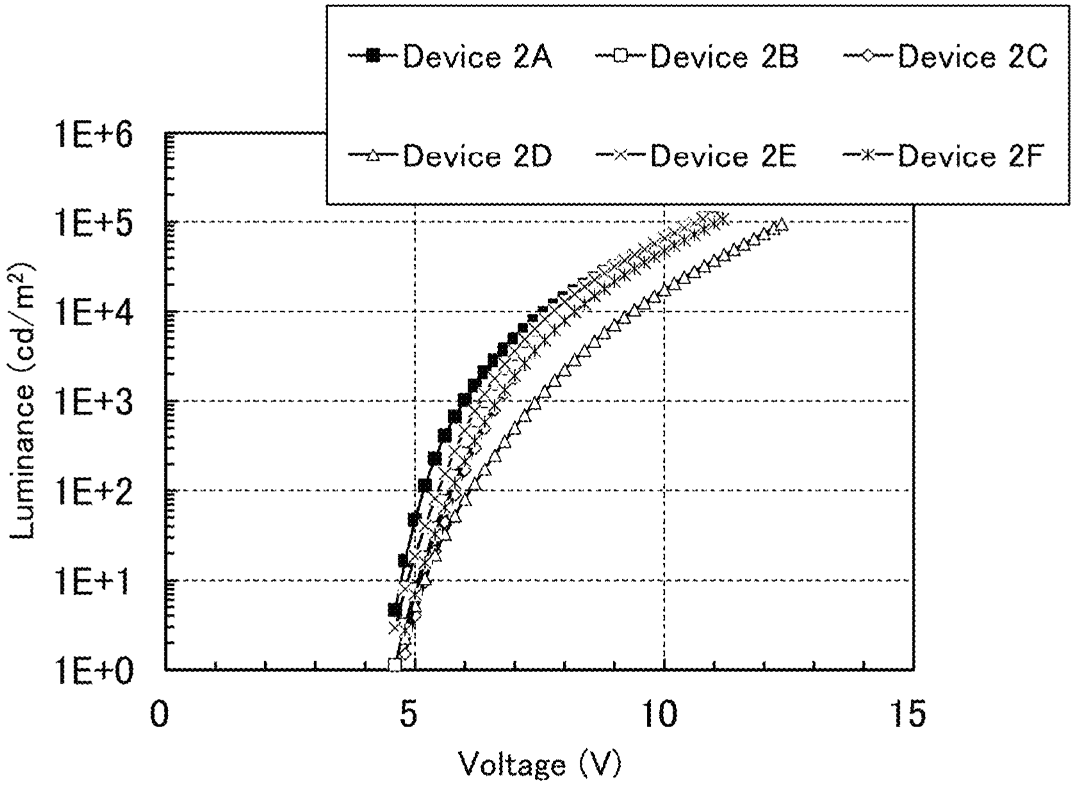
FIG. 32 is a graph showing luminance-voltage characteristics of samples in an example.
Figure 33:
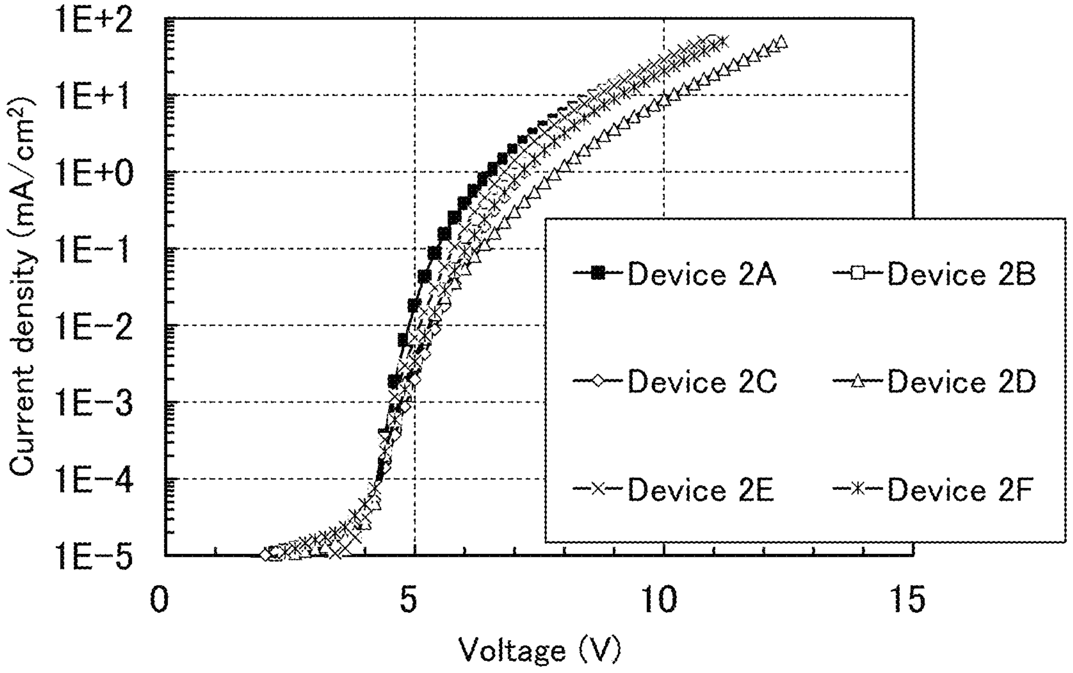
FIG. 33 is a graph showing current density-voltage characteristics of samples in an example.
Figure 34:
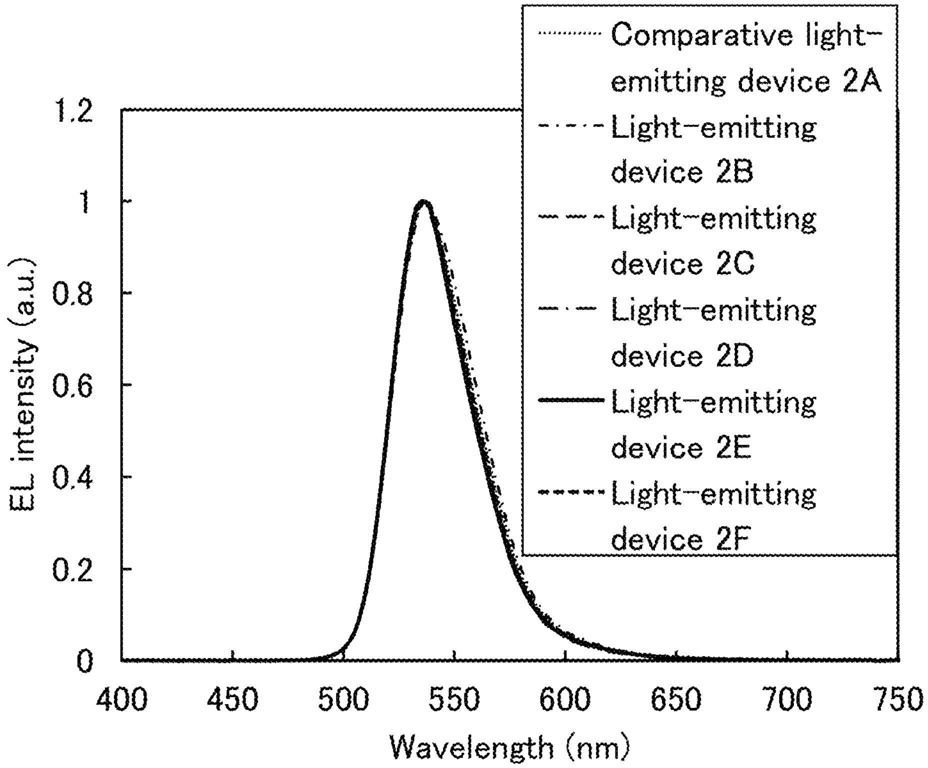
FIG. 34 is a graph showing electroluminescence spectra of samples in an example.

FIG. 30 shows the luminance-current density characteristics of the light-emitting devices 2B to 2F and the comparative light-emitting device 2A. FIG. 31 shows the current efficiency-luminance characteristics thereof. FIG. 32 shows the luminance-voltage characteristics thereof. FIG. 33 shows the current density-voltage characteristics thereof. FIG. 34 shows the electroluminescence spectra thereof. The main characteristics of the light-emitting devices 2B to 2F and the comparative light-emitting device 2A at a luminance of approximately 1000 $cd/cm^2$ are shown in the table below. The luminance, CIE chromaticity, and electroluminescence spectra were measured with a spectroradiometer (SR-UL1R produced by TOPCON TECHNOHOUSE CORPORATION). The external quantum efficiency was calculated from the luminance and the electroluminescence spectra measured with the spectroradiometer, on the assumption that the light-emitting devices had Lambertian light-distribution characteristics.

As shown in FIG. 34, the peak wavelengths in the electroluminescence spectra of the light-emitting devices 2B to 2F and the comparative light-emitting device 2A are around 550 nm, and the light-emitting devices 2B to 2F and the comparative light-emitting device 2A emitted green light.

<Reliability Test Result>

Figure 35:
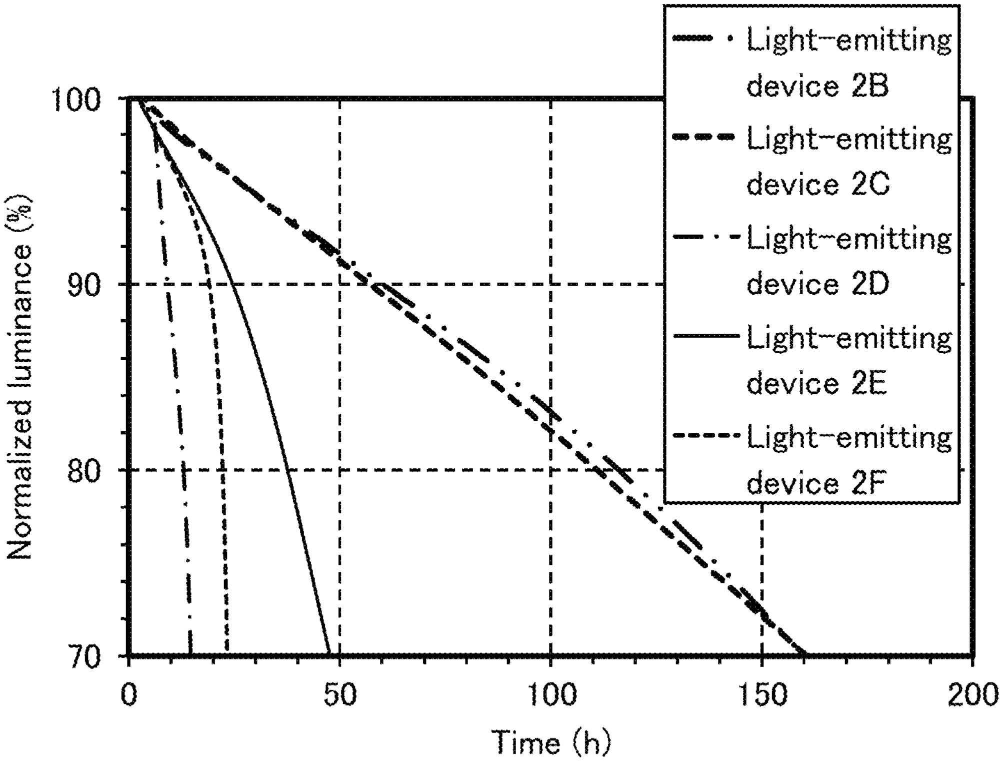
FIG. 35 is a graph showing time dependence of normalized luminance of samples in an example.

Moreover, a reliability test was conducted on the light-emitting devices 2B to 2F. FIG. 35 shows a time-dependent change in normalized luminance at the time of constant current density driving (50 [$mA/cm^2$]). In FIG. 35, the vertical axis represents the luminance (%) normalized with the luminance at the time of the start of light emission being regarded as 100%, and the horizontal axis represents time (h).

From FIG. 35, LT75 (h), which is the time required for the measured luminance to decrease to 75% of the initial luminance, was obtained; the table below lists the values of LT75 (h).

TABLE 6

| Device | Organic compound used in intermediate layer | LT75 [h] |
|---|---|---|
| Light-emitting device 2B | 2,7hpp2SF | 139.06 |
| Light-emitting device 2C | 2hppSF | 135.06 |
| Light-emitting device 2D | Pyrrd-Phen | 13.87 |

TABLE 5

| | Voltage (V) | Current density ($mA/cm^2$) | Chromaticity x | Chromaticity y | Luminance ($cd/m^2$) | Current efficiency (cd/A) | External quantum efficiency (%) |
|---|---|---|---|---|---|---|---|
| Comparative light-emitting device 2A | 6.00 | 0.3884 | 0.299 | 0.677 | 1023.0 | 263.4 | 61.25 |
| Light-emitting device 2B | 6.60 | 0.4225 | 0.303 | 0.674 | 1117.0 | 264.4 | 61.46 |
| Light-emitting device 2C | 6.40 | 0.1922 | 0.293 | 0.682 | 496.7 | 258.4 | 60.30 |
| Light-emitting device 2D | 7.40 | 0.5478 | 0.291 | 0.684 | 953.3 | 174.0 | 40.34 |
| Light-emitting device 2E | 6.40 | 0.4632 | 0.292 | 0.683 | 1202.0 | 259.5 | 60.47 |
| Light-emitting device 2F | 6.60 | 0.3687 | 0.295 | 0.681 | 895.0 | 242.8 | 56.50 |

According to FIGS. 30 to 33 and the above table, the light-emitting devices 2B to 2F each had luminance and chromaticity equivalent to those of the comparative light-emitting device 2A fabricated using lithium. The light-emitting devices 2B, 2C, and 2E each had particularly high current efficiency, which was equivalent to that of the comparative light-emitting device 2A. Thus, the light-emitting devices 2B to 2F function as tandem light-emitting devices that emit light from the first light-emitting layer and the second light-emitting layer.

TABLE 6-continued

| Device | Organic compound used in intermediate layer | LT75 [h] |
|---|---|---|
| Light-emitting device 2E | 2,9hpp2Phen | 42.61 |
| Light-emitting device 2F | 4,7hpp2Phen | 22.72 |
| All devices | mPPhen2P | — |

The HOMO and LUMO levels of each of the organic compounds used in the intermediate layers 905 of the light-emitting devices were measured using cyclic voltammetry (CV) measurement and/or ionization potential (IP) measurement. The results are shown in the table below.

TABLE 7

| Device | Organic compound used in intermediate layer | HOMO level [eV] CV measurement value | HOMO level [eV] IP measurement value | Light intensity for IP measurement [nW] | LUMO level [eV] CV measurement value | LUMO level [eV] IP measurement value |
|---|---|---|---|---|---|---|
| Light-emitting device 2B | 2,7hpp2SF | −5.30 | −5.48 | 50 | — | −2.05 |
| Light-emitting device 2C | 2hppSF | −5.30 | −5.65 | 30 | — | −2.09 |
| Light-emitting device 2D | Pyrrd-Phen | −5.80 | — | — | −2.55 | — |
| Light-emitting device 2E | 2,9hpp2Phen | −5.60 | — | — | −2.30 | — |
| Light-emitting device 2F | 4,7hpp2Phen | −5.57 | — | — | −2.50 | — |
| All devices | mPPhen2P | — | −5.88 | | −2.71 | −2.60 |

An electrochemical analyzer (ALS model 600A or 600C, manufactured by BAS Inc.) was used for the CV measurement. The solvent of each of the solutions of the organic compounds used in the measurement was dehydrated dimethylformamide (DMF). In the measurement, the potential of a working electrode with respect to a reference electrode was changed within an appropriate range, so that the oxidation peak potential and the reduction peak potential were obtained. A platinum electrode (PTE platinum electrode, manufactured by BAS Inc.) was used as the working electrode, another platinum electrode (Pt counter electrode for VC-3 (5 cm), manufactured by BAS Inc.) was used as an auxiliary electrode, and an $Ag/Ag^+$ electrode (RE7 reference electrode for nonaqueous solvent, manufactured by BAS Inc.) was used as the reference electrode. The HOMO and LUMO levels of the compound were calculated from the estimated redox potential of the reference electrode of −4.94 eV and the obtained peak potentials.

The ionization potential (TP) measurement was performed in the air using an atmospheric photoemission yield spectrometer (AC-3 manufactured by Riken Keiki Co., Ltd.). The LUMO level was calculated using the HOMO level and an optical band gap (energy (eV) calculated from an absorption edge on the long wavelength side of an absorption spectrum of a thin film). Specifically, the LUMO level was calculated by adding the energy (eV) calculated from the band gap to the HOMO level.

The above results show that the light-emitting device 2B fabricated using 2,7hpp2SF and the light-emitting device 2C fabricated using 2hppSF had high reliability. Neither 2,7hpp2SF nor 2hppSF has an electron-transport skeleton. This suggests that electrons were transported by the electron-transport material without entering the strongly basic material in the intermediate layer 905 of each of the light-emitting devices 2B and 2C emitting light. By contrast, holes are trapped by the strongly basic material, meaning that the holes are accepted by one molecule and the electrons are accepted by another molecule. This structure presumably lowered the probability of recombination of holes and electrons and inhibited formation of an unstable excited state that would readily cause material deterioration, leading to the higher reliability.

A 1,3,4,6,7,8-hexahydro-2H-pyrimido[1,2-a]pyridine skeleton, which is strongly basic, has an electron-donating property and allows a material having this skeleton to have a high HOMO level. This skeleton is bonded to a spirofluorene skeleton having no heterocycle in each of 2,7hpp2SF and 2hppSF, so that these compounds have a high HOMO level.

Thus, a light-emitting device can have high reliability by including the intermediate layer 905 in which an electron-transport material and a strongly basic material having no electron-transport skeleton are mixed. A light-emitting device can have high reliability by including a mixture of a π-electron rich strongly basic material and an electron-transport material.

Here, thin films containing the organic compounds used in the intermediate layer 905 were evaluated by an electron spin resonance (ESR) method.

Figure 36:
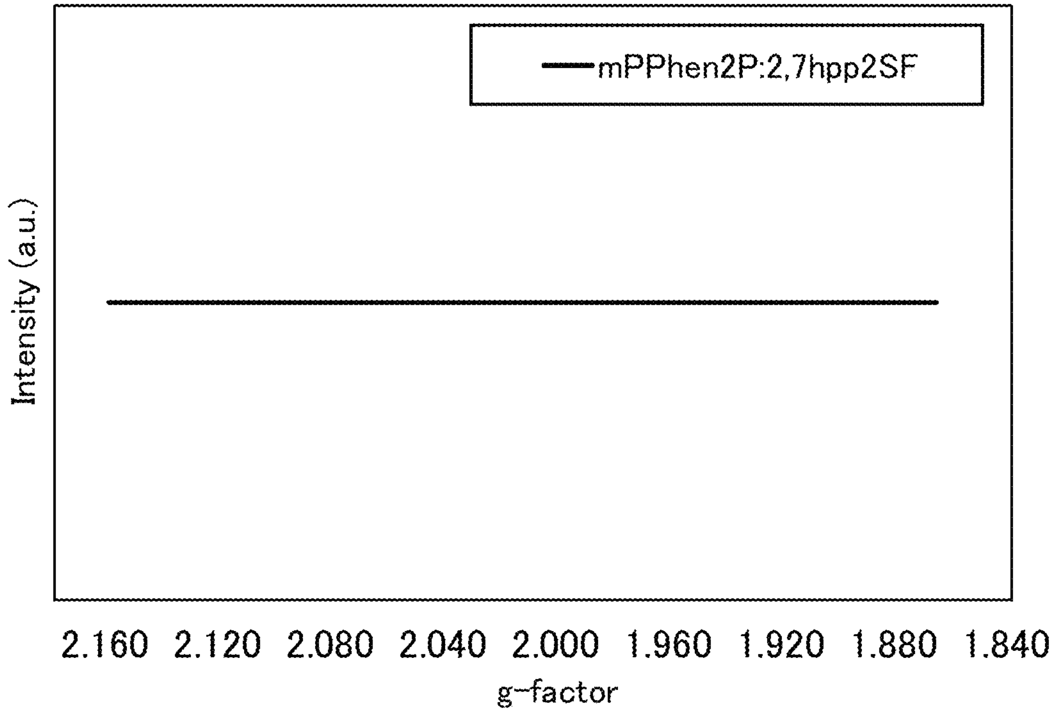
FIG. 36 is a graph showing an ESR spectrum of a thin film containing organic compounds used in a sample in an example.

Specifically, a thin film was formed in the following manner: mPPhen2P and 2,7hpp2SF were deposited by co-evaporation to a thickness of 50 nm over a quartz substrate such that the weight ratio of mPPhen2P to 2,7hpp2SF was 1:1; then, an electron spin resonance spectrum of the thin film was measured at room temperature. Note that the measurement of the electron spin resonance spectrum using an ESR method was performed with an electron spin resonance spectrometer E500 (manufactured by Bruker Corporation). The measurement was performed at room temperature under the conditions where the resonance frequency was 9.56 GHz, the output power was 1 mW, the modulated magnetic field was 50 mT, the modulation width was 0.5 mT, the time constant was 0.04 s, and the sweep time was 1 min. FIG. 36 shows the measurement results. From FIG. 36, it was found that no signal was observed at a g-factor of around 2.000 and the spin density was lower than $1\times10^{16}$ spins/$cm^3$, which is the lower detection limit. Spin density that is lower than or equal to $1\times10^{17}$ spins/$cm^3$, preferably lower than $1\times10^{16}$ spins/$cm^3$ (the lower detection limit), suggests the lack of an electron-donating property. Therefore, 2,7hpp2SF presumably has no electron-donating property with respect to mPPhen2P.

Figure 37:
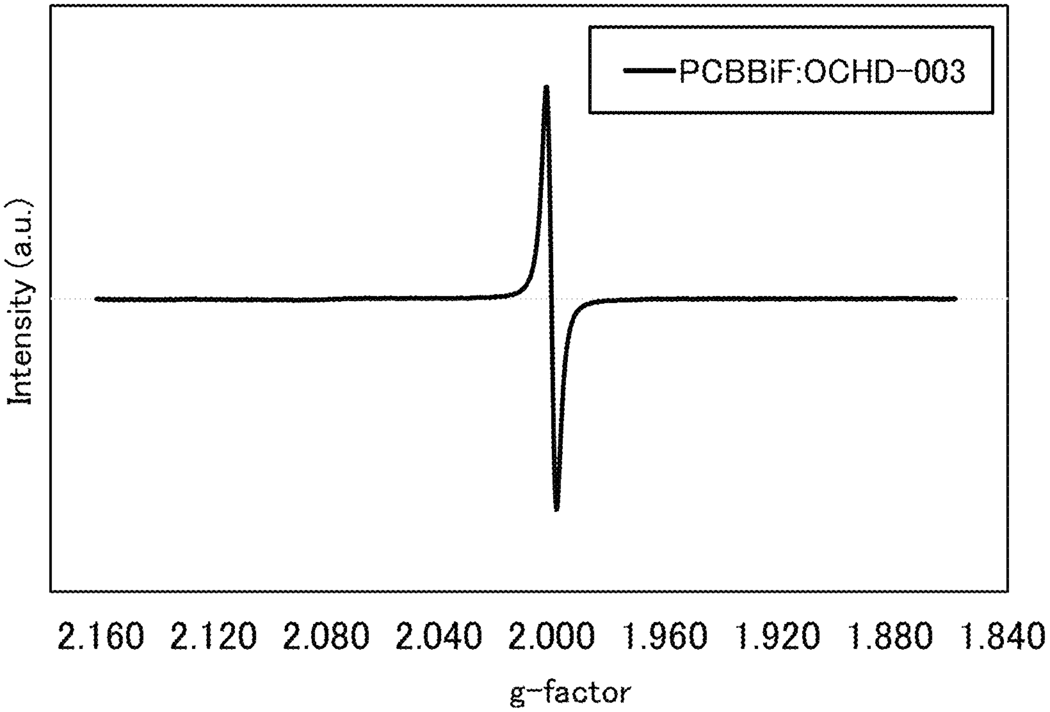
FIG. 37 is a graph showing an ESR spectrum of a thin film containing organic compounds used in a sample in an example.

Furthermore, a thin film was formed in the following manner: PCBBiF and OCHD-003 were deposited by co-evaporation to a thickness of 100 nm over a quartz substrate such that the weight ratio of PCBBiF to OCHD-003 was 1:0.1; then, an electron spin resonance spectrum of the thin film was measured at room temperature. Note that the measurement of the electron spin resonance spectrum using an ESR method was performed with an electron spin resonance spectrometer JES FA300 (manufactured by JEOL Ltd.). The measurement was performed at room temperature under the conditions where the resonance frequency was 9.18 GHz, the output power was 1 mW, the modulated magnetic field was 50 mT, the modulation width was 0.5 mT, the time constant was 0.03 s, and the sweep time was 1 min. FIG. 37 shows the measurement results. From FIG. 37, it was found that a signal was observed at a g-factor of around 2.000 and the spin density was $5\times10^{19}$ spins/$cm^3$. This suggests that OCHD-003 has an electron-accepting property with respect to PCBBiF and a layer containing PCBBiF and OCHD-003 functions as a charge-generation layer.

It was found from the above that a device that emits light with high efficiency can be provided by using one embodiment of the present invention.

Example 3

In this example, a light-emitting device 3A of one embodiment of the present invention and comparative light-emitting devices 3B to 3H were fabricated by a vacuum multi-chamber process, and the evaluated characteristics of the light-emitting devices are described.

The organic compounds whose structural formulae are shown below were used in all of the light-emitting device 3A and the comparative light-emitting devices 3B to 3H.

[Chemical Formula 13]

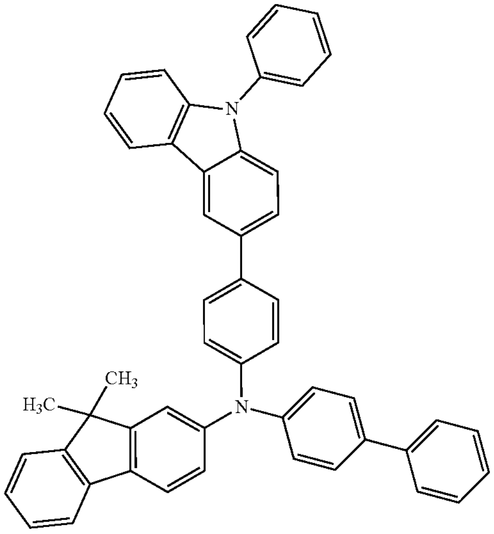

PCBBiF

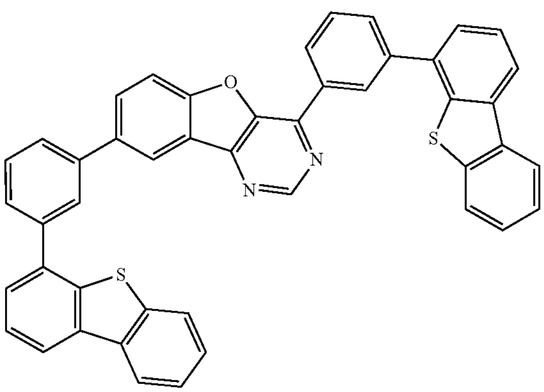

4,8mDBtP2Bfpm

-continued

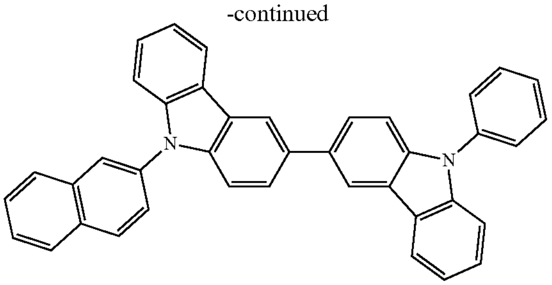

β NCCP

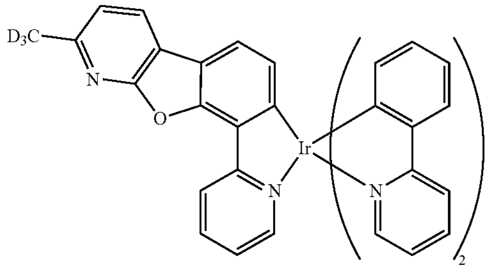

$Ir(ppy)_2(mbfpypy-d3)$

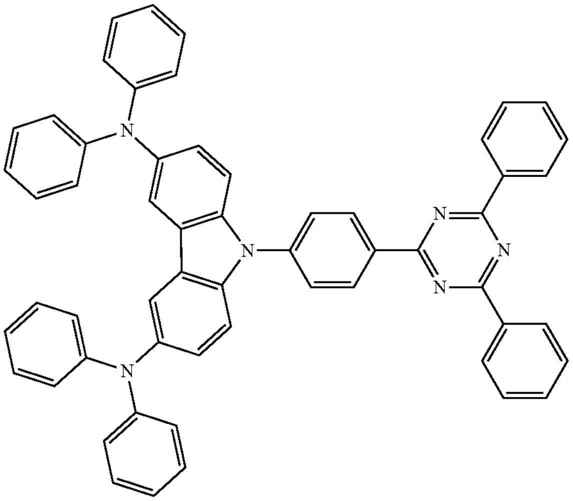

DACT-II

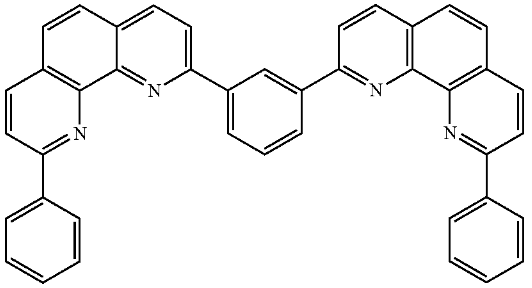

mPPhen2P

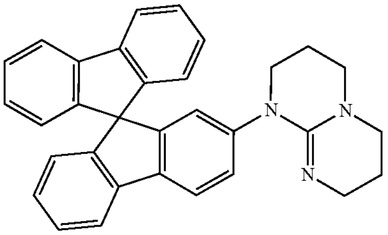

2hppSF

-continued
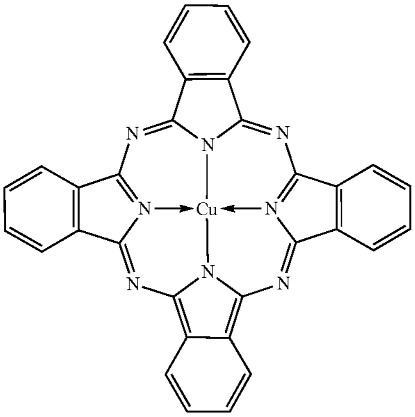
CuPc
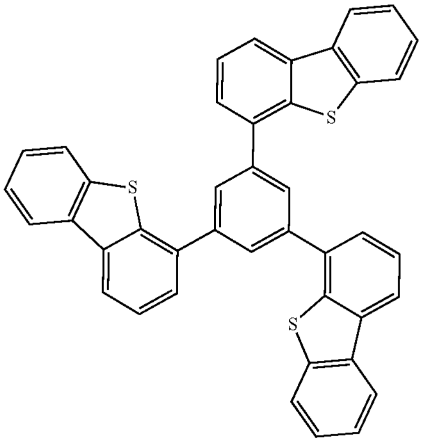
DBT3P-II
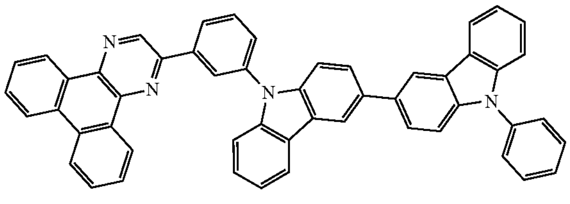
2mPCCzPDBq
The organic compounds whose structural formulae are shown below were used in the respective light-emitting devices.
[Chemical Formula 14]
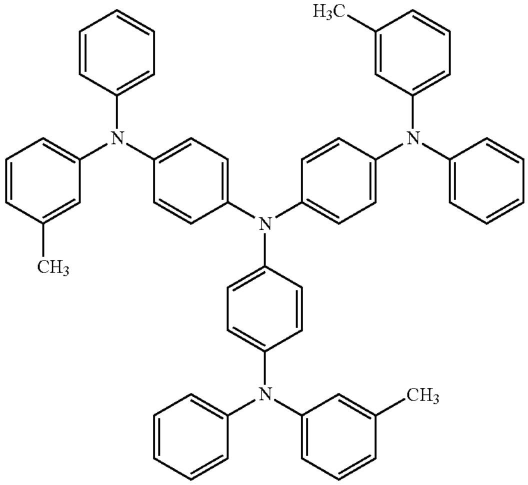
m-MTDATA
Comparative light-emitting device 3B
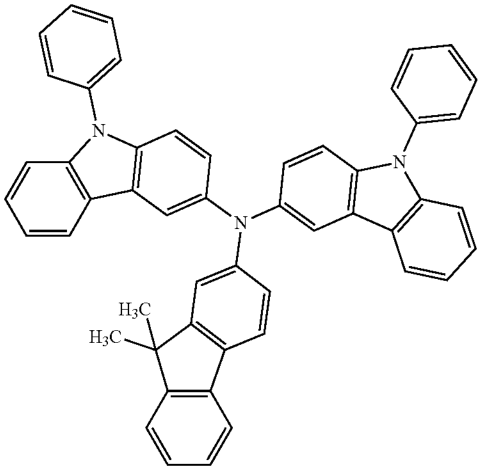
PCzPCFL
Comparative light-emitting device 3C -continued

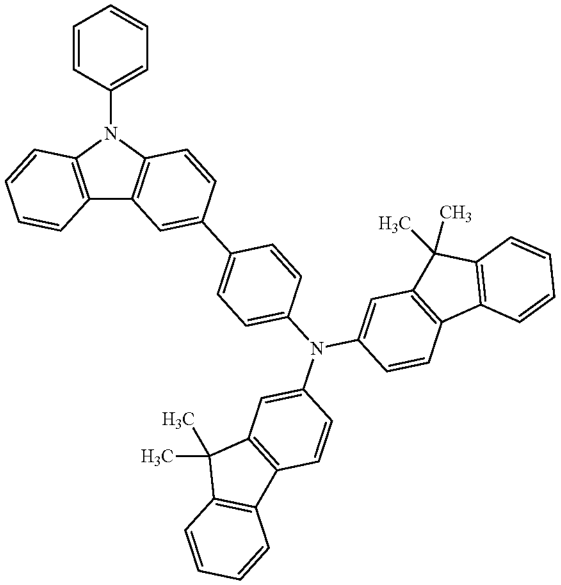

PCBFF
Comparative light-emitting device 3D

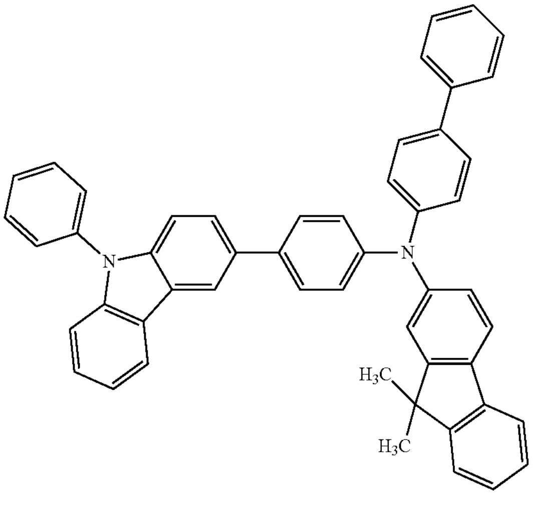

PCBBiF
Comparative light-emitting device 3E

-continued

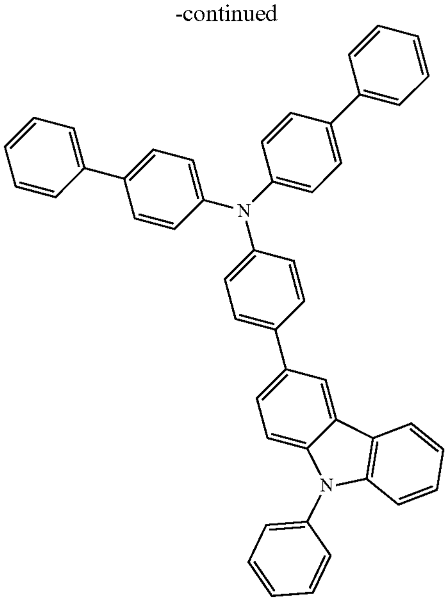

PCBBi1BP
Comparative light-emitting device 3F

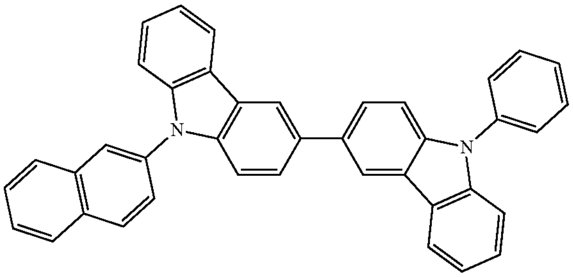

β NCCP
Comparative light-emitting device 3G

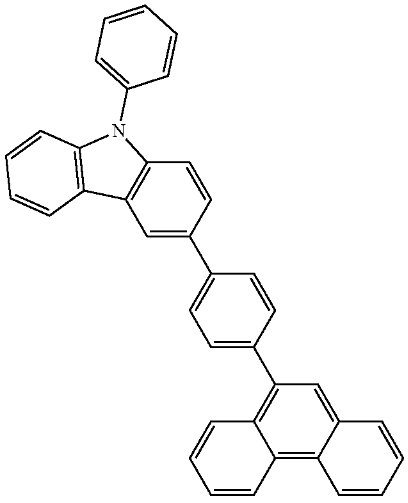

PcPPn
Comparative light-emitting device 3H

As illustrated in FIG. 23, the light-emitting device 3A and the comparative light-emitting devices 3B to 3H have a tandem structure in which the first EL layer 903, the intermediate layer 905, the second EL layer 904, and the second electrode 902 are stacked over the first electrode 901 formed over the substrate 900 that is a glass substrate.

The first EL layer 903 has a structure in which the hole-injection layer 910, the first hole-transport layer 911, the first light-emitting layer 912, and the first electron-transport layer 913 are stacked in this order. The intermediate layer 905 includes the electron-injection buffer region 914 and the layer 915 including an electron-relay region and a charge-generation region. The second EL layer 904 has a structure in which the second hole-transport layer 916, the second light-emitting layer 917, the second electron-transport layer 918, and the electron-injection layer 919 are stacked in this order.

<Method for Fabricating Light-Emitting Device 3A and Comparative Light-Emitting Devices 3B to 3H>

First, as a reflective electrode, silver (Ag) was deposited over the substrate 900 that is a glass substrate to a thickness of 100 nm by a sputtering method, and then, as a transparent electrode, indium tin oxide containing silicon oxide (ITSO) was deposited to a thickness of 10 nm by a sputtering method, so that the first electrode 901 was formed. The electrode area was set to 4 $mm^2$ (2 mm×2 mm). Note that the first electrode 901 is a transparent electrode, and the transparent electrode and the reflective electrode can be collectively regarded as the first electrode 901.

Next, the first EL layer 903 was provided. First, in pretreatment for forming each of the light-emitting device 3A and the comparative light-emitting devices 3B to 3H over the substrate, a surface of the substrate was washed with water and baking was performed at 200° C. for 1 hour. Then, the substrate was transferred into a vacuum evaporation apparatus where the pressure was reduced to approximately $1\times10^{-4}$ Pa, and vacuum baking was performed at 170° C. for 30 minutes in a heating chamber of the vacuum evaporation apparatus. After that, natural cooling was performed for approximately 30 minutes.

Then, the substrate provided with the first electrode 901 was fixed to a substrate holder provided in the vacuum evaporation apparatus such that the surface on which the first electrode 901 was formed faced downward. Over the first electrode 901, N-(biphenyl-4-yl)-N-[4-(9-phenyl-9H-carbazol-3-yl)phenyl]-9,9-dimethyl-9H-fluoren-2-amine (abbreviation: PCBBiF) and a fluorine-containing electron acceptor material with a molecular weight of 672 (OCHD-003) were deposited by co-evaporation using resistance heating to a thickness of 10 nm such that the weight ratio of PCBBiF to OCHD-003 was 1:0.03, whereby the hole-injection layer 910 was formed.

Next, PCBBiF was deposited by evaporation to a thickness of 20 nm over the hole-injection layer 910, so that the first hole-transport layer 911 was formed.

Next, the first light-emitting layer 912 was formed over the first hole-transport layer 911. Using resistance heating, 4,8-bis[3-(dibenzothiophen-4-yl)phenyl]-[1]benzofuro[3,2-d]pyrimidine (abbreviation: 4,8mDBtP2Bfpm), 9-(2-naphthyl)-9'-phenyl-9H,9'H-3,3'-bicarbazole (abbreviation: PNCCP), and [2-d3-methyl-(2-pyridinyl-κN)benzofuro[2,3-b]pyridine-κC]bis[2-(2-pyridinyl-κN)phenyl-κC]iridium (III) (abbreviation: $Ir(ppy)_2$(mbfpypy-d3)) were deposited by co-evaporation to a thickness of 40 nm such that the weight ratio of 4,8mDBtP2Bfpm to PNCCP and $Ir(ppy)_2$(mbfpypy-d3) was 5:5:1, whereby the first light-emitting layer 912 was formed.

Then, over the first light-emitting layer 912, 3,6-bis(diphenylamino)-9-[4-(4,6-diphenyl-1,3,5-triazin-2-yl)phenyl]-9H-carbazole (abbreviation: DACT-II) was deposited by evaporation to a thickness of 20 nm, so that the first electron-transport layer 913 was formed.

Next, the intermediate layer 905 was provided. In the light-emitting device 3A, 2,2'-(1,3-phenylene)bis(9-phenyl-1,10-phenanthroline) (abbreviation: mPPhen2P) and 1-(9,9'-spirobi[9H-fluoren]-2-yl)-1,3,4,6,7,8-hexahydro-2H-pyrimido[1,2-a]pyrimidine (abbreviation: 2hppSF) were deposited over the first electron-transport layer 913 by co-evaporation using resistance heating to a thickness of 10 nm under conditions 3X, which are shown in Table 9, so that a layer serving as the electron-injection buffer region 914 was formed. No hole-transport material was mixed in the electron-injection buffer region 914 of the light-emitting device 3A.

In each of the comparative light-emitting devices 3B to 3H, mPPhen2P, 2hppSF, and a hole-transport material were deposited over the first electron-transport layer 913 by co-evaporation using resistance heating to a thickness of 10 nm under any of the conditions 3X listed in Table 9, so that a layer serving as the electron-injection buffer region 914 was formed. As the hole-transport material, 4,4',4"-tris[N-(3-methylphenyl)-N-phenylamino]triphenylamine (abbreviation: m-MTDATA) was used in the comparative light-emitting device 3B, 3-[N-(9,9-dimethyl-9H-fluoren-2-yl)-N-(9-phenylcarbazol-3-yl)amino]-9-phenylcarbazole (abbreviation: PCzPCFL) was used in the comparative light-emitting device 3C, N-[4-(9-phenyl-9H-carbazol-3-yl)phenyl]bis(9,9-dimethyl-9H-fluoren-2-yl)amine (abbreviation: PCBFF) was used in the comparative light-emitting device 3D, N-(biphenyl-4-yl)-N-[4-(9-phenyl-9H-carbazol-3-yl)phenyl]-9,9-dimethyl-9H-fluoren-2-amine (abbreviation: PCBBiF) was used in the comparative light-emitting device 3E, 4,4'-diphenyl-4"-(9-phenyl-9H-carbazol-3-yl)triphenylamine (abbreviation: PCBBi1BP) was used in the comparative light-emitting device 3F, 9-(2-naphthyl)-9'-phenyl-9H,9'H-3,3'-bicarbazole (abbreviation: PNCCP) was used in the comparative light-emitting device 3G, and 9-[4-(9-phenyl-9H-carbazol-3-yl)phenyl]phenanthrene (abbreviation: PcPPn) was used in the comparative light-emitting device 3H.

Then, as the electron-relay region, copper phthalocyanine (abbreviation: CuPc) was deposited to a thickness of 2 nm. Next, as the charge-generation region, N-(biphenyl-4-yl)-N-[4-(9-phenyl-9H-carbazol-3-yl)phenyl]-9,9-dimethyl-9H-fluoren-2-amine (abbreviation: PCBBiF) and a fluorine-containing electron acceptor material with a molecular weight of 672 (OCHD-003) were deposited by co-evaporation using resistance heating to a thickness of 10 nm such that the weight ratio of PCBBiF to OCHD-003 was 1:0.15, whereby the layer 915 including the electron-relay region and the charge-generation region was formed.

Next, the second EL layer 904 was provided. First, PCBBiF was deposited by evaporation to a thickness of 40 nm, so that the second hole-transport layer 916 was formed.

Next, 4,8-bis[3-(dibenzothiophen-4-yl)phenyl]-[1]benzofuro[3,2-d]pyrimidine (abbreviation: 4,8mDBtP2Bfpm), 9-(2-naphthyl)-9'-phenyl-9H,9'H-3,3'-bicarbazole (abbreviation: PNCCP), and [2-d3-methyl-(2-pyridinyl-κN)benzofuro[2,3-b]pyridine-κC]bis[2-(2-pyridinyl-κN)phenyl-κC]iridium(III) (abbreviation: $Ir(ppy)_2$(mbfpypy-d3)) were deposited by co-evaporation using resistance heating to a thickness of 40 nm such that the weight ratio of 4,8mDBtP2Bfpm to PNCCP and $Ir(ppy)_2$(mbfpypy-d3) was 5:5:1, whereby the second light-emitting layer 917 was formed.

Next, over the second light-emitting layer 917, 2-{3-[3-(N-phenyl-9H-carbazol-3-yl)-9H-carbazol-9-yl]phenyl}dibenzo[f,h]quinoxaline (abbreviation: 2mPCCzPDBq) was deposited by evaporation to a thickness of 20 nm, and then 2,2'-(1,3-phenylene)bis(9-phenyl-1,10-phenanthroline) (abbreviation: mPPhen2P) was deposited by evaporation to a thickness of 20 nm, so that the second electron-transport layer 918 was formed.

Next, over the second electron-transport layer 918, lithium fluoride (LiF) and ytterbium (Yb) were deposited by co-evaporation to a thickness of 1.5 nm such that the volume ratio of LiF to Yb was 2:1, whereby the electron-injection layer 919 was formed.

Next, over the electron-injection layer 919, Ag and Mg were deposited by co-evaporation to a thickness of 15 nm such that the volume ratio of Ag to Mg was 1:0.1, whereby the second electrode 902 was formed. Note that the second electrode 902 is a semi-transmissive and semi-reflective electrode having functions of transmitting light and reflecting light.

Then, as a cap layer, 4,4',4"-(benzene-1,3,5-triyl)tri(dibenzothiophene) (abbreviation: DBT3P-II) was deposited by evaporation to a thickness of 70 nm.

Through the above process, the light-emitting device 3A and the comparative light-emitting devices 3B to 3H were fabricated.

The structures of the light-emitting device 3A and the comparative light-emitting devices 3B to 3H are listed in the table below.

TABLE 8

| | Thickness [nm] | Light-emitting device 3A and comparative light-emitting devices 3B to 3H |
|---|---|---|
| Cap layer | 70 | DBT3P-II |
| Second electrode | 15 | Ag:Mg (1:0.1) |
| Electron-injection layer | 1.5 | LiF:Yb (2:1) |
| Second electron-transport layer | 20 | mPPhen2P |
| | 20 | 2mPCCzPDBq |
| Second light-emitting layer | 40 | 4,8mDBtP2Bfpm:βNCCP:Ir(ppy)$_2$(mbfpypy-d3) (5:5:1) |
| Second hole-transport layer | 40 | PCBBiF |
| Charge-generation region | 10 | PCBBiF:OCHD-003 (1:0.15) |
| Electron-relay region | 2 | CuPc |
| Electron-injection buffer region | 10 | Condition 3X |
| First electron-transport layer | 20 | DACT-II |
| First light-emitting layer | 40 | 4,8mDBtP2Bfpm:βNCCP:Ir(ppy)$_2$(mbfpypy-d3) (5:5:1) |
| First hole-transport layer | 20 | PCBBiF |
| Hole-injection layer | 10 | PCBBiF:OCHD-003 (1:0.03) |
| First electrode | 10 | ITSO |
| | 100 | Ag |

The table below lists the conditions 3X for the electron-injection buffer regions 914 of the light-emitting device 3A and the comparative light-emitting devices 3B to 3H.

TABLE 9

| | Condition 3X | |
|---|---|---|
| | Material | Weight ratio |
| Light-emitting device 3A | mPPhen2P:2hppSF | (2:1) |
| Comparative light-emitting device 3B | mPPhen2P:2hppSF:m-MTDATA | (1:1:1) |
| Comparative light-emitting device 3C | mPPhen2P:2hppSF:PCzPCFL | (1:1:1) |
| Comparative light-emitting device 3D | mPPhen2P:2hppSF:PCBFF | (1:1:1) |
| Comparative light-emitting device 3E | mPPhen2P:2hppSF:PCBBiF | (1:1:1) |
| Comparative light-emitting device 3F | mPPhen2P:2hppSF:PCBBi1BP | (1:1:1) |

TABLE 9-continued

| | Condition 3X | |
|---|---|---|
| | Material | Weight ratio |
| Comparative light-emitting device 3G | mPPhen2P:2hppSF:βNCCP | (1:1:1) |
| Comparative light-emitting device 3H | mPPhen2P:2hppSF:PcPPn | (1:1:1) |

<Device Characteristics>

The light-emitting device 3A and the comparative light-emitting devices 3B to 3H were sealed using a glass substrate in a glove box containing a nitrogen atmosphere so as not to be exposed to the air (a sealing material was applied to surround the devices and UV treatment and heat treatment at 80° C. for 1 hour were performed at the time of sealing). Then, the emission characteristics of the light-emitting device 3A and the comparative light-emitting devices 3B to 3H were measured.

Figure 38:
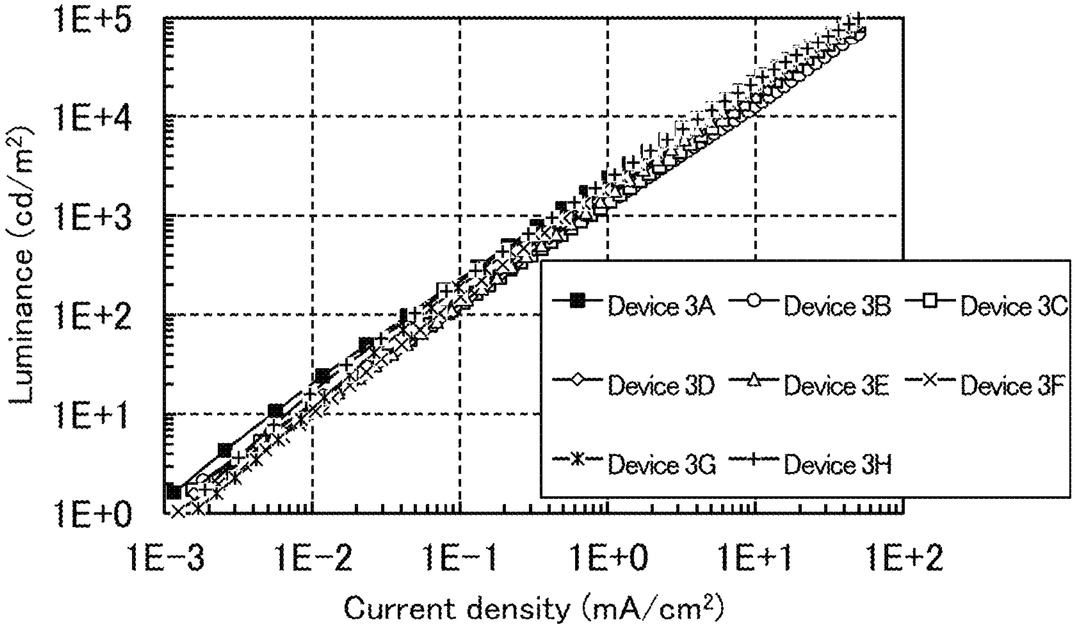
FIG. 38 is a graph showing luminance-current density characteristics of samples in an example.
Figure 39:
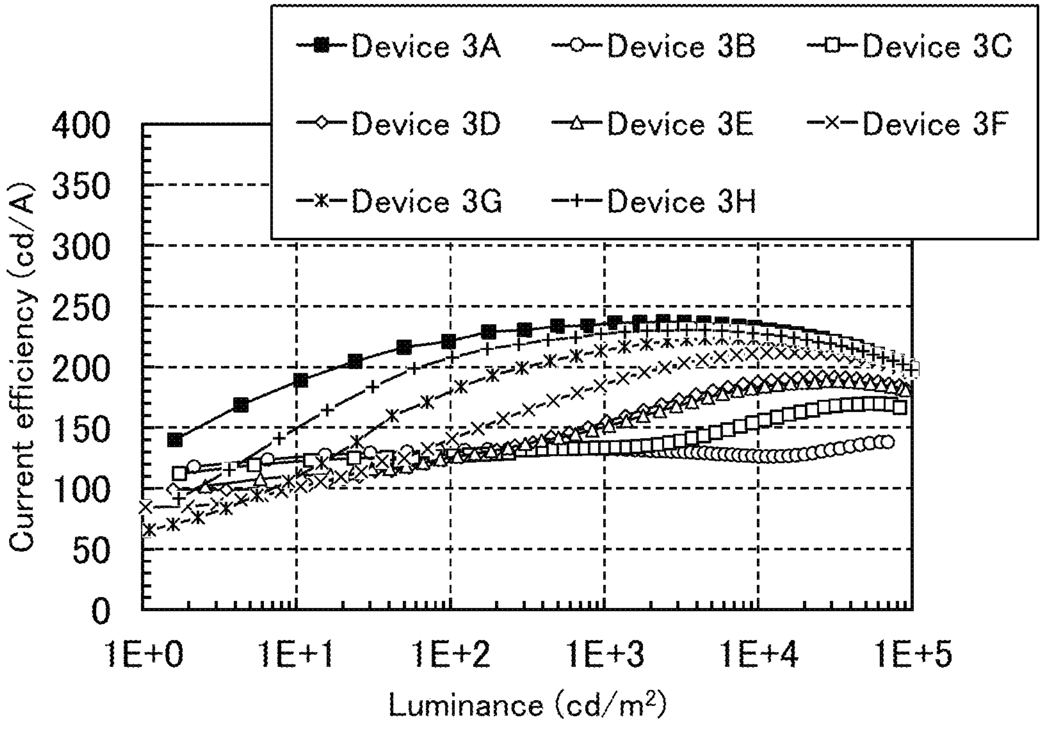
FIG. 39 is a graph showing current efficiency-luminance characteristics of samples in an example.
Figure 40:
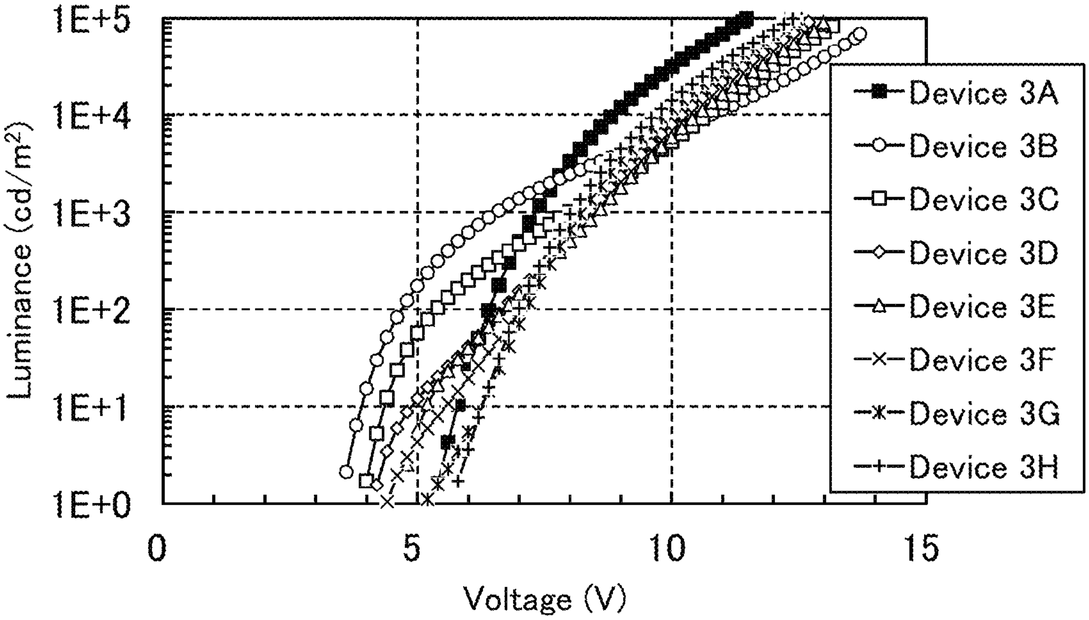
FIG. 40 is a graph showing luminance-voltage characteristics of samples in an example.
Figure 41:
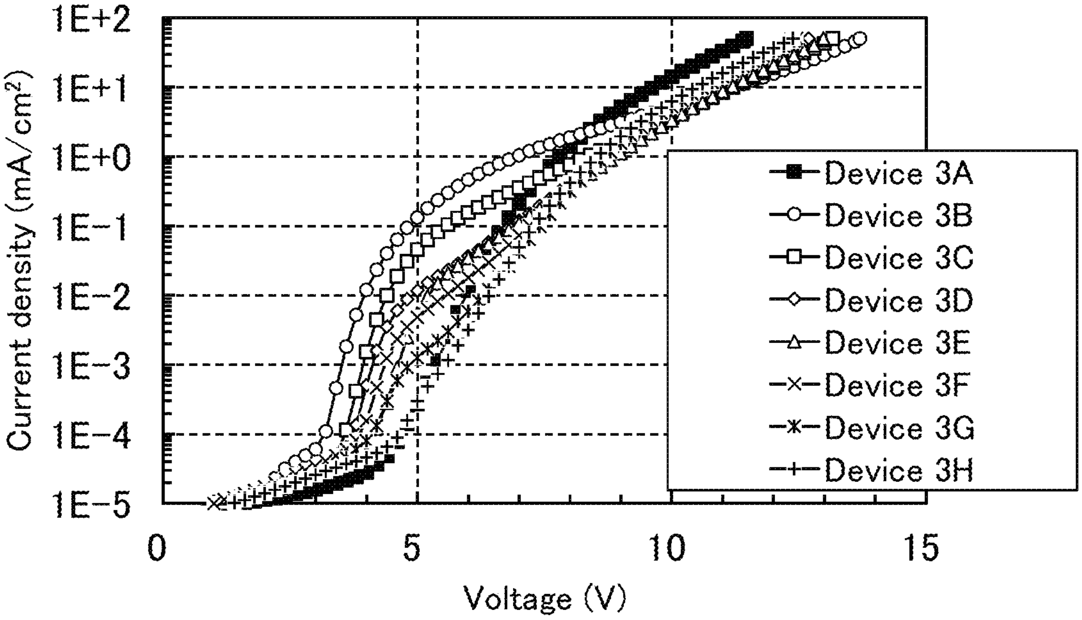
FIG. 41 is a graph showing current density-voltage characteristics of samples in an example.
Figure 42:
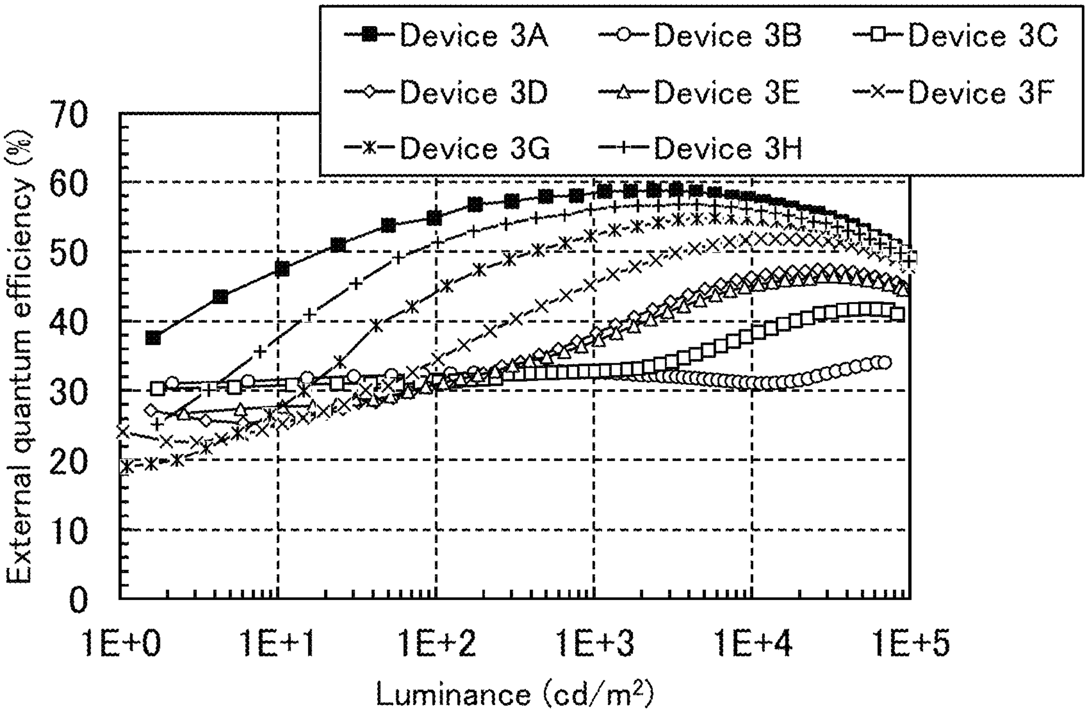
FIG. 42 is a graph showing external quantum efficiency-luminance characteristics of samples in an example.
Figure 43:
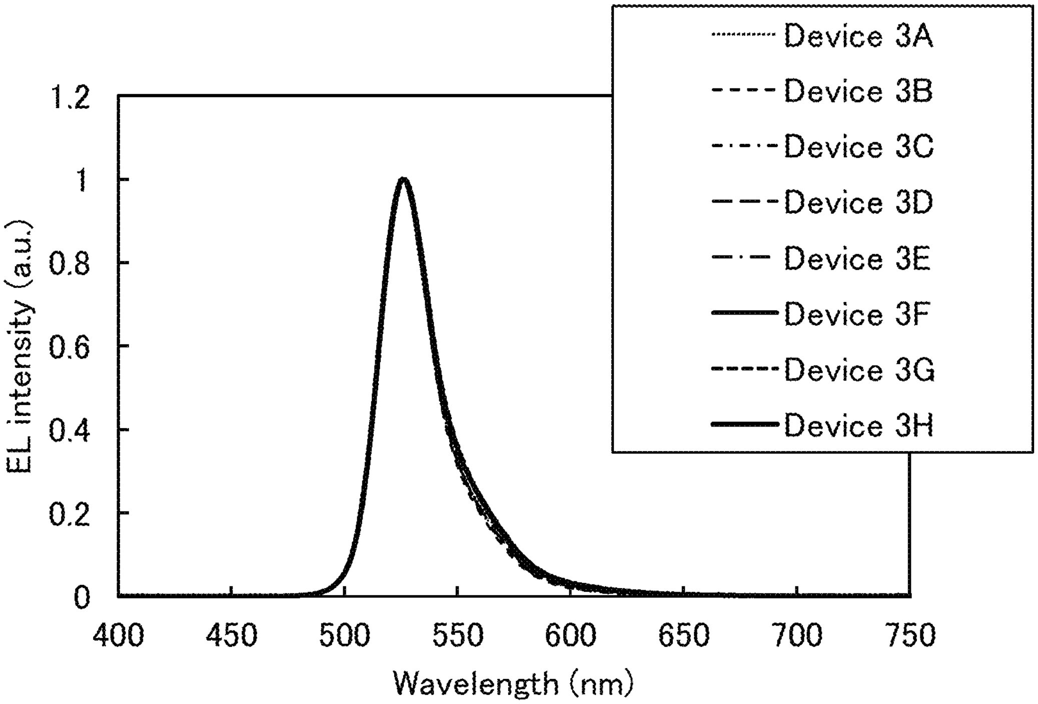
FIG. 43 is a graph showing electroluminescence spectra of samples in an example.

FIG. 38 shows the luminance-current density characteristics of the light-emitting device 3A and the comparative light-emitting devices 3B to 3H. FIG. 39 shows the current efficiency-luminance characteristics thereof. FIG. 40 shows the luminance-voltage characteristics thereof. FIG. 41 shows the current density-voltage characteristics thereof. FIG. 42 shows the external quantum efficiency-luminance characteristics thereof. FIG. 43 shows the electroluminescence spectra thereof. The main characteristics of the light-emitting device 3A and the comparative light-emitting devices 3B to 3H at a luminance of approximately 1000 cd/cm$^2$ are shown in the table below. The luminance, CIE chromaticity, and electroluminescence spectra were measured with a spectroradiometer (SR-UL1R produced by TOPCON TECHNOHOUSE CORPORATION). The external quantum efficiency was calculated from the luminance and the electroluminescence spectra measured with the spectroradiometer, on the assumption that the light-emitting devices had Lambertian light-distribution characteristics.

TABLE 10

| | Voltage (V) | Current density (mA/cm$^2$) | Chromaticity x | Chromaticity y | Luminance (cd/m$^2$) | Current efficiency (cd/A) | External quantum efficiency (%) |
|---|---|---|---|---|---|---|---|
| Light-emitting device 3A | 7.40 | 0.4954 | 0.232 | 0.719 | 1171.0 | 236.4 | 58.62 |
| Comparative light-emitting device 3B | 6.60 | 0.7834 | 0.220 | 0.730 | 1038.0 | 132.5 | 32.57 |
| Comparative light-emitting device 3C | 8.00 | 0.7658 | 0.222 | 0.728 | 1021.0 | 133.3 | 32.72 |
| Comparative light-emitting device 3D | 8.40 | 0.6685 | 0.226 | 0.725 | 1037.0 | 155.1 | 38.24 |
| Comparative light-emitting device 3E | 8.60 | 0.7101 | 0.225 | 0.726 | 1076.0 | 151.5 | 37.28 |
| Comparative light-emitting device 3F | 8.20 | 0.5109 | 0.235 | 0.720 | 943.4 | 184.7 | 45.18 |
| Comparative light-emitting device 3G | 8.20 | 0.4470 | 0.239 | 0.716 | 953.6 | 213.3 | 52.28 |
| Comparative light-emitting device 3H | 8.00 | 0.4196 | 0.238 | 0.716 | 953.7 | 227.3 | 56.03 |

The table below lists the HOMO and LUMO levels of each of the organic compounds used in the electron-injection buffer regions 914 of the intermediate layers 905 of the light-emitting devices. The HOMO and LUMO levels were measured using cyclic voltammetry (CV) measurement and ionization potential (TP) measurement.

TABLE 11

| Device | Hole-transport material added to intermediate layer | HOMO level [eV] CV measurement value | HOMO level [eV] IP measurement value | LUMO level [eV] CV measurement value | LUMO level [eV] IP measurement value |
|---|---|---|---|---|---|
| Light-emitting device 3A | — | — | — | — | — |
| Comparative light-emitting device 3B | m-MTDATA | −4.98 | −5.08 | −2.22 | −1.93 |
| Comparative light-emitting device 3C | PCzPCFL | −5.14 | −5.19 | −2.05 | −2.46 |
| Comparative light-emitting device 3D | PCBFF | −5.30 | −5.41 | −2.04 | −2.31 |
| Comparative light-emitting device 3E | PCBBiF | −5.36 | −5.55 | −2.00 | −2.38 |
| Comparative light-emitting device 3F | PCBBi1BP | −5.42 | −5.59 | −2.00 | −2.36 |
| Comparative light-emitting device 3G | βNCCP | −5.62 | −5.57 | −2.21 | −2.18 |
| Comparative light-emitting device 3H | PcPPn | −5.80 | −5.91 | −2.24 | −2.37 |

FIGS. 38 to 42 and Tables 10 and 11 show that among the light-emitting device 3A and the comparative light-emitting devices 3B to 311, the light-emitting devices in each of which the hole-transport material was added to the electron-injection buffer region 914 of the intermediate layer 905 had lower efficiency and higher luminance. Specifically, as shown in FIG. 41, the rising voltage in the current density-voltage characteristics was lower when the hole-transport material with a higher HOMO level was used.

The HOMO level of 2hppSF, which was used in all the light-emitting devices, was calculated to be −5.65 eV by IP measurement. The light-emitting device fabricated using PcPPn with a low HOMO level did not have the aforementioned lower rising voltage, whereas the light-emitting devices fabricated using, in their electron-injection buffer regions 914 of the intermediate layers 905, the materials whose HOMO levels obtained by the IP measurement are higher than −5.65 eV each had the aforementioned lower rising voltage.

The lower rising voltage and lower efficiency indicate that holes injected from the anode failed to be recombined with electrons in the first light-emitting layer 912 and reached the charge-generation region of the intermediate layer 905. The rising voltage and efficiency are lower when the second light-emitting layer 917 mainly emits light with the first light-emitting layer 912 hardly emitting light.

In other words, the lower rising voltage and resultant lower efficiency of the case where the material having a higher HOMO level than 2hppSF was used in the electron-injection buffer region 914 of the intermediate layer 905 strongly suggest that the holes injected from the first electrode 901 serving as the anode passed through the intermediate layer 905. Furthermore, the rising voltage and efficiency were significantly low when the material having a higher HOMO level than 2hppSF was used. This indicates that in the electron-injection buffer region 914 of the intermediate layer 905, preferably, the strongly basic material has the highest HOMO level and the material mixed with the strongly basic material has no hole-transport skeleton and a low HOMO level.

As shown in FIG. 43, the peak wavelengths in the electroluminescence spectra of the light-emitting device 3A and the comparative light-emitting devices 3B to 3H are around 550 nm, and the light-emitting device 3A and the comparative light-emitting devices 3B to 3H emitted green light.

<Reliability Test Result>

Figure 44:
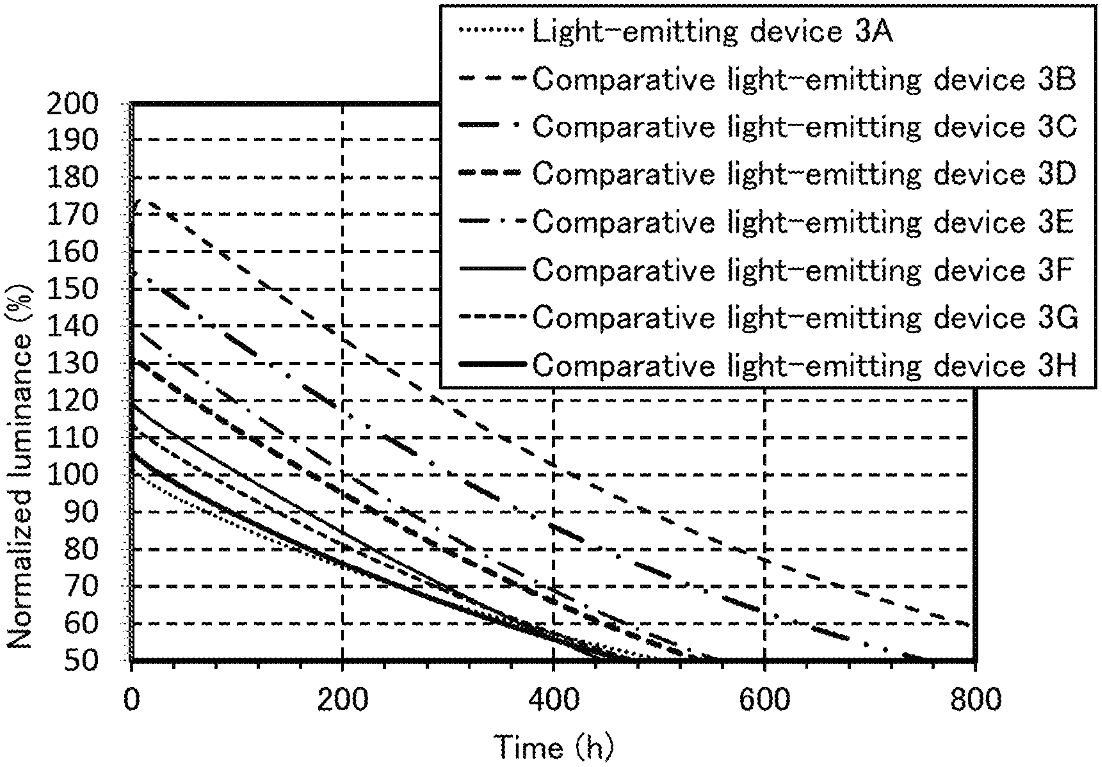
FIG. 44 is a graph showing time dependence of normalized luminance of samples in an example.

Moreover, a reliability test was conducted on the light-emitting device 3A and the comparative light-emitting devices 3B to 3H. FIG. 44 shows a time-dependent change in normalized luminance at the time of constant current density driving (50 [mA/cm$^2$]). In FIG. 44, the vertical axis represents the luminance (%) normalized with the luminance at the time of the start of light emission being regarded as 100%, and the horizontal axis represents time (h).

From FIG. 44, normalized luminance [%] 1 hour after the start of the measurement and LT75 (h), which is the time required for the measured luminance to decrease to 75% of the initial luminance, were obtained; the table below lists the values of the normalized luminance and LT75 (h).

TABLE 12

| Device | Hole-transport material added to intermediate layer | Normalized luminance [%] | LT75 [h] |
|---|---|---|---|
| Light-emitting device 3A | — | 101.44 | 201.00 |
| Comparative light-emitting device 3B | m-MTDATA | 167.53 | 620.00 |
| Comparative light-emitting device 3C | PCzPCFL | 152.56 | 187.00 |
| Comparative light-emitting device 3D | PCBFF | 131.04 | 330.00 |
| Comparative light-emitting device 3E | PCBBiF | 138.73 | 220.00 |
| Comparative light-emitting device 3F | PCBBi1BP | 118.73 | 221.00 |
| Comparative light-emitting device 3G | βNCCP | 113.29 | 212.00 |
| Comparative light-emitting device 3H | PcPPn | 105.86 | 210.00 |

From the above results, it was found that the light-emitting device in which the hole-transport material with a higher HOMO level is added to the electron-injection buffer region 914 of the intermediate layer 905 has higher luminance and that the luminance of such a light-emitting device increases more 1 hour after the start of the measurement, meaning lower stability of such a light-emitting device. This is probably because holes are extracted from the 2hppSF-containing electron-injection buffer region 914 of the intermediate layer 905. Accordingly, it can be said that in the electron-injection buffer region 914 of the intermediate layer 905, the material mixed with the strongly basic material preferably has no hole-transport skeleton and a low HOMO level.

Thus, a light-emitting device can have high reliability when its intermediate layer 905 includes the electron-injection buffer region 914 in which an electron-transport material and a strongly basic material having no electron-transport skeleton are mixed. In addition, the strongly basic material preferably has a higher HOMO level than the electron-transport material in the electron-injection buffer region 914 of the intermediate layer 905. Furthermore, the strongly basic material preferably has a higher LUMO level than the electron-transport material.

It was found from the above that a device that emits light with high efficiency can be provided by using one embodiment of the present invention.

Example 4

In this example, light-emitting devices 4A to 4C of embodiments of the present invention were fabricated by a vacuum multi-chamber process, and the evaluated characteristics of the light-emitting devices are described.

The structural formulae of organic compounds used for the light-emitting devices 4A to 4C are shown below.

[Chemical Formula 15]

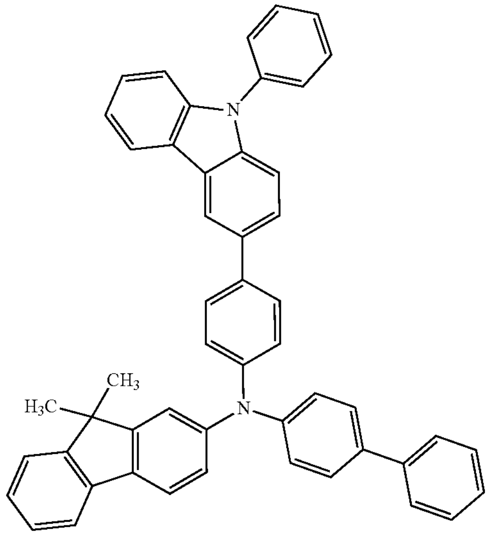

PCBBiF

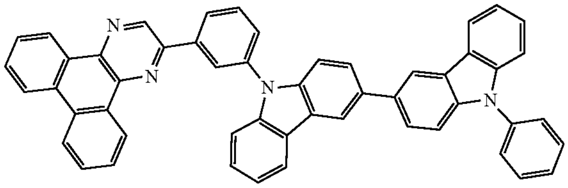

2mPCCzPDBq

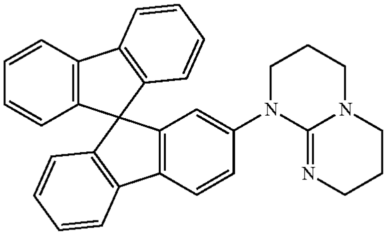

2hppSF

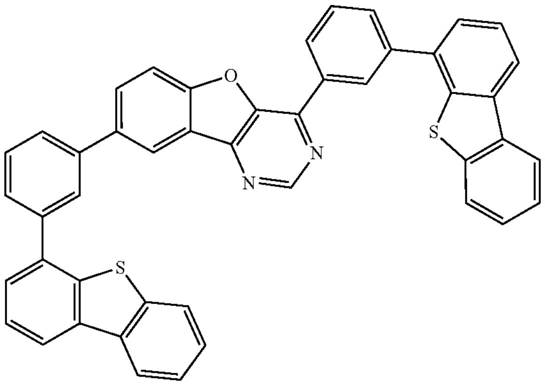

4,8mDBtP2Bfpm

-continued

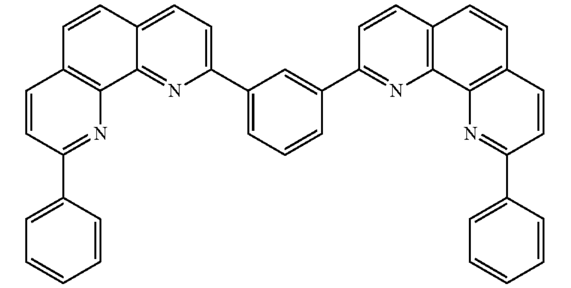

mPPhen2P

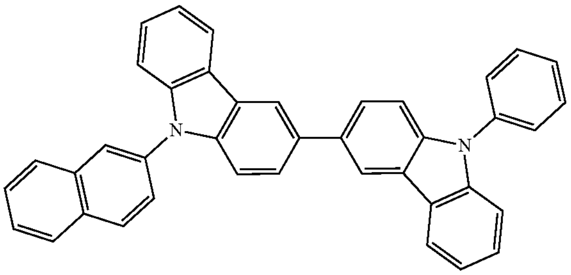

β NCCP

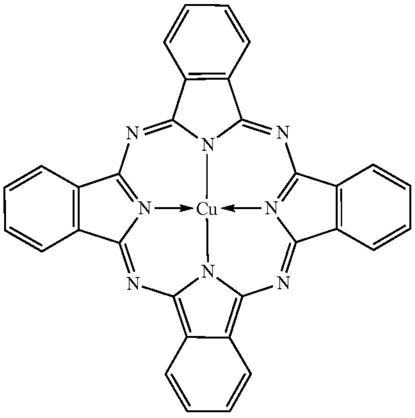

CuPc

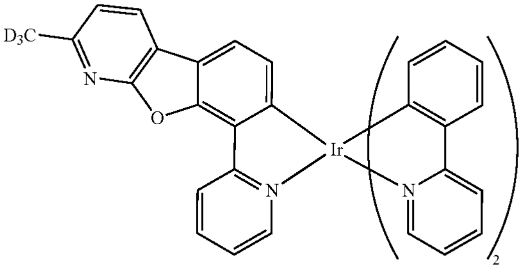

Ir(ppy)2(mbfpypy-d3)

-continued

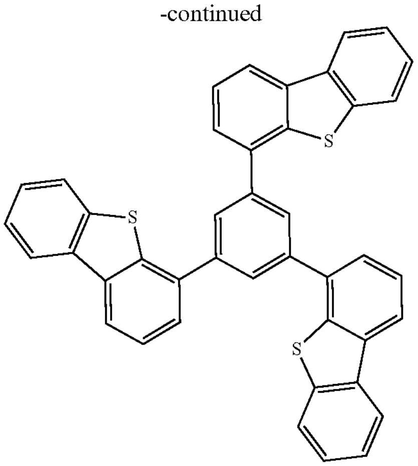

DBT3P-II

As illustrated in FIG. 23, the light-emitting devices 4A to 4C have a tandem structure in which the first EL layer 903, the intermediate layer 905, the second EL layer 904, and the second electrode 902 are stacked over the first electrode 901 formed over the substrate 900 that is a glass substrate.

The first EL layer 903 has a structure in which the hole-injection layer 910, the first hole-transport layer 911, the first light-emitting layer 912, and the first electron-transport layer 913 are stacked in this order. The intermediate layer 905 includes the electron-injection buffer region 914 and the layer 915 including an electron-relay region and a charge-generation region. The second EL layer 904 has a structure in which the second hole-transport layer 916, the second light-emitting layer 917, the second electron-transport layer 918, and the electron-injection layer 919 are stacked in this order.

<Method for Fabricating Light-Emitting Devices 4A to 4C>

First, as a reflective electrode, an alloy containing silver (Ag), palladium (Pd), and copper (Cu) (abbreviation: APC) was deposited over the substrate 900 that is a glass substrate to a thickness of 100 nm by a sputtering method, and then, as a transparent electrode, indium tin oxide containing silicon oxide (ITSO) was deposited to a thickness of 100 nm by a sputtering method, so that the first electrode 901 was formed. The electrode area was set to 4 $mm^2$ (2 mm×2 mm). Note that the first electrode 901 is a transparent electrode, and the transparent electrode and the reflective electrode can be collectively regarded as the first electrode 901.

Next, the first EL layer 903 was provided. First, in pretreatment for forming each of the light-emitting devices 4A to 4C over the substrate, a surface of the substrate was washed with water and baking was performed at 200° C. for 1 hour. Then, the substrate was transferred into a vacuum evaporation apparatus where the pressure was reduced to approximately $1\times10^{-4}$ Pa, and vacuum baking was performed at 170° C. for 30 minutes in a heating chamber of the vacuum evaporation apparatus. After that, natural cooling was performed for approximately 30 minutes.

Then, the substrate provided with the first electrode 901 was fixed to a substrate holder provided in the vacuum evaporation apparatus such that the surface on which the first electrode 901 was formed faced downward. Over the first electrode 901, N-(biphenyl-4-yl)-N-[4-(9-phenyl-9H-carbazol-3-yl)phenyl]-9,9-dimethyl-9H-fluoren-2-amine (abbreviation: PCBBiF) and a fluorine-containing electron acceptor material with a molecular weight of 672 (OCHD- 003) were deposited by co-evaporation using resistance heating to a thickness of 10 nm such that the weight ratio of PCBBiF to OCHD-003 was 1:0.03, whereby the hole-injection layer 910 was formed.

Next, PCBBiF was deposited by evaporation to a thickness of 60 nm over the hole-injection layer 910, so that the first hole-transport layer 911 was formed.

Next, the first light-emitting layer 912 was formed over the first hole-transport layer 911. Using resistance heating, 4,8-bis[3-(dibenzothiophen-4-yl)phenyl]-[1]benzofuro[3,2-d]pyrimidine (abbreviation: 4,8mDBtP2Bfpm), 9-(2-naphthyl)-9'-phenyl-9H,9'H-3,3'-bicarbazole (abbreviation: PNCCP), and [2-d3-methyl-(2-pyridinyl-κN)benzofuro[2,3-b]pyridine-κC]bis[2-(2-pyridinyl-κN)phenyl-κC]iridium (III) (abbreviation: $Ir(ppy)_2$(mbfpypy-d3)) were deposited by co-evaporation to a thickness of 40 nm such that the weight ratio of 4,8mDBtP2Bfpm to PNCCP and $Ir(ppy)_2$ (mbfpypy-d3) was 5:5:1, whereby the first light-emitting layer 912 was formed.

Then, over the first light-emitting layer 912, 2-{3-[3-(N-phenyl-9H-carbazol-3-yl)-9H-carbazol-9-yl] phenyl}dibenzo[f,h]quinoxaline (abbreviation: 2mPCCzPDBq) was deposited by evaporation to a thickness of 10 nm, and then 2,2'-(1,3-phenylene)bis(9-phenyl-1,10-phenanthroline) (abbreviation: mPPhen2P) was deposited by evaporation to a thickness of 15 nm, so that the first electron-transport layer 913 was formed.

Next, the intermediate layer 905 was provided. First, over the first electron-transport layer 913, 2,2'-(1,3-phenylene) bis(9-phenyl-1,10-phenanthroline) (abbreviation: mPPhen2P) and 1-(9,9'-spirobi[9H-fluoren]-2-yl)-1,3,4,6,7,8-hexahydro-2H-pyrimido[1,2-a]pyrimidine (abbreviation: 2hppSF) were deposited by co-evaporation using resistance heating to a thickness of 5 nm, so that a layer serving as the electron-injection buffer region 914 was formed.

Here, the weight ratio of mPPhen2P to 2hppSF was 1:1 in the light-emitting device 4A. The weight ratio of mPPhen2P to 2hppSF was 1:0.5 in the light-emitting device 4B. The weight ratio of mPPhen2P to 2hppSF was 1:0.25 in the light-emitting device 4C.

Then, as the electron-relay region, copper phthalocyanine (abbreviation: CuPc) was deposited to a thickness of 2 nm. Next, as the charge-generation region, N-(biphenyl-4-yl)-N-[4-(9-phenyl-9H-carbazol-3-yl)phenyl]-9,9-dimethyl-9H-fluoren-2-amine (abbreviation: PCBBiF) and a fluorine-containing electron acceptor material with a molecular weight of 672 (OCHD-003) were deposited by co-evaporation using resistance heating to a thickness of 10 nm such that the weight ratio of PCBBiF to OCHD-003 was 1:0.15, whereby the layer 915 including the electron-relay region and the charge-generation region was formed.

Next, the second EL layer 904 was provided. First, PCBBiF was deposited by evaporation to a thickness of 40 nm, so that the second hole-transport layer 916 was formed.

Next, 4,8-bis[3-(dibenzothiophen-4-yl)phenyl]-[1]benzofuro[3,2-d]pyrimidine (abbreviation: 4,8mDBtP2Bfpm), 9-(2-naphthyl)-9'-phenyl-9H,9'H-3,3'-bicarbazole (abbreviation: PNCCP), and [2-d3-methyl-(2-pyridinyl-κN)benzofuro[2,3-b]pyridine-κC]bis[2-(2-pyridinyl-κN)phenyl-κC] iridium(III) (abbreviation: $Ir(ppy)_2$(mbfpypy-d3)) were deposited by co-evaporation using resistance heating to a thickness of 40 nm such that the weight ratio of 4,8mDBtP2Bfpm to PNCCP and $Ir(ppy)_2$(mbfpypy-d3) was 5:5:1, whereby the second light-emitting layer 917 was formed.

Next, over the second light-emitting layer 917, 2-{3-[3-(N-phenyl-9H-carbazol-3-yl)-9H-carbazol-9-yl] phenyl}dibenzo[f,h]quinoxaline (abbreviation: 2mPCCzPDBq) was deposited by evaporation to a thickness of 20 nm, and then 2,2'-(1,3-phenylene)bis(9-phenyl-1,10-phenanthroline) (abbreviation: mPPhen2P) was deposited by evaporation to a thickness of 20 nm, so that the second electron-transport layer 918 was formed.

Next, over the second electron-transport layer 918, lithium fluoride (LiF) and ytterbium (Yb) were deposited by co-evaporation to a thickness of 1.5 nm such that the volume ratio of LiF to Yb was 2:1, whereby the electron-injection layer 919 was formed.

Next, over the electron-injection layer 919, Ag and Mg were deposited by co-evaporation to a thickness of 15 nm such that the volume ratio of Ag to Mg was 1:0.1, whereby the second electrode 902 was formed. Note that the second electrode 902 is a semi-transmissive and semi-reflective electrode having functions of transmitting light and reflecting light.

Then, as a cap layer, 4,4',4"-(benzene-1,3,5-triyl)tri (dibenzothiophene) (abbreviation: DBT3P-II) was deposited by evaporation to a thickness of 70 nm.

Through the above process, the light-emitting devices 4A to 4C were fabricated.

The structures of the light-emitting devices 4A to 4C are listed in the table below. Note that in each of the light-emitting devices 4A to 4C, the electron-injection buffer region 914 as part of the intermediate layer 905 is a mixed layer of mPPhen2P that has an electron-transport property and 2hppSF that is a strongly basic material having an acid dissociation constant $pK_a$ of 13.35. The mixing ratio between mPPhen2P and 2hppSF differs between the light-emitting devices.

TABLE 13

| | Thickness [nm] | Light-emitting device 4A | Light-emitting device 4B | Light-emitting device 4C |
|---|---|---|---|---|
| Cap layer | 70 | DBT3P-II | | |
| Second electrode | 15 | Ag:Mg (1:0.1) | | |
| Electron-injection layer | 1.5 | LiF:Yb (2:1) | | |
| Second electron-transport layer | 20 | mPPhen2P | | |
| | 20 | 2mPCCzPDBq | | |
| Second light-emitting layer | 40 | 4,8mDBtP2Bfpm:βNCCP:$Ir(ppy)_2$(mbfpypy-d3) (5:5:1) | | |
| Second hole-transport layer | 40 | PCBBiF | | |
| Charge-generation region | 10 | PCBBiF:OCHD-003 (1:0.15) | | |
| Electron-relay region | 2 | CuPc | | |
| Electron-injection buffer region | 5 | mPPhen2P:2hppSF (1:1) | (1:0.5) | (1:0.25) |

TABLE 13-continued

| | Thickness [nm] | Light-emitting device 4A | Light-emitting device 4B | Light-emitting device 4C |
|---|---|---|---|---|
| First electron-transport layer | 15 | mPPhen2P | | |
| | 10 | 2mPCCzPDBq | | |
| First light-emitting layer | 40 | 4,8mDBtP2Bfpm:βNCCP:Ir(ppy)$_2$(mbfpypy-d3) (5:5:1) | | |
| First hole-transport layer | 60 | PCBBiF | | |
| Hole-injection layer | 10 | PCBBiF:OCHD-003 (1:0.03) | | |
| First electrode | 100 | ITSO | | |
| | 100 | APC | | |

<Device Characteristics>

The light-emitting devices 4A to 4C were sealed using a glass substrate in a glove box containing a nitrogen atmosphere so as not to be exposed to the air (a sealing material was applied to surround the devices and UV treatment and heat treatment at 80° C. for 1 hour were performed at the time of sealing). Then, the emission characteristics of the light-emitting devices 4A to 4C were measured.

Figure 45:
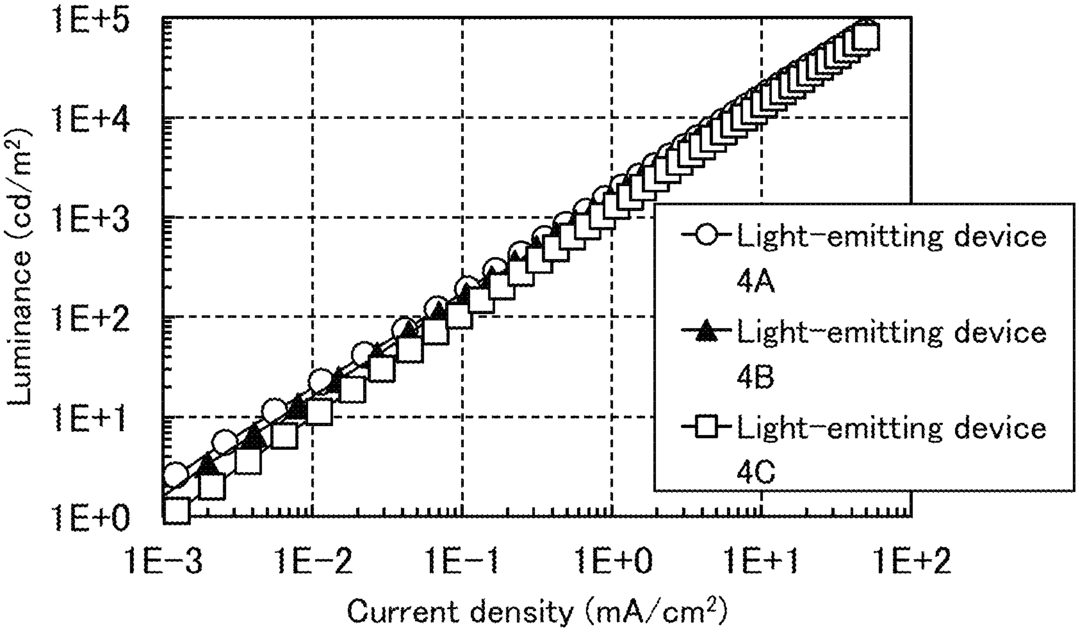
FIG. 45 is a graph showing luminance-current density characteristics of samples in an example.
Figure 46:
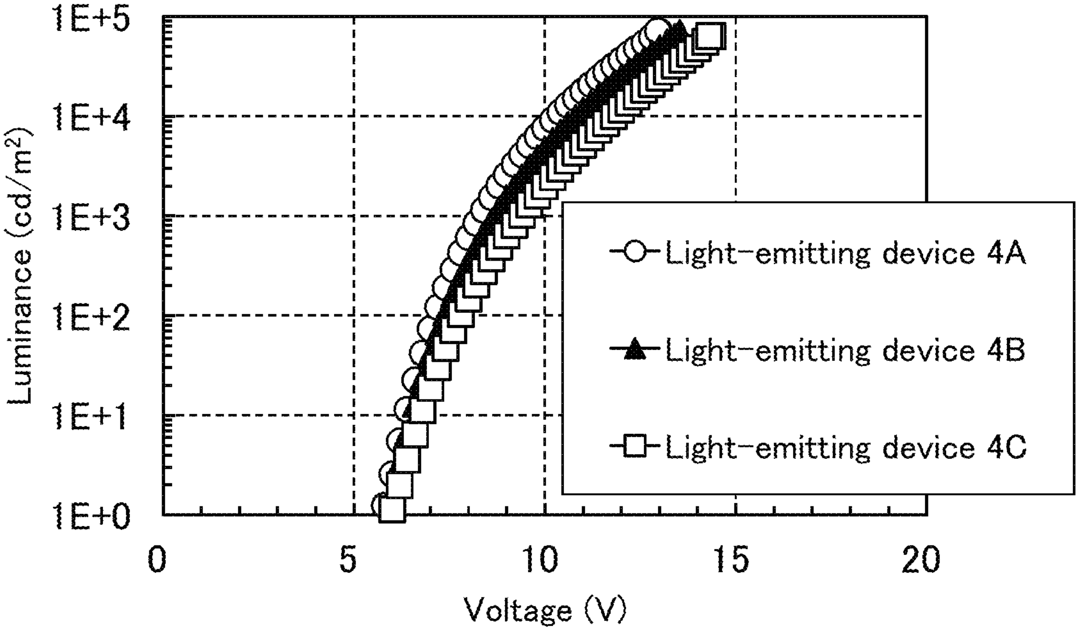
FIG. 46 is a graph showing luminance-voltage characteristics of samples in an example.
Figure 47:
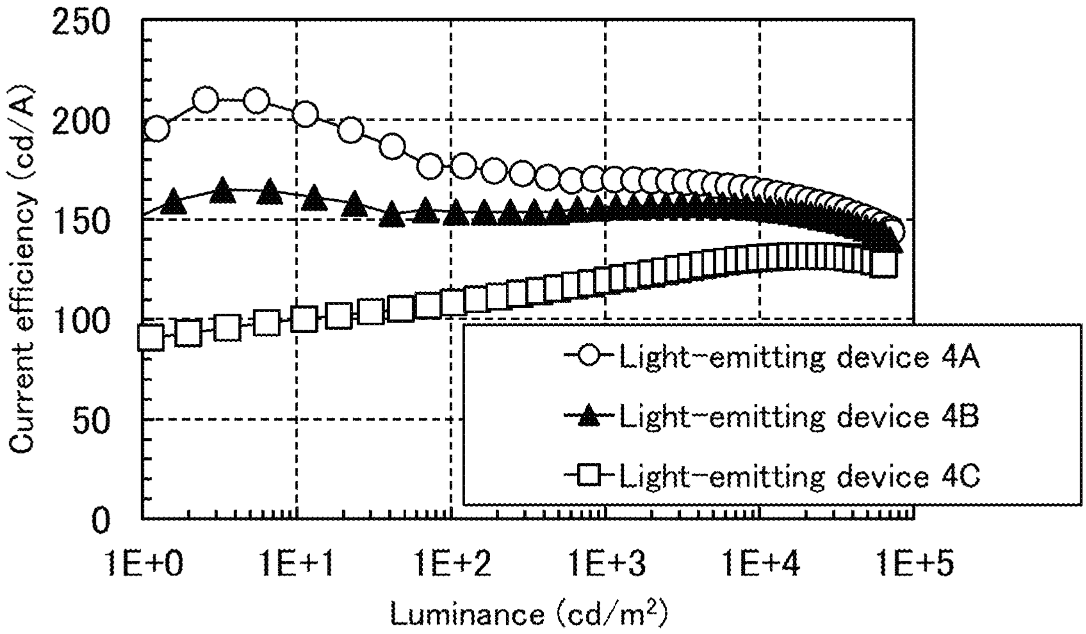
FIG. 47 is a graph showing current efficiency-luminance characteristics of samples in an example.
Figure 48:
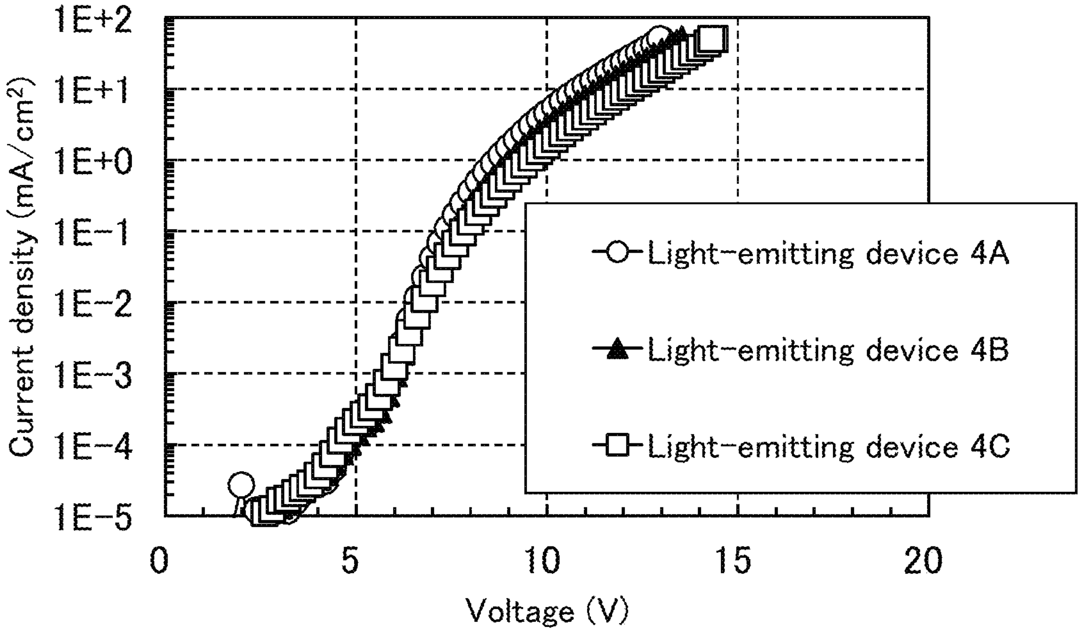
FIG. 48 is a graph showing current density-voltage characteristics of samples in an example.
Figure 49:
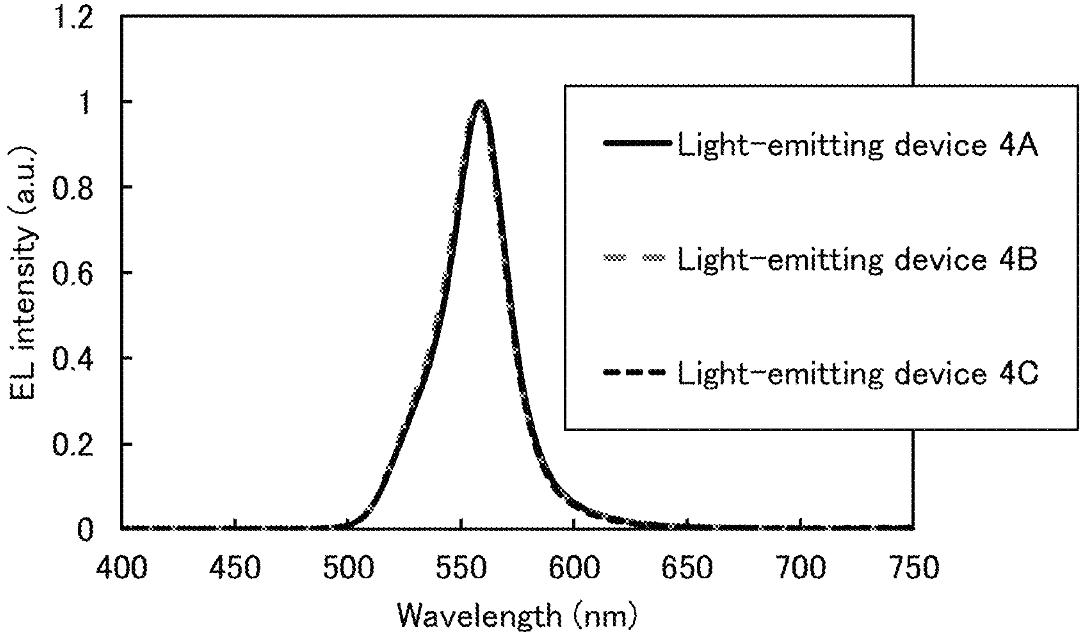
FIG. 49 is a graph showing electroluminescence spectra of samples in an example.

FIG. 45 shows the luminance-current density characteristics of the light-emitting devices 4A to 4C. FIG. 46 shows the luminance-voltage characteristics thereof. FIG. 47 shows the current efficiency-luminance characteristics thereof. FIG. 48 shows the current density-voltage characteristics thereof. FIG. 49 shows the electroluminescence spectra thereof. The main characteristics of the light-emitting devices 4A to 4C at a luminance of approximately 1000 cd/cm$^2$ are shown in the table below. The luminance, CIE chromaticity, and electroluminescence spectra were measured with a spectroradiometer (SR-UL1R produced by TOPCON TECHNOHOUSE CORPORATION). The external quantum efficiency was calculated from the luminance and the electroluminescence spectra measured with the spectroradiometer, on the assumption that the light-emitting devices had Lambertian light-distribution characteristics.

<Reliability Test Result>

Figure 50:
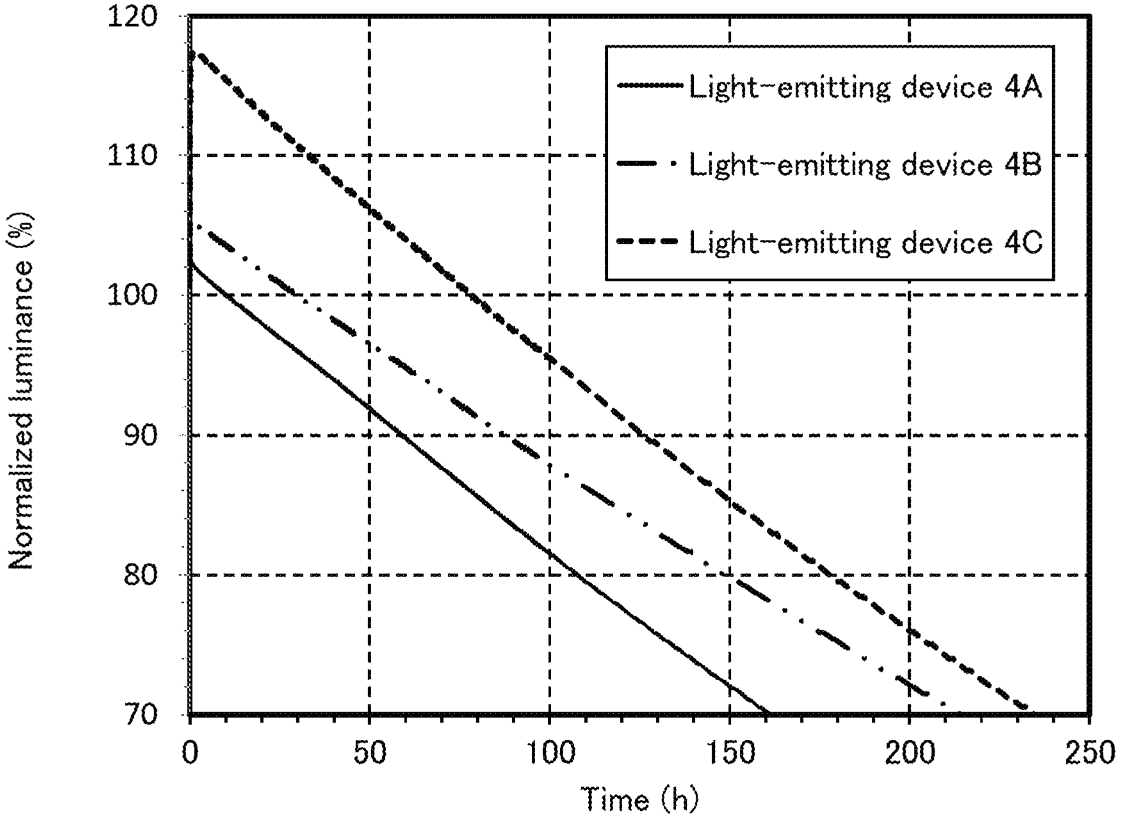
FIG. 50 is a graph showing time dependence of normalized luminance of samples in an example.

Moreover, a reliability test was conducted on the light-emitting devices 4A to 4C. FIG. 50 shows a time-dependent change in normalized luminance at the time of constant current density driving (50 [mA/cm$^2$]). In FIG. 50, the vertical axis represents the luminance (%) normalized with the luminance at the time of the start of light emission being regarded as 100%, and the horizontal axis represents time (h).

In FIG. 50, LT75 (h), which is the time required for the measured luminance to decrease to 75% of the initial luminance, of the light-emitting device 4A is approximately 133 hours. LT75 of the light-emitting device 4B is approximately 181 hours and LT75 of the light-emitting device 4C is approximately 206 hours. The light-emitting device 4B deteriorated only gradually over time.

It was found from the above that a highly reliable light-emitting device can be provided by using one embodiment of the present invention.

Example 5

In this example, light-emitting devices 5 (light-emitting devices 5A to 5D) of embodiments of the present invention and a comparative light-emitting device 5E were fabricated by a vacuum multi-chamber process, and the evaluated characteristics of the light-emitting devices are described.

TABLE 14

| | Voltage (V) | Current density (mA/cm$^2$) | Chromaticity x | Chromaticity y | Luminance (cd/m$^2$) | Current efficiency (cd/A) | External quantum efficiency (%) |
|---|---|---|---|---|---|---|---|
| Light-emitting device 4A | 8.40 | 0.6743 | 0.365 | 0.624 | 1146.0 | 169.9 | 38.52 |
| Light-emitting device 4B | 8.60 | 0.5712 | 0.359 | 0.630 | 890.1 | 155.8 | 35.22 |
| Light-emitting device 4C | 9.40 | 0.8635 | 0.361 | 0.628 | 1030.0 | 119.3 | 26.90 |

As seen from FIGS. 45 to 48 and the above table, the light-emitting devices 4A to 4C had favorable device characteristics. The light-emitting device 4C, in which the weight ratio of mPPhen2P as an electron-transport material to 2hppSF as a strongly basic material was 1:0.25, had lower efficiency. It was thus found that mPPhen2P as an electron-transport material and 2hppSF as a strongly basic material are preferably mixed in substantially the same proportion by weight. That is, the weight of a strongly basic material is greater than or equal to 0.15 times and less than or equal to 1.5 times that of an electron-transport material, further preferably greater than or equal to 0.25 times and less than or equal to 1.25 times that of an electron-transport material.

As shown in FIG. 49, the peak wavelengths in the electroluminescence spectra of the light-emitting devices 4A to 4C are around 550 nm, and the light-emitting devices 4A to 4C emitted green light.

Figure 51:
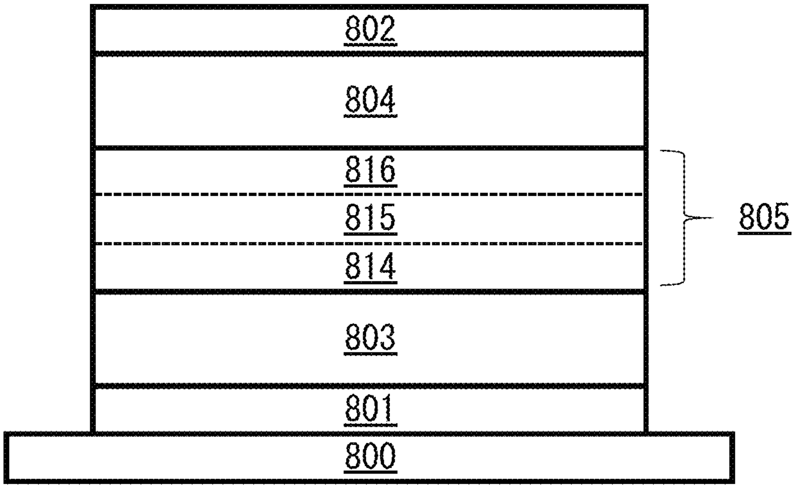
FIG. 51 illustrates a structure of samples in an example.

As illustrated in FIG. 51, the light-emitting devices 5A to 5D and the comparative light-emitting device 5E have a tandem structure in which a first EL layer 803, an intermediate layer 805, a second EL layer 804, and a second electrode 802 are stacked over a first electrode 801 formed over a substrate 800 that is a glass substrate. The intermediate layer 805 includes an electron-injection buffer region 814, an electron-relay region 815, and a charge-generation region 816.

The light-emitting devices 5A to 5D and the comparative light-emitting device 5E fabricated differ from one another in the structure of the intermediate layer 805. The table below lists the structures of the intermediate layers 805 of the light-emitting devices 5.

TABLE 15

| | Thickness [nm] | Material used in intermediate layer |
|---|---|---|
| Charge-generation region 816 | 10 | PCBBiF:OCHD-003 (1:0.15) |
| Electron-relay region 815 | 2 | CuPc |
| Electron-injection buffer region 814 | 5 | mPPhen2P:Condition 5X (1:1) |

The table below lists the conditions 5X for the light-emitting devices 5A to 5D and the comparative light-emitting device 5E. The table also lists the acid dissociation constant $pK_a$ values of the organic compounds (conditions 5X) in the light-emitting devices.

TABLE 16

| | Condition 5X | $pK_a$ |
|---|---|---|
| Light-emitting device 5A | 2,7hpp2SF | 14.83 |
| Light-emitting device 5B | 2hppSF | 13.95 |
| Light-emitting device 5C | pyrrd-Phen | 11.23 |
| Light-emitting device 5D | 2,6tip2Py | 9.58 |
| Comparative light-emitting device 5E | Comparative organic compound | 7.83 |

The structural formulae of the organic compounds used in the light-emitting devices 5A to 5D are shown below.

[Chemical Formula 16]

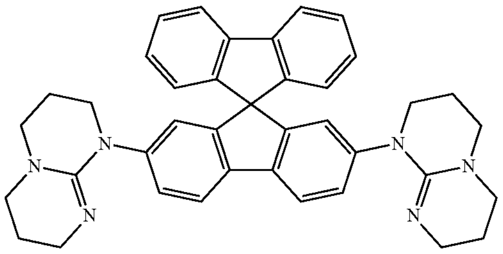

2,7hpp2SF
Light-emitting device 5A

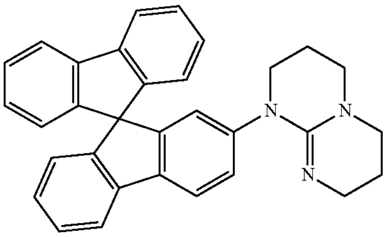

2hppSF
Light-emitting device 5B

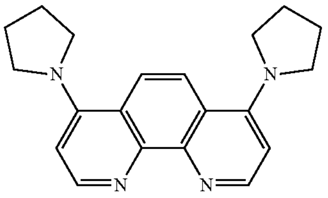

pyrrd-Phen
Light-emitting device 5C

-continued

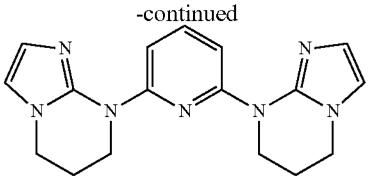

2,6tip2Py
Light-emitting device 5D

<Method for Fabricating Light-Emitting Devices 5A to 5D and Comparative Light-Emitting Device 5E>

First, the first electrode 801 was formed over the substrate 800 that is a glass substrate and then, the first EL layer 803 was provided.

Next, the intermediate layer 805 was provided. First, over the first EL layer 803, 2,2'-(1,3-phenylene)bis(9-phenyl-1,10-phenanthroline) (abbreviation: mPPhen2P) and the organic compound shown as "Condition 5X" were deposited by co-evaporation using resistance heating to a thickness of 5 nm such that the weight ratio of mPPhen2P to the organic compound shown as "Condition 5X" was 1:1, whereby a layer serving as the electron-injection buffer region 814 was formed.

As the organic compound shown as "Condition 5X", 1,1'-(9,9'-spirobi[9H-fluorene]-2,7-diyl)bis(1,3,4,6,7,8-hexahydro-2H-pyrimido[1,2-a]pyrimidine) (abbreviation: 2,7hpp2SF) was used in the light-emitting device 5A; 1-(9,9'-spirobi[9H-fluoren]-2-yl)-1,3,4,6,7,8-hexahydro-2H-pyrimido[1,2-a]pyrimidine (abbreviation: 2hppSF) was used in the light-emitting device 5B; 4,7-di-1-pyrrolidinyl-1,10-phenanthroline (abbreviation: Pyrrd-Phen) was used in the light-emitting device 5C; 8,8'-pyridine-2,6-diyl-bis(5,6,7,8-tetrahydroimidazo[1,2-a]pyrimidine) (abbreviation: 2,6tip2Py) was used in the light-emitting device 5D; and an organic compound with an acid dissociation constant $pK_a$ of 7.83 was used in the comparative light-emitting device 5E.

Then, as the electron-relay region 815, copper phthalocyanine (abbreviation: CuPc) was deposited to a thickness of 2 nm. Next, as the charge-generation region 816, N-(biphenyl-4-yl)-N-[4-(9-phenyl-9H-carbazol-3-yl)phenyl]-9,9-dimethyl-9H-fluoren-2-amine (abbreviation: PCBBiF) and a fluorine-containing electron acceptor material with a molecular weight of 672 (OCHD-003) were deposited by co-evaporation using resistance heating to a thickness of 10 nm such that the weight ratio of PCBBiF to OCHD-003 was 1:0.15.

Subsequently, the second EL layer 904 was provided, followed by formation of the second electrode 802. After that, a cap layer was formed by evaporation.

Through the above process, the light-emitting devices 5 and the comparative light-emitting device 5E were fabricated.

<Device Characteristics>

The light-emitting devices 5A to 5D and the comparative light-emitting device 5E were sealed using a glass substrate in a glove box containing a nitrogen atmosphere so as not to be exposed to the air (a sealing material was applied to surround the devices and UV treatment and heat treatment at 80° C. for 1 hour were performed at the time of sealing). Then, the emission characteristics of the light-emitting devices 5A to 5D and the comparative light-emitting device 5E were measured.

The ratio of the external quantum efficiency of each of the light-emitting devices 5 as a percentage of the external quantum efficiency of a light-emitting device in which the electron-injection buffer region 814 was formed in the following manner was calculated: mPPhen2P and $Li_2O$ were deposited by co-evaporation using resistance heating to a thickness of 5 nm such that the weight ratio of mPPhen2P to $Li_2O$ was 1:0.01. The external quantum efficiency of the latter light-emitting device was regarded as 100%. The results are shown in FIG. 52 and the table below.

TABLE 17

| Device | Organic compound used in electron-injection buffer region 814 | $pK_a$ | Ratio of external quantum efficiency [%] |
|---|---|---|---|
| Light-emitting device 5A | 2,7hpp2SF | 14.83 | 99% |
| Light-emitting device 5B | 2hppSF | 13.95 | 98% |
| Light-emitting device 5C | pyrrd-Phen | 11.23 | 84% |
| Light-emitting device 5D | 2,6tip2Py | 9.58 | 83% |
| Comparative light-emitting device 5E | Comparative organic compound | 7.83 | 45% |

Figure 52:
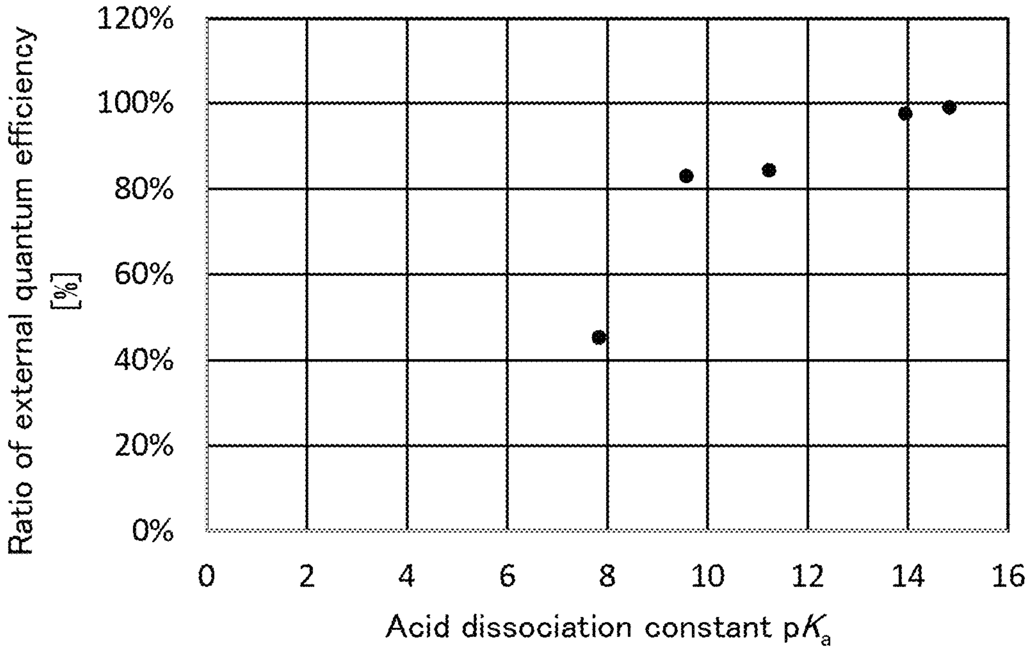
FIG. 52 is a graph showing the ratios of external quantum efficiency of light-emitting devices as function of acid dissociation constants $pK_a$ of organic compounds used in the light-emitting devices.

FIG. 52 and the table above show that the external quantum efficiency of the light-emitting devices 5A to 5D in each of which the electron-injection buffer region 814 was formed using an organic compound with an acid dissociation constant $pK_a$ higher than or equal to 8 was greater than or equal to 80% of the external quantum efficiency of the light-emitting device in which the electron-injection buffer region 814 was formed using lithium oxide. Specifically, the light-emitting devices 5A and 5B in each of which the electron-injection buffer region 814 was formed using an organic compound with an acid dissociation constant $pK_a$ higher than or equal to 12 had external quantum efficiency equivalent to that of the light-emitting device in which the electron-injection buffer region 814 was formed using lithium oxide.

It was thus found that the light-emitting devices 5A to 5D in each of which the intermediate layer 805 was formed using an organic compound with an acid dissociation constant $pK_a$ higher than or equal to 8 can achieve efficiency equivalent to that of the light-emitting device in which the electron-injection buffer region 814 of the intermediate layer 805 was formed using $Li_2O$. By contrast, the efficiency of the comparative light-emitting device 5E fabricated using the comparative organic compound with an acid dissociation constant $pK_a$ lower than 8 was found to be below half the efficiency of the light-emitting device fabricated using $Li_2O$.

It was found from the above that a device that emits light with high efficiency can be provided by using one embodiment of the present invention.

Example 6

In this example, devices 6 (devices 6A to 6H) of embodiments of the present invention were fabricated by a vacuum multi-chamber process, and the evaluated characteristics of the devices are described.

In some of the devices fabricated in this example, a material having a lower HOMO level than PCBBiF as a reference organic compound was added, and the hole-transport property in the devices was evaluated.

Figure 53:
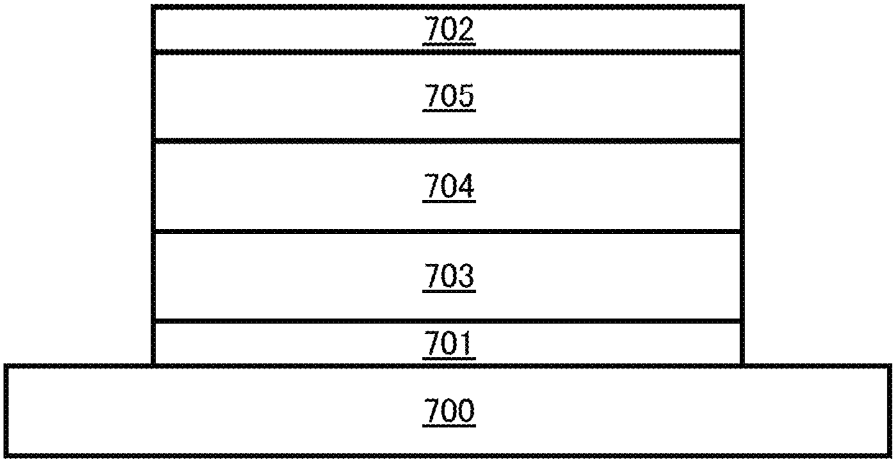
FIG. 53 illustrates a structure of samples in an example.

As illustrated in FIG. 53, the devices 6A to 6H have a structure in which a hole-injection layer 703, a hole-transport layer 704, a hole-relay layer 705, and a second electrode 702 are stacked over a first electrode 701 formed over a substrate 700 that is a glass substrate.

The devices 6A to 6H differ from one another in the structure of the hole-transport layer 704. The table below lists the structures of the devices 6.

TABLE 18

| | Thickness [nm] | Structure of device 6 |
|---|---|---|
| Second electrode | 100 | Al |
| Hole-relay layer | 5 | PCBBiF:$MoO_x$ (1:1) |
| Hole-transport layer | 50 | Condition 6X (1:0.25) |
| Hole-injection layer | 10 | PCBBiF:OCHD-003 (1:0.15) |
| First electrode | 70 | ITSO |

The table below lists the conditions 6X.

TABLE 19

| | Condition 6X |
|---|---|
| Device 6A | PCBBiF |
| Device 6B | PCBBiF:UGH-2 |
| Device 6C | PCBBiF:mFBPTzn |
| Device 6D | PCBBiF:2mDBTBPDBq-II |
| Device 6E | PCBBiF:NBPhen |
| Device 6F | PCBBiF:mPPhen2P |
| Device 6G | PCBBiF:Pyrrd-Phen |
| Device 6H | PCBBiF:2hppSF |

The structural formulae of the organic compounds used in the devices 6A to 6H are shown below.

[Chemical Formula 17]

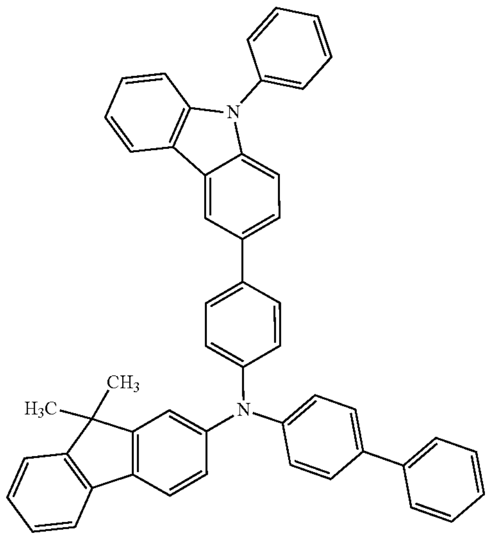

PCBBiF

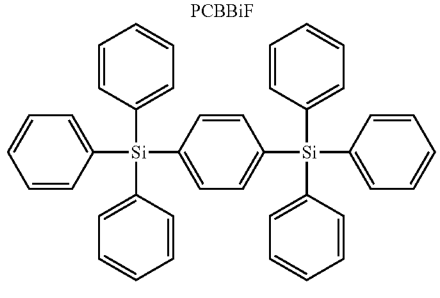

UGH-2
Device 6B

-continued

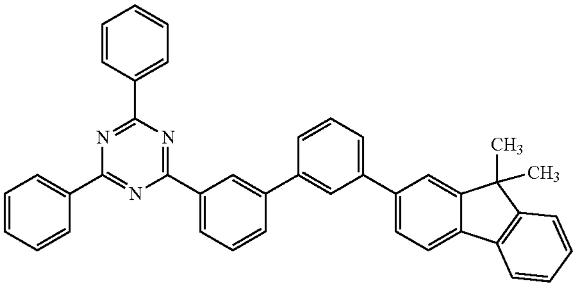

mFBPTzn
Device 6C

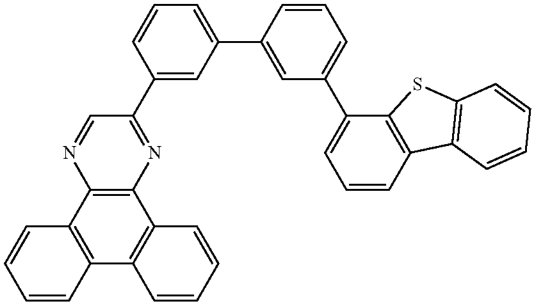

2mDBTBPDBq-II
Device 6D

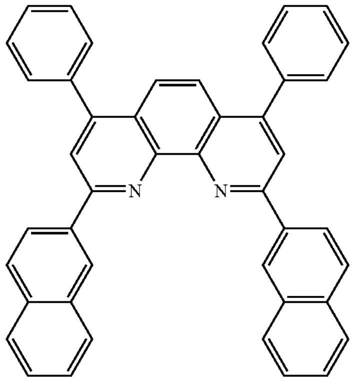

NBPhen
Device 6E

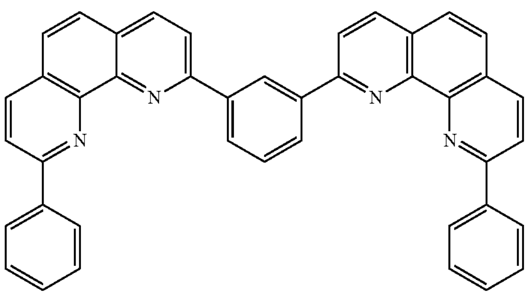

mPPhen2P
Device 6F

-continued

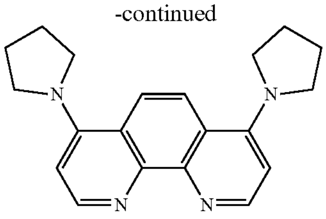

Pyrrd-Phen
Device 6G

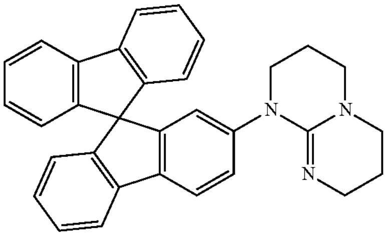

2hppSF
Device 6H

<Method for Fabricating Devices 6>

First, as a transparent electrode, indium tin oxide containing silicon oxide (ITSO) was deposited over the substrate 700 that is a glass substrate to a thickness of 70 nm by a sputtering method, so that the first electrode 701 was formed.

Then, in pretreatment for forming each of the devices 6 over the substrate, a surface of the substrate was washed with water and baking was performed at 200° C. for 1 hour. Then, the substrate was transferred into a vacuum evaporation apparatus where the pressure was reduced to approximately $1\times10^{-4}$ Pa, and vacuum baking was performed at 170° C. for 30 minutes in a heating chamber of the vacuum evaporation apparatus. After that, natural cooling was performed for approximately 30 minutes.

Then, the substrate provided with the first electrode 701 was fixed to a substrate holder provided in the vacuum evaporation apparatus such that the surface on which the first electrode 701 was formed faced downward. Over the first electrode 701, N-(biphenyl-4-yl)-N-[4-(9-phenyl-9H-carbazol-3-yl)phenyl]-9,9-dimethyl-9H-fluoren-2-amine (abbreviation: PCBBiF) and a fluorine-containing electron acceptor material with a molecular weight of 672 (OCHD-003) were deposited by co-evaporation using resistance heating to a thickness of 10 nm such that the weight ratio of PCBBiF to OCHD-003 was 1:0.15, whereby the hole-injection layer 703 was formed.

Then, over the hole-injection layer 703, N-(biphenyl-4-yl)-N-[4-(9-phenyl-9H-carbazol-3-yl)phenyl]-9,9-dimethyl-9H-fluoren-2-amine (abbreviation: PCBBiF) and the organic compound shown as "Condition 6X" were deposited by co-evaporation using resistance heating to a thickness of 50 nm such that the weight ratio of PCBBiF to the organic compound shown as "Condition 6X" was 1:0.25, whereby the hole-transport layer 704 was formed.

Note that the hole-transport layer 704 in the device 6A was a layer consisting of PCBBiF. The hole-transport layer 704 in the device 6B was a mixed layer formed by co-evaporation of 1,4-di(triphenylsilyl)benzene (abbreviation: UGH-2) and PCBBiF; the hole-transport layer 704 in the device 6C was a mixed layer formed by co-evaporation of 2-[3'-(9,9-dimethyl-9H-fluoren-2-yl)biphenyl-3-yl]-4,6-diphenyl-1,3,5-triazine (abbreviation: mFBPTzn) and PCB- BiF; the hole-transport layer 704 in the device 6D was a mixed layer formed by co-evaporation of 2-[3-(3'-dibenzothiophen-4-yl)biphenyl]dibenzo[f,h]quinoxaline (abbreviation: 2mDBTBPDBq-II) and PCBBiF; the hole-transport layer 704 in the device 6E was a mixed layer formed by co-evaporation of 2,9-di(naphthalen-2-yl)-4,7-diphenyl-1,10-phenanthroline (abbreviation: NBPhen) and PCBBiF; the hole-transport layer 704 in the device 6F was a mixed layer formed by co-evaporation of 2,2'-(1,3-phenylene)bis(9-phenyl-1,10-phenanthroline) (abbreviation: mPPhen2P) and PCBBiF; the hole-transport layer 704 in the device 6G was a mixed layer formed by co-evaporation of 4,7-di-1-pyrrolidinyl-1,10-phenanthroline (abbreviation: Pyrrd-Phen) and PCBBiF; and the hole-transport layer 704 in the device 6H was a mixed layer formed by co-evaporation of 1-(9,9'-spirobi[9H-fluoren]-2-yl)-1,3,4,6,7,8-hexahydro-2H-pyrimido[1,2-a]pyrimidine (abbreviation: 2hppSF) and PCBBiF.

Then, over the hole-transport layer 704, N-(biphenyl-4-yl)-N-[4-(9-phenyl-9H-carbazol-3-yl)phenyl]-9,9-dimethyl-9H-fluoren-2-amine (abbreviation: PCBBiF) and molybdenum oxide ($MoO_x$) were deposited by co-evaporation using resistance heating to a thickness of 5 nm such that the weight ratio of PCBBiF to $MoO_x$ was 1:1, whereby the hole-relay layer 705 was formed.

Then, over the hole-relay layer 705, aluminum (Al) was deposited by evaporation to a thickness of 100 nm, so that the second electrode 702 was formed.

Through the above process, the devices 6 were fabricated.

<Device Characteristics>

Figure 54:
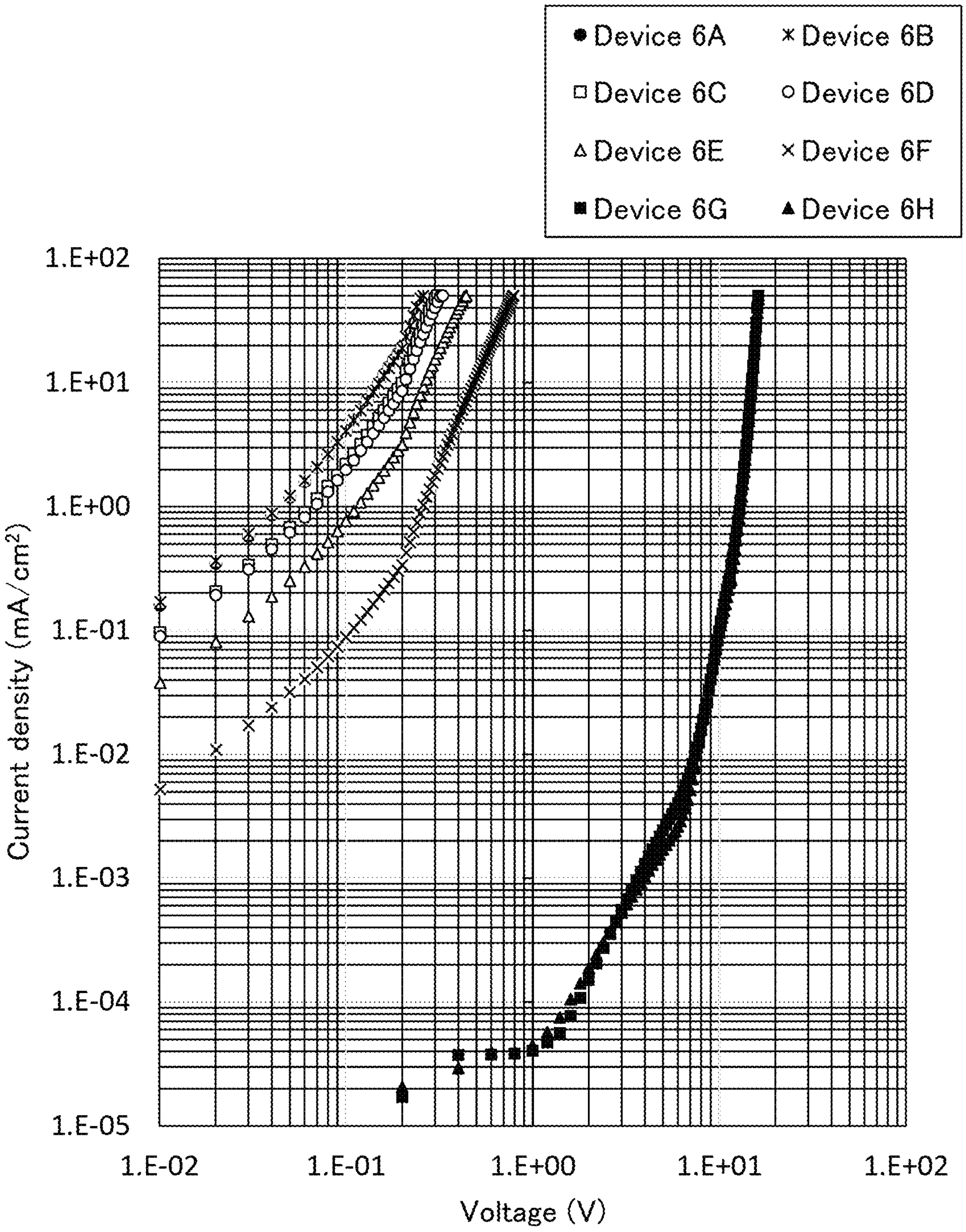
FIG. 54 is a graph showing current density-voltage characteristics of samples in an example.
Figure 55A:
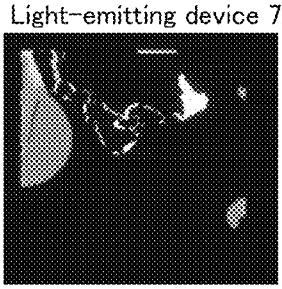
FIGS. 55A to 55K show results of observation of samples in an example by an optical microscope.
Figure 55B:
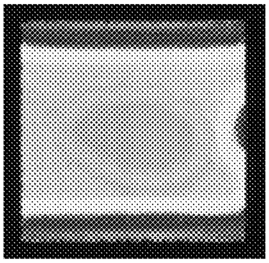
Figure 55C:
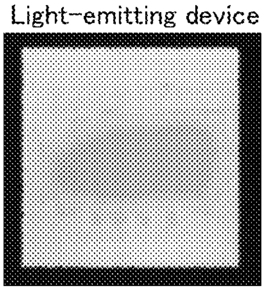
Figure 55D:
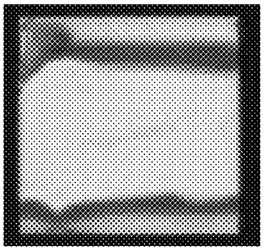
Figure 55E:
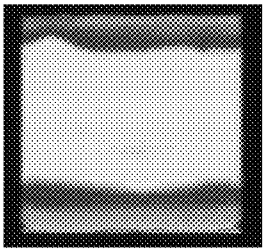
Figure 55F:
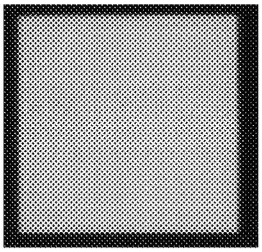
Figure 55G:
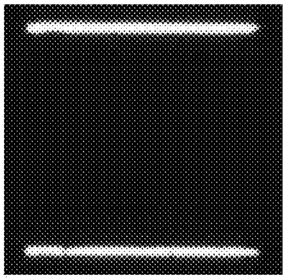
Figure 55H:
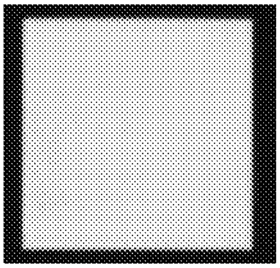
Figure 55I:
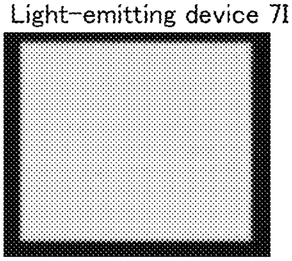
Figure 55J:
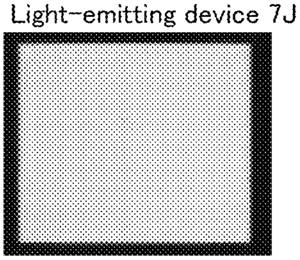
Figure 55K:
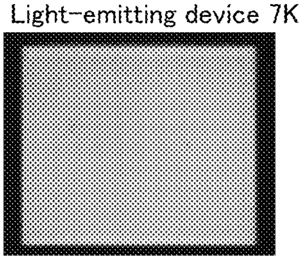

The hole-transport property in the above devices 6A to 6H was evaluated. FIG. 54 shows current density-voltage characteristics of the devices. The table below lists the HOMO levels of the organic compounds used in the devices 6. The HOMO levels were measured using cyclic voltammetry (CV) measurement and/or ionization potential (IP) measurement. The table also lists the acid dissociation constants $pK_a$ of the organic compounds used in the devices 6. The acid dissociation constants $pK_a$ of PCBBiF, UGH-2, mFBPTzn, and 2mDBTBPDBq-II were lower than 1.

TABLE 20

| | | | CV measurement | IP measurement | |
|---|---|---|---|---|---|
| | Material | $pK_a$ | HOMO [eV] | HOMO [eV] | Light intensity for IP measurement [nW] |
| Device 6B | UGH-2 | <1 | — | −5.78 | 10 |
| Device 6C | mFBPTzn | <1 | −5.80 | −6.23 | 1 |
| Device 6D | 2mDBTBPDBq-II | <1 | — | −6.17 | 10 |
| Device 6E | NBPhen | 5.59 | −6.22 | −6.20 | 1 |
| Device 6F | mPPhen2P | 5.16 | −6.23 | −5.88 | 30 |
| Device 6G | Pyrrd-Phen | 11.23 | −6.11 | — | — |
| Device 6H | 2hppSF | 13.95 | — | −5.65 | 30 |
| All devices 6 | PCBBiF | <1 | −5.36 | −5.15 | 400 |

FIG. 54 and the table above show that in the devices 6A to 6H, the higher the acid dissociation constant $pK_a$ of the added organic compound was, the higher the driving voltage was. The devices 6B, 6C, and 6D that were respectively fabricated using UGH-2, mFBPTzn, and 2mDBTBPDBq-II, i.e., the organic compounds with low basicity, had slightly higher driving voltages than the reference device 6A. The higher driving voltage may be attributable to the lower volume proportion of PCBBiF capable of transporting holes. The devices 6E to 6H that were fabricated using the organic compounds with high basicity had much higher driving voltages than the devices 6A to 6D. These results, which cannot be explained only from the lower volume proportion of PCBBiF, show that the addition of the organic compounds having high basicity reduced a hole-transport property. Furthermore, although the acid dissociation constants $pK_a$ of NBPhen and mPPhen2P are equivalent to each other, an increase from the driving voltage of the device 6A was larger in the device 6F fabricated using mPPhen2P than in the device 6E fabricated using NBPhen. This is attributed to the fact that mPPhen2P contains two phenanthroline rings, which are basic skeletons, whereas NBPhen contains one phenanthroline ring. It is thus found that a larger number of basic skeletons in a molecule causes a lower hole-transport property.

Therefore, the acid dissociation constant $pK_a$ of the second organic compound in one embodiment of the present invention is preferably higher than or equal to 3 and lower than or equal to 8, further preferably higher than or equal to 4 and lower than or equal to 6. The second organic compound preferably contains a pyridine or phenanthroline ring, which is a basic skeleton, further preferably two or more pyridine or phenanthroline rings.

It was found from the above that a device that emits light with high efficiency can be provided by using one embodiment of the present invention.

Example 7

In this example, light-emitting devices 7 (light-emitting devices 7A to 7K) were fabricated by an MML process, and the evaluated characteristics of the light-emitting devices are described.

The organic compounds whose structural formulae are shown below were used in all of the light-emitting devices 7.

[Chemical Formula 18]

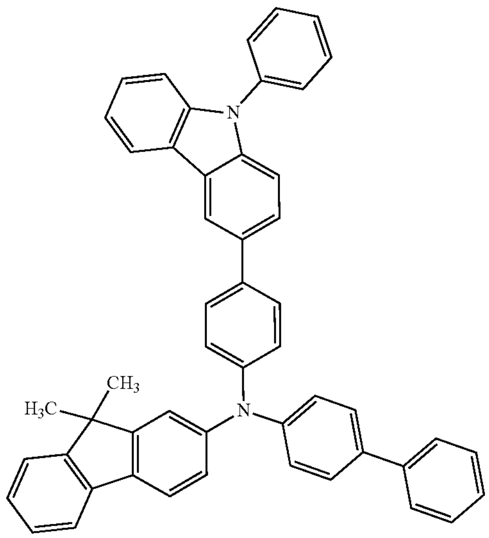

PCBBiF

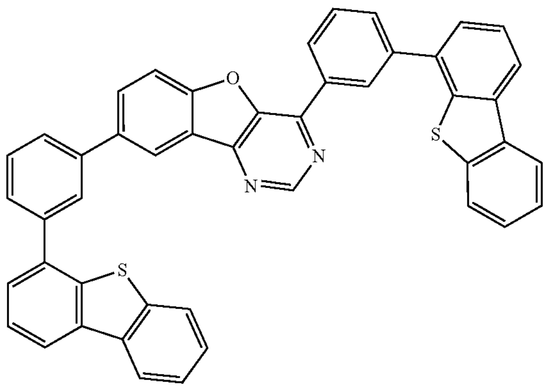

4,8mDBtP2Bfpm

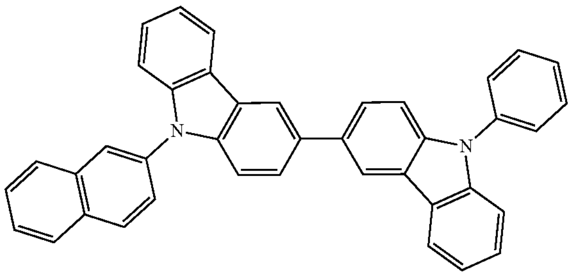

β NCCP

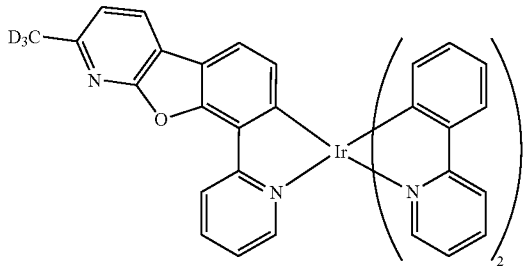

Ir(ppy)2(mbfpypy-d3)

-continued

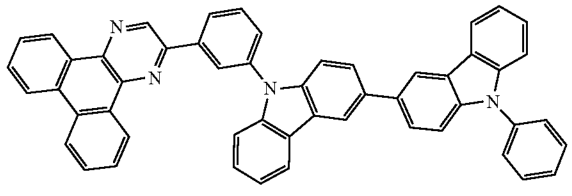

2mPCCzPDBq

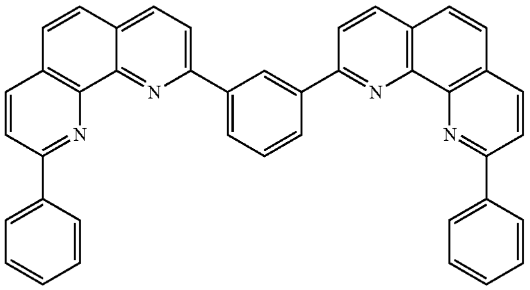

mPPhen2P

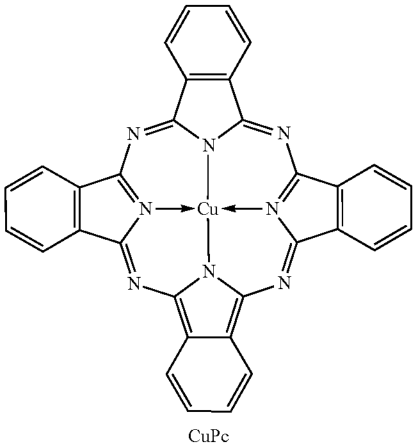

CuPc

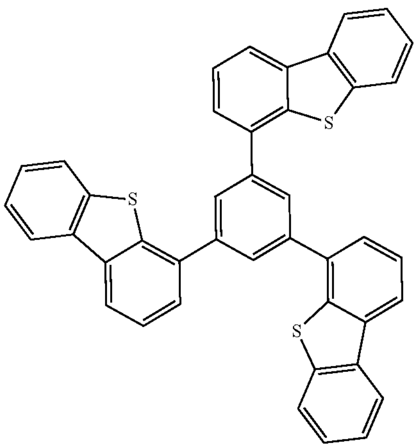

DBT3P-II

The light-emitting devices 7A to 7K were each fabricated using the corresponding one of the organic compounds whose structural formulae are shown below.

[Chemical Formula 19]

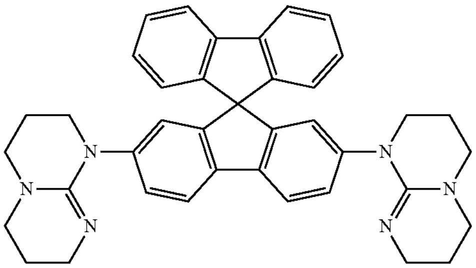

2,7hpp2SF
Light-emitting device 7A
Light-emitting device 7B
Light-emitting device 7C

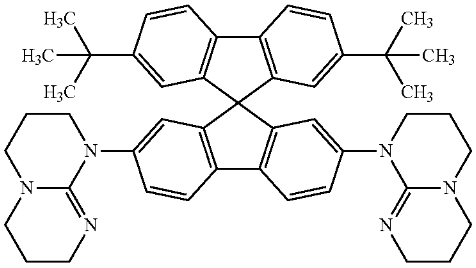

2′,7′tBu-2,7hpp2SF
Light-emitting device 7D
Light-emitting device 7E
Light-emitting device 7F

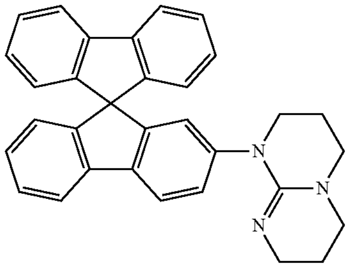

2hppSF
Light-emitting device 7G
Light-emitting device 7H

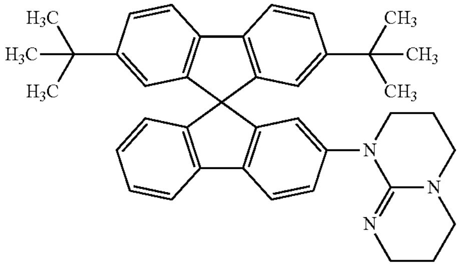

2′,7′tBu-2hppSF
Light-emitting device 7I
Light-emitting device 7J
Light-emitting device 7K As illustrated in FIG. 23, the light-emitting devices 7A to 7K have a tandem structure in which the first EL layer 903, the intermediate layer 905, the second EL layer 904, and the second electrode 902 are stacked over the first electrode 901 formed over the substrate 900 that is a glass substrate.

The first EL layer 903 has a structure in which the hole-injection layer 910, the first hole-transport layer 911, the first light-emitting layer 912, and the first electron-transport layer 913 are stacked in this order. The intermediate layer 905 includes the electron-injection buffer region 914 and the layer 915 including an electron-relay region and a charge-generation region. The second EL layer 904 has a structure in which the second hole-transport layer 916, the second light-emitting layer 917, the second electron-transport layer 918, and the electron-injection layer 919 are stacked in this order.

<Method for Fabricating Light-Emitting Devices 7>

First, as a reflective electrode, an alloy containing silver (Ag), palladium (Pd), and copper (Cu) (abbreviation: APC) was deposited over the substrate 900 that is a glass substrate to a thickness of 100 nm by a sputtering method, and then, as a transparent electrode, indium tin oxide containing silicon oxide (ITSO) was deposited to a thickness of 100 nm by a sputtering method, so that the first electrode 901 was formed. The electrode area was set to 4 $mm^2$ (2 mm×2 mm). Note that the first electrode 901 is a transparent electrode, and the transparent electrode and the reflective electrode can be collectively regarded as the first electrode 901.

Next, the first EL layer 903 was provided. First, in pretreatment for forming each of the light-emitting devices 7 over the substrate, a surface of the substrate was washed with water and baking was performed at 200° C. for 1 hour. Then, the substrate was transferred into a vacuum evaporation apparatus where the pressure was reduced to approximately $1\times10^{-4}$ Pa, and vacuum baking was performed at 170° C. for 30 minutes in a heating chamber of the vacuum evaporation apparatus. After that, natural cooling was performed for approximately 30 minutes.

Then, the substrate provided with the first electrode 901 was fixed to a substrate holder provided in the vacuum evaporation apparatus such that the surface on which the first electrode 901 was formed faced downward. Over the first electrode 901, N-(biphenyl-4-yl)-N-[4-(9-phenyl-9H-carbazol-3-yl)phenyl]-9,9-dimethyl-9H-fluoren-2-amine (abbreviation: PCBBiF) and a fluorine-containing electron acceptor material with a molecular weight of 672 (OCHD-003) were deposited by co-evaporation using resistance heating to a thickness of 10 nm such that the weight ratio of PCBBiF to OCHD-003 was 1:0.03, whereby the hole-injection layer 910 was formed.

Next, PCBBiF was deposited by evaporation to a thickness of 60 nm over the hole-injection layer 910, so that the first hole-transport layer 911 was formed.

Next, the first light-emitting layer 912 was formed over the first hole-transport layer 911. Using resistance heating, 4,8-bis[3-(dibenzothiophen-4-yl)phenyl]-[1]benzofuro[3,2-d]pyrimidine (abbreviation: 4,8mDBtP2Bfpm), 9-(2-naphthyl)-9'-phenyl-9H,9'H-3,3'-bicarbazole (abbreviation: PNCCP), and [2-d3-methyl-(2-pyridinyl-κN)benzofuro[2,3-b]pyridine-κC]bis[2-(2-pyridinyl-κN)phenyl-κC]iridium (III) (abbreviation: $Ir(ppy)_2$(mbfpypy-d3)) were deposited by co-evaporation to a thickness of 40 nm such that the weight ratio of 4,8mDBtP2Bfpm to PNCCP and $Ir(ppy)_2$(mbfpypy-d3) was 5:5:1, whereby the first light-emitting layer 912 was formed.

Then, over the first light-emitting layer 912, 2-{3-[3-(N-phenyl-9H-carbazol-3-yl)-9H-carbazol-9-yl]phenyl}dibenzo[f,h]quinoxaline (abbreviation: 2mPCCzPDBq) was deposited by evaporation to a thickness of 10 nm, and then 2,2'-(1,3-phenylene)bis(9-phenyl-1,10-phenanthroline) (abbreviation: mPPhen2P) was deposited by evaporation to a thickness of 15 nm, so that the first electron-transport layer 913 was formed.

Next, the intermediate layer 905 was provided. In each of the light-emitting devices 7A to 7C, 2,2'-(1,3-phenylene)bis(9-phenyl-1,10-phenanthroline) (abbreviation: mPPhen2P) and 1,1'-(9,9'-spirobi[9H-fluorene]-2,7-diyl)bis(1,3,4,6,7,8-hexahydro-2H-pyrimido[1,2-a]pyrimidine) (abbreviation: 2,7hpp2SF) were deposited over the first electron-transport layer 913 by co-evaporation using resistance heating to a thickness of 5 nm under any of conditions 7X, which are listed in Table 22, so that a layer serving as the electron-injection buffer region 914 was formed.

Here, the weight ratio of mPPhen2P to 2,7hpp2SF was 1:1 in the light-emitting device 7A. The weight ratio of mPPhen2P to 2,7hpp2SF was 1:0.5 in the light-emitting device 7B. The weight ratio of mPPhen2P to 2,7hpp2SF was 1:0.25 in the light-emitting device 7C.

In each of the light-emitting devices 7D to 7F, mPPhen2P and 1,1'-(2',7'-di-tert-butyl-9,9'-spirobi[9H-fluorene]-2,7-diyl)bis(1,3,4,6,7,8-hexahydro-2H-pyrimido[1,2-a]pyrimidine) (abbreviation: 2',7'tBu-2,7hpp2SF) were deposited over the first electron-transport layer 913 by co-evaporation using resistance heating to a thickness of 5 nm under any of the conditions 7X, which are listed in Table 22, so that a layer serving as the electron-injection buffer region 914 was formed.

Here, the weight ratio of mPPhen2P to 2',7'tBu-2,7hpp2SF was 1:1 in the light-emitting device 7D. The weight ratio of mPPhen2P to 2',7'tBu-2,7hpp2SF was 1:0.5 in the light-emitting device 7E. The weight ratio of mPPhen2P to 2',7'tBu-2,7hpp2SF was 1:0.25 in the light-emitting device 7F.

In each of the light-emitting devices 7G and 7H, mPPhen2P and 1-(9,9'-spirobi[9H-fluoren]-2-yl)-1,3,4,6,7,8-hexahydro-2H-pyrimido[1,2-a]pyrimidine (abbreviation: 2hppSF) were deposited over the first electron-transport layer 913 by co-evaporation using resistance heating to a thickness of 5 nm under any of the conditions 7X, which are listed in Table 22, so that a layer serving as the electron-injection buffer region 914 was formed.

Here, the weight ratio of mPPhen2P to 2hppSF was 1:1 in the light-emitting device 7G. The weight ratio of mPPhen2P to 2hppSF was 1:0.5 in the light-emitting device 7H.

In each of the light-emitting devices 7I to 7K, mPPhen2P and 1-(2',7'-di-tert-butyl-9,9'-spirobi[9H-fluoren]-2-yl)-1,3,4,6,7,8-hexahydro-2H-pyrimido[1,2-a]pyrimidine (abbreviation: 2',7'tBu-2hppSF) were deposited over the first electron-transport layer 913 by co-evaporation using resistance heating to a thickness of 5 nm under any of the conditions 7X, which are listed in Table 22, so that a layer serving as the electron-injection buffer region 914 was formed.

Here, the weight ratio of mPPhen2P to 2',7'tBu-2hppSF was 1:1 in the light-emitting device 7I. The weight ratio of mPPhen2P to 2',7'tBu-2hppSF was 1:0.5 in the light-emitting device 7J. The weight ratio of mPPhen2P to 2',7'tBu-2hppSF was 1:0.25 in the light-emitting device 7K.

Then, as the electron-relay region, copper phthalocyanine (abbreviation: CuPc) was deposited to a thickness of 2 nm. Next, as the charge-generation region, N-(biphenyl-4-yl)-N-[4-(9-phenyl-9H-carbazol-3-yl)phenyl]-9,9-dimethyl-9H-fluoren-2-amine (abbreviation: PCBBiF) and a fluorine-containing electron acceptor material with a molecular weight of 672 (OCHD-003) were deposited by co-evaporation using resistance heating to a thickness of 10 nm such that the weight ratio of PCBBiF to OCHD-003 was 1:0.15, whereby the layer 915 including the electron-relay region and the charge-generation region was formed.

Next, the second EL layer 904 was provided. First, PCBBiF was deposited by evaporation to a thickness of 40 nm, so that the second hole-transport layer 916 was formed.

Next, 4,8-bis[3-(dibenzothiophen-4-yl)phenyl]-[1]benzofuro[3,2-d]pyrimidine (abbreviation: 4,8mDBtP2Bfpm), 9-(2-naphthyl)-9'-phenyl-9H,9'H-3,3'-bicarbazole (abbreviation: PNCCP), and [2-d3-methyl-(2-pyridinyl-κN)benzofuro[2,3-b]pyridine-κC]bis[2-(2-pyridinyl-κN)phenyl-κC] iridium(III) (abbreviation: $Ir(ppy)_2$(mbfpypy-d3)) were deposited by co-evaporation using resistance heating to a thickness of 40 nm such that the weight ratio of 4,8mDBtP2Bfpm to PNCCP and $Ir(ppy)_2$(mbfpypy-d3) was 5:5:1, whereby the second light-emitting layer 917 was formed.

Next, over the second light-emitting layer 917, 2-{3-[3-(N-phenyl-9H-carbazol-3-yl)-9H-carbazol-9-yl] phenyl}dibenzo[f,h]quinoxaline (abbreviation: 2mPCCzPDBq) was deposited by evaporation to a thickness of 20 nm, and then 2,2'-(1,3-phenylene)bis(9-phenyl-1,10-phenanthroline) (abbreviation: mPPhen2P) was deposited by evaporation to a thickness of 20 nm, so that the second electron-transport layer 918 was formed.

Here, the substrate 900 was exposed to the air. Then, an aluminum oxide (abbreviation: $AlO_x$) film with a thickness of 30 nm was formed by an ALD method, and an oxide containing indium, gallium, and zinc (abbreviation: IGZO) was deposited to a thickness of 50 nm by a sputtering method. Then, a resist was formed using a photoresist, and the IGZO was processed into a predetermined shape by a lithography method. Specifically, a 3-pm-wide slit was formed to be 3.5 μm apart from an end portion of the first electrode 901.

Next, using the IGZO as a mask, the stacked-layer structure formed of the aluminum oxide film, the first EL layer 903, the intermediate layer 905, the second hole-transport layer 916, the second light-emitting layer 917, and the second electron-transport layer 918 was processed into a predetermined shape, and then the IGZO and the aluminum oxide film were removed. The IGZO and the aluminum oxide film were removed by wet etching using a basic chemical solution.

Next, heat treatment was performed in a vacuum at 110° C. for 1 hour. The heat treatment can remove moisture or the like attached by the above-described processing, the exposure to the air, or the like.

Next, over the second electron-transport layer 918, lithium fluoride (LiF) and ytterbium (Yb) were deposited by co-evaporation to a thickness of 1.5 nm such that the volume ratio of LiF to Yb was 2:1, whereby the electron-injection layer 919 was formed.

Next, over the electron-injection layer 919, Ag and Mg were deposited by co-evaporation to a thickness of 15 nm such that the volume ratio of Ag to Mg was 1:0.1, whereby the second electrode 902 was formed. Note that the second electrode 902 is a semi-transmissive and semi-reflective electrode having functions of transmitting light and reflecting light.

Then, as a cap layer, 4,4',4''-(benzene-1,3,5-triyl)tri (dibenzothiophene) (abbreviation: DBT3P-II) was deposited by evaporation to a thickness of 70 nm.

Through the above process, the light-emitting devices 7 were fabricated.

The structures of the light-emitting devices 7 are listed in the table below.

TABLE 21

| | Thickness [nm] | Light-emitting device 7 |
|---|---|---|
| Cap layer | 70 | DBT3P-II |
| Second electrode | 15 | Ag:Mg□(1:0.1) |
| Electron-injection layer | 1.5 | LiF:Yb□(2:1) |
| Second electron-transport layer | 20 | mPPhen2P |
| | 20 | 2mPCCzPDBq |
| Second light-emitting layer | 40 | 4,8mDBtP2Bfpm:βNCCP:$Ir(ppy)_2$(mbfpypy-d3) (5:5:1) |
| Second hole-transport layer | 40 | PCBBiF |
| Charge-generation region | 10 | PCBBiF:OCHD-003 (1:0.15) |
| Electron-relay region | 2 | CuPc |
| Electron-injection buffer region | 5 | Condition 7X |
| First electron-transport layer | 15 | mPPhen2P |
| | 10 | 2mPCCzPDBq |
| First light-emitting layer | 40 | 4,8mDBtP2Bfpm:βNCCP:$Ir(ppy)_2$(mbfpypy-d3) (5:5:1) |
| First hole-transport layer | 60 | PCBBiF |
| Hole-injection layer | 10 | PCBBiF:OCHD-003 (1:0.03) |
| First electrode | 100 | ITSO |
| | 100 | APC |

The table below lists the conditions 7X for the electron-injection buffer regions 914 of the light-emitting devices 7A to 7K.

TABLE 22

| | Condition 7X | |
|---|---|---|
| | Material added to electron-injection buffer region 914 | Weight ratio |
| Light-emitting device 7A | mPPhen2P:2,7hpp2SF | (1:1) |
| Light-emitting device 7B | | (1:0.5) |
| Light-emitting device 7C | | (1:0.25) |
| Light-emitting device 7D | mPPhen2P:2',7'tBu-2,7hpp2SF | (1:1) |
| Light-emitting device 7E | | (1:0.5) |
| Light-emitting device 7F | | (1:0.25) |
| Light-emitting device 7G | mPPhen2P:2hppSF | (1:1) |
| Light-emitting device 7H | | (1:0.5) |
| Light-emitting device 7I | mPPhen2P:2',7'tBu-2hppSF | (1:1) |
| Light-emitting device 7J | | (1:0.5) |
| Light-emitting device 7K | | (1:0.25) |

Through the above process, the light-emitting devices 7A to 7K were fabricated.

<Observation of Device with Optical Microscope>

The light-emitting devices 7A to 7K were sealed using a glass substrate in a glove box containing a nitrogen atmosphere so as not to be exposed to the air (a sealing material was applied to surround the devices and UV treatment and heat treatment at 80° C. for 1 hour were performed at the time of sealing). Then, a 4-mm$^2$ (2 mm×2 mm) area of each of the light-emitting devices 7A to 7K was observed with an optical microscope. FIGS. 55A to 55K show the results of the light-emitting devices 7A to 7K.

The table below lists the number of hydrophilic hpp groups, the number of hydrophobic tert-butyl groups, and water solubility of the materials added to the electron-injection buffer regions 914 in the light-emitting devices 7A to 7K.

TABLE 23

| | Material added to electron-injection buffer region 914 | hpp group | tert-butyl group | Solubility [mg/ml] |
|---|---|---|---|---|
| Light-emitting device 7A<br>Light-emitting device 7B<br>Light-emitting device 7C | 2,7hpp2SF | 2 | 0 | 0.23 to 0.39 |
| Light-emitting device 7D<br>Light-emitting device 7E<br>Light-emitting device 7F | 2',7'tBu-2,7hpp2SF | 2 | 2 | 0.058 to 0.062 |
| Light-emitting device 7G<br>Light-emitting device 7H | 2hppSF | 1 | 0 | 0.018 to 0.022 |
| Light-emitting device 7I<br>Light-emitting device 7J<br>Light-emitting device 7K | 2',7'tBu-2hppSF | 1 | 2 | <0.0023 |

Figure 56:
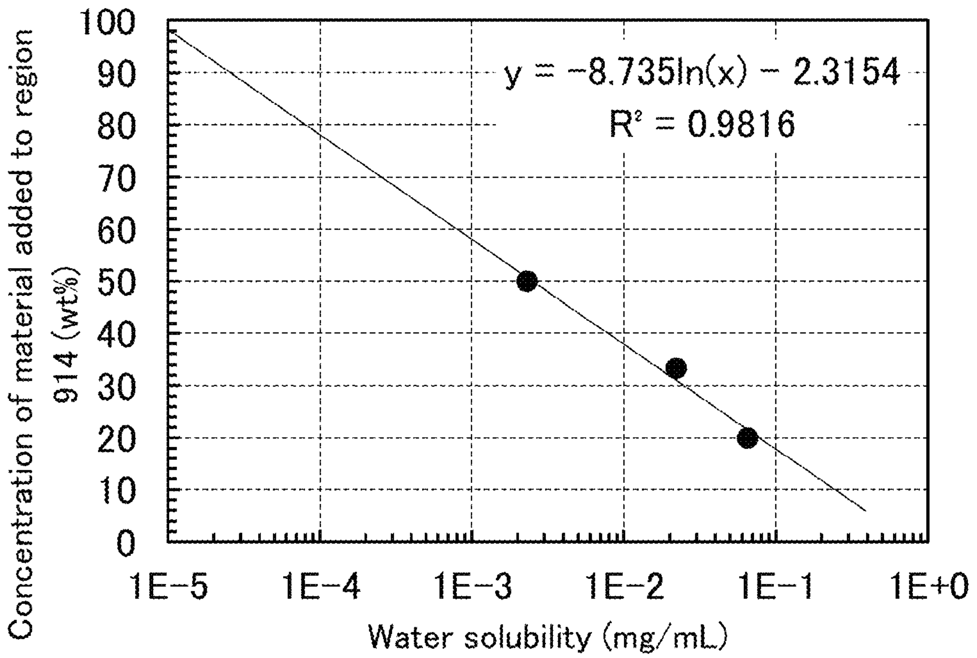
FIG. 56 is a graph showing relationship between concentration and solubility of materials in an example.

FIG. 56 shows the relationship between the concentration of the material added to the electron-injection buffer region 914 and water solubility of the material in each of the light-emitting devices 7F, 7H, and 7K that emitted light without any defect.

No defect was observed in the light-emitting devices 7F and 7H to 7K. By contrast, defective light emission occurred especially in peripheral portions of the light-emitting devices 7A, 7B, 7C, 7D, 7E, and 7G.

It was found that the light-emitting devices 7F and 7H to 7K fabricated through the process involving exposure to the air and the chemical solution and the etching process in the device fabrication show favorable device characteristics. Accordingly, the light-emitting devices 7F and 7H to 7K were found to be highly resistant to the process involving exposure to the air and the chemical solution and the etching process.

The above results show that in the case where a light-emitting device is fabricated by an MML process involving exposure to the air or a washing step using an aqueous solution, for example, the material added to the electron-injection buffer region 914 preferably has low solubility. Specifically, the solubility of the material added to the electron-injection buffer region 914 is preferably lower than 0.77 mg/ml, further preferably lower than or equal to 0.065 mg/ml, still further preferably lower than or equal to 0.0023 mg/ml, yet still further preferably lower than or equal to $1\times10^{-5}$ mg/ml.

Even when the material added to the electron-injection buffer region 914 has high solubility, adjusting the concentration of the material makes it possible to provide a defect-free light-emitting device. Specifically, $y \leq -8.735\times\ln(x)-2.3154$ is preferably satisfied, where y is the concentration (weight %) of the material added to the electron-injection buffer region 914 and x is the water solubility (mg/ml) of the added material.

The above-described results have revealed that a device that has high tolerance to a process involving exposure to the air or a chemical solution and an etching process and has favorable device characteristics can be provided by using one embodiment of the present invention.

This application is based on Japanese Patent Application Serial No. 2022-filed with Japan Patent Office on Nov. 30, 2022 and Japanese Patent Application Serial No. 2022-209514 filed with Japan Patent Office on Dec. 27, 2022, the entire contents of which are hereby incorporated by reference.

What is claimed is:

1. A light-emitting device comprising:

a first electrode;

a second electrode; and an organic compound layer between the first electrode and the second electrode, wherein the organic compound layer comprises a first light-emitting unit, a second light-emitting unit, and an intermediate layer, wherein the intermediate layer is between the first light-emitting unit and the second light-emitting unit, wherein the intermediate layer comprises a mixed layer comprising a first organic compound and a second organic compound, wherein the first organic compound is a strongly basic compound having an acid dissociation constant $pK_a$ higher than or equal to 8, wherein the second organic compound has an electron-transport property, and wherein a LUMO level of the first organic compound is higher than a LUMO level of the second organic compound.

2. The light-emitting device according to claim 1, wherein the LUMO level of the first organic compound is higher than the LUMO level of the second organic compound by greater than or equal to 0.05 eV.

3. The light-emitting device according to claim 1, wherein the LUMO level of the first organic compound is higher than the LUMO level of the second organic compound by greater than or equal to 0.05 eV, and wherein a HOMO level of the first organic compound is higher than a HOMO level of the second organic compound by greater than or equal to 0.05 eV.

4. The light-emitting device according to claim 1, wherein the LUMO level of the first organic compound is higher than or equal to −2.50 eV and lower than or equal to −1.00 eV.

5. The light-emitting device according to claim 1, wherein the LUMO level of the first organic compound is higher than or equal to −2.50 eV and lower than or equal to −1.00 eV, and wherein a HOMO level of the first organic compound is higher than or equal to −5.7 eV and lower than or equal to −4.8 eV.

6. The light-emitting device according to claim 1, wherein the LUMO level of the first organic compound is higher than or equal to −2.50 eV and lower than or equal to −1.00 eV, and wherein the LUMO level of the second organic compound is higher than or equal to −3.25 eV and lower than or equal to −2.50 eV.

7. The light-emitting device according to claim 1, wherein the LUMO level of the first organic compound is higher than or equal to −2.50 eV and lower than or equal to −1.00 eV, wherein the LUMO level of the second organic compound is higher than or equal to −3.25 eV and lower than or equal to −2.50 eV, wherein a HOMO level of the first organic compound is higher than or equal to −5.7 eV and lower than or equal to −4.8 eV, and wherein a HOMO level of the second organic compound is higher than or equal to −6.5 eV and lower than or equal to −5.7 eV.

8. The light-emitting device according to claim 1, wherein the second organic compound is a basic compound having an acid dissociation constant $pK_a$ higher than or equal to 4 and lower than or equal to 8.

9. The light-emitting device according to claim 1, wherein the first organic compound has no electron-donating property with respect to the second organic compound.

10. The light-emitting device according to claim 1, wherein the mixed layer comprising the first organic compound and the second organic compound has spin density lower than or equal to $1\times10^{17}$ spins/$cm^3$ measured by an electron spin resonance method.

11. A light-emitting device comprising:

a first electrode;

a second electrode; and an organic compound layer between the first electrode and the second electrode, wherein the organic compound layer comprises a first light-emitting unit, a second light-emitting unit, and an intermediate layer, wherein the intermediate layer is between the first light-emitting unit and the second light-emitting unit, wherein the intermediate layer comprises a mixed layer comprising a first organic compound and a second organic compound, wherein the first organic compound is a strongly basic compound having an acid dissociation constant $pK_a$ higher than or equal to 8, wherein the second organic compound has an electron-transport property, wherein a LUMO level of the first organic compound is higher than a LUMO level of the second organic compound, and wherein a HOMO level of the first organic compound is higher than a HOMO level of the second organic compound.

12. The light-emitting device according to claim 11, wherein the LUMO level of the first organic compound is higher than the LUMO level of the second organic compound by greater than or equal to 0.05 eV.

13. The light-emitting device according to claim 11, wherein the LUMO level of the first organic compound is higher than the LUMO level of the second organic compound by greater than or equal to 0.05 eV, and wherein the HOMO level of the first organic compound is higher than the HOMO level of the second organic compound by greater than or equal to 0.05 eV.

14. The light-emitting device according to claim 11, wherein the LUMO level of the first organic compound is higher than or equal to −2.50 eV and lower than or equal to −1.00 eV.

15. The light-emitting device according to claim 11, wherein the LUMO level of the first organic compound is higher than or equal to −2.50 eV and lower than or equal to −1.00 eV, and wherein the HOMO level of the first organic compound is higher than or equal to −5.7 eV and lower than or equal to −4.8 eV.

16. The light-emitting device according to claim 11, wherein the LUMO level of the first organic compound is higher than or equal to −2.50 eV and lower than or equal to −1.00 eV, and wherein the LUMO level of the second organic compound is higher than or equal to −3.25 eV and lower than or equal to −2.50 eV.

17. The light-emitting device according to claim 11, wherein the LUMO level of the first organic compound is higher than or equal to −2.50 eV and lower than or equal to −1.00 eV, wherein the LUMO level of the second organic compound is higher than or equal to −3.25 eV and lower than or equal to −2.50 eV, wherein the HOMO level of the first organic compound is higher than or equal to −5.7 eV and lower than or equal to −4.8 eV, and wherein the HOMO level of the second organic compound is higher than or equal to −6.5 eV and lower than or equal to −5.7 eV.

18. The light-emitting device according to claim 11, wherein the second organic compound is a basic compound having an acid dissociation constant $pK_a$ higher than or equal to 4 and lower than or equal to 8.

19. The light-emitting device according to claim 11, wherein the first organic compound has no electron-donating property with respect to the second organic compound.

20. The light-emitting device according to claim 11, wherein the mixed layer comprising the first organic compound and the second organic compound has spin density lower than or equal to $1\times10^{17}$ spins/$cm^3$ measured by an electron spin resonance method.

* * * * *